US011780866B2

(12) United States Patent
Lee et al.

(10) Patent No.: US 11,780,866 B2
(45) Date of Patent: Oct. 10, 2023

(54) ORGANOMETALLIC COMPOUND, ORGANIC LIGHT-EMITTING DEVICE INCLUDING ORGANOMETALLIC COMPOUND, AND DIAGNOSTIC COMPOSITION INCLUDING ORGANOMETALLIC COMPOUND

(71) Applicant: Samsung Electronics Co., Ltd., Suwon-si (KR)

(72) Inventors: Sunyoung Lee, Seoul (KR); Yoonhyun Kwak, Seoul (KR); Juhyun Kim, Seoul (KR); Sangho Park, Anyang-si (KR); Sunghun Lee, Hwaseong-si (KR); Jeoungin Yi, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 210 days.

(21) Appl. No.: 17/032,120

(22) Filed: Sep. 25, 2020

(65) Prior Publication Data

US 2021/0155647 A1 May 27, 2021

(30) Foreign Application Priority Data

Nov. 25, 2019 (KR) ........................ 10-2019-0152230

(51) Int. Cl.
*C07F 15/00* (2006.01)
*H10K 85/30* (2023.01)
(Continued)

(52) U.S. Cl.
CPC ....... *C07F 15/0033* (2013.01); *H10K 85/342* (2023.02); *C09K 11/06* (2013.01);
(Continued)

(58) Field of Classification Search
CPC ............. H01L 51/0085; H01L 51/5016; C07F 15/0033; C09K 2211/185;
(Continued)

(56) References Cited

U.S. PATENT DOCUMENTS 6,921,915 B2 7/2005 Takiguchi et al.
8,709,615 B2 4/2014 Kottas et al.
(Continued)

FOREIGN PATENT DOCUMENTS

CN 105111243 A 12/2015
CN 105461756 A 4/2016
(Continued)

OTHER PUBLICATIONS

Anastasia I. Solomatina, et al., Dibenzothiophene-platinated complexes: probing the effect of ancillary ligands on the photophysical performance, The Royal Society of Chemistry 2017, Dalton Trans., 46, 3895-3905.
(Continued)

*Primary Examiner* — Gregory D Clark
(74) *Attorney, Agent, or Firm* — CANTOR COLBURN LLP

(57) ABSTRACT

Provided are an organometallic compound represented by Formula 1, an organic light-emitting device including the organometallic compound, and a diagnostic composition including the organometallic compound:

$$M(L_1)_{n1}(L_2)_{n2} \quad \text{Formula 1}$$

wherein, in Formula 1, M, $L_1$, $L_2$, n1 and n2 may each be understood by referring to the descriptions thereof provided herein.

18 Claims, 1 Drawing Sheet

(51) Int. Cl.

| | |
|---|---|
| *C09K 11/06* | (2006.01) |
| *H10K 50/11* | (2023.01) |
| *H10K 101/10* | (2023.01) |

(52) U.S. Cl.
CPC ................. *C09K 2211/1425* (2013.01); *C09K 2211/1433* (2013.01); *C09K 2211/1466* (2013.01); *C09K 2211/185* (2013.01); *H10K 50/11* (2023.02); *H10K 2101/10* (2023.02)

(58) Field of Classification Search
CPC .... C09K 2211/1466; C09K 2211/1433; C09K 2211/1425; C09K 2211/145; C09K 11/06
See application file for complete search history.

(56) References Cited

U.S. PATENT DOCUMENTS

| | | | | |
|---|---|---|---|---|
| 8,795,850 | B2 | 8/2014 | Kottas et al. | |
| 9,184,397 | B2 | 11/2015 | Kottas et al. | |
| 9,193,745 | B2 | 11/2015 | Ma et al. | |
| 9,954,180 | B2 | 4/2018 | Xia et al. | |
| 2009/0236974 | A1* | 9/2009 | Tamaru | H05B 33/20 313/504 |
| 2010/0244004 | A1 | 9/2010 | Xia et al. | |
| 2013/0119354 | A1* | 5/2013 | Ma | H05B 33/10 546/4 |
| 2014/0159028 | A1 | 6/2014 | Kottas et al. | |
| 2016/0111665 | A1* | 4/2016 | Kim | C09K 11/06 257/40 |
| 2016/0155962 | A1 | 6/2016 | Hwang et al. | |
| 2018/0076393 | A1 | 3/2018 | Zeng et al. | |
| 2019/0006590 | A1 | 1/2019 | Park et al. | |
| 2019/0296251 | A1 | 9/2019 | Yen et al. | |
| 2019/0355917 | A1 | 11/2019 | Metz et al. | |
| 2020/0212318 | A1 | 7/2020 | Kim et al. | |
| 2020/0287143 | A1* | 9/2020 | Kim | H10K 85/342 |

FOREIGN PATENT DOCUMENTS

| | | | |
|---|---|---|---|
| CN | 108948098 | A | 12/2018 |
| CN | 109970809 | A | 7/2019 |
| EP | 1238981 | A2 | 9/2002 |
| KR | 1020150034333 | A | 4/2015 |
| KR | 1020150045295 | A | 4/2015 |
| KR | 20150134371 | A | 12/2015 |
| KR | 20160046295 | A | 4/2016 |
| KR | 1020160064955 | A | 6/2016 |
| KR | 101744248 | B1 | 6/2017 |
| KR | 1020180020878 | A | 2/2018 |
| KR | 20190088025 | A | 7/2019 |
| KR | 20190130513 | A | 11/2019 |
| WO | 2019143153 | A1 | 7/2019 |
| WO | 2019221484 | A1 | 11/2019 |

OTHER PUBLICATIONS

English Abstract of CN 105111243.
English Abstract of CN 105461756.
English Abstract of KR 10-2015-0034333.
English Abstract of KR 10-2015-0045295.
English Abstract of KR 10-2018-0020878.
Hidetaka Tsujimoto, et al., Photoluminescentpropertiesofheteroleptic cyclometalatedplatinum(II) complexesbearing1,3-bis(3,4-dibutoxyphenyl)propane-1,3-dionateasan ancillary ligand, Journal of Luminescence 130 (2010) 217-221.
Hidetaka Tsujimoto, et al., Pure red electroluminescence from novel heteroleptic cyclometalated platinum(II) emitters embedded in polyvinylcarbazole, Synthetic Metals 160 (2010) 615-620.
Mie Tanaka, et al., Electronic Structures of Platinum(II) Complexes with 2-Arylpyridine and 1,3-Diketonate Ligands: A Relativistic Density Functional Study on Photoexcitation and Phosphorescent Properties, American Chemical Society, J. Phys. Chem. C 2014, 118, 12443-12449.
Tatsuya Shigehiro, et al., Photo- and Electroluminescence from 2-(Dibenzo[b,d]furan-4-yl)pyridine-Based Heteroleptic Cyclometalated Platinum(II) Complexes: Excimer Formation Drastically Facilitated by an Aromatic Diketonate Ancillary Ligand, J. Phys. Chem. C 2013, 117, 532-542.
Tian-Yi Li, et al., N-Heterocyclic Carbenes: Versatile Second Cyclometalated Ligands for Neutral Iridium(III) Heteroleptic Complexes, Inorg Chem. 2015, 54, 161-173.
Extended European Search Report dated Apr. 26, 2021, issued in EP Patent Application No. 20208566.8, 7 pp.
English Abstract of KR 10-2019-0130513.
English Translation of Office Action dated Jul. 13, 2023, issued in corresponding KR Patent Application No. 10-2019-0152230, 19 pp.
Office Action dated Jul. 13, 2023, issued in corresponding KR Patent Application No. 10-2019-0152230, 15 pp.

* cited by examiner

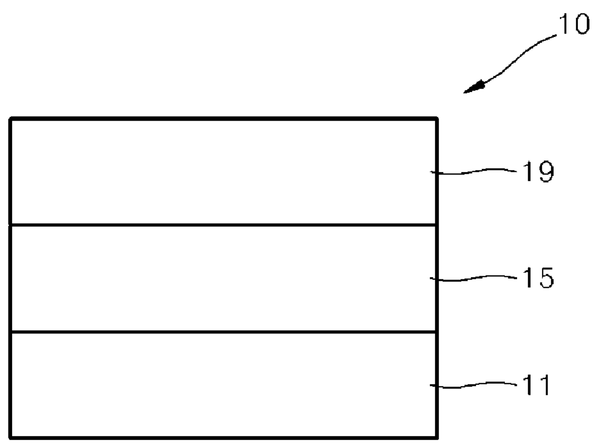
10
19
15
11

ORGANOMETALLIC COMPOUND, ORGANIC LIGHT-EMITTING DEVICE INCLUDING ORGANOMETALLIC COMPOUND, AND DIAGNOSTIC COMPOSITION INCLUDING ORGANOMETALLIC COMPOUND

CROSS-REFERENCE TO RELATED APPLICATION

This application claims priority to and the benefit of Korean Patent Application No. 10-2019-0152230, filed on Nov. 25, 2019, in the Korean Intellectual Property Office, the content of which is incorporated herein in its entirety by reference.

BACKGROUND

1. Field

The present disclosure relates to an organometallic compound, an organic light-emitting device including the organometallic compound, and a diagnostic composition including the organometallic compound.

2. Description of Related Art

Organic light-emitting devices (OLEDs) are self-emission devices which produce full-color images. In addition, OLEDs have wide viewing angles and exhibit excellent driving voltage and response speed characteristics.

OLEDs include an anode, a cathode, and an organic layer between the anode and the cathode and including an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state to thereby generate light.

Further, light-emitting compounds, e.g., phosphorescence-emitting compounds, can also be used to monitor, sense, or detect biological materials, including a variety of cells and proteins.

SUMMARY

Provided are an organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments of the disclosure.

According an aspect of an embodiment, an organometallic compound is represented by Formula 1.

$$M(L_1)_{n1}(L_2)_{n2} \quad \text{Formula 1}$$

wherein, in Formula 1,

M is a transition metal, $L_1$ is a ligand represented by Formula 2, $L_2$ is a ligand represented by Formula 3, n1 and n2 are each 1 or 2, and the sum of n1 and n2 is 3, $L_1$ is different from $L_2$,

2

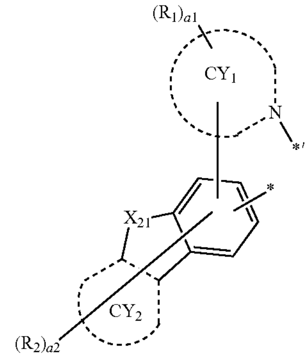

3

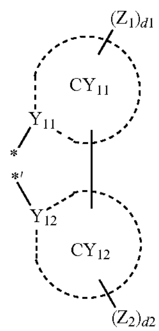

wherein, in Formulae 2 and 3, $Y_{11}$ is N, and $Y_{12}$ is C, ring $CY_1$ and ring $CY_{11}$ are each independently a $C_1$-$C_{30}$ heterocyclic group, ring $CY_2$ and ring $CY_{12}$ are each independently a $C_5$-$C_{30}$ carbocyclic group or a $C_1$-$C_{30}$ heterocyclic group, $X_{21}$ is O, S, Se, $N(R_{28})$, $C(R_{28})(R_{29})$, or $Si(R_{28})(R_{29})$, $R_1$, $R_2$, $R_{28}$, $R_{29}$, $Z_1$, and $Z_2$ are each independently deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_6$-$C_{30}$ unsaturated carbocyclic group, a substituted or unsubstituted $C_2$-$C_{30}$ unsaturated heterocyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, a1, a2, and d1 are each independently an integer from 0 to 10, wherein, when a1 is 2 or greater, at least two $R_1$(s) may be identical to or different from each other, when a2 is 2 or greater, at least two $R_2$(s) may be identical to or different from each other, and when d1 is 2 or greater, at least two $Z_1$(s) may be identical to or different from each other, the sum of a1 and a2 is 1 or greater, d2 is an integer from 1 to 10, wherein, when d2 is 2 or greater, at least two $Z_2$(s) are identical to or different from each other, at least two selected from a plurality of $R_1$(s) are optionally linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, at least two selected from a plurality of $R_2$(s) are optionally linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, at least two selected from a plurality of $Z_1$(s) are optionally linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, at least two selected from a plurality of $Z_2$(s) are optionally linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, at least two selected from $R_1$(s), $R_2$(s), $Z_1$(s), and $Z_2$(s) are optionally linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{10a}$ is understood by referring to the description of $R_1$ provided herein,

* and *' may each indicate a binding site to M in Formula 1, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_6$-$C_{30}$ unsaturated carbocyclic group, and the substituted $C_2$-$C_{30}$ unsaturated heterocyclic group is:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_6$-$C_{30}$ unsaturated carbocyclic group, a $C_2$-$C_{30}$ unsaturated heterocyclic group, $—N(Q_{11})(Q_{12})$, $—Si(Q_{13})(Q_{14})(Q_{15})$, $—Ge(Q_{13})(Q_{14})(Q_{15})$, $—B(Q_{16})(Q_{17})$, $—P(=O)(Q_{18})(Q_{19})$, $—P(Q_{18})(Q_{19})$, or any combination thereof, a $C_6$-$C_{30}$ unsaturated carbocyclic group or a $C_2$-$C_{30}$ unsaturated heterocyclic group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{30}$ unsaturated carbocyclic group, a $C_2$-$C_{30}$ unsaturated heterocyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(=O)(Q_{28})(Q_{29})$, $—P(Q_{28})(Q_{29})$, or any combination thereof, $—N(Q_{31})(Q_{32})$, $—Si(Q_{33})(Q_{34})(Q_{35})$, $—Ge(Q_{33})(Q_{34})(Q_{35})$, $—B(Q_{36})(Q_{37})$, $—P(=O)(Q_{38})(Q_{39})$, or $—P(Q_{38})(Q_{39})$, or any combination thereof, wherein $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group unsubstituted or substituted with deuterium, a $C_1$-$C_{60}$ alkyl group, a $C_6$-$C_{60}$ aryl group, or any combination thereof, a $C_2$-$C_{60}$ alkenyl group, a $C_2$-$C_{60}$ alkynyl group, a $C_1$-$C_{60}$ alkoxy group, or a $C_6$-$C_{30}$ unsaturated carbocyclic group or $C_2$-$C_{30}$ unsaturated heterocyclic group, each unsubstituted or substituted with deuterium, a $C_1$-$C_{60}$ alkyl group, a $C_6$-$C_{60}$ aryl group, or any combination thereof.

According to an aspect of another embodiment, an organic light-emitting device includes a first electrode, a second electrode, and an organic layer disposed between the first electrode and the second electrode and including an emission layer, the organic layer including at least one organometallic compound represented by Formula 1.

In the organic layer, the organometallic compound included in the emission layer may serve as a dopant.

According to an aspect of still another embodiment, a diagnostic composition may include at least one organometallic compound represented by Formula 1.

BRIEF DESCRIPTION OF THE DRAWING

The above and other aspects, features, and advantages of certain embodiments of the disclosure will be more apparent from the following description taken in conjunction with the accompanying drawings, in which The FIGURE is a schematic cross-sectional view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the FIGURES It will be understood that relative terms are intended to encompass different orientations of the device in addition to the orientation depicted in the FIGURES For example, if the device in one of the FIGURES is turned over, elements described as being on the "lower" side of other elements would then be oriented on "upper" sides of the other elements The exemplary term "lower," can therefore, encompasses both an orientation of "lower" and "upper," depending on the particular orientation of the FIGURE Similarly, if the device in one of the FIGURES is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within 30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the FIGURES are schematic in nature and their shapes are not intended to illustrate the precise shape of a region and are not intended to limit the scope of the present claims.

According to an aspect, an organometallic compound may be represented by Formula 1:

$$M(L_1)_{n1}(L_2)_{n2}. \quad \text{Formula 1}$$

In Formula 1, M may be a transition metal.

In some embodiments, M may be a first-row transition metal, a second-row transition metal, or a third-row transition metal.

In some embodiments, M may be iridium (Ir), platinum (Pt), osmium (Os), titanium (Ti), zirconium (Zr), hafnium (Hf), europium (Eu), terbium (Tb), thulium (Tm), or rhodium (Rh).

In some embodiments, M may be Ir, Pt, Os, or Rh.

In one or more embodiments, M may be iridium (Ir).

$L_1$ in Formula 1 may be a ligand represented by Formula 2, and $L_2$ may be a ligand represented by Formula 3:

2

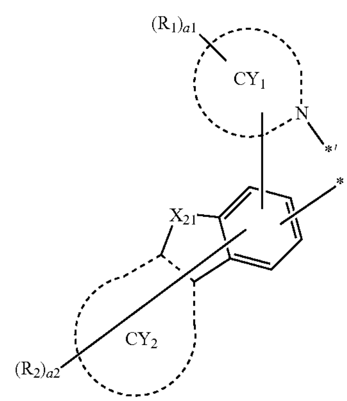

3

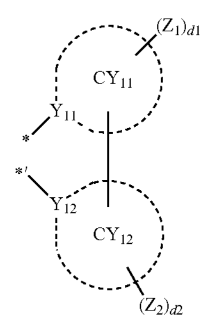

Formulae 2 and 3 may each be understood by referring to the descriptions thereof provided herein.

n1 and n2 in Formula 1 may respectively indicate the number of $L_1$(s) and $L_2$(s), and n1 and n2 may each independently be 1 or 2. When n1 is 2, two $L_1$(s) may be identical to or different from each other, and when n2 is 2, two $L_2$(s) may be identical to or different from each other. The sum of n1 and n2 may be 3.

$L_1$ and $L_2$ in Formula 1 may be different from each other. That is, the organometallic compound represented by Formula 1 may be a heteroleptic complex.

In Formula 3, $Y_{11}$ may be N, and $Y_{12}$ may be C.

In Formulae 2 and 3, ring $CY_1$ and ring $CY_1$ may each independently be a $C_1$-$C_{30}$ heterocyclic group, and ring $CY_2$ and ring $CY_{12}$ may each independently be a $C_5$-$C_{30}$ carbocyclic group or a $C_1$-$C_{30}$ heterocyclic group. Ring $CY_1$ and ring $CY_1$ may respectively be the lowest unoccupied molecular orbital (LUMO) parts in the ligands represented by Formulae 2 and 3, and a condensed ring, with which ring $CY_2$ is condensed, and ring $CY_{12}$ may respectively be the highest occupied molecular orbital (HOMO) parts in the ligands represented by Formulae 2 and 3.

In some embodiments, ring $CY_1$ and ring $CY_1$ may each independently be an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In some embodiments, ring $CY_2$ and ring $CY_{12}$ may each independently be a cyclopentene group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a borole group, a silole group, a germole group, a phosphole group, a selenophene group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In some embodiments, ring $CY_1$ and ring $CY_1$ may each independently be a pyridine group, a pyrimidine group, a pyrazine group, a pyridazine group, a triazine group, a quinoline group, an isoquinoline group, a quinoxaline group, a quinazoline group, a phenanthroline group, a 5,6,7,8-tetrahydroisoquinoline group, or a 5,6,7,8-tetrahydroquinoline group, and ring $CY_2$ and ring $CY_{12}$ may each independently be a benzene group, a naphthalene group, an anthracene group, a phenanthrene group, a triphenylene group, a pyrene group, a chrysene group, a 1,2,3,4-tetrahydronaphthalene group, a thiophene group, a furan group, an indole group, a borole group, a silole group, a germole group, a phosphole group, a selenophene group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a 5,6,7,8-tetrahydroisoquinoline group, or a 5,6,7,8-tetrahydroquinoline group.

In one or more embodiments, ring $CY_1$ and ring $CY_{11}$ may each independently be a pyridine group, a pyrimidine group, a pyrazine group, a pyridazine group, a triazine group, a quinoline group, an isoquinoline group, a quinoxaline group, a quinazoline group, a 5,6,7,8-tetrahydroisoquinoline group, or a 5,6,7,8-tetrahydroquinoline group, and ring $CY_2$ and ring $CY_{12}$ may each independently be a benzene group, a naphthalene group, or a 1,2,3,4-tetrahydronaphthalene group.

In one or more embodiments, ring $CY_1$ and ring $CY_{11}$ may each be a pyridine group, and ring $CY_2$ and ring $CY_{12}$ may be a benzene group.

In Formula 2, $X_{21}$ may be O, S, Se, $N(R_{28})$, $C(R_{28})(R_{29})$, or $Si(R_{28})(R_{29})$.

In some embodiments, $X_{21}$ may be O or S.

In Formulae 2 and 3, $R_1$, $R_2$, $R_{28}$, $R_{29}$, $Z_1$, and $Z_2$ may each independently be deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_6$-$C_{30}$ unsaturated carbocyclic group, a substituted or unsubstituted $C_2$-$C_{30}$ unsaturated heterocyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, wherein $Q_1$ to $Q_9$ may respectively be understood by referring to the descriptions of $Q_1$ to $Q_9$ provided herein.

In some embodiments, $R_1$, $R_2$, $R_{28}$, $R_{29}$, $Z_1$, and $Z_2$ may each independently be:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $—SF_5$, a $C_1$-$C_{20}$ alkyl group, a $C_1$-$C_{20}$ alkenyl group, or a $C_1$-$C_{20}$ alkoxy group;

a $C_1$-$C_{20}$ alkyl group, a $C_1$-$C_{20}$ alkenyl group, or a $C_1$-$C_{20}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a phenyl group, a ($C_1$-$C_{20}$ alkyl) phenyl group, a biphenyl group, a terphenyl group, a naphthyl group, a pyridinyl group, a pyrimidinyl group, or any combination thereof;

a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_2$-$C_{20}$ alkyl group, a $C_1$-$C_{20}$ alkoxy group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or $—N(Q_1)(Q_2)$, $—Si(Q_3)(Q_4)(Q_5)$, $—Ge(Q_3)(Q_4)(Q_5)$, $—B(Q_6)(Q_7)$, $—P(=O)(Q_8)(Q_9)$, or $—P(Q_8)(Q_9)$, wherein $Q_1$ to $Q_9$ may each independently be:

deuterium, —F, $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, $—CD_2CDH_2$, $—CF_3$, $—CF_2H$, $—CFH_2$, $—CH_2CF_3$, $—CH_2CF_2H$, $—CH_2CFH_2$, $—CHFCH_3$, $—CHFCF_2H$, $—CHFCFH_2$, $—CHFCF_3$, $—CF_2CF_3$, $—CF_2CF_2H$, or $—CF_2CFH_2$; or an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, a $C_1$-$C_{10}$ alkyl group, a phenyl group, or any combination thereof.

In one or more embodiments, in Formulae 2 and 3, $R_1$, $R_2$, $R_{28}$, $R_{29}$, $Z_1$, and $Z_2$ may each independently be deuterium, —F, $—CH_3$, $—CD_3$, $—CD_2H$, $—CDH_2$, $—CF_3$, $—CF_2H$, $—CFH_2$, a $C_1$-$C_{10}$ alkenyl group, a $C_1$-$C_{10}$ alkoxy group, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 10-1 to 10-112, a group represented by one of Formulae 10-1 to 10-112 in which at least one hydrogen is substituted with deuterium, a group represented by one of Formulae 10-1 to 10-112 in which at least one hydrogen is substituted with —F, a group represented by one of Formulae 10-201 to 10-350, a group represented by one of Formulae 10-201 to 10-350 in which at least one hydrogen is substituted with deuterium, a group represented by one of Formulae 10-201 to 10-350 in which at least one hydrogen is substituted with —F, $—Si(Q_3)(Q_4)(Q_5)$, or $—Ge(Q_3)(Q_4)(Q_5)$, wherein $Q_3$ to $Q_5$ may respectively be understood by referring to the descriptions of $Q_3$ to $Q_5$ provided herein:

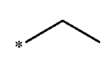
9-1

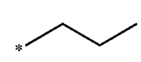
9-2

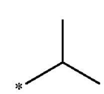
9-3

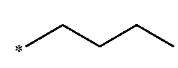
9-4

-continued
9-5
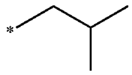
9-6
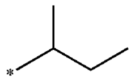
9-7
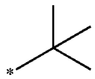
9-8
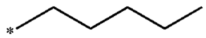
9-9
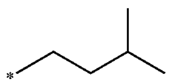
9-10
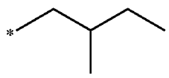
9-11
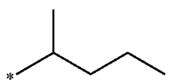
9-12
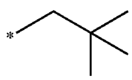
9-13
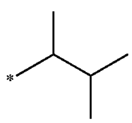
9-14
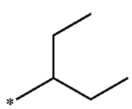
9-15
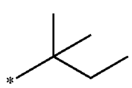
9-16
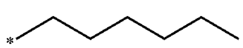
9-17
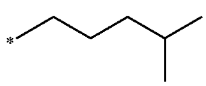
9-18
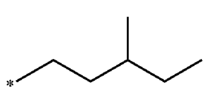
9-19
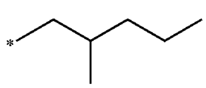
9-20
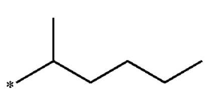
-continued
9-21
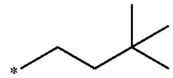
9-22
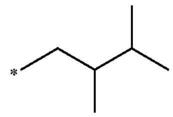
9-23
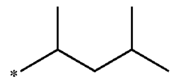
9-24
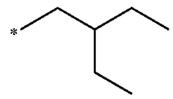
9-25
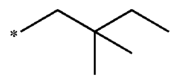
9-26
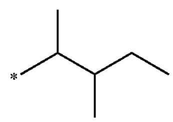
9-27
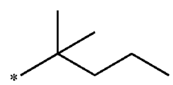
9-28
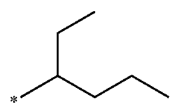
9-29
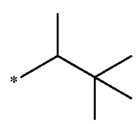
9-30
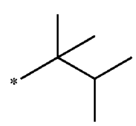
9-31
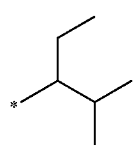
9-32
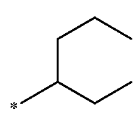
9-33
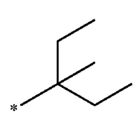

-continued
9-34
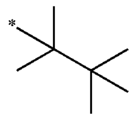
9-35
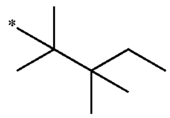
9-36
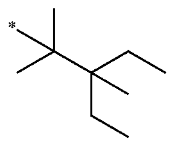
9-37
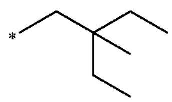
9-38
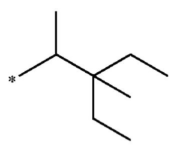
9-39
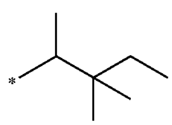
10-1
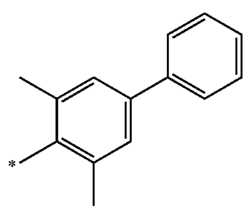
10-2
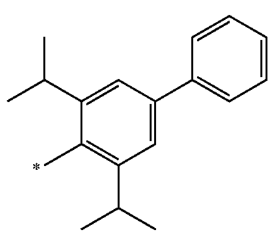
10-3
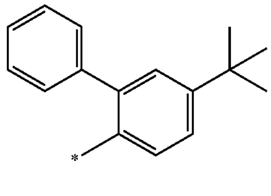
-continued
10-4
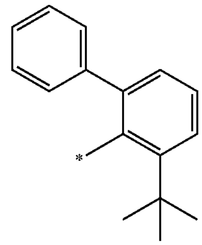
10-5
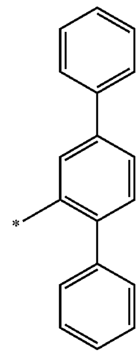
10-6
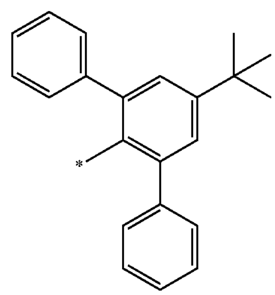
10-7
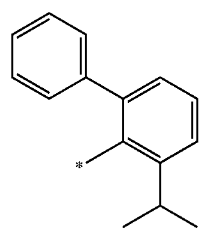
10-8
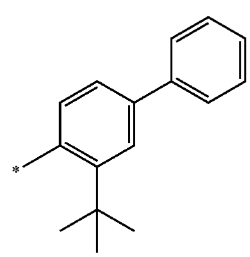
10-9
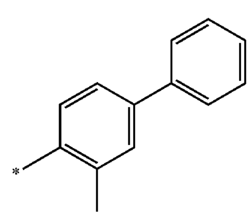

-continued
10-10
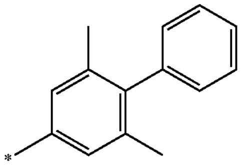
10-11
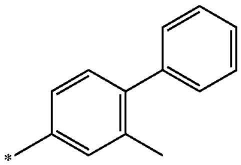
10-12
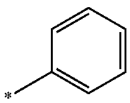
10-13
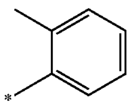
10-14
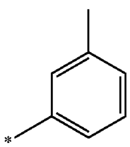
10-15
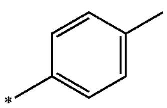
10-16
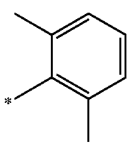
10-17
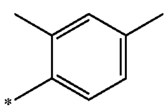
10-18
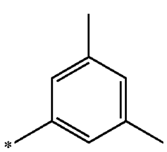
10-19
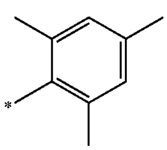
10-20
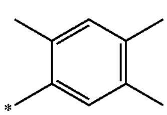
-continued
10-21
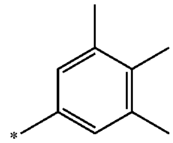
10-22
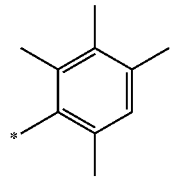
10-23
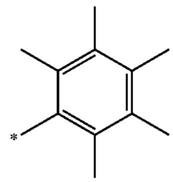
10-24
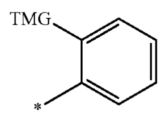
10-25
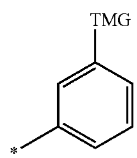
10-26
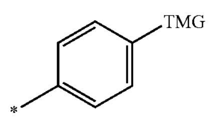
10-27
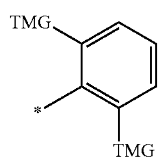
10-28
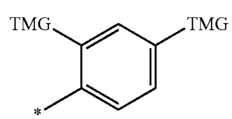
10-29
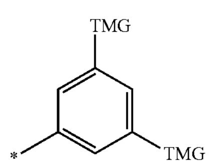
10-30
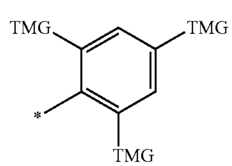

-continued
10-31
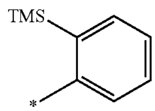
10-32
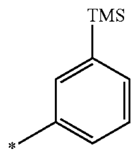
10-33
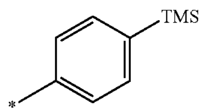
10-34
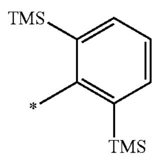
10-35
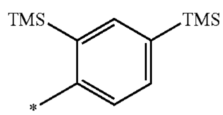
10-36
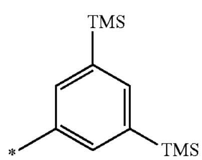
10-37
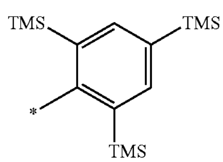
10-38
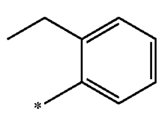
10-39
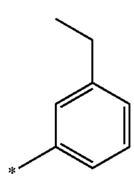
10-40
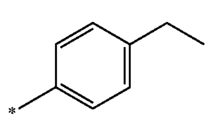
-continued
10-41
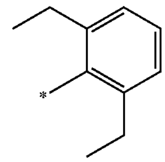
10-42
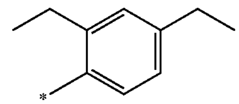
10-43
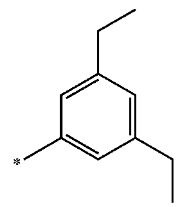
10-44
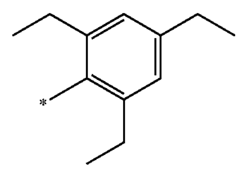
10-45
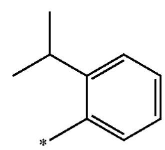
10-46
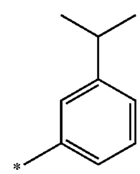
10-47
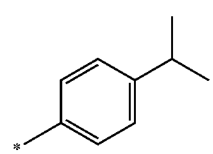
10-48
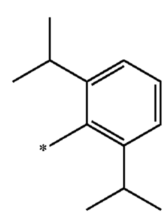
10-49
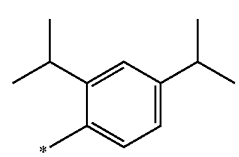

-continued
10-50
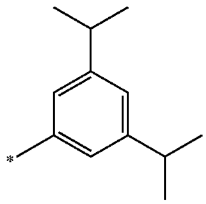
10-51
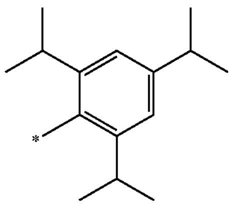
10-52
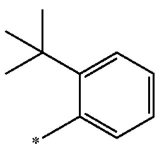
10-53
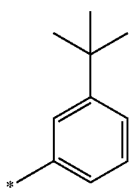
10-54
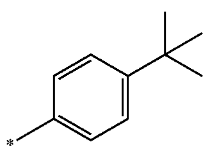
10-55
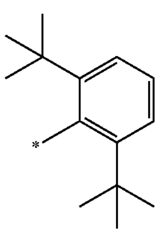
10-56
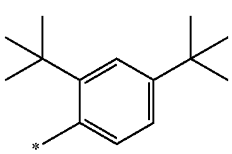
10-57
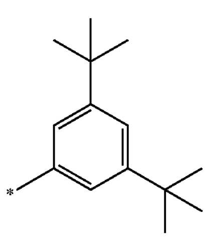
-continued
10-58
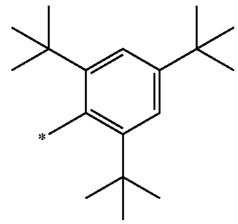
10-59
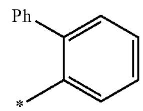
10-60
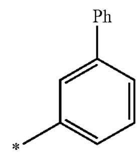
10-61
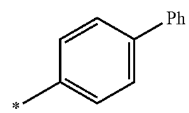
10-62
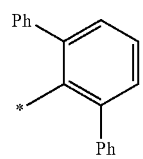
10-63
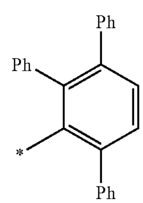
10-64
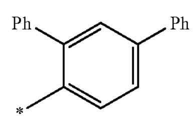
10-65
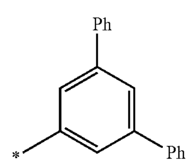
10-66
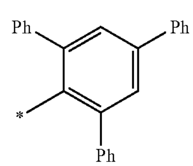
10-67
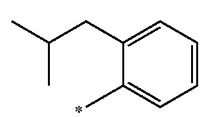

-continued
10-68
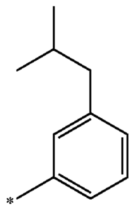
10-69
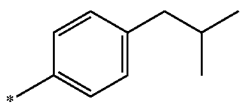
10-70
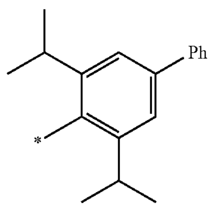
10-71
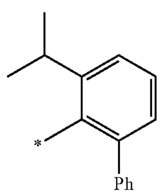
10-72
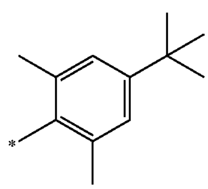
10-73
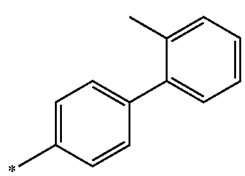
10-74
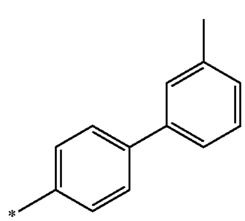
10-75
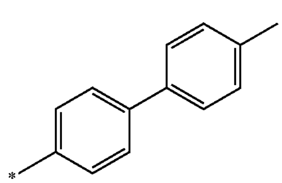
-continued
10-76
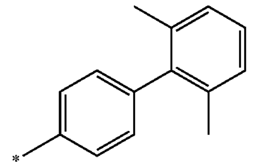
10-77
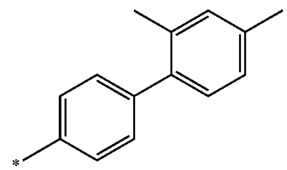
10-78
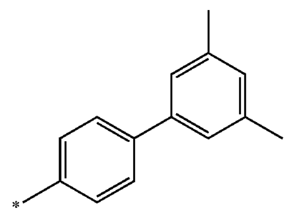
10-79
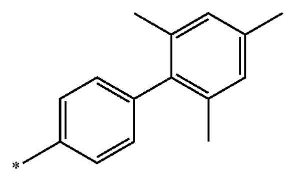
10-80
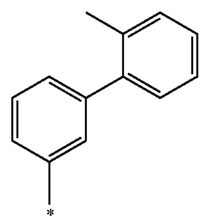
10-81
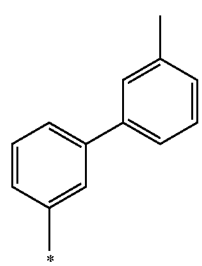
10-82
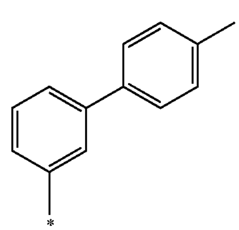

-continued
10-83
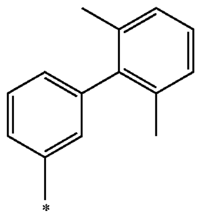
10-84
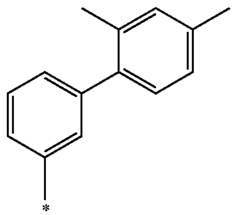
10-85
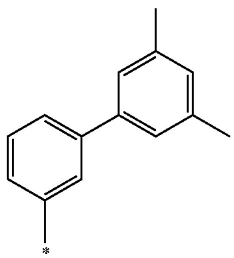
10-86
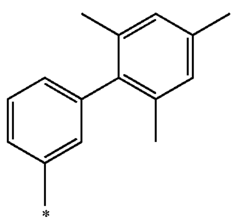
10-87
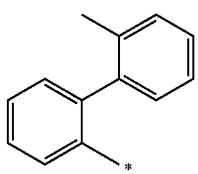
10-88
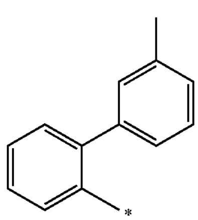
10-89
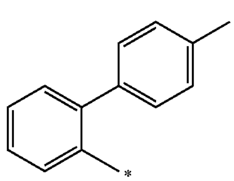
-continued
10-90
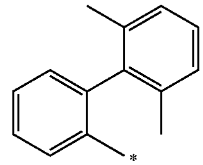
10-91
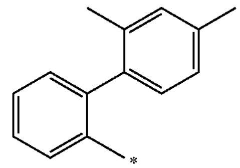
10-92
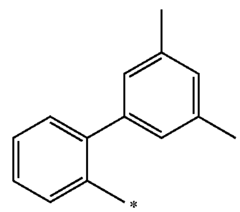
10-93
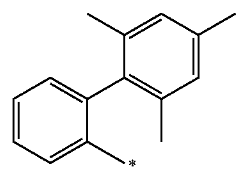
10-94
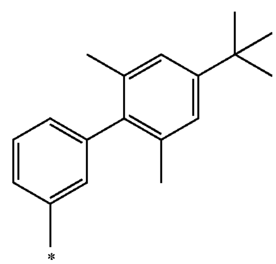
10-95
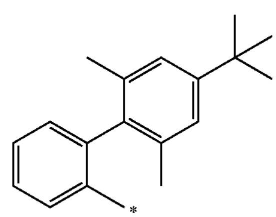
10-96
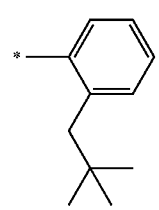

-continued
10-97
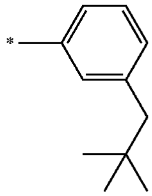
10-98
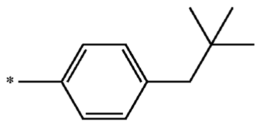
10-99
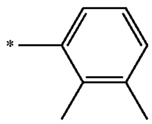
10-100
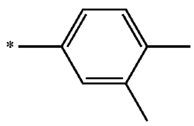
10-101
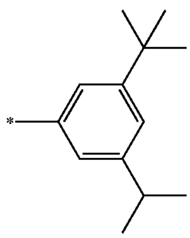
10-102
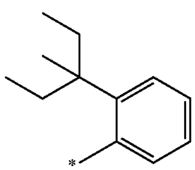
10-103
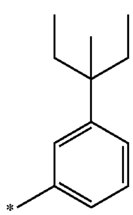
10-104
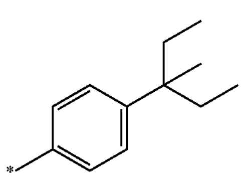
-continued
10-105
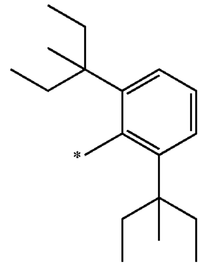
10-106
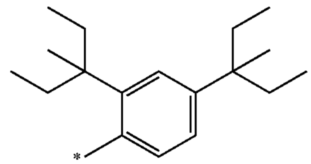
10-107
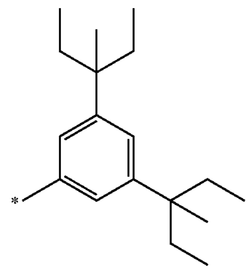
10-108
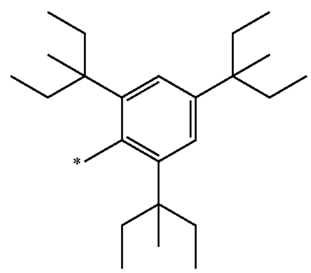
10-109
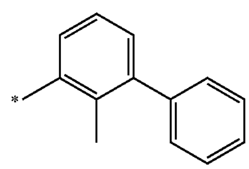
10-110
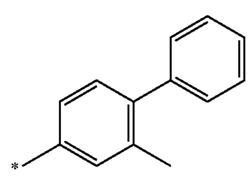
10-111
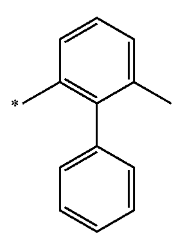

-continued
10-112
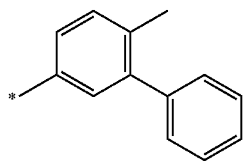
10-201
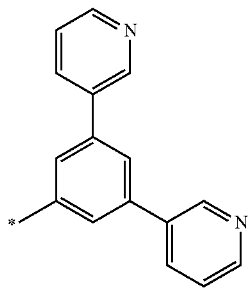
10-202
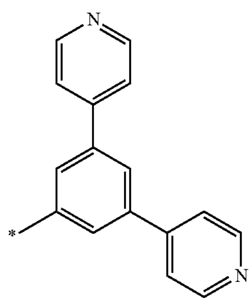
10-203
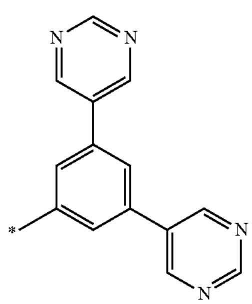
10-204
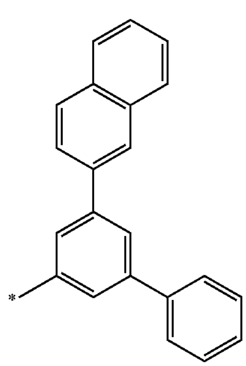
-continued
10-205
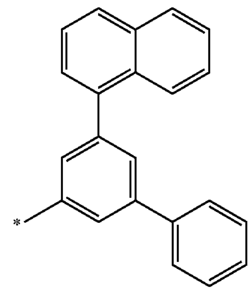
10-206
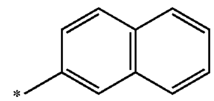
10-207
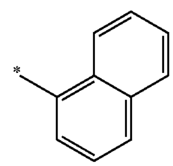
10-208
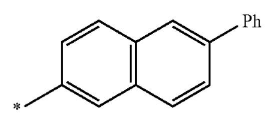
10-209
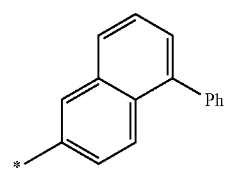
10-210
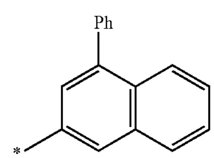
10-211
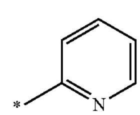
10-212
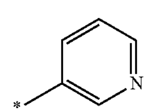
10-213
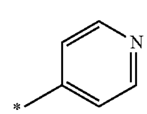
10-214
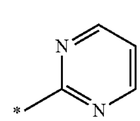

10-215
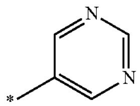
10-216
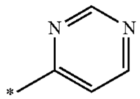
10-217
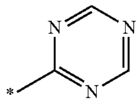
10-218
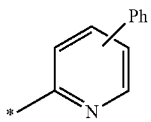
10-219
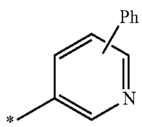
10-220
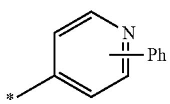
10-221
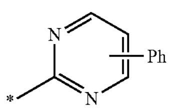
10-222
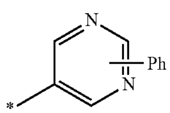
10-223
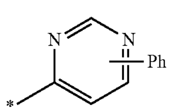
10-224
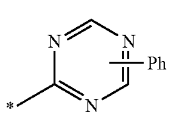
10-225
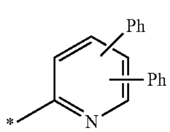
10-226
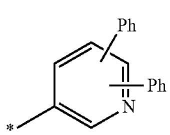
10-227
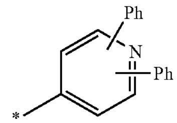
10-228
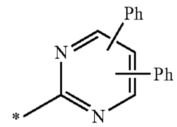
10-229
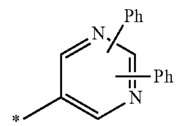
10-230
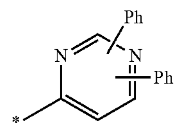
10-231
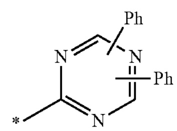
10-232
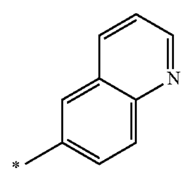
10-233
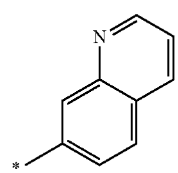
10-234
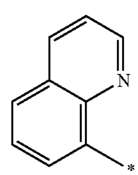
10-235
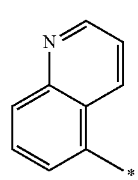

-continued
10-236
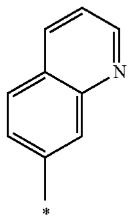
10-237
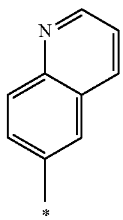
10-238
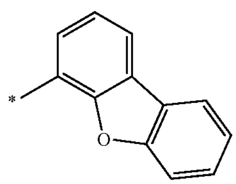
10-239
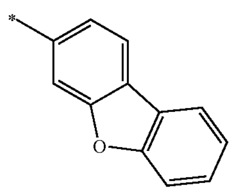
10-240
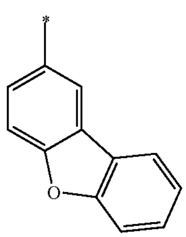
10-241
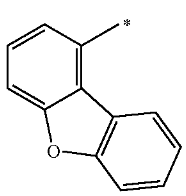
10-242
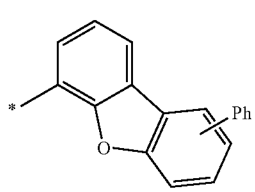
-continued
10-243
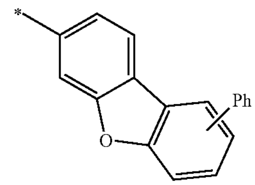
10-244
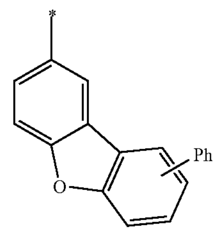
10-245
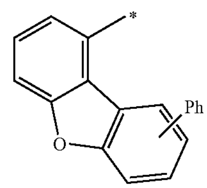
10-246
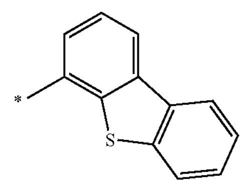
10-247
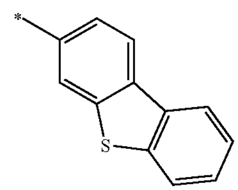
10-248
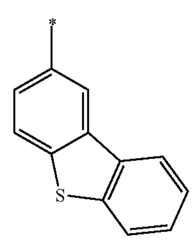
10-249
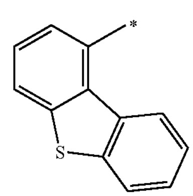
10-250
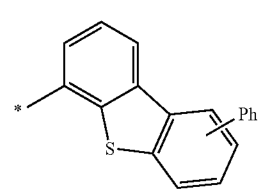

-continued
10-251
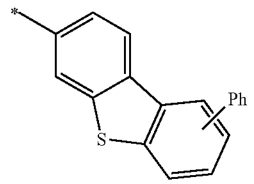
10-252
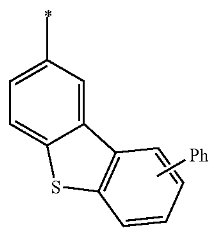
10-253
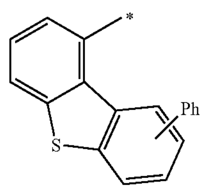
10-254
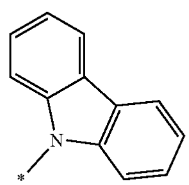
10-255
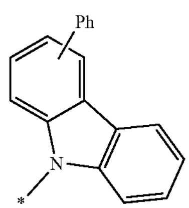
10-256
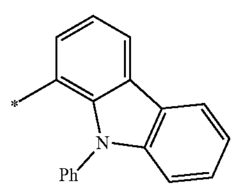
10-257
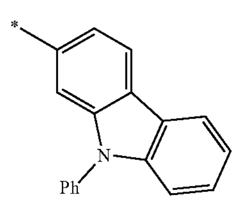
-continued
10-258
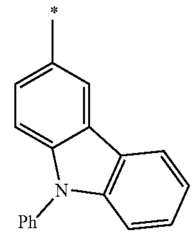
10-259
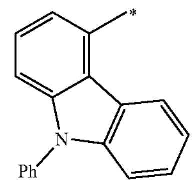
10-260
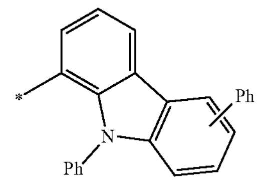
10-261
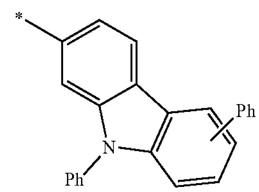
10-262
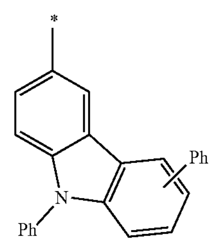
10-263
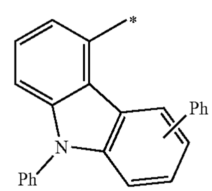
10-264
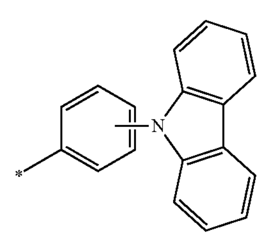

-continued
10-265
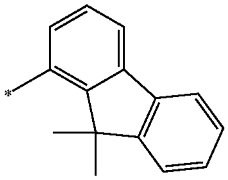
10-266
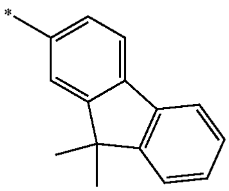
10-267
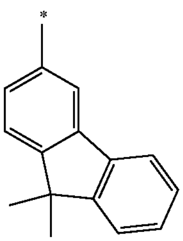
10-268
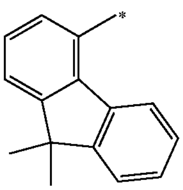
10-269
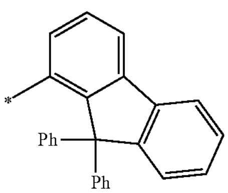
10-270
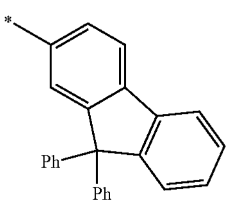
10-271
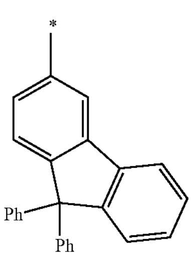
-continued
10-272
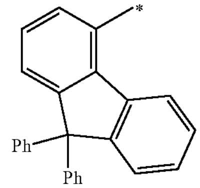
10-273
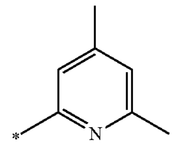
10-274
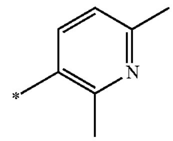
10-275
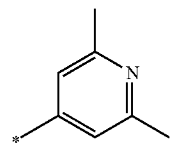
10-276
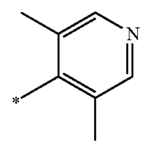
10-277
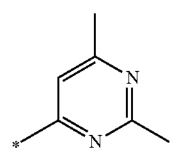
10-278
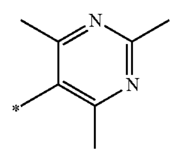
10-279
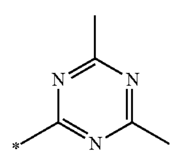
10-280
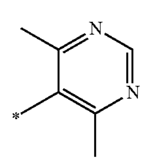
10-281
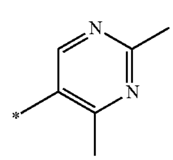

-continued
10-282
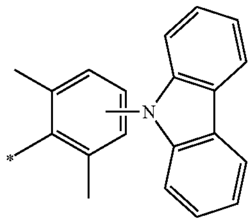
10-283
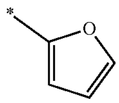
10-284
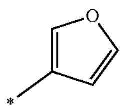
10-285
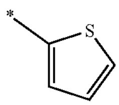
10-286
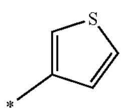
10-287
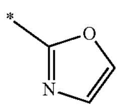
10-288
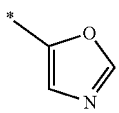
10-289
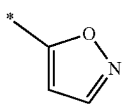
10-290
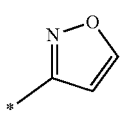
10-291
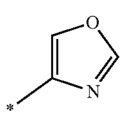
10-292
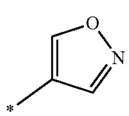
10-293
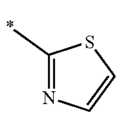
-continued
10-294
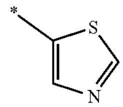
10-295
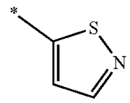
10-296
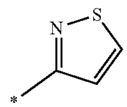
10-297
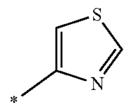
10-298
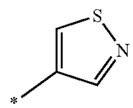
10-299
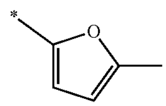
10-300
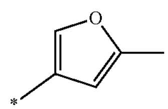
10-301
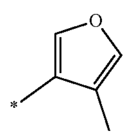
10-302
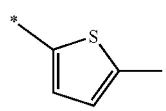
10-303
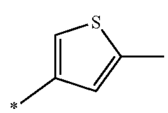
10-304
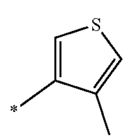
10-305
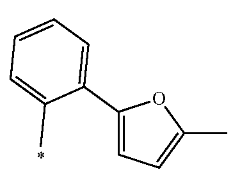

-continued
10-306
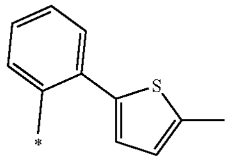
10-307
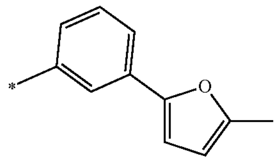
10-308
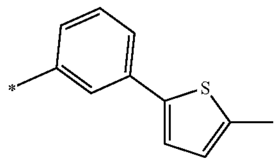
10-309
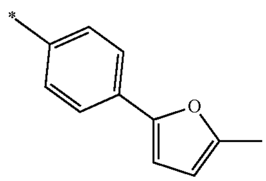
10-310
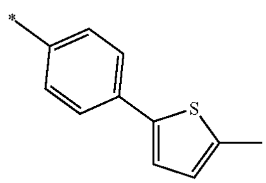
10-311
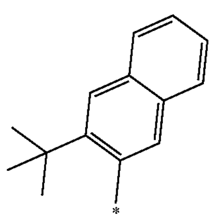
10-312
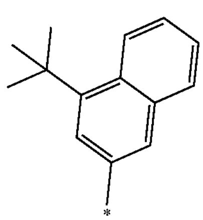
10-313
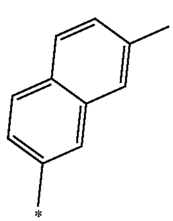
-continued
10-314
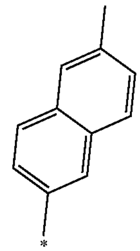
10-315
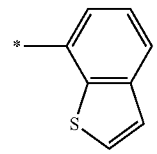
10-316
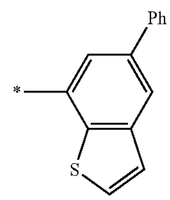
10-317
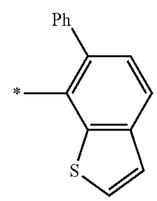
10-318
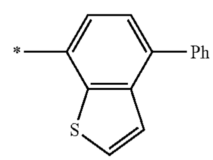
10-319
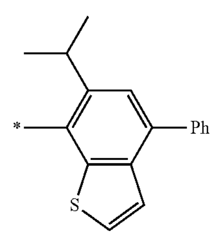
10-320
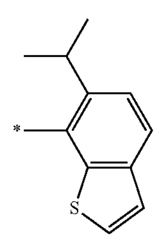

-continued
10-321
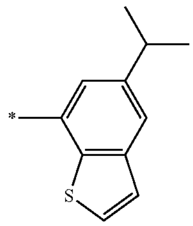
10-322
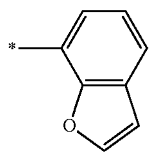
10-323
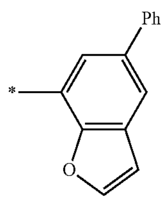
10-324
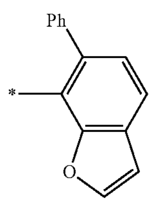
10-325
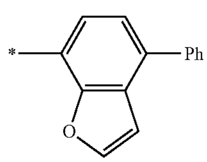
10-326
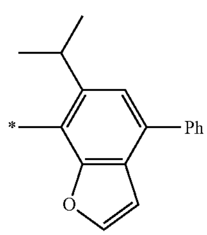
10-327
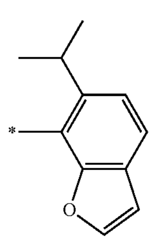
-continued
10-328
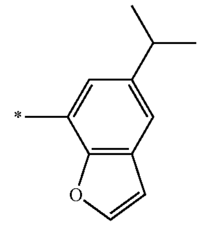
10-329
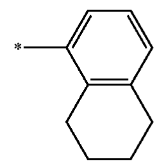
10-330
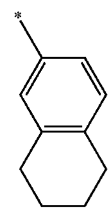
10-331
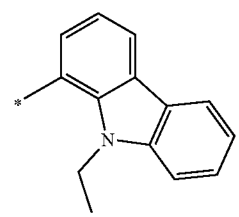
10-332
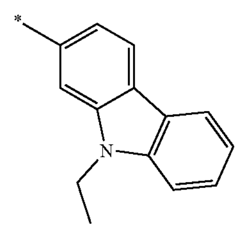
10-333
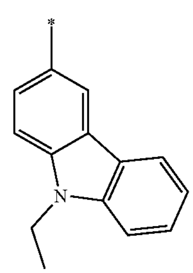
10-334
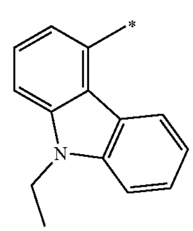

-continued 10-335

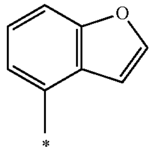

10-336

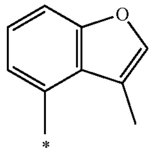

10-337

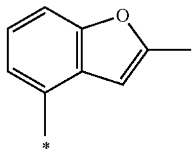

10-338

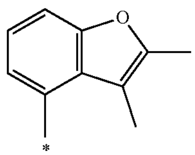

10-339

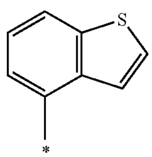

10-340

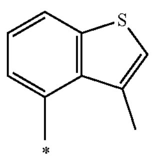

10-341

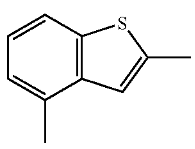

10-342

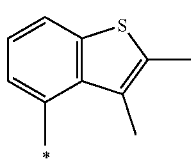

10-343

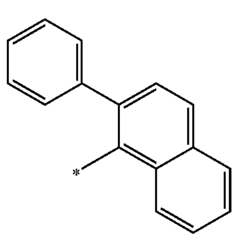

-continued 10-344

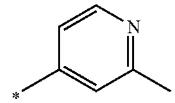

10-345

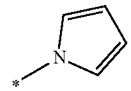

10-346

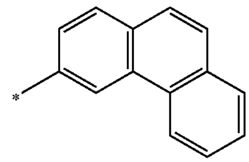

10-347

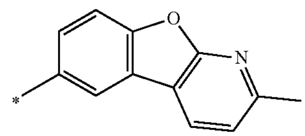

10-348

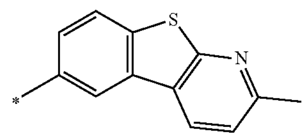

10-349

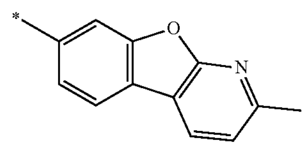

10-350

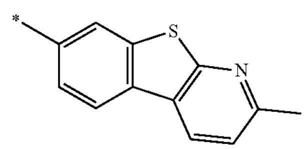

In Formulae 9-1 to 9-39, 10-1 to 10-112 and 10-201 to 10-350, * may indicate a binding site to an adjacent atom, “Ph” represents a phenyl group, “TMS” represents a trimethylsilyl group, and “TMG” represents a trimethylgermyl group.

The “group represented by Formulae 9-1 to 9-39 in which at least one hydrogen is substituted with deuterium” may be, for example, a group represented by one of Formulae 9-501 to 514:

9-501

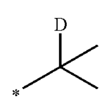

9-502

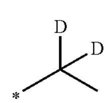

-continued
9-503
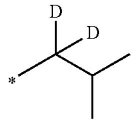
9-504
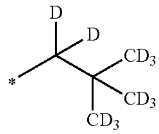
9-505
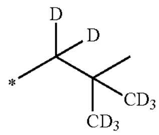
9-506
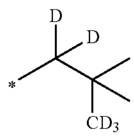
9-507
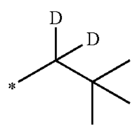
9-508
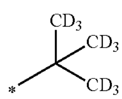
9-509
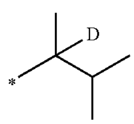
9-510
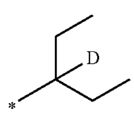
9-511
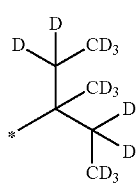
9-512
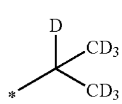
9-513
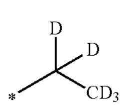
-continued
9-514
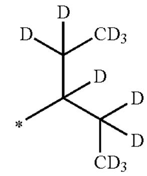
The "group represented by Formulae 9-1 to 9-39 in which at least one hydrogen is substituted with —F" may be, for example, a group represented by one of Formulae 9-701 to 710:
9-701
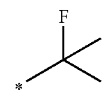
9-702
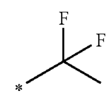
9-703
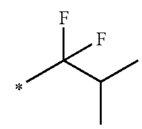
9-704
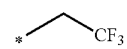
9-705
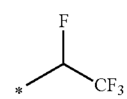
9-706
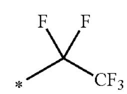
9-707
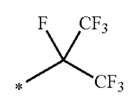
9-708
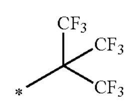
9-709
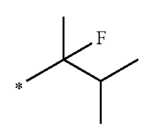
9-710
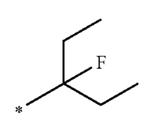
The "group represented by Formulae 10-1 to 10-112 in which at least one hydrogen is substituted with deuterium" and the "group represented by Formulae 10-201 to 10-350 in which at least one hydrogen is substituted with deuterium" may each be, for example, a group represented by one of Formulae 10-501 to 553:
10-501
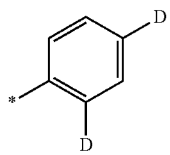
10-502
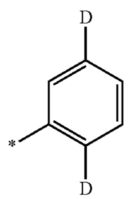
10-503
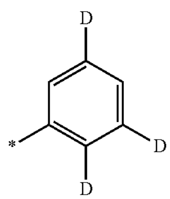
10-504
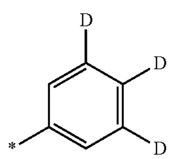
10-505
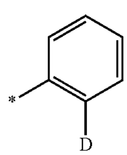
10-506
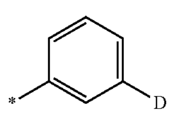
10-507
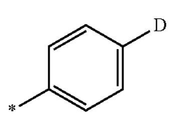
10-508
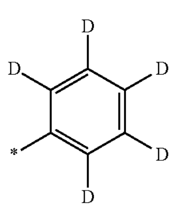
10-509
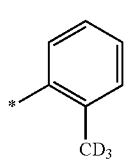
-continued
10-510
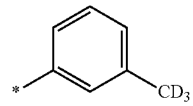
10-511
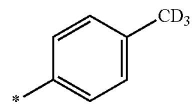
10-512
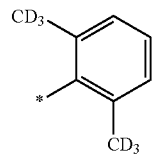
10-513
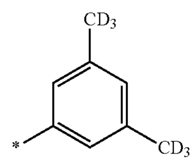
10-514
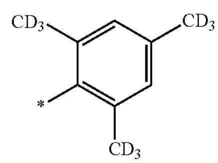
10-515
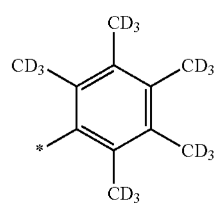
10-516
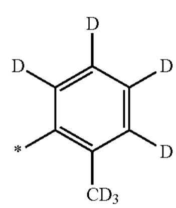
10-517
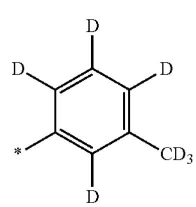
10-518
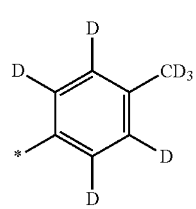

-continued
10-519
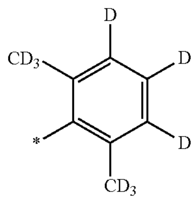
10-520
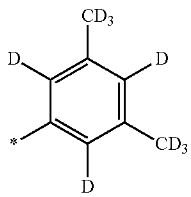
10-521
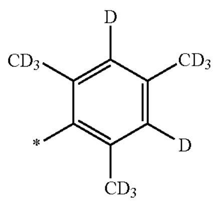
10-522
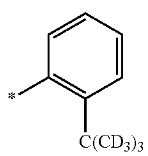
10-523
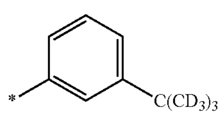
10-524
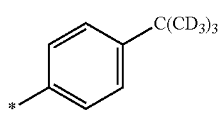
10-525
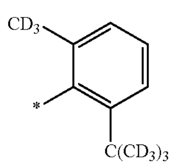
10-526
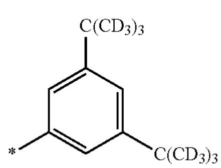
10-527
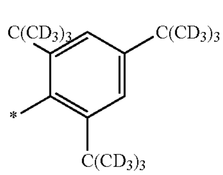
-continued
10-528
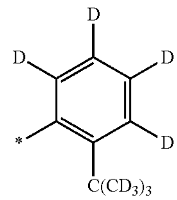
10-529
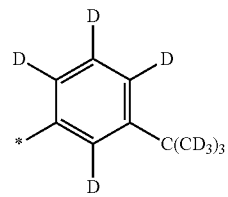
10-530
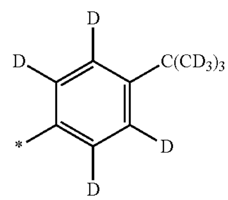
10-531
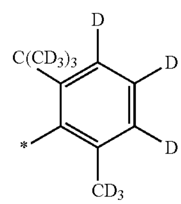
10-532
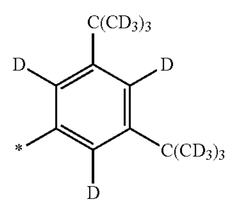
10-533
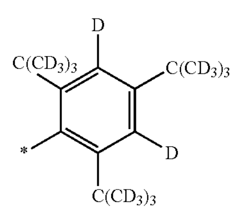
10-534
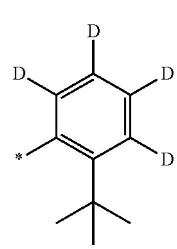

-continued
10-535
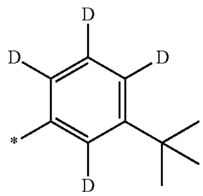
10-536
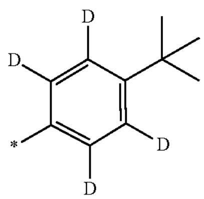
10-537
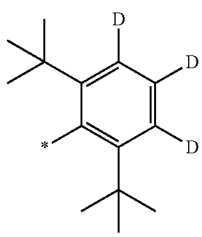
10-538
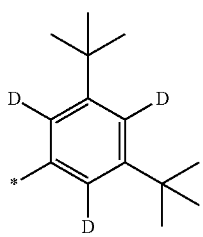
10-540
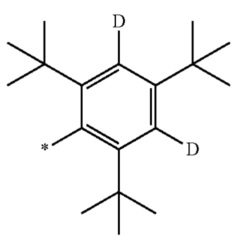
10-541
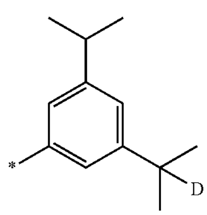
10-542
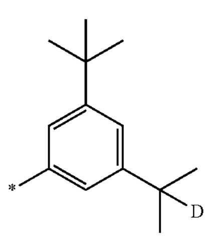
-continued
10-543
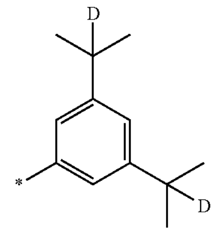
10-544
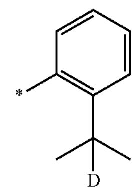
10-545
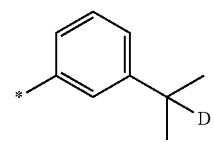
10-546
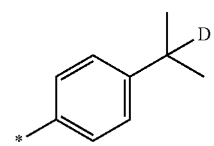
10-547
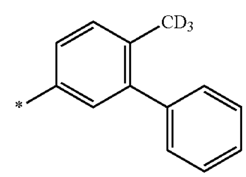
10-548
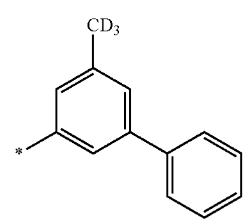
10-549
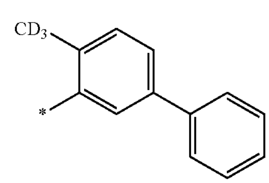
10-550
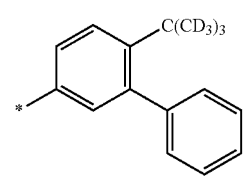

10-551
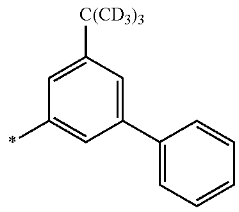
10-552
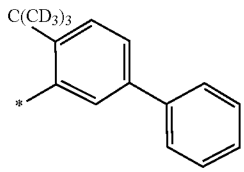
10-553
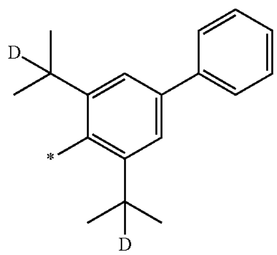
The "group represented by Formulae 10-1 to 10-112 in which at least one hydrogen is substituted with —F" and the "group represented by Formulae 10-201 to 10-350 in which at least one hydrogen is substituted with —F" may each be, for example, a group represented by one of Formulae 10-601 to 617:
10-601
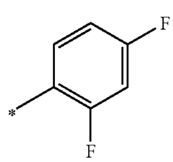
10-602
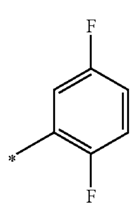
10-603
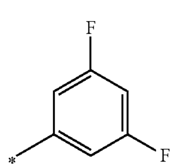
10-604
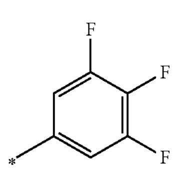
10-605
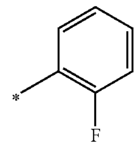
10-606
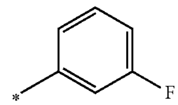
10-607
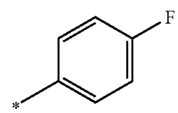
10-608
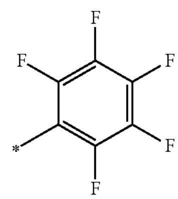
10-609
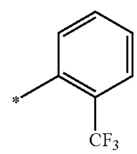
10-610
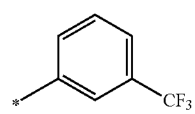
10-611
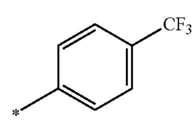
10-612
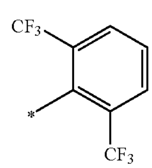
10-613
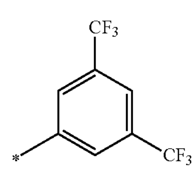
10-614
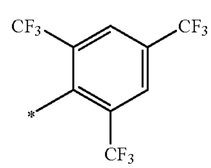

-continued 10-615

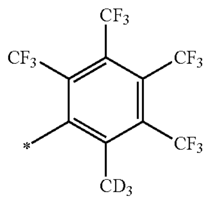

In Formulae 2 and 3, a1, a2, and d1 may respectively indicate the number of $R_1$(s), $R_2$(s), and $Z_1$(s), and a1, a2, and d1 each independently be an integer from 0 to 10. When a1 is 2 or greater, at least two $R_1$(s) may be identical to or different from each other, when a2 is 2 or greater, at least two $R_2$(s) may be identical to or different from each other, and when d1 is 2 or greater, at least two $Z_1$(s) may be identical to or different from each other.

In some embodiments, a1, a2, and d1 may each independently be 0, 1, 2, 3, 4, 5, or 6.

In Formula 2, the sum of a1 and a2 may be 1 or greater. That is, the ligand represented by Formula 2 may be substituted with at least one selected from $R_1$ and $R_2$ (in the present specification, $R_1$ and $R_2$ may not each be hydrogen). In some embodiments, the sum of a1 and a2 may be an integer from 1 to 5.

d2 in Formula 3 may indicate the number of $Z_2$(s), and d2 may be an integer from 1 to 10. When d2 is 2 or greater, at least two $Z_2$(s) may be identical to or different from each other. That is, ring $CY_{12}$ in Formula 3 may be substituted with at least one $Z_2$ (in the present specification, $Z_2$ may not be hydrogen). In some embodiments, d2 may be an integer from 1 to 5.

In some embodiments, in Formulae 2 and 3, a2 and d2 may each independently be 1, 2, or 3.

In one or more embodiments, in Formula 2, i) a1 may be 0, and a2 may be 1 or 2, ii) a1 may be 1 or 2, and a2 may be 0, or iii) a1 may be 1 or 2, and a2 may be 1 or 2.

In one or more embodiments, in Formula 3, d1 may be 0, 1, or 2, and d2 may be 1, 2, 3, or 4.

In one or more embodiments, the organometallic compound represented by Formula 1 may include at least one deuterium.

In one or more embodiments, the organometallic compound represented by Formula 1 may include a group represented by —$Si(Q_3)(Q_4)(Q_5)$, a group represented by —$Ge(Q_3)(Q_4)(Q_5)$, or any combination thereof.

In Formulae 2 and 3, i) at least two selected from $R_1$(s) may optionally be linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, ii) at least two selected from $R_2$(s) may optionally be linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, iii) at least two selected from $Z_1$(s) may optionally be linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, iv) at least two selected from $Z_2$(s) may optionally be linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, and v) at least two selected from $R_1$(s), $R_2$(s), $Z_1$(s), and $Z_2$(s) may optionally be linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$. $R_{10a}$ may be understood by referring to the description of $R_1$ provided herein.

* and *' in Formulae 2 and 3 may each indicate a binding site to M in Formula 1.

In some embodiments, in Formulae 2 and 3, the sum of a1 and d1 may be 1, 2, or 3.

In one or more embodiments, ring $CY_1$ in Formula 2 may be a group represented by one of Formulae CY1-1 to CY1-19:

CY1-1

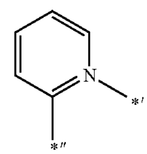

CY1-2

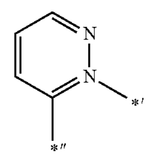

CY1-3

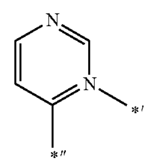

CY1-4

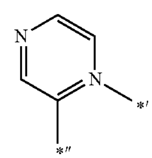

CY1-5

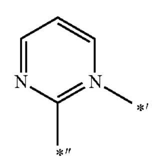

CY1-6

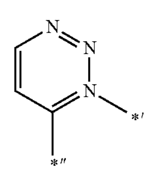

CY1-7

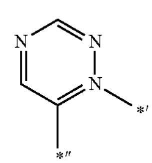

-continued
CY1-8
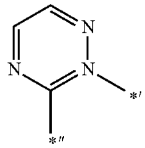
CY1-9
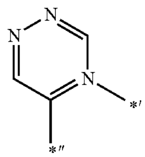
CY1-10
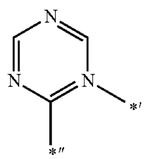
CY1-11
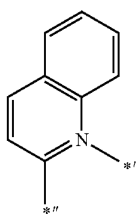
CY1-12
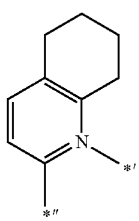
CY1-13
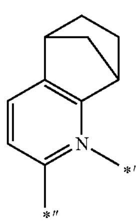
CY1-14
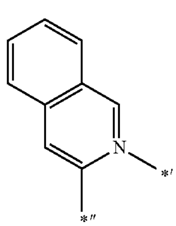
-continued
CY1-15
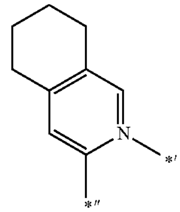
CY1-16
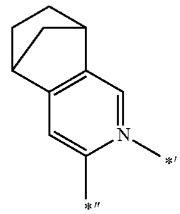
CY1-17
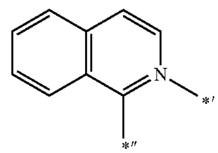
CY1-18
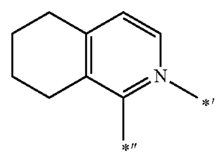
CY1-19
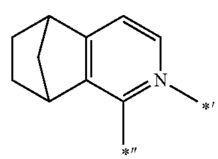
In Formulae CY1-1 to CY1-19, *' may indicate a binding site to M in Formula 1, and *" may indicate a binding site to an adjacent benzo group.
In one or more embodiments, a group represented by
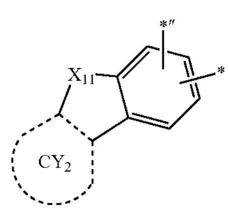

in Formula 2 may be a group represented by one of Formulae CY2-1 to CY2-6:

CY2-1

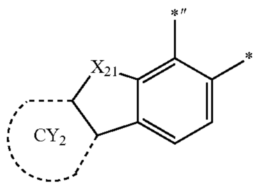

CY2-2

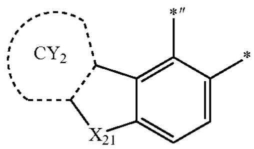

CY2-3

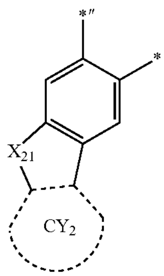

CY2-4

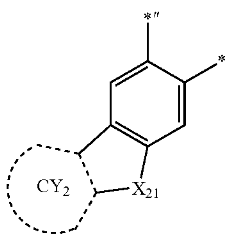

CY2-5

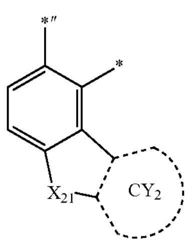

CY2-6

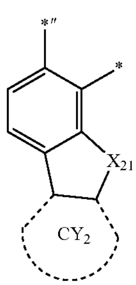

In Formulae CY2-1 to CY2-6, $X_{21}$ and ring $CY_2$ may each be understood by referring to the descriptions thereof provided herein, * may indicate a binding site to M in Formula 1, and*" may indicate a binding site to ring $CY_1$ in Formula 2.

In one or more embodiments, a group represented by

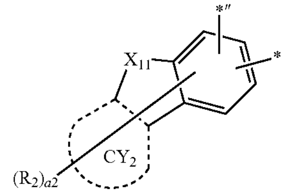

in Formula 2 may be a group represented by one of Formulae CY2(1) to CY2(22):

CY2(1)

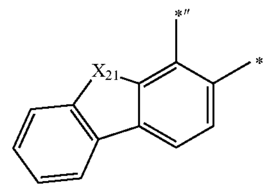

CY2(2)

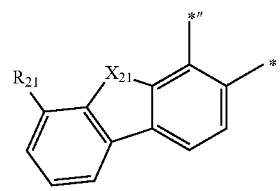

CY2(3)

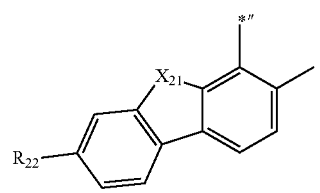

CY2(4)

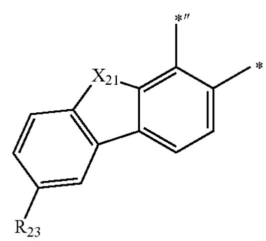

CY2(5)

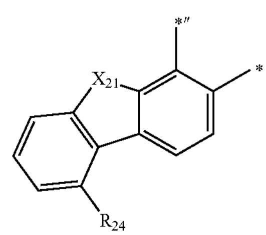

CY2(6)

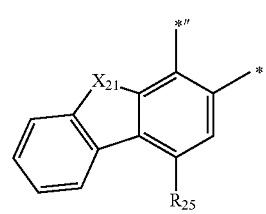

-continued
CY2(7)
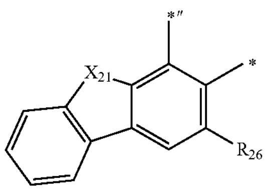
CY2(8)
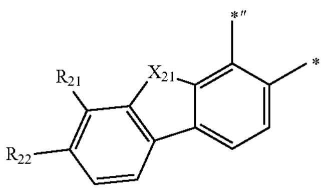
CY2(9)
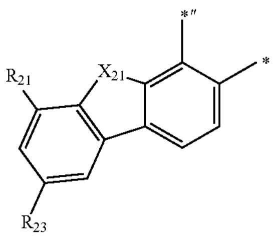
CY2(10)
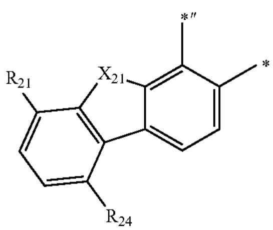
CY2(11)
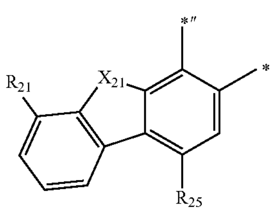
CY2(12)
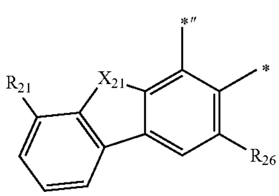
CY2(13)
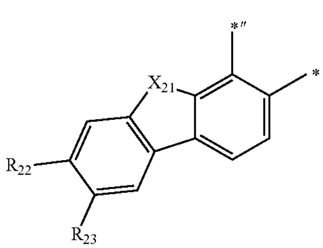
-continued
CY2(14)
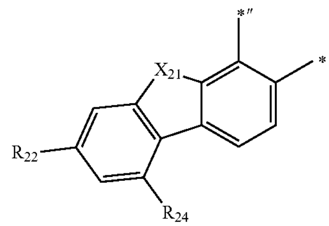
CY2(15)
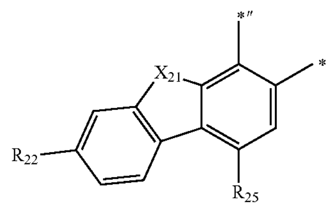
CY2(16)
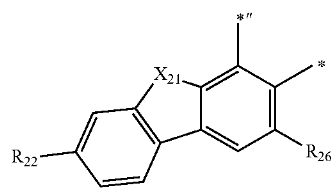
CY2(17)
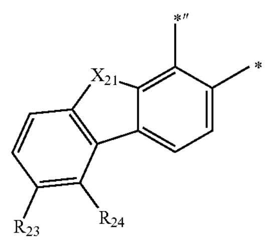
CY2(18)
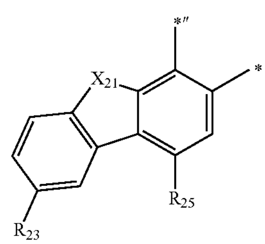
CY2(19)
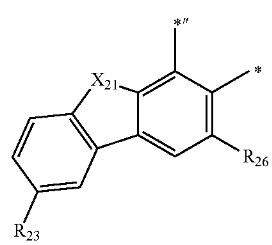
CY2(20)
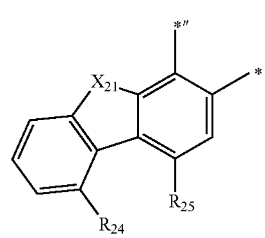

-continued

CY2(21)

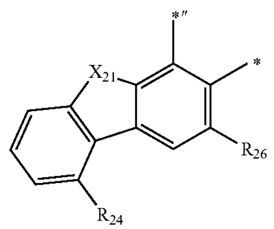

CY2(22)

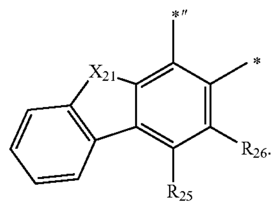

In Formulae CY2(1) to CY2(22), $X_{21}$ may be understood by referring to the description thereof provided herein, $R_{21}$ to $R_{26}$ may each be understood by referring to the description of $R_2$ provided herein, * may indicate a binding site to M in Formula 1, and *" may indicate a binding site to ring CY1 in Formula 2.

In one or more embodiments, ring $CY_{11}$ in Formula 3 may be a group represented by one of Formulae CY11-1 to CY11-31, and/or ring $CY_{12}$ in Formula 3 may be a group represented by one of Formulae CY12-1 to CY12-31:

CY11-1

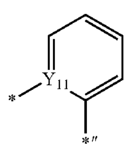

CY11-2

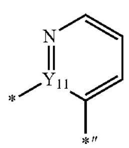

CY11-3

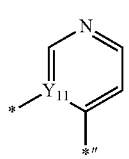

CY11-4

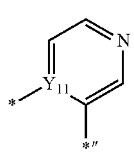

CY11-5

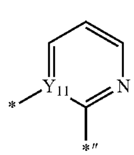

-continued

CY11-6

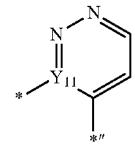

CY11-7

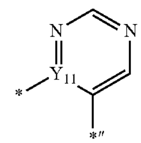

CY11-8

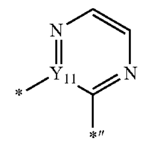

CY11-9

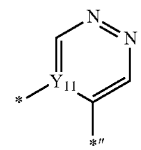

CY11-10

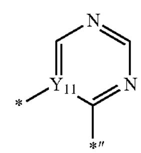

CY11-11

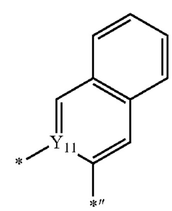

CY11-12

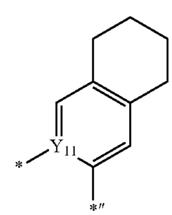

CY11-13

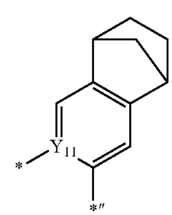

CY11-14

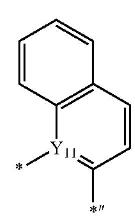

-continued
CY11-15
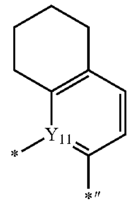
CY11-16
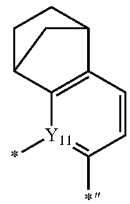
CY11-17
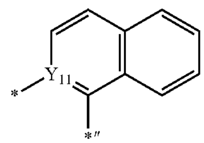
CY11-18
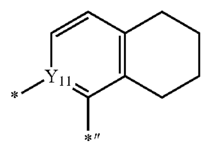
CY11-19
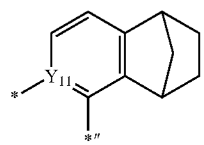
CY11-20
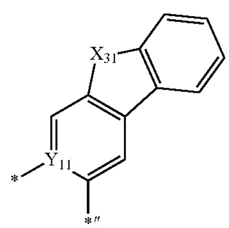
CY11-21
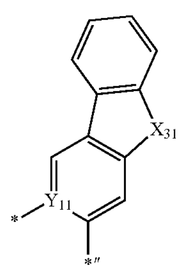
CY11-22
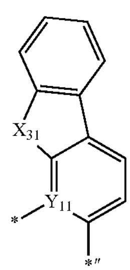
-continued
CY11-23
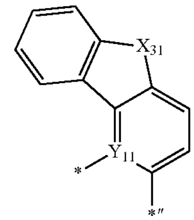
CY11-24
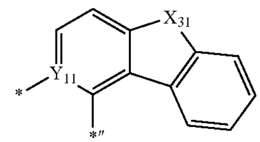
CY11-25
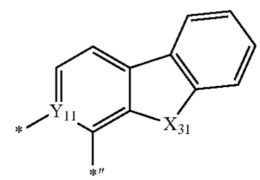
CY11-26
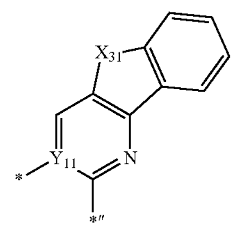
CY11-27
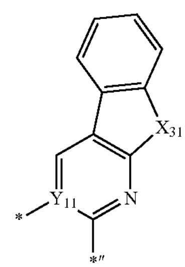
CY11-28
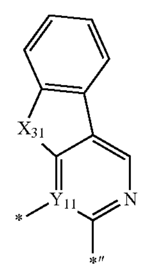
CY11-29
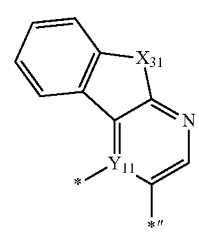

-continued
CY11-30
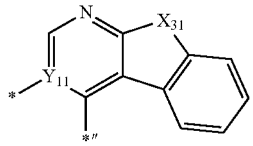
CY11-31
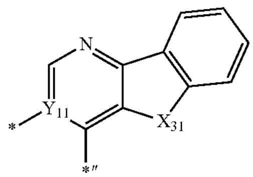
CY12-1
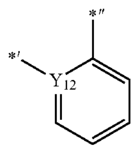
CY12-2
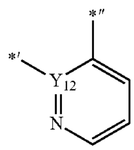
CY12-3
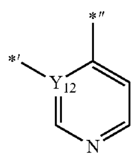
CY12-4
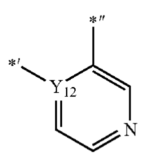
CY12-5
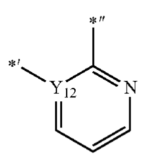
CY12-6
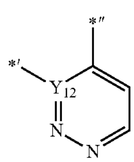
CY12-7
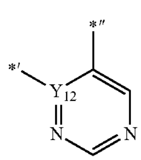
CY12-8
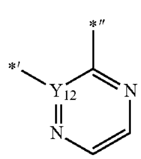
-continued
CY12-9
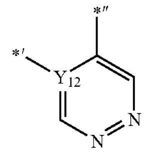
CY12-10
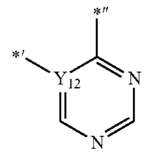
CY12-11
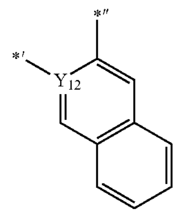
CY12-12
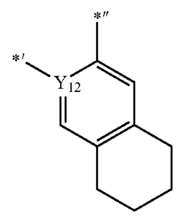
CY12-13
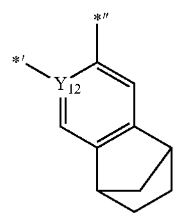
CY12-14
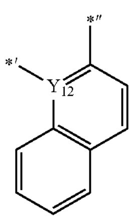
CY12-15
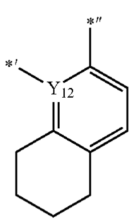
CY12-16
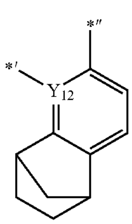

-continued
CY12-17
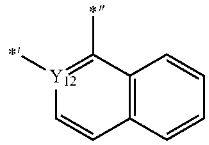
CY12-18
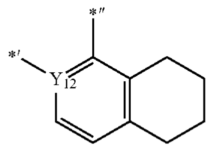
CY12-19
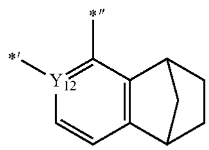
CY12-20
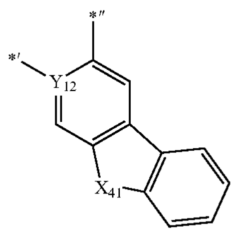
CY12-21
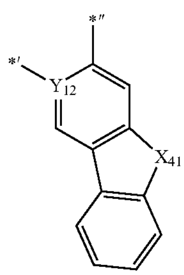
CY12-22
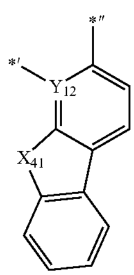
CY12-23
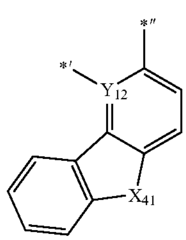
CY12-24
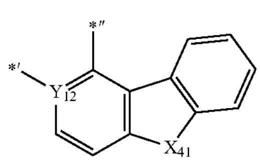
-continued
CY12-25
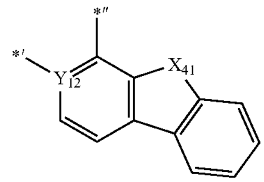
CY12-26
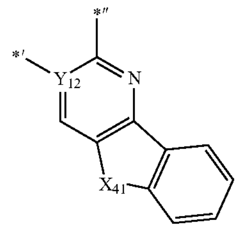
CY12-27
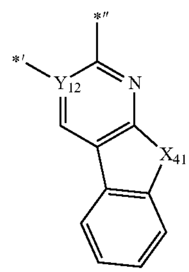
CY12-28
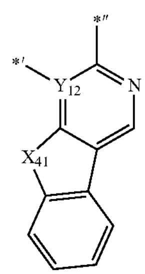
CY12-29
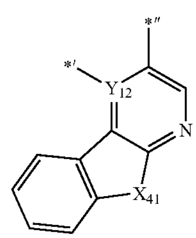
CY12-30
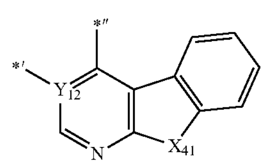
CY12-31
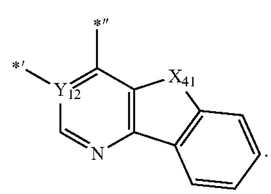

In Formulae CY11-1 to CY11-31 and CY12-1 to CY12-31, $Y_{11}$ and $Y_{12}$ may respectively be understood by referring to the descriptions of $Y_{11}$ and $Y_{12}$ provided herein, $X_{31}$ may be O, S, $N(Z_{18})$, $C(Z_{18})(Z_{19})$, or $Si(Z_{18})(Z_{19})$, $X_{41}$ may be O, S, $N(Z_{28})$, $C(Z_{28})(Z_{29})$, or $Si(Z_{28})(Z_{29})$, $Z_{18}$ and $Z_{19}$ may each be understood by referring to the descriptions of $Z_1$ provided herein, $Z_{28}$ and $Z_{29}$ may each be understood by referring to the descriptions of $Z_2$ provided herein,

* and *' in Formulae CY11-1 to CY11-31 and CY12-1 to CY12-31 may each indicate a binding site to M in Formula 1, and *" indicates a binding site to an adjacent atom in Formula 3.

In one or more embodiments, a group represented by

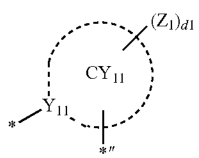

in Formula 3 may be a group represented by one of Formulae CY11(1) to CY11(18):

CY11(1)

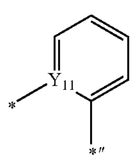

CY11(2)

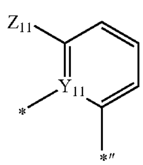

CY11(3)

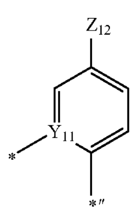

CY11(4)

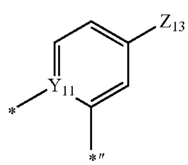

CY11(5)

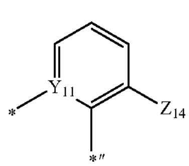

-continued

CY11(6)

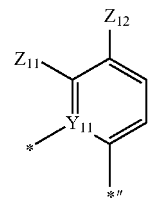

CY11(7)

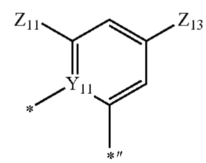

CY11(8)

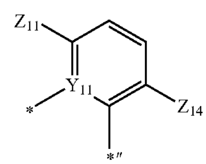

CY11(9)

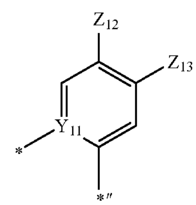

CY11(10)

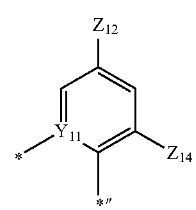

CY11(11)

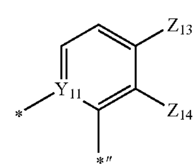

CY11(12)

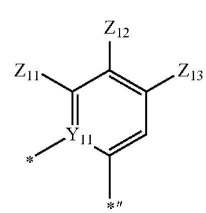

CY11(13)

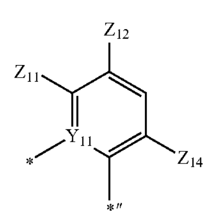

-continued

CY11(14)

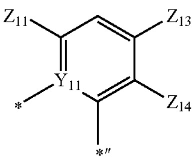

CY11(15)

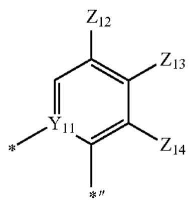

CY11(16)

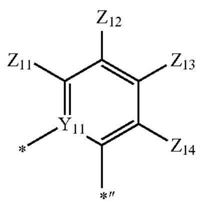

CY11(17)

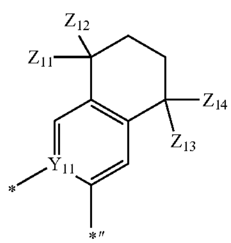

CY11(18)

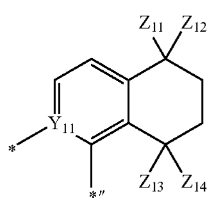

In Formulae CY11(1) to CY11(18), $Y_{12}$ may be understood by referring to the description thereof provided herein, $Z_{11}$ to $Z_{14}$ may each be understood by referring to the description of $Z_1$ provided herein, * may indicate a binding site to M in Formula 1, and*" may indicate a binding site to an adjacent atom in Formula 3.

In one or more embodiments, a group represented by

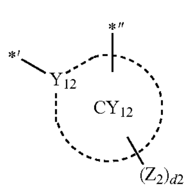

in Formula 3 may be a group represented by one of Formulae CY12(1) to CY12(17):

CY12(1)

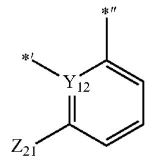

CY12(2)

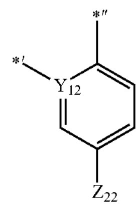

CY12(3)

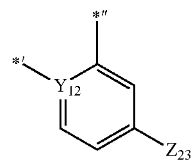

CY12(4)

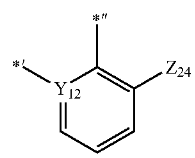

CY12(5)

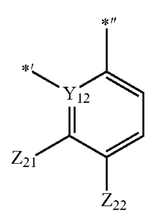

CY12(6)

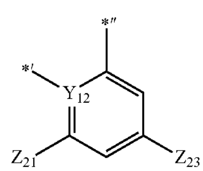

CY12(7)

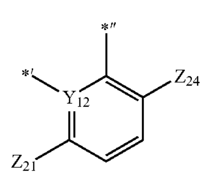

CY12(8)

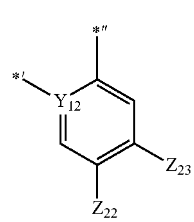

-continued

CY12(9)

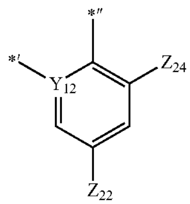

CY12(10)

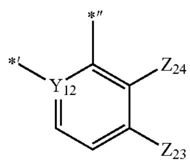

CY12(11)

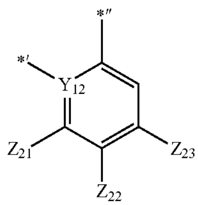

CY12(12)

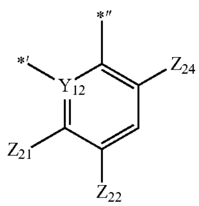

CY12(13)

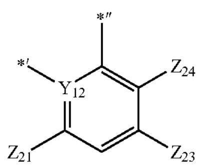

CY12(14)

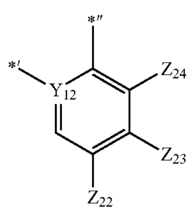

CY12(15)

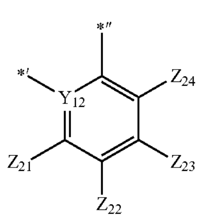

-continued

CY12(16)

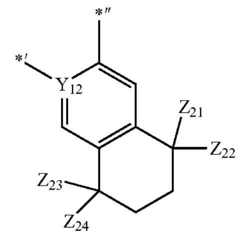

CY12(17)

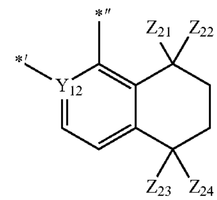

In Formulae CY12(1) to CY12(17), $Y_{12}$ may be understood by referring to the description thereof provided herein, $Z_{21}$ to $Z_{24}$ may each be understood by referring to the description of $Z_2$ provided herein, *' may indicate a binding site to M in Formula 1, and *" may indicate a binding site to an adjacent atom in Formula 3.

In one or more embodiments, the organometallic compound represented by Formula 1 may be of Compounds 1 to 296:

1

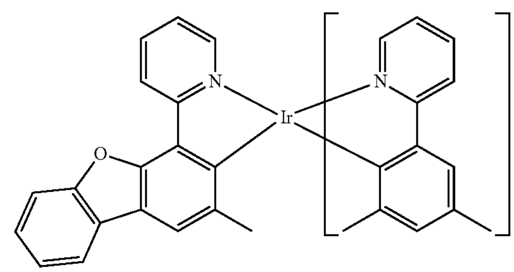

2

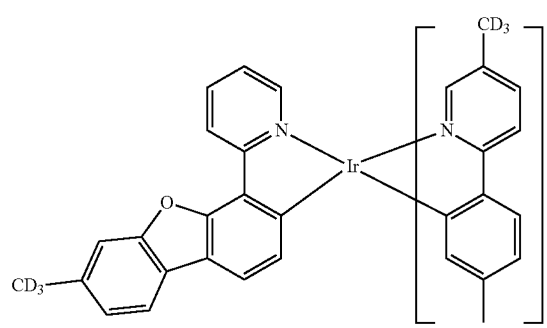

-continued
3
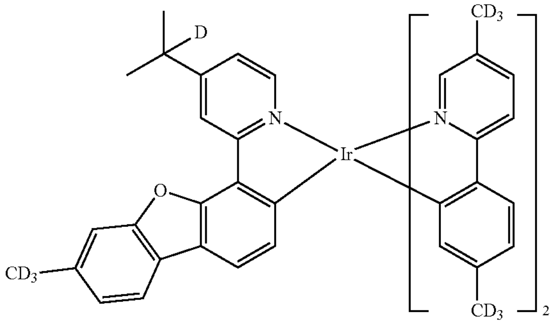
4
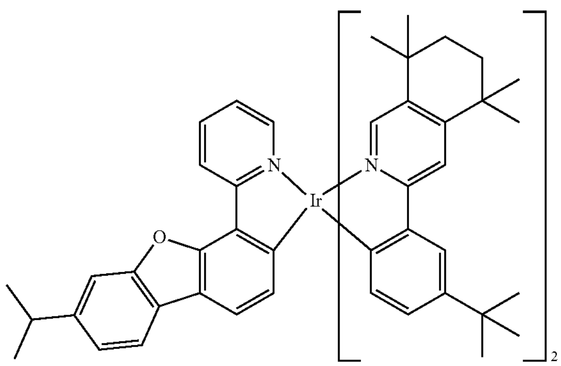
5
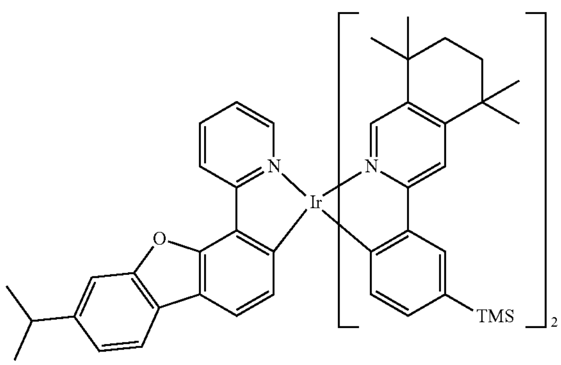
6
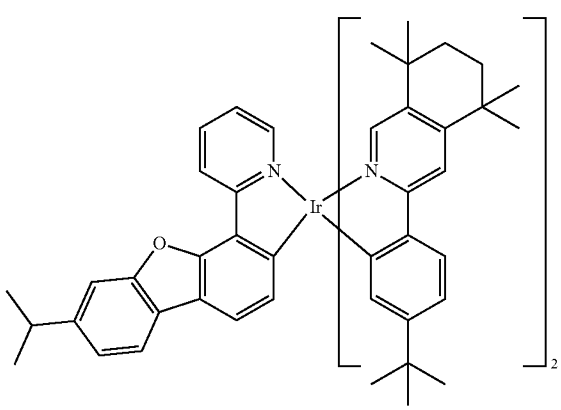
-continued
7
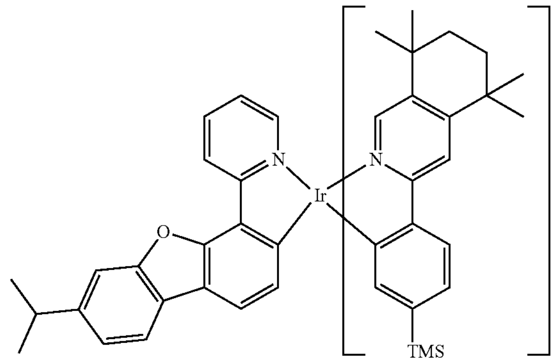
8
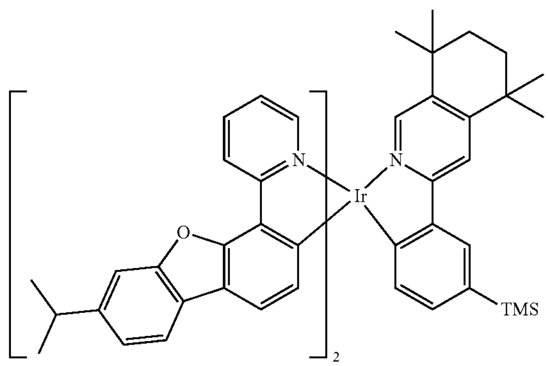
9
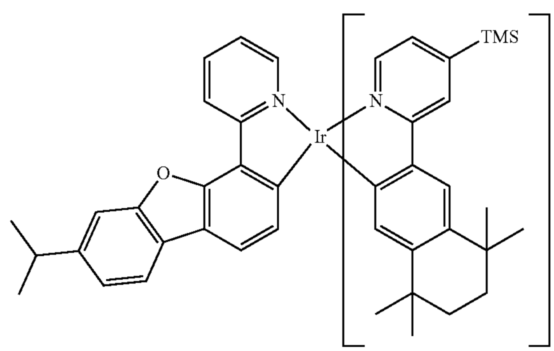
10
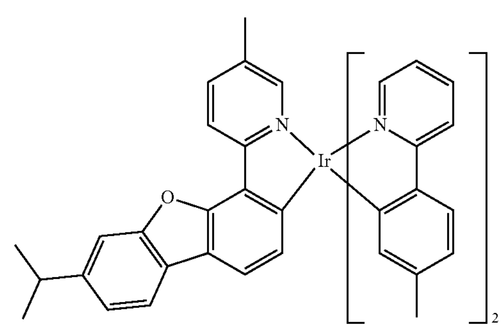

11
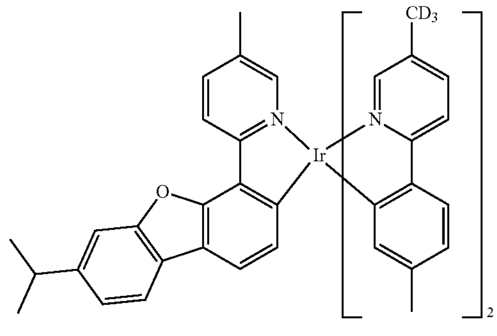
12
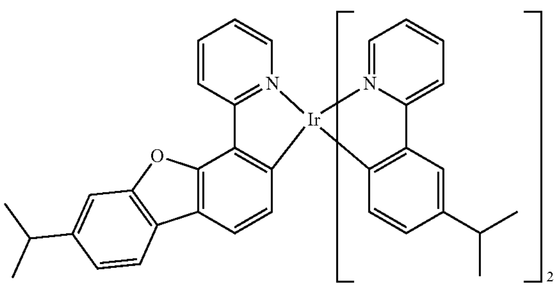
13
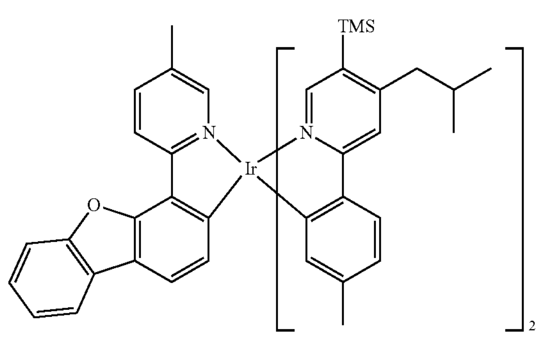
14
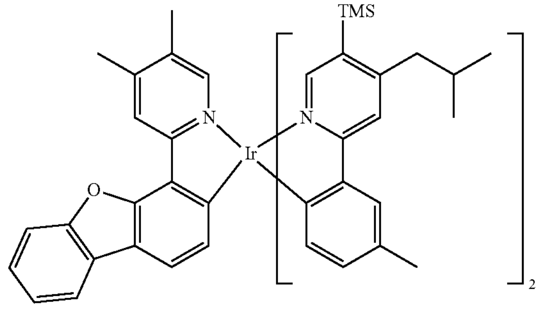
15
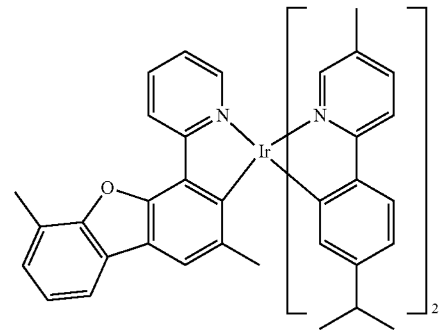
16
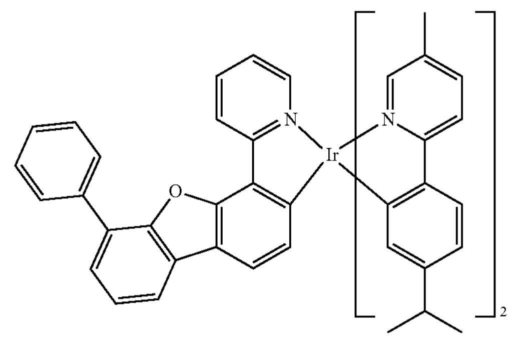
17
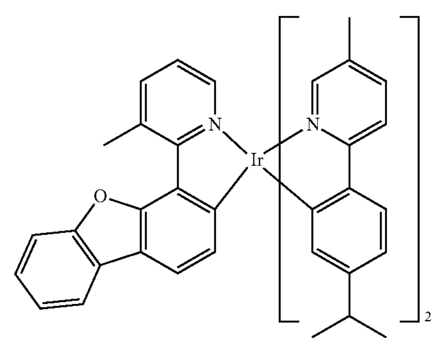
18
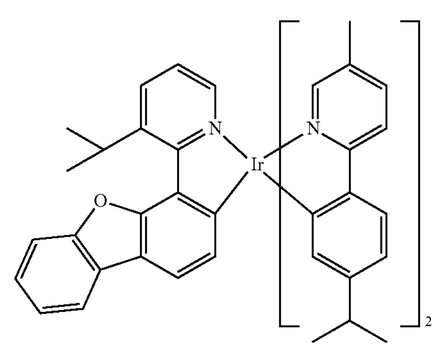

19
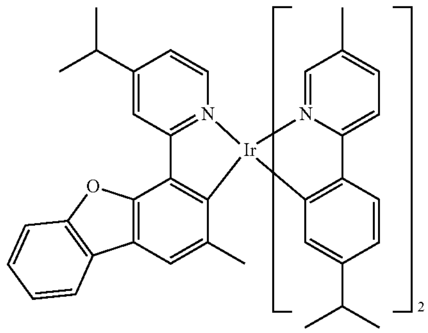
20
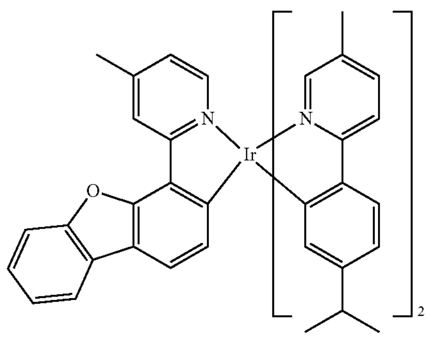
21
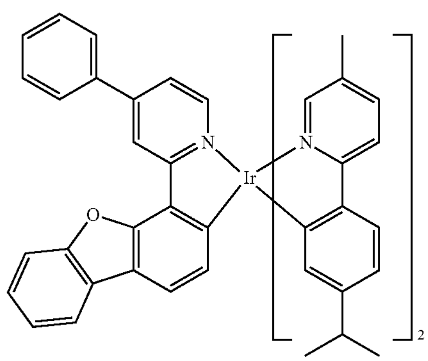
22
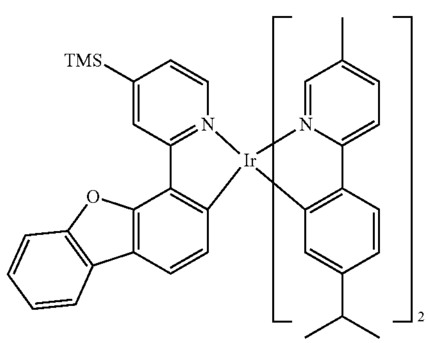
23
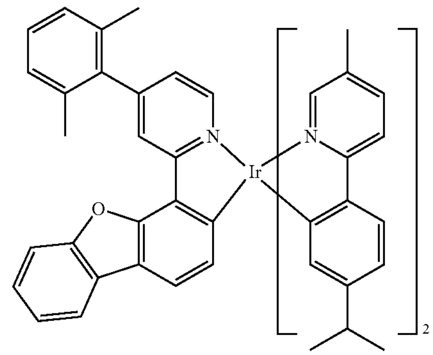
24
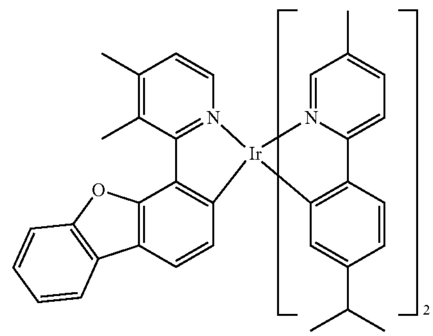
25
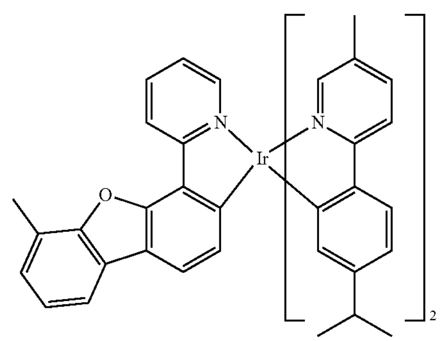
26
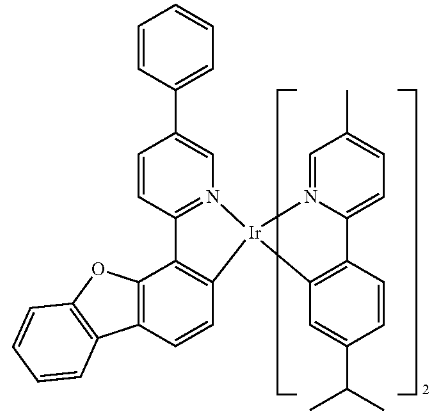

-continued
27
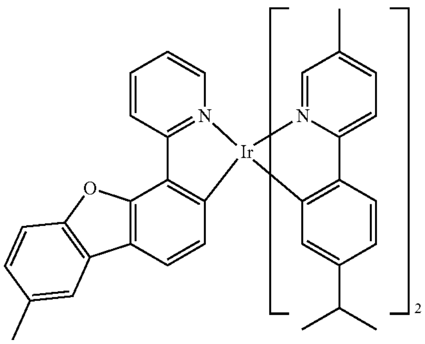
28
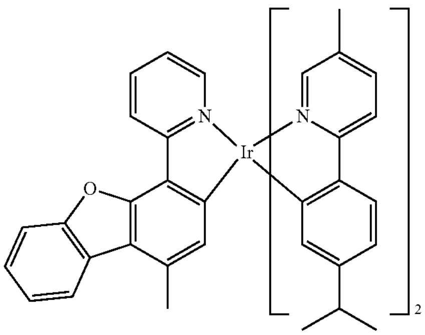
29
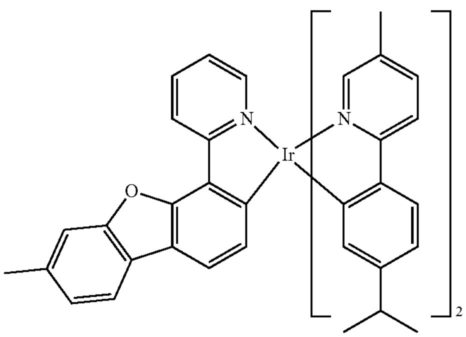
30
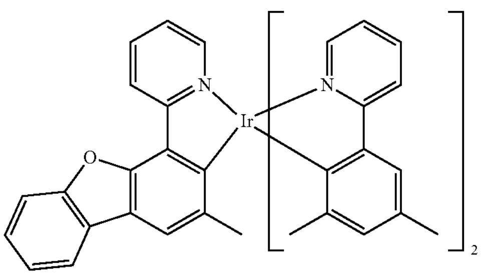
31
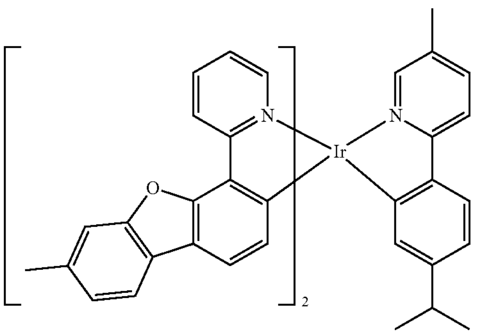
-continued
32
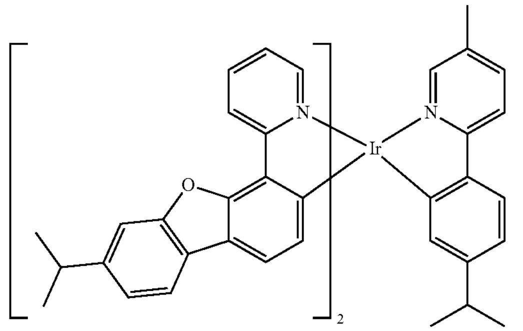
33
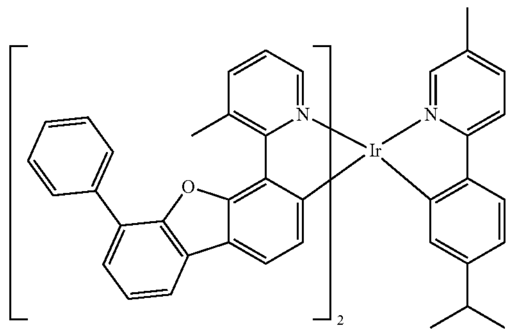
34
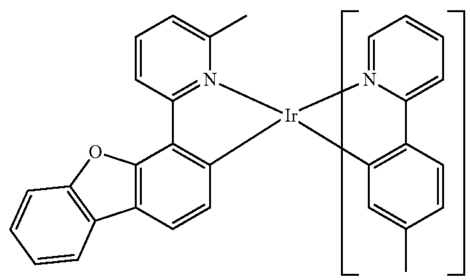
35
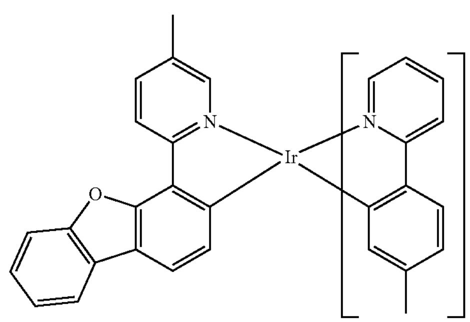
36
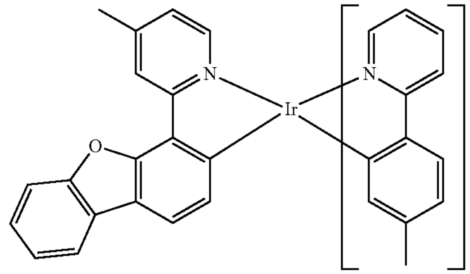

-continued
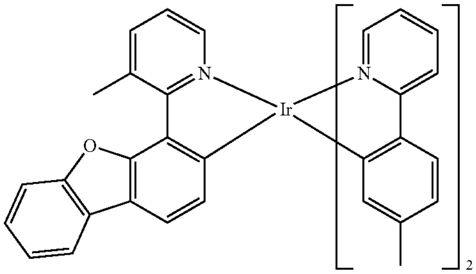
37
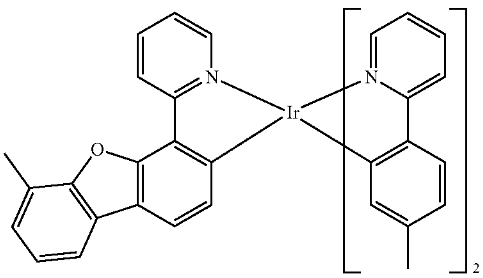
38
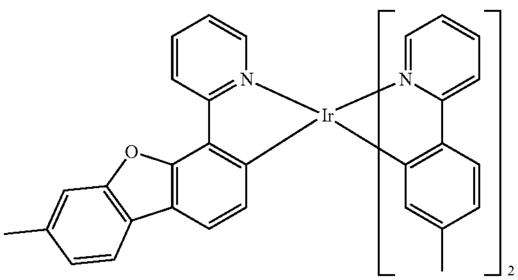
39
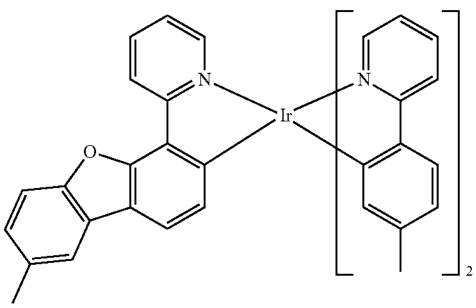
40
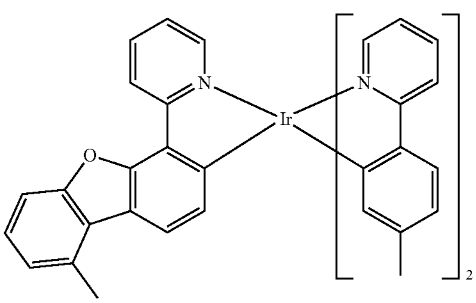
41
-continued
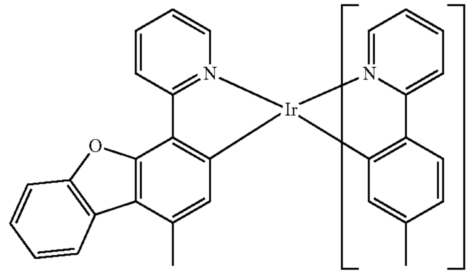
42
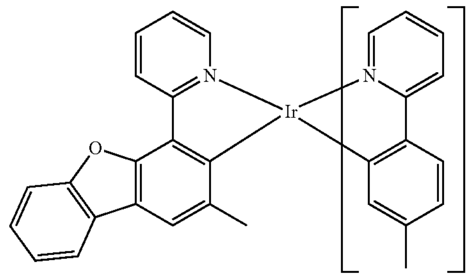
43
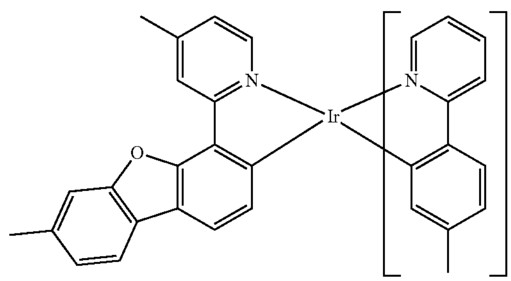
44
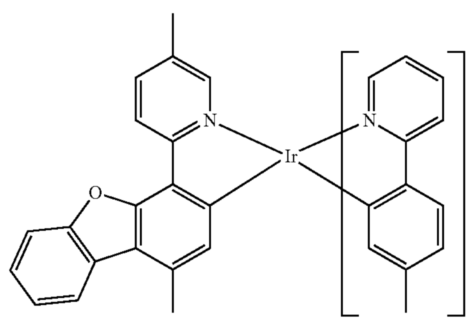
45
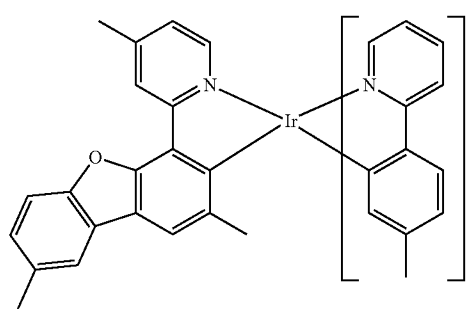
46

47
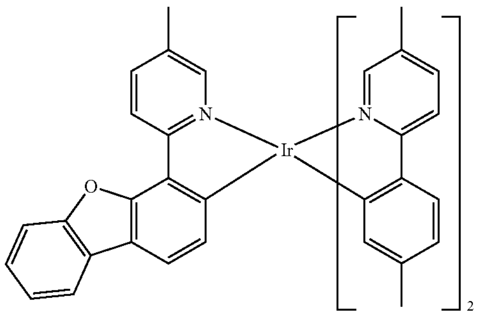
48
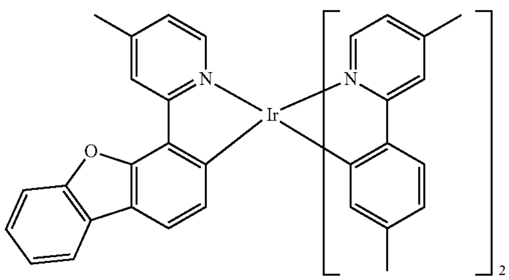
49
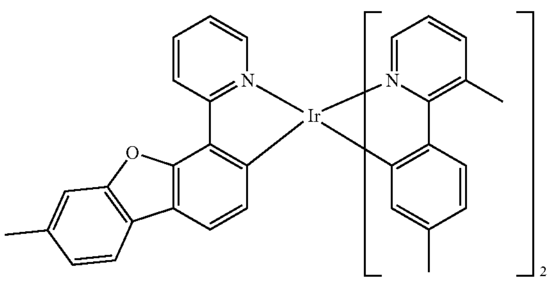
50
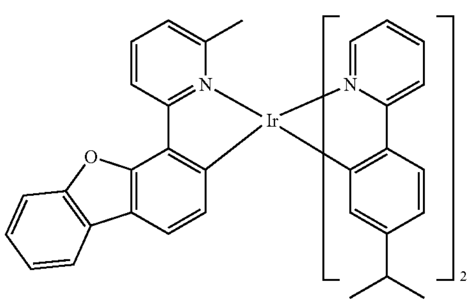
51
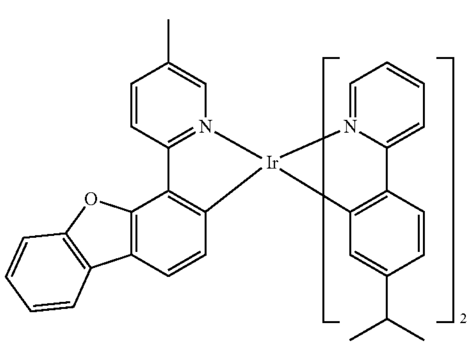
52
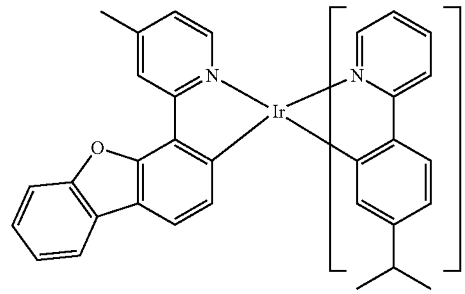
53
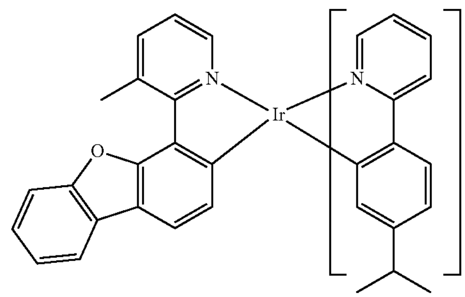
54
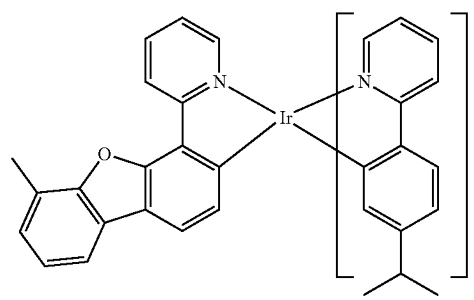
55
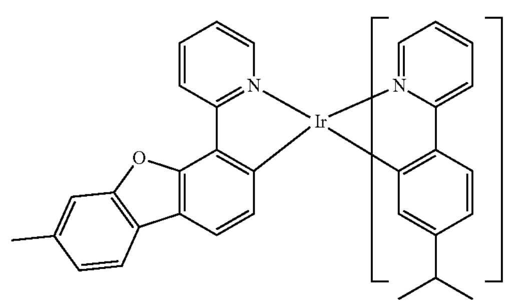
56
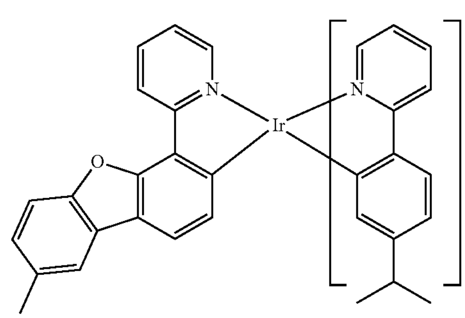

-continued
57
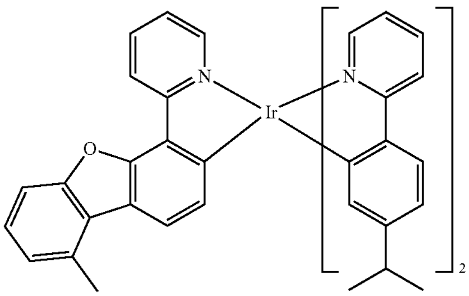
58
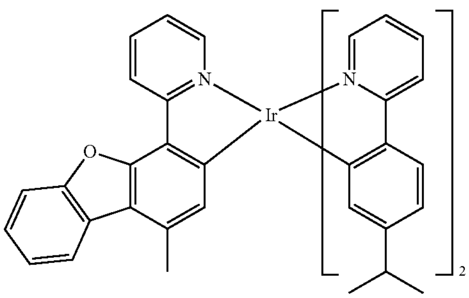
59
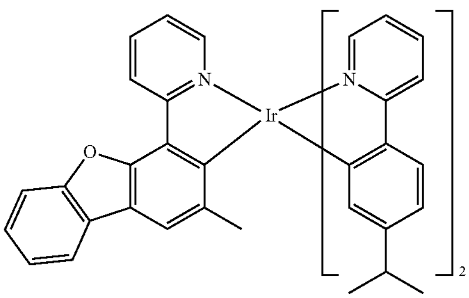
60
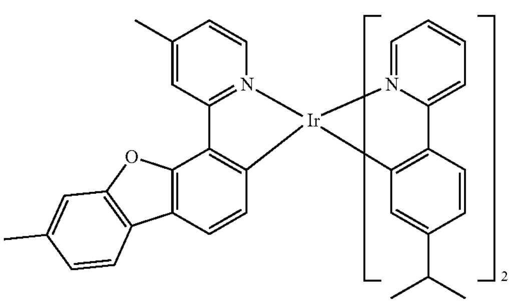
61
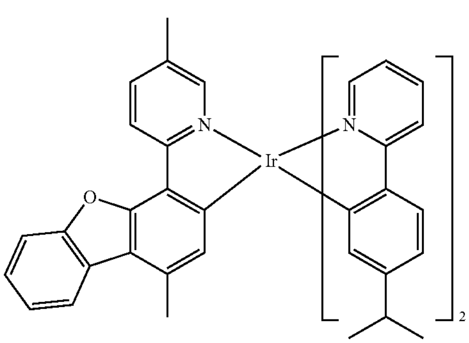
-continued
62
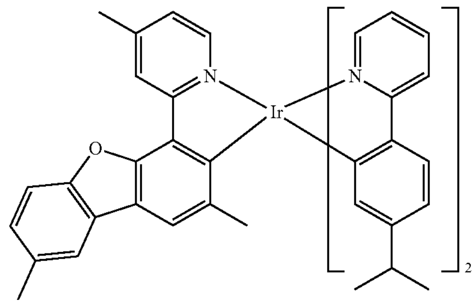
63
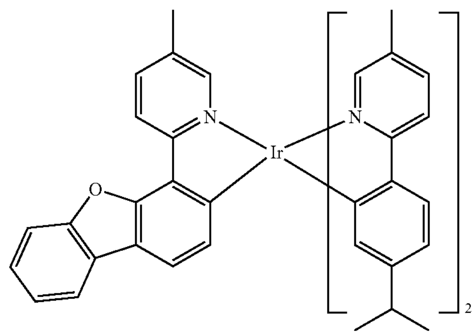
64
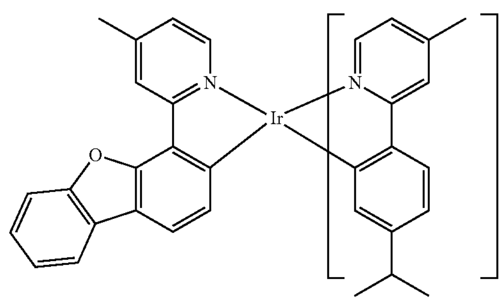
65
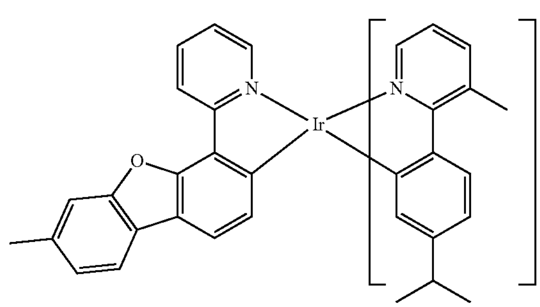

66
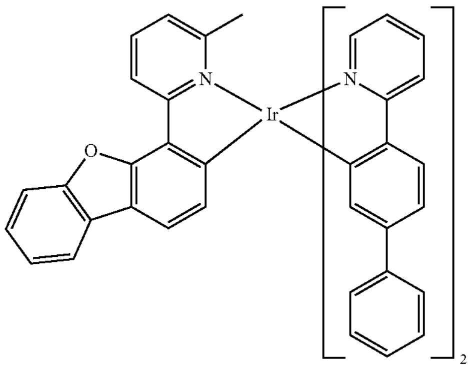
67
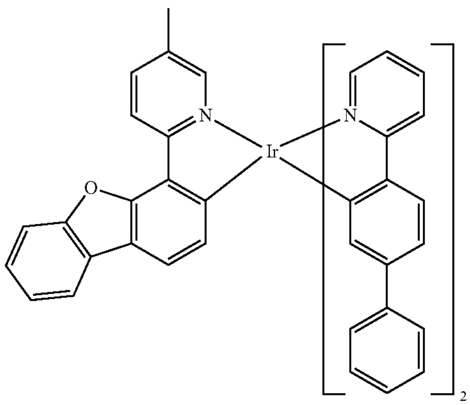
68
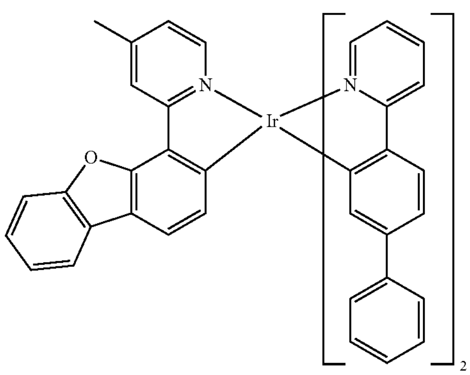
69
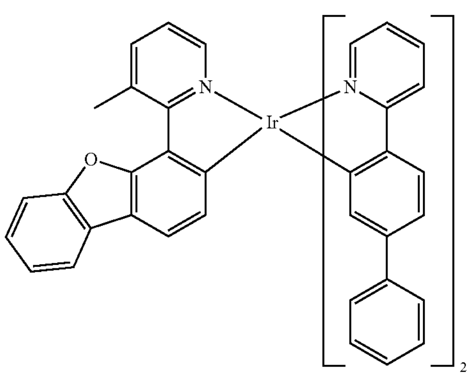
70
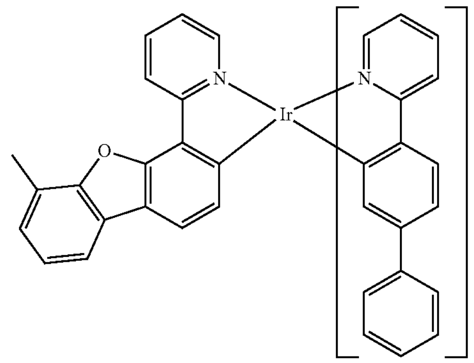
71
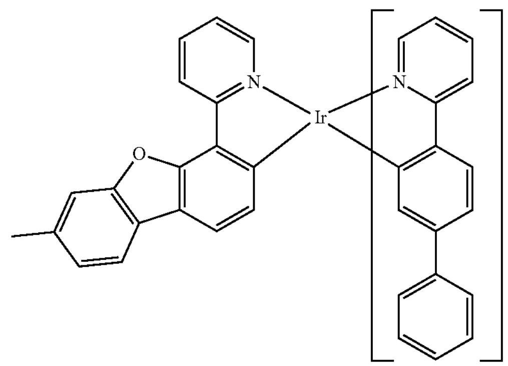
72
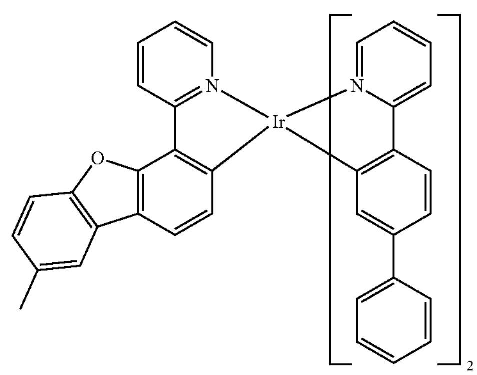
73
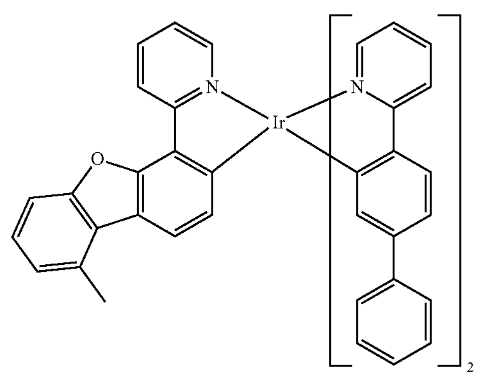

-continued
74
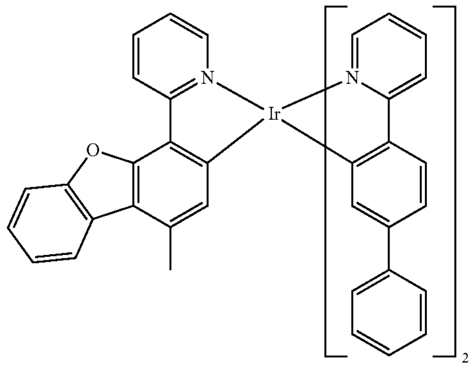
75
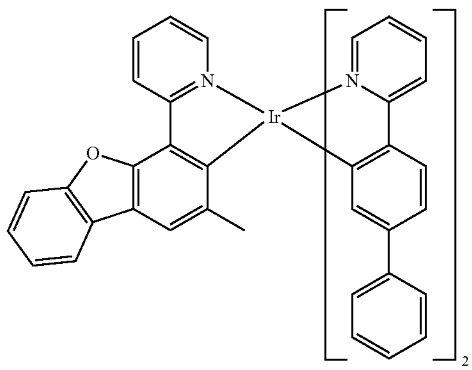
76
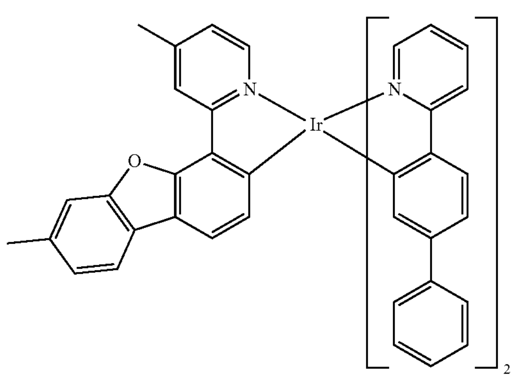
77
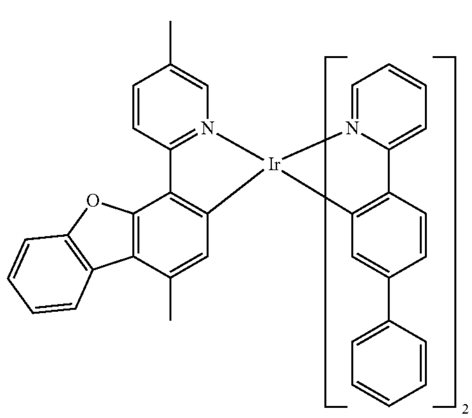
-continued
78
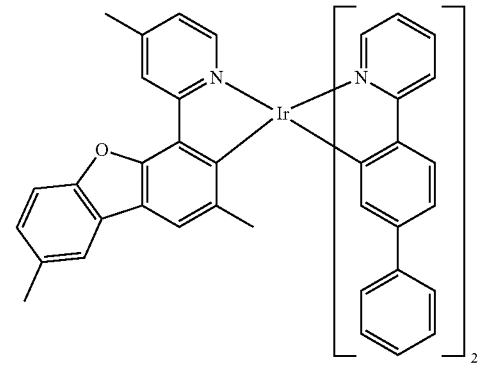
79
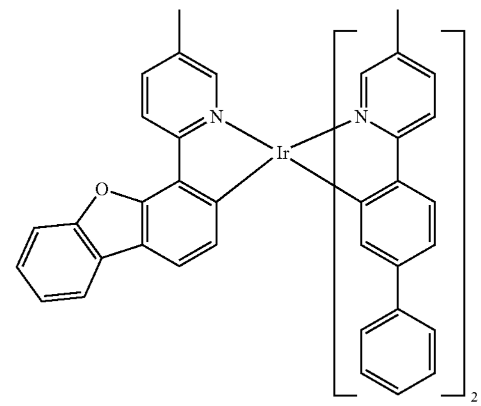
80
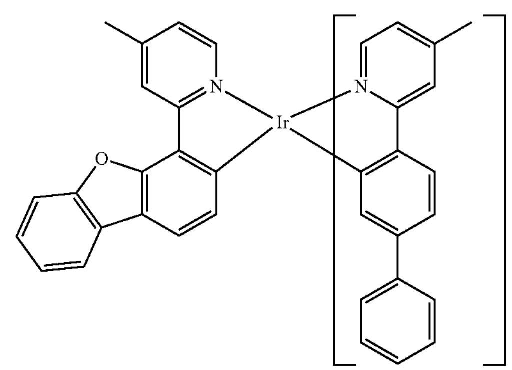
81
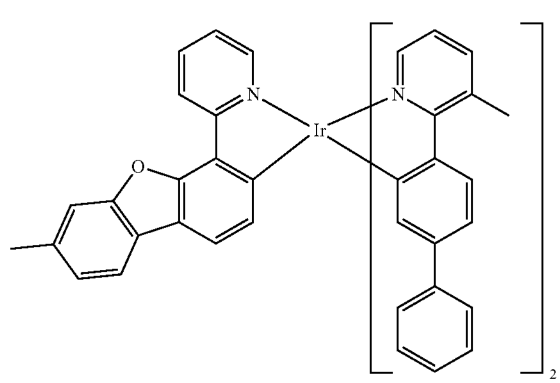

-continued
82
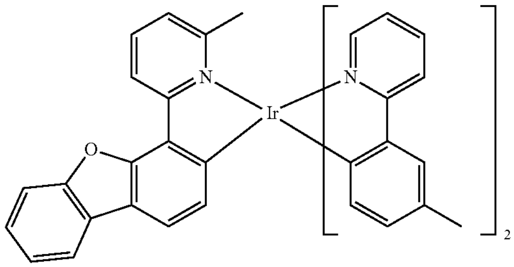
83
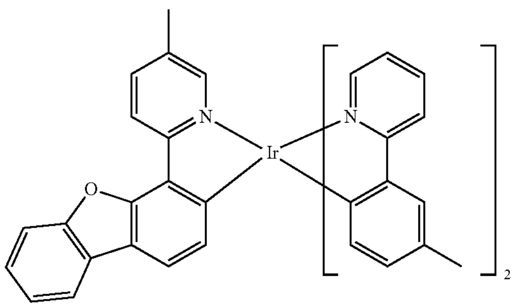
84
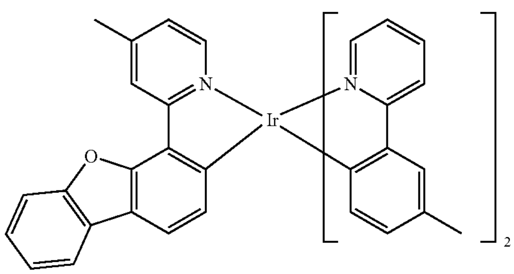
85
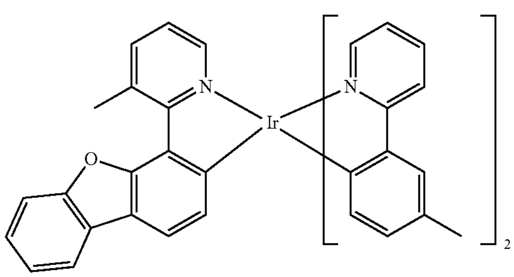
86
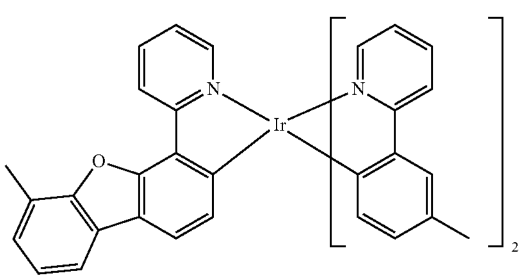
-continued
87
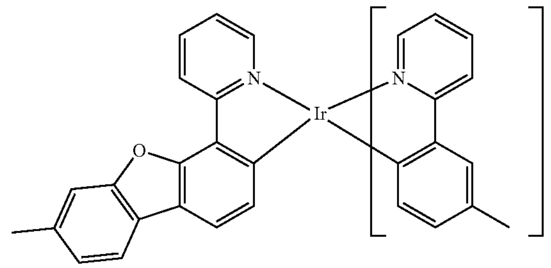
88
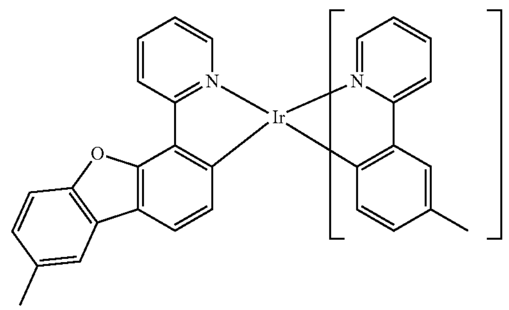
89
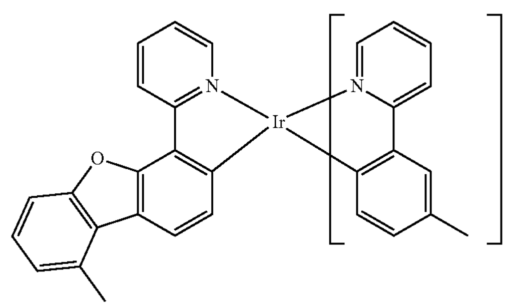
90
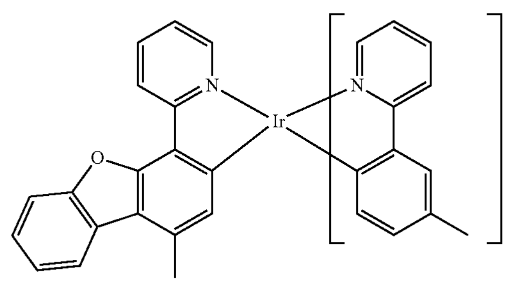
91
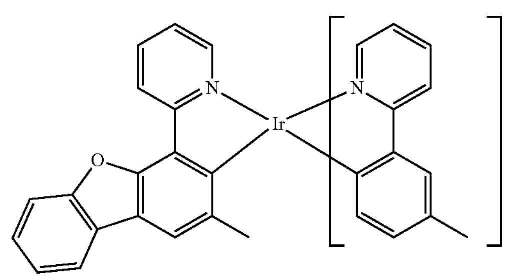

92
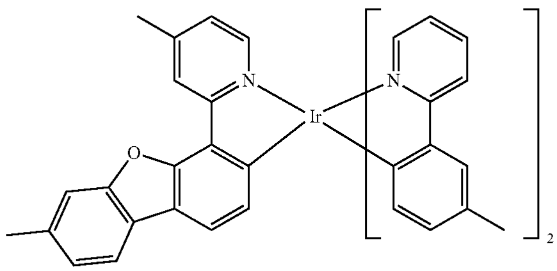
93
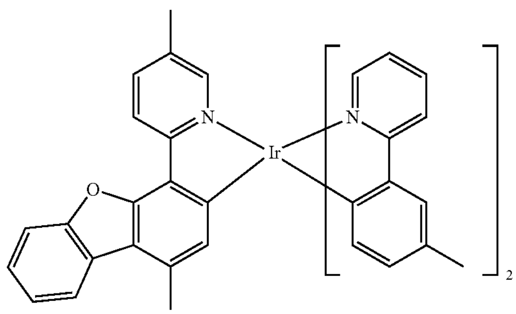
94
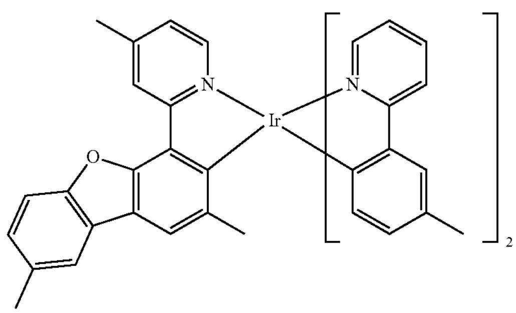
95
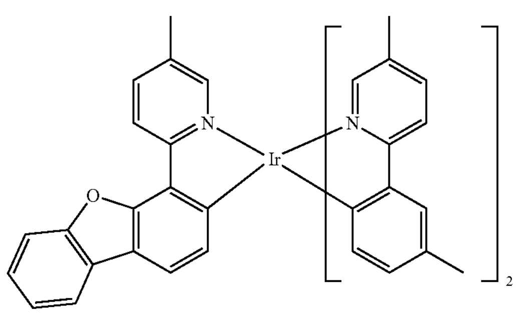
96
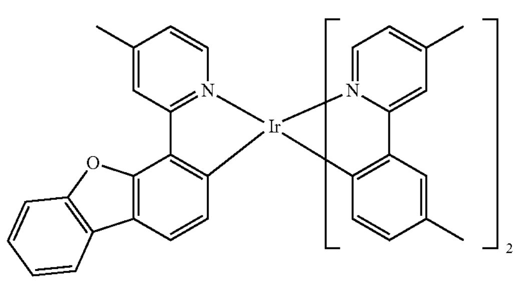
97
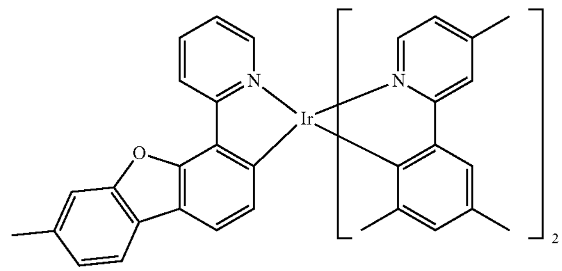
98
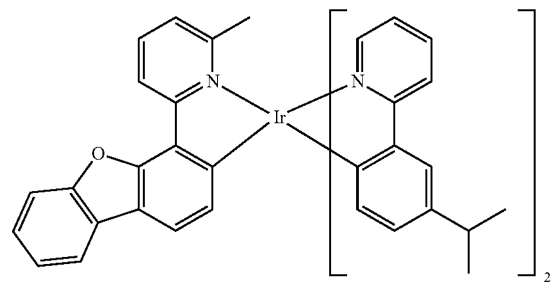
99
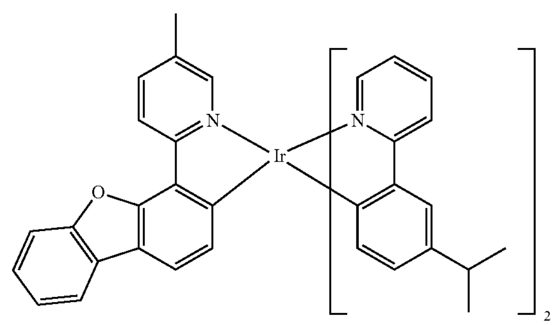
100
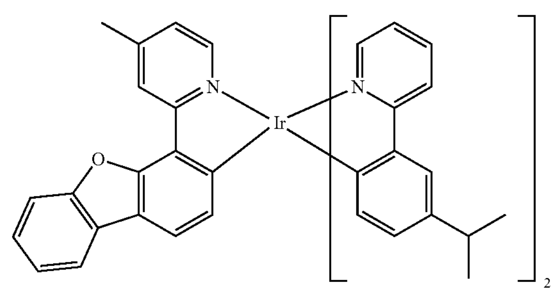
101
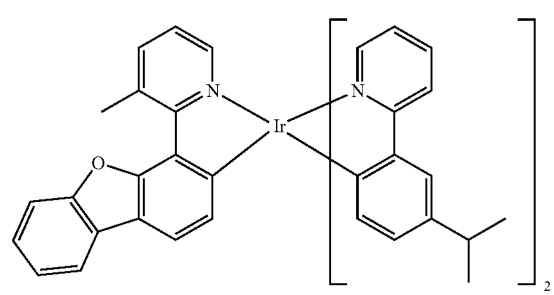

-continued
102
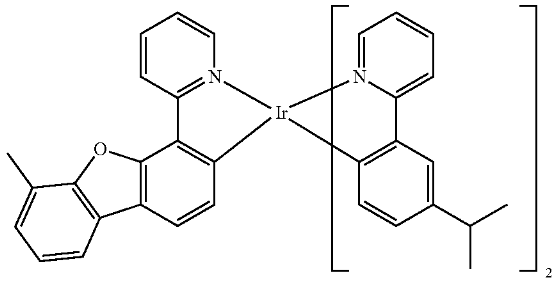
103
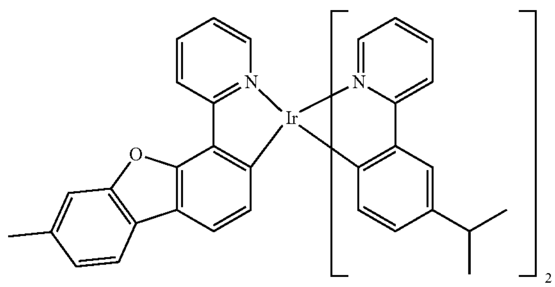
104
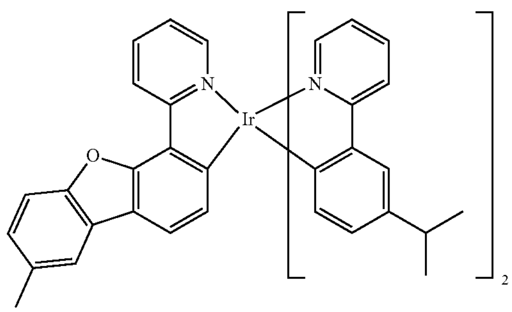
105
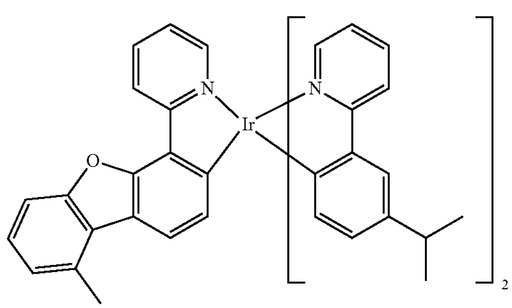
106
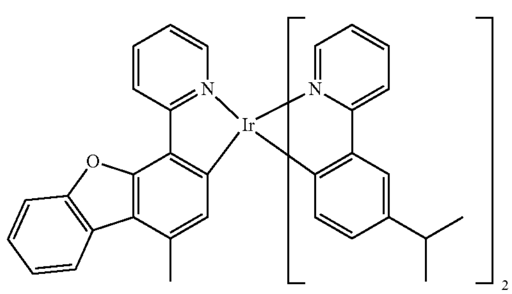
-continued
107
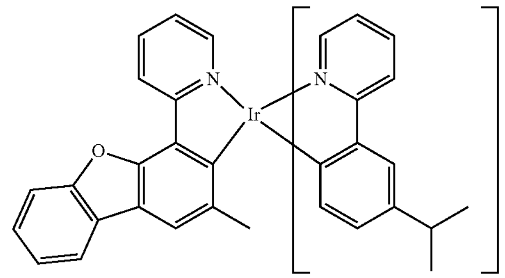
108
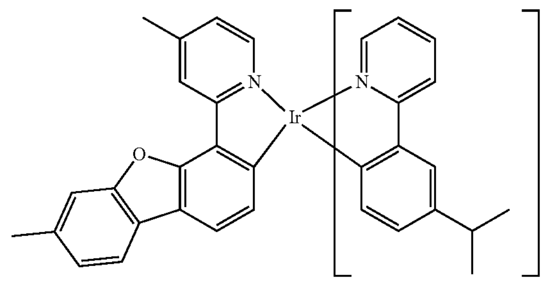
109
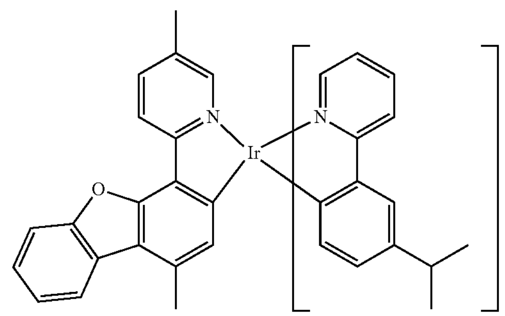
110
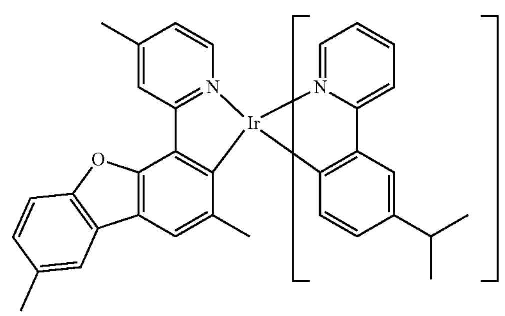
111
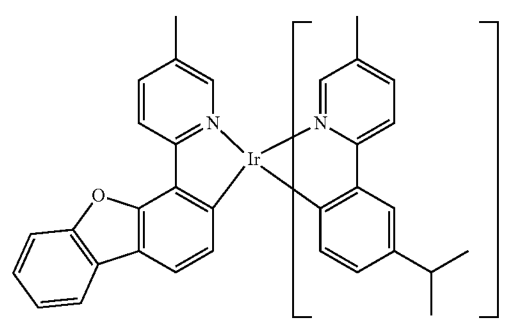

-continued
112
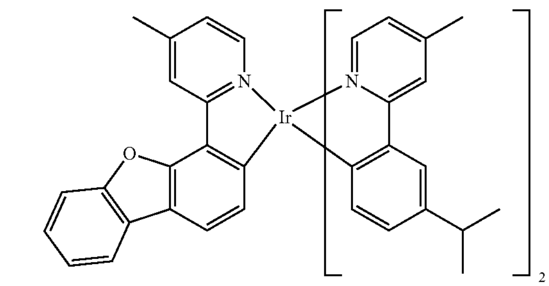
113
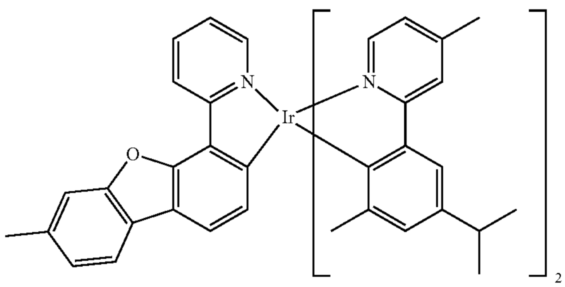
114
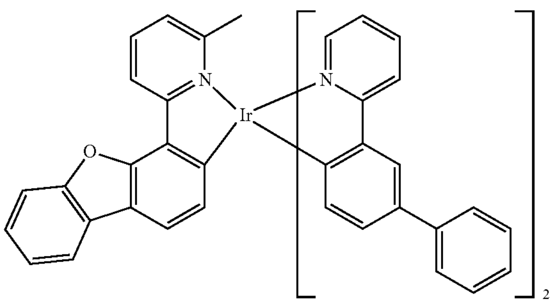
115
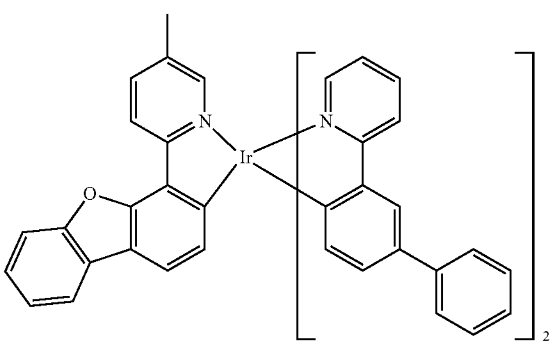
116
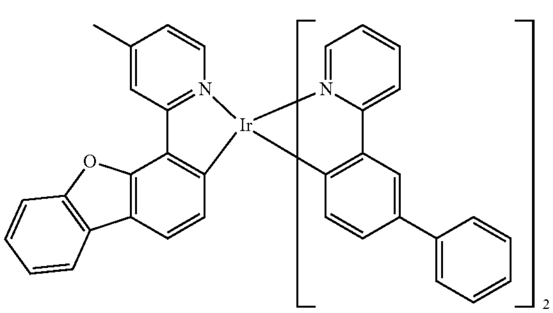
-continued
117
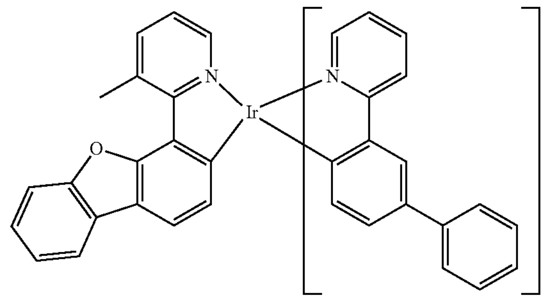
118
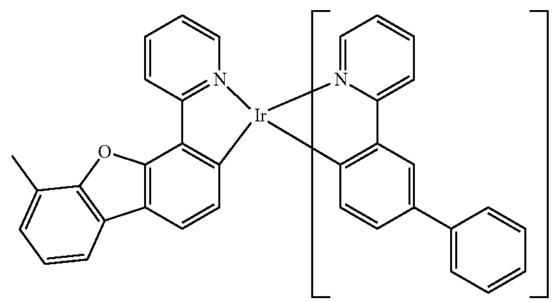
119
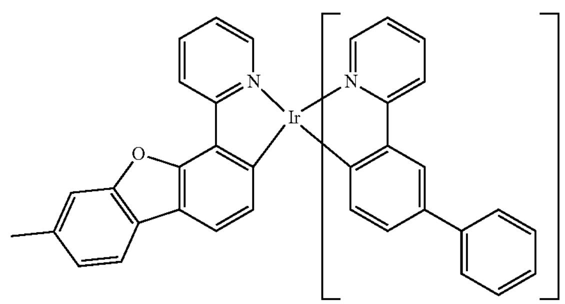
120
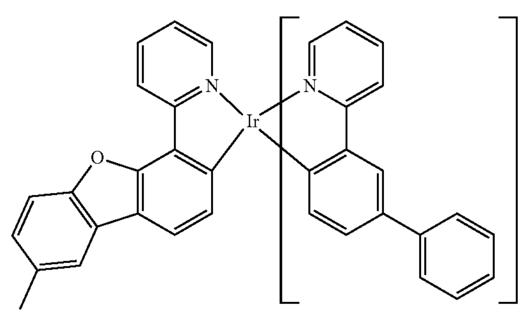
121
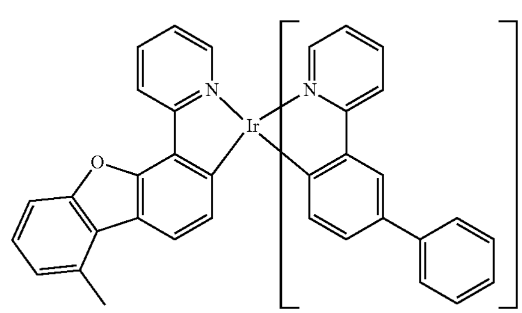

-continued
122
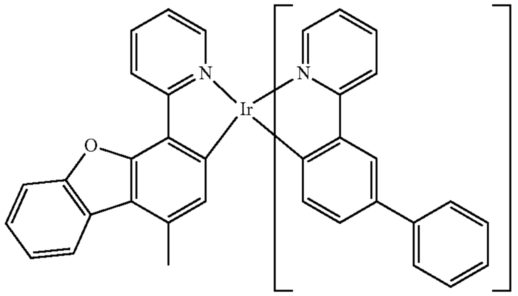
123
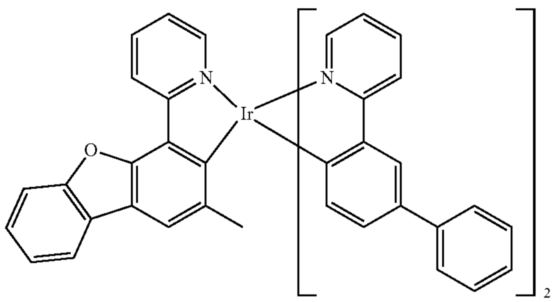
124
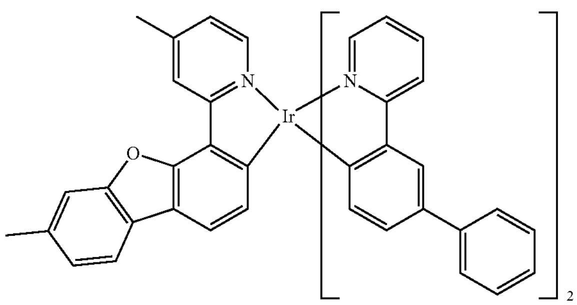
125
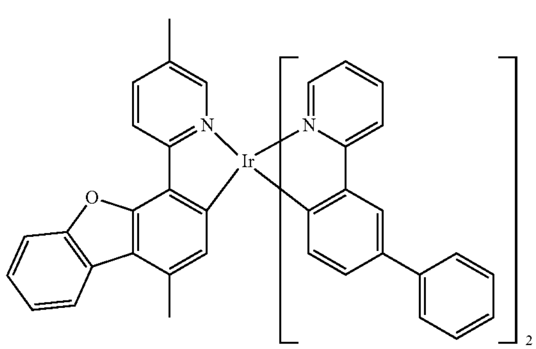
-continued
126
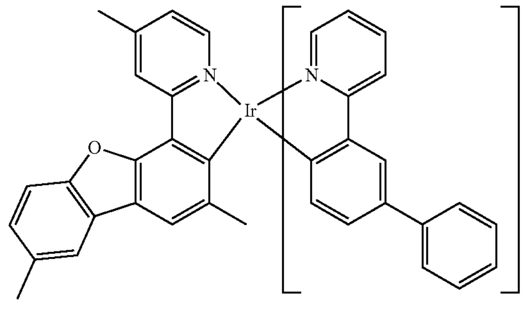
127
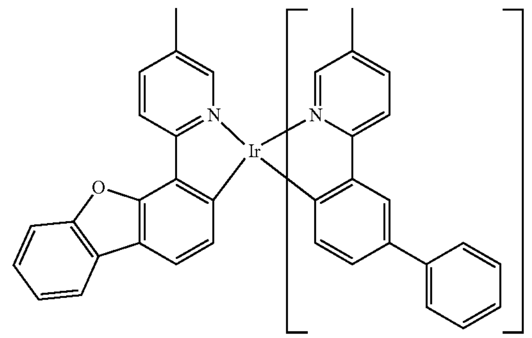
128
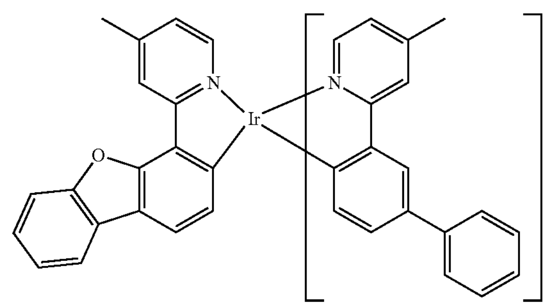
129
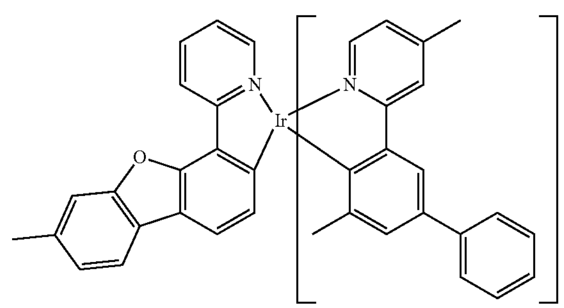

130
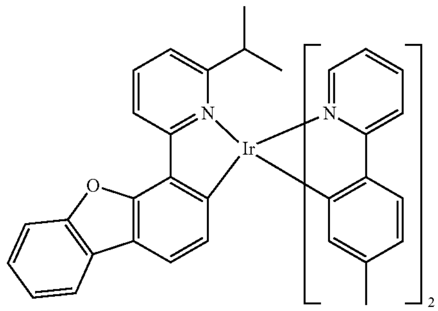
131
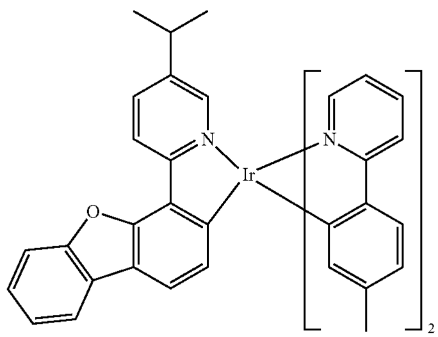
132
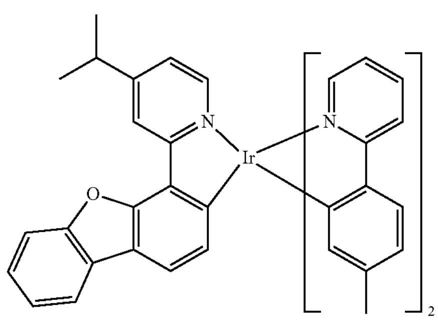
133
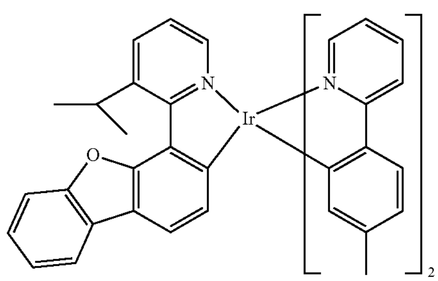
134
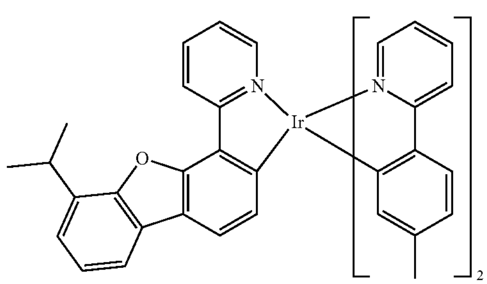
135
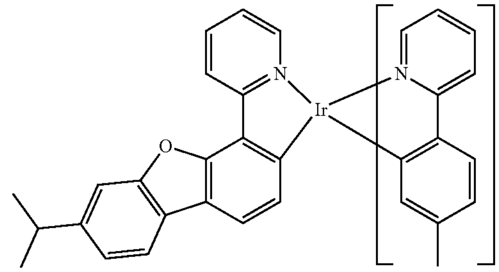
136
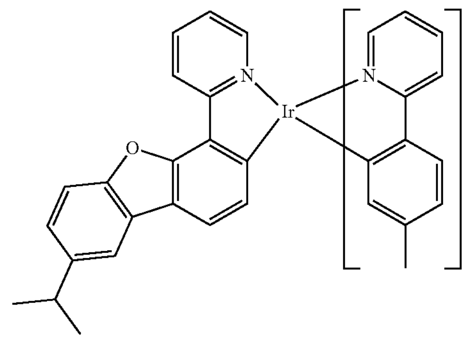
137
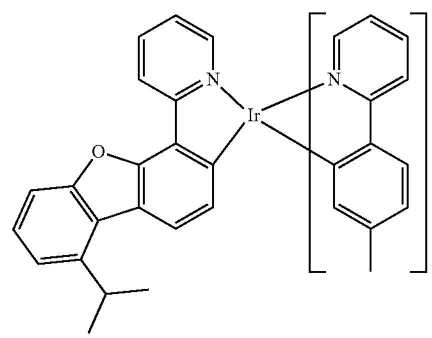
138
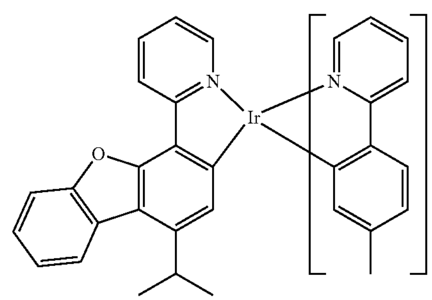
139
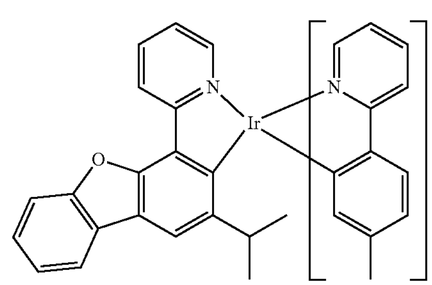

140
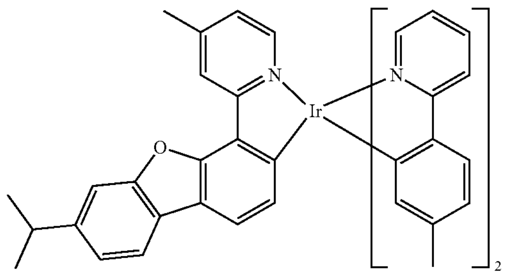
141
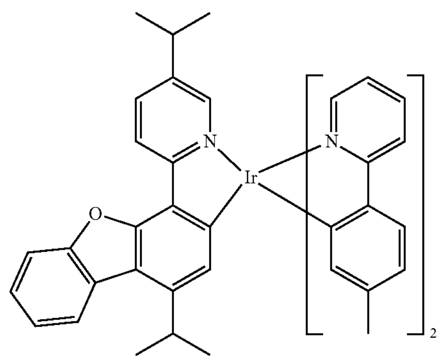
142
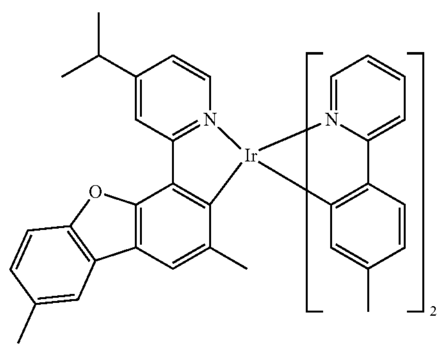
143
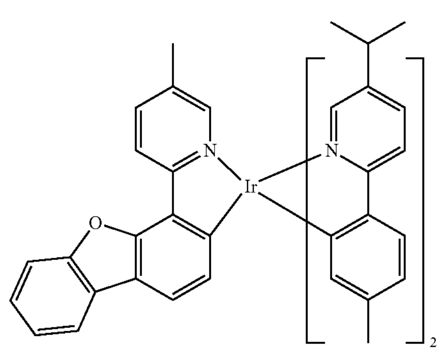
144
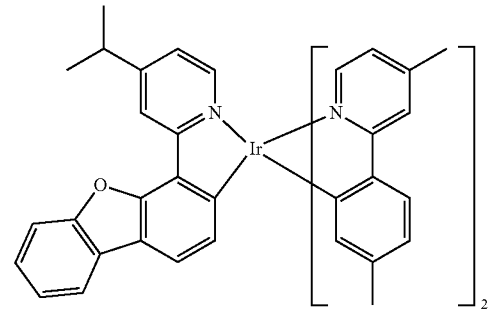
145
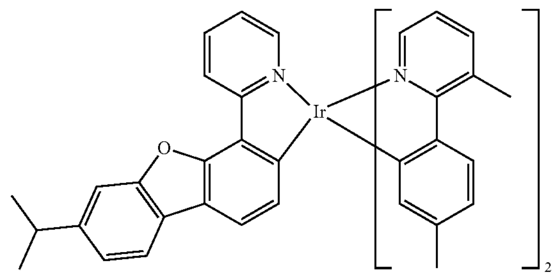
146
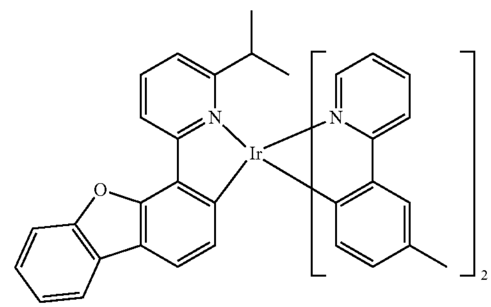
147
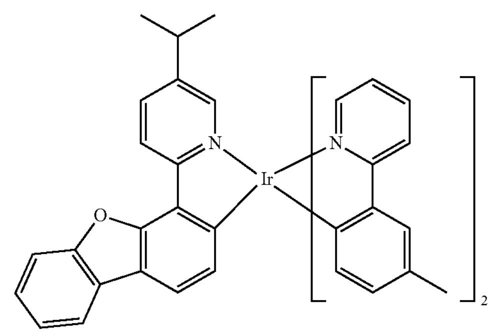
148
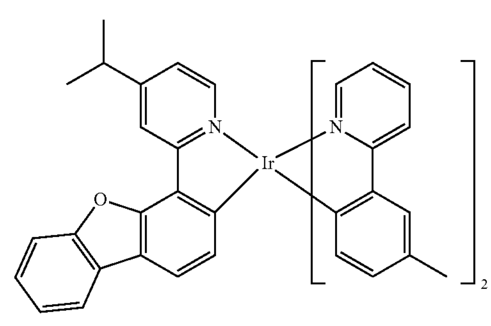

-continued
149
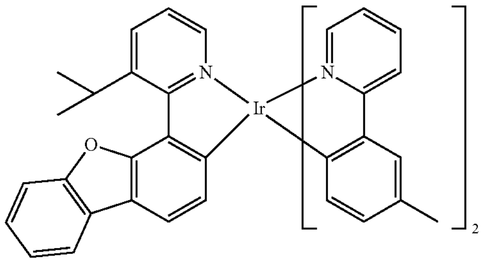
150
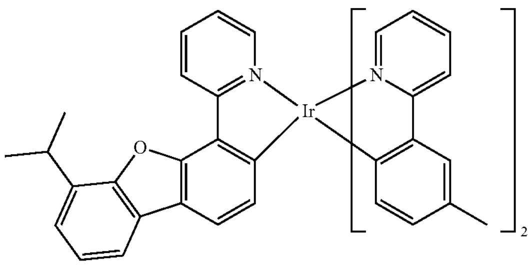
151
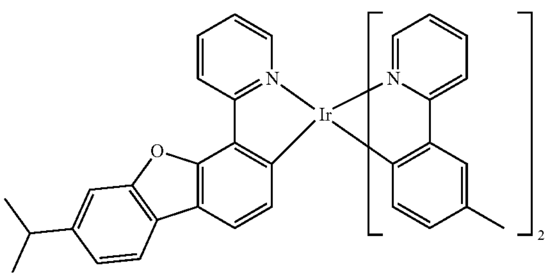
152
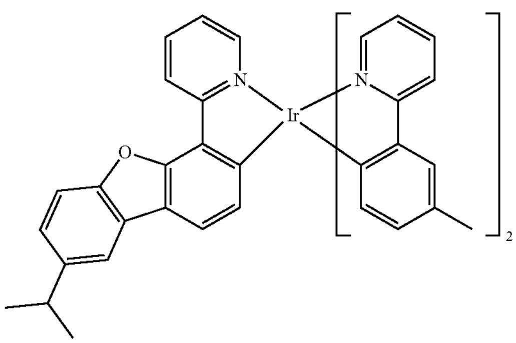
153
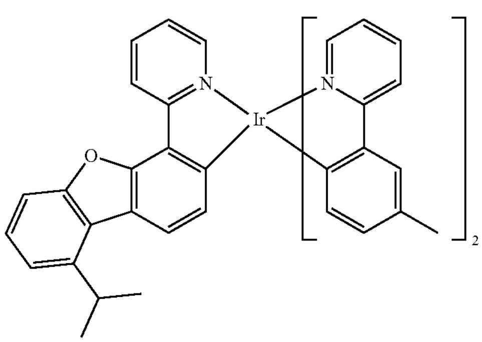
-continued
154
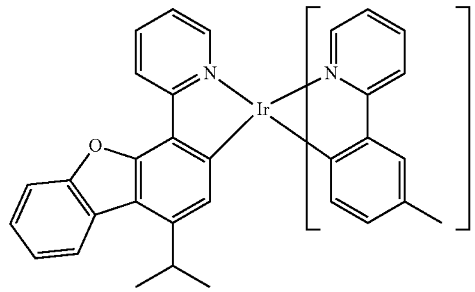
155
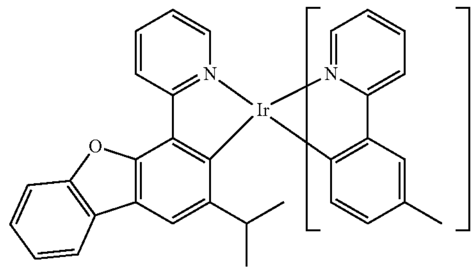
156
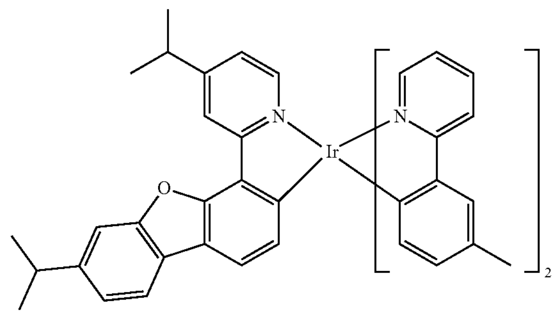
157
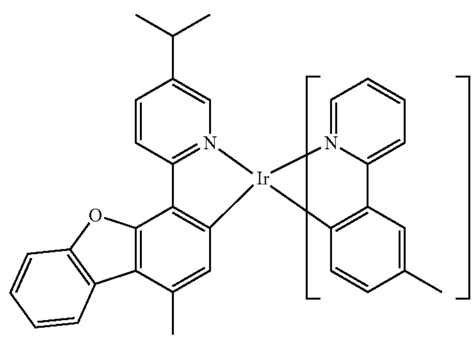
158
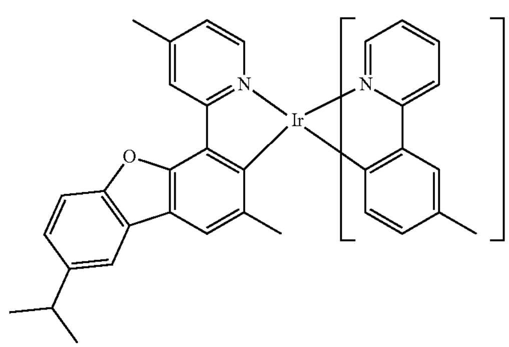

-continued
159
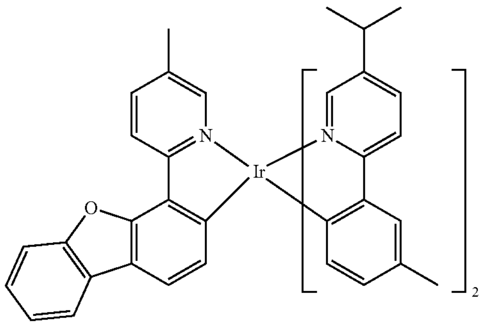
160
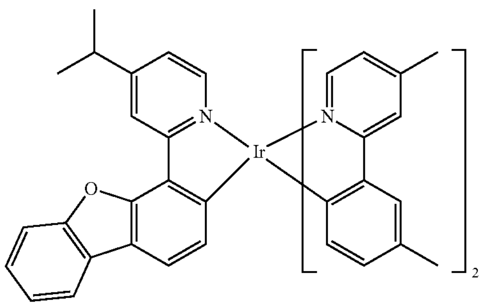
161
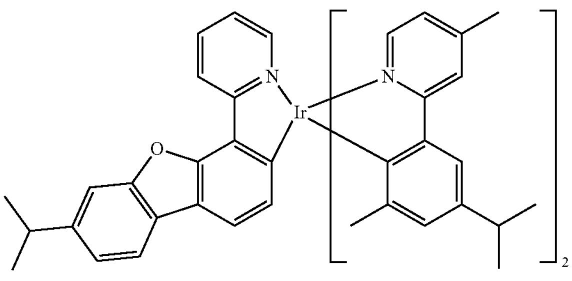
162
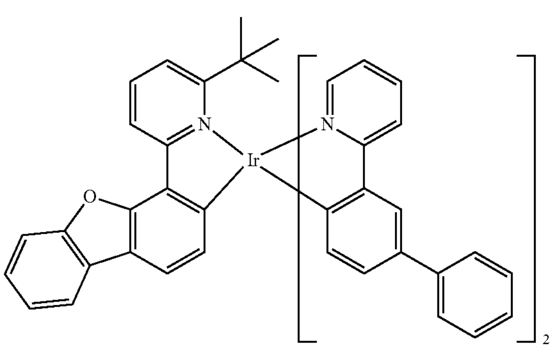
-continued
163
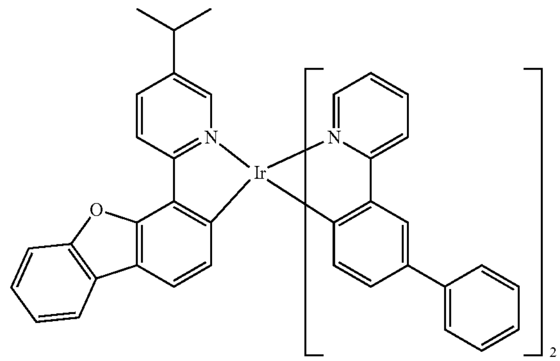
164
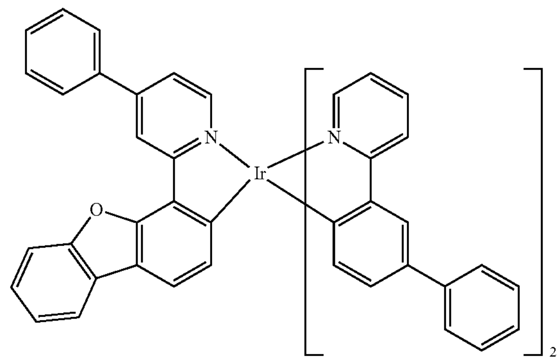
165
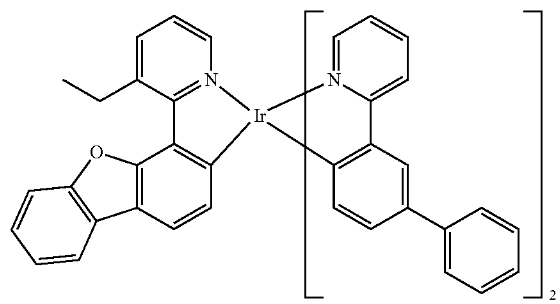
166
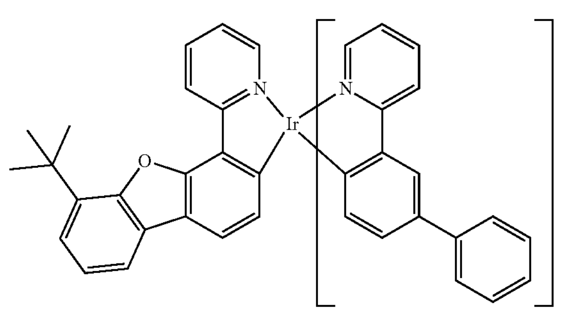

-continued
167
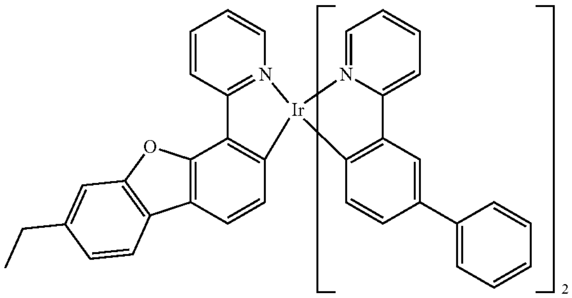
168
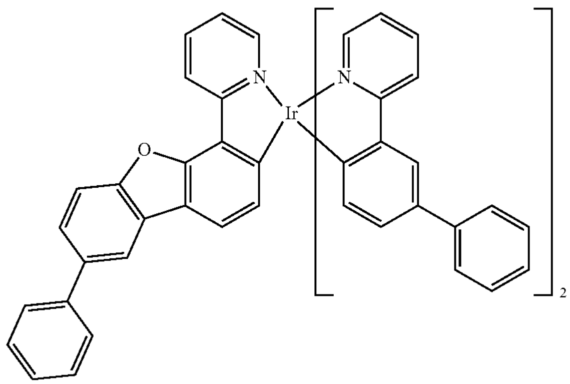
169
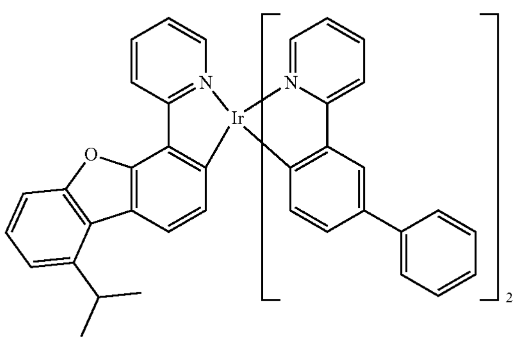
170
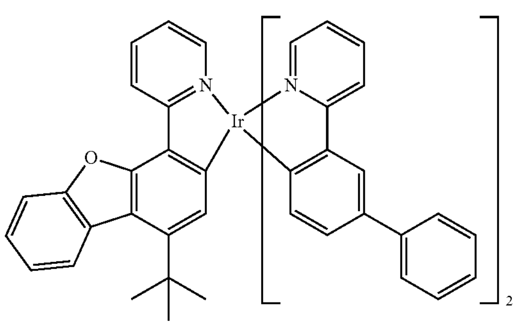
-continued
171
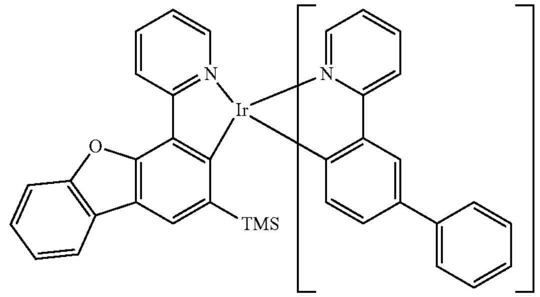
172
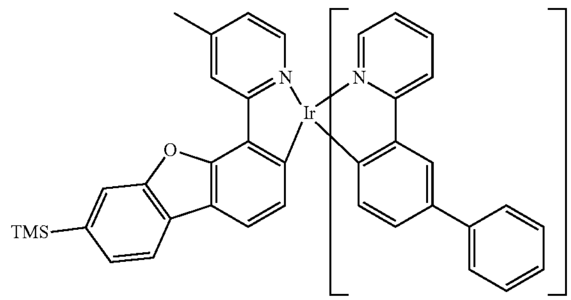
173
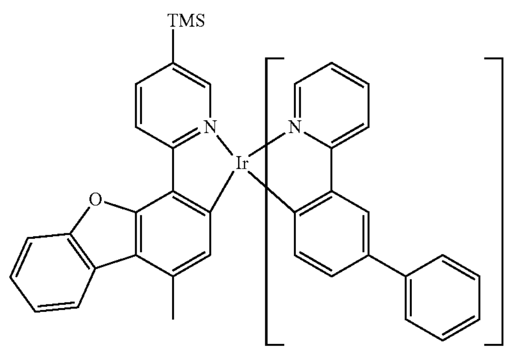
174
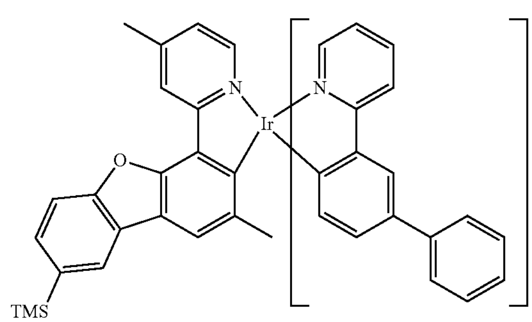

-continued
175
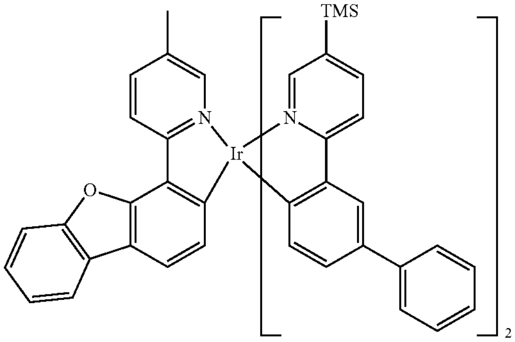
176
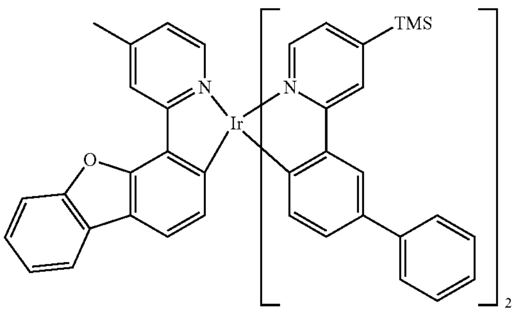
177
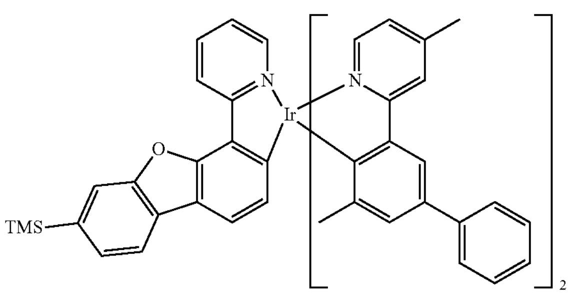
178
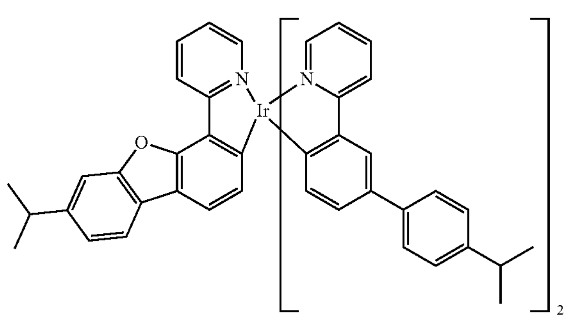
-continued
179
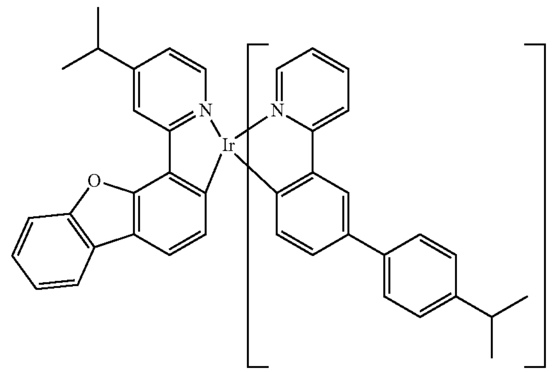
180
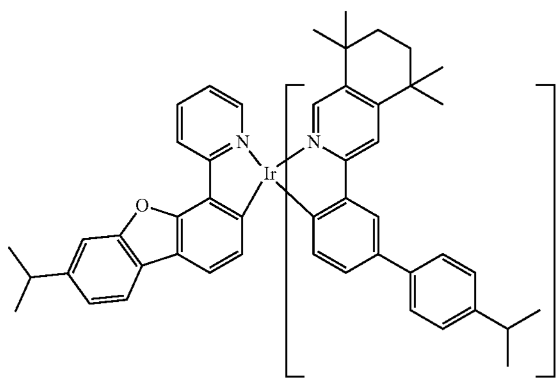
181
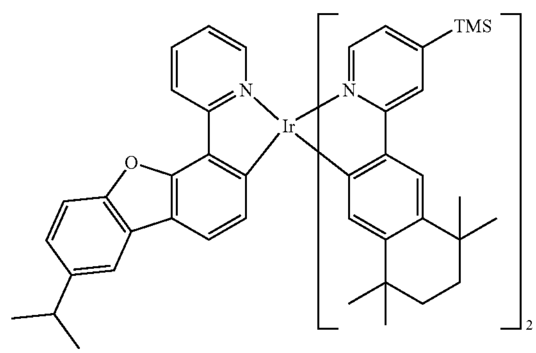
182
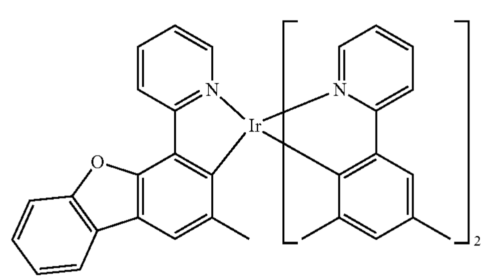

183
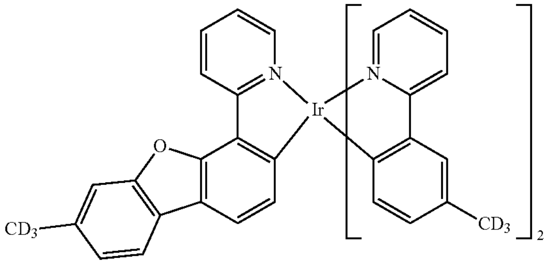
184
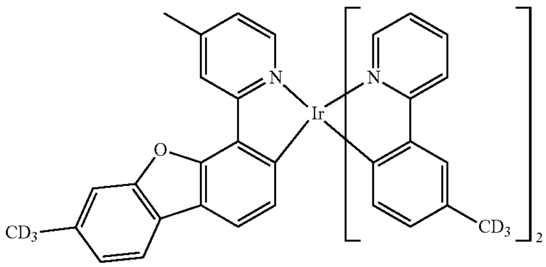
185
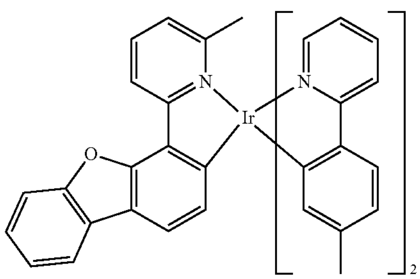
186
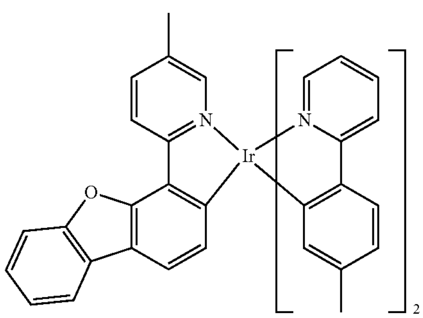
187
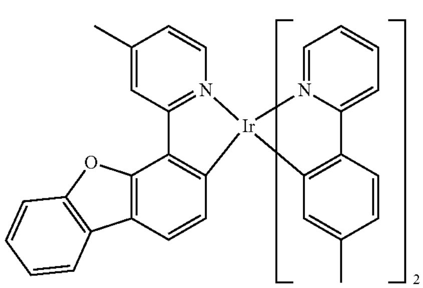
188
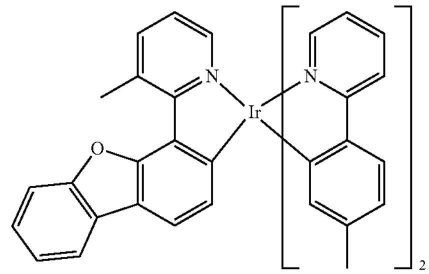
189
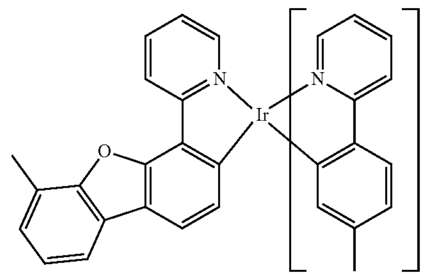
190
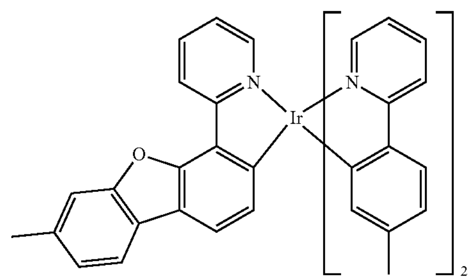
191
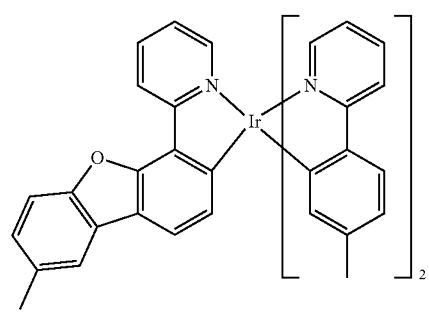
192
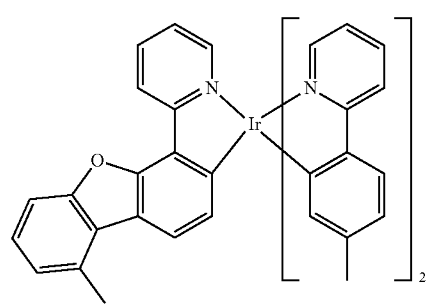

-continued
193
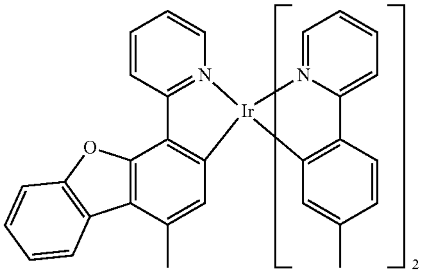
194
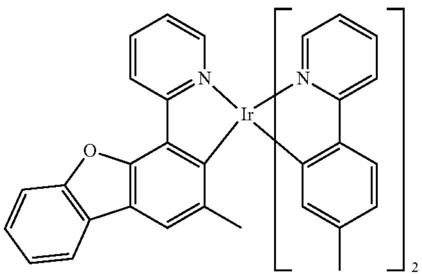
195
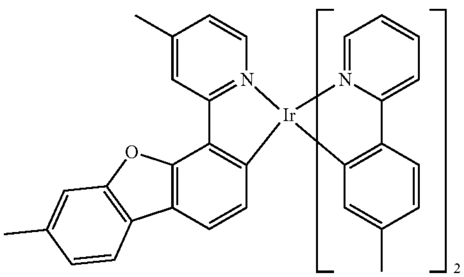
196
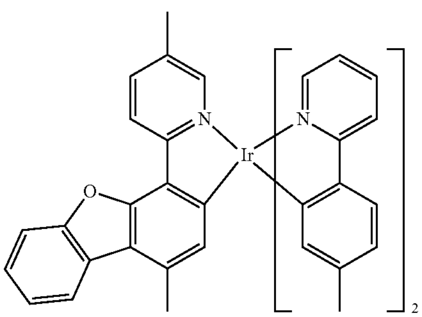
197
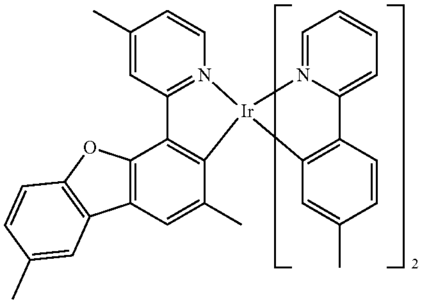
-continued
198
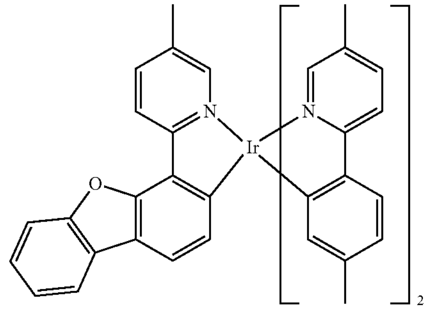
199
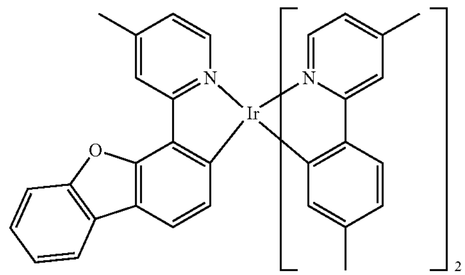
200
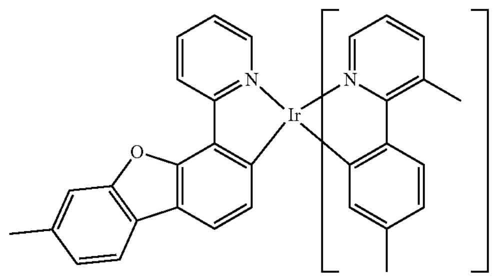
201
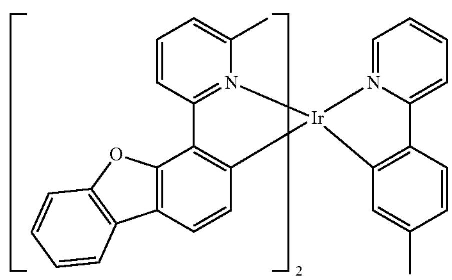
202
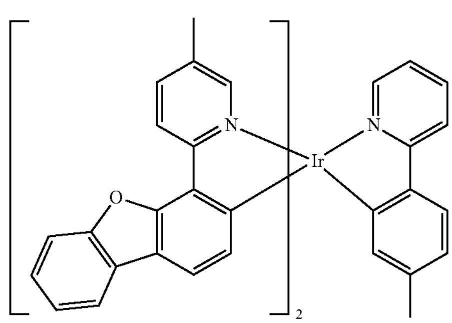

-continued
203
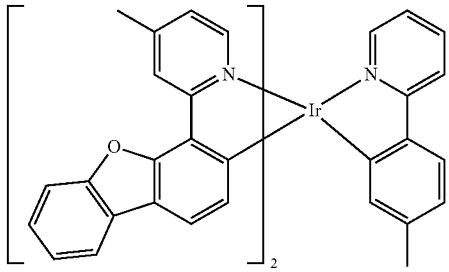
204
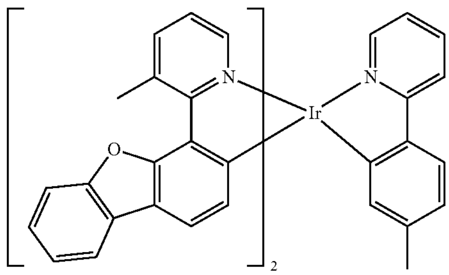
205
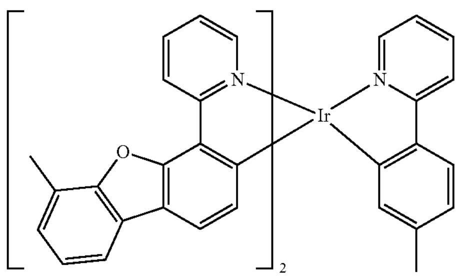
206
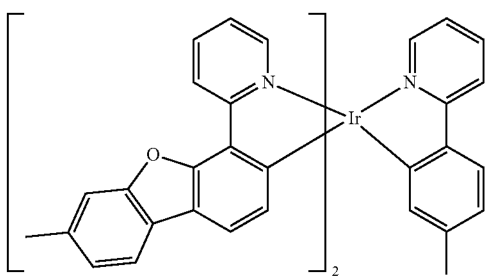
207
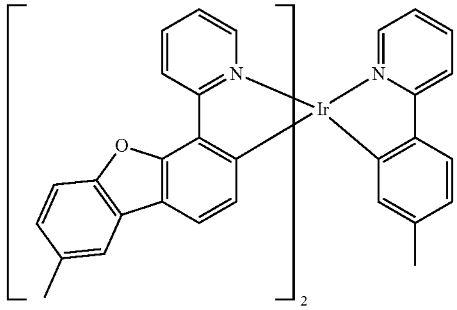
-continued
208
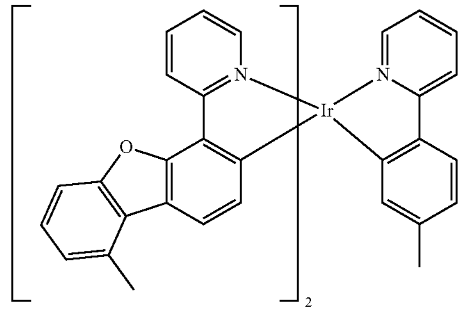
209
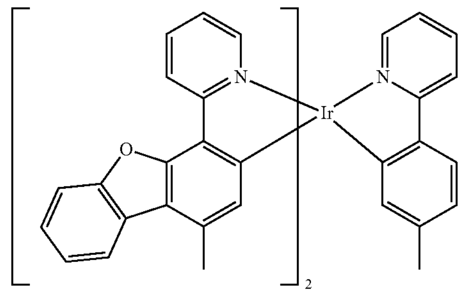
210
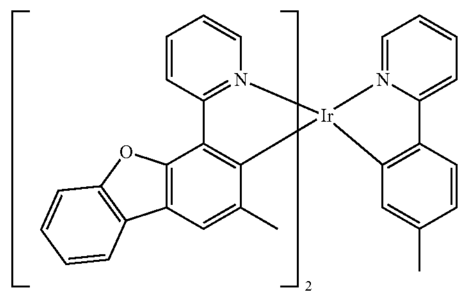
211
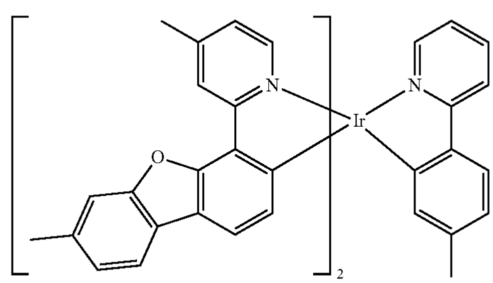
212
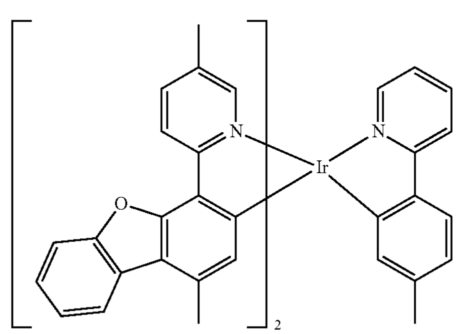

-continued
213
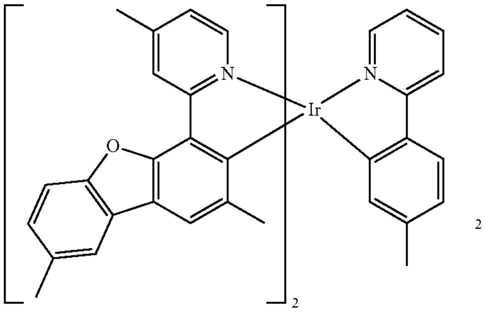
214
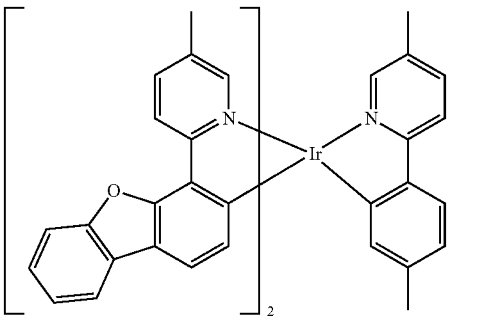
215
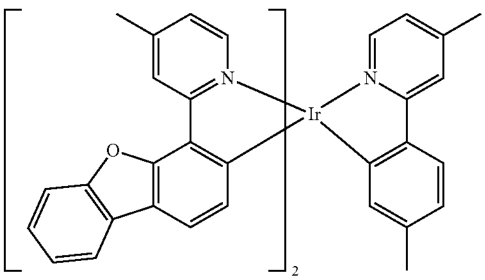
216
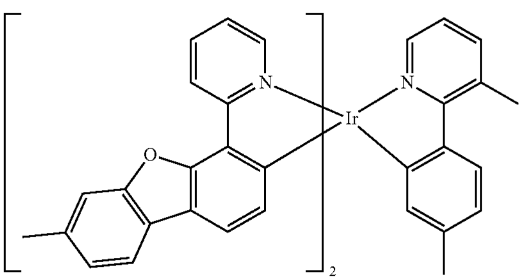
217
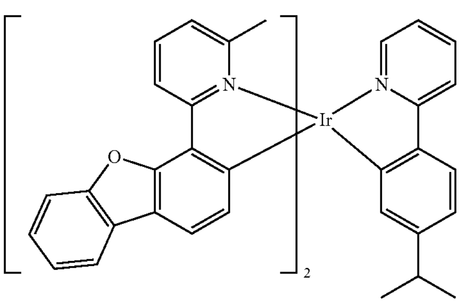
-continued
218
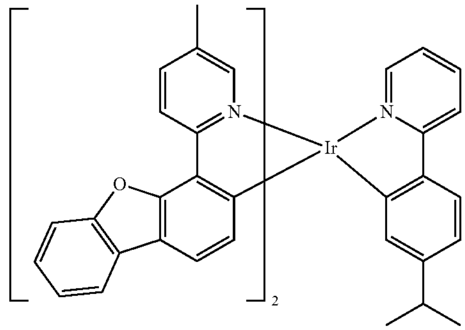
219
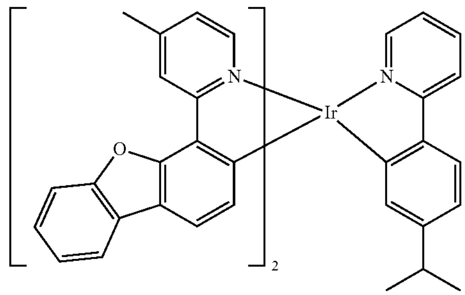
220
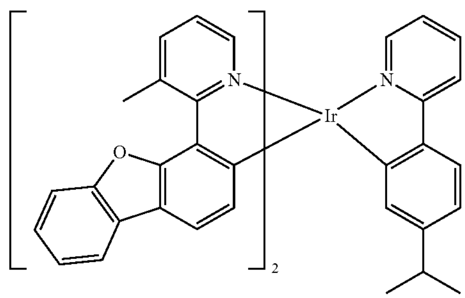
221
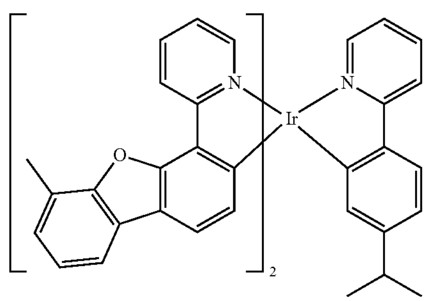
222
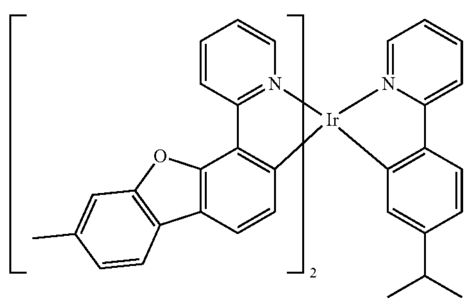

223
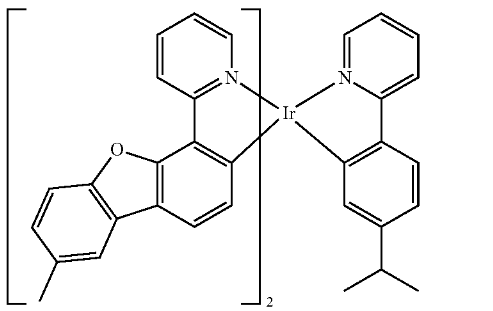
224
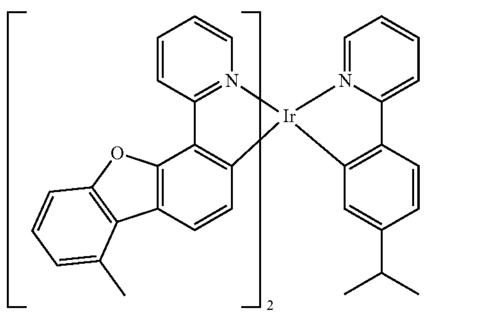
225
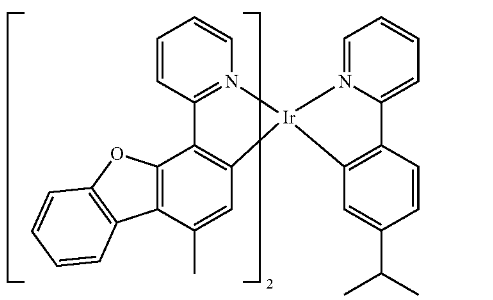
226
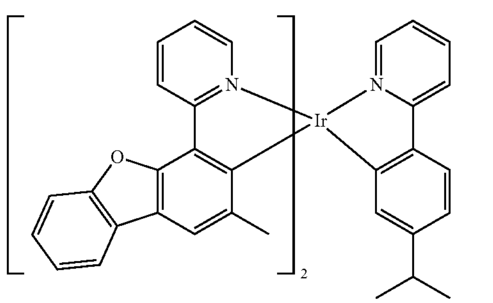
227
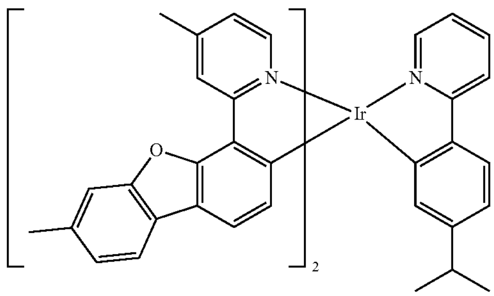
228
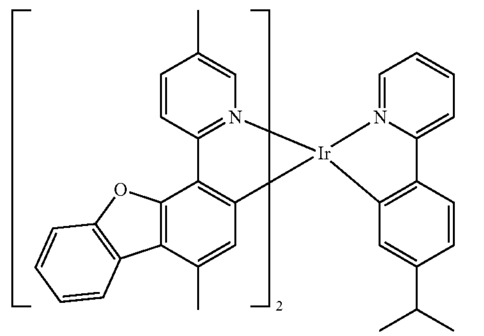
229
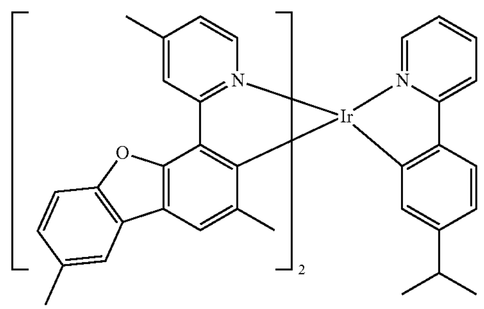
230
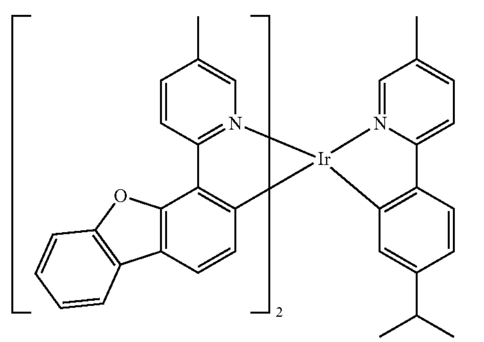
231
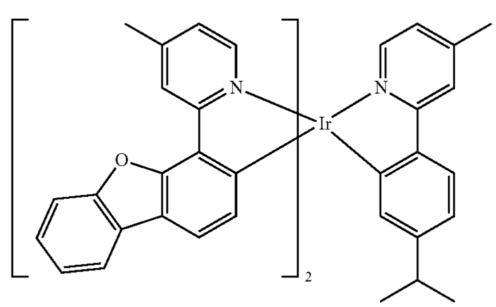
232
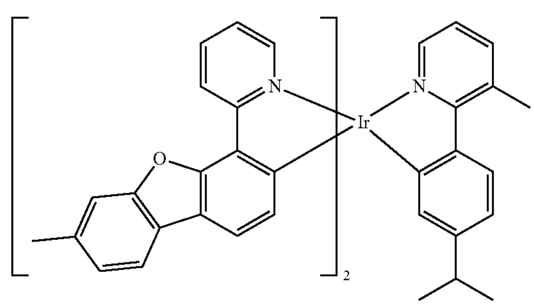

-continued
233
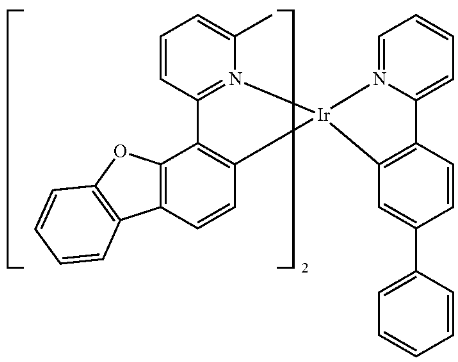
234
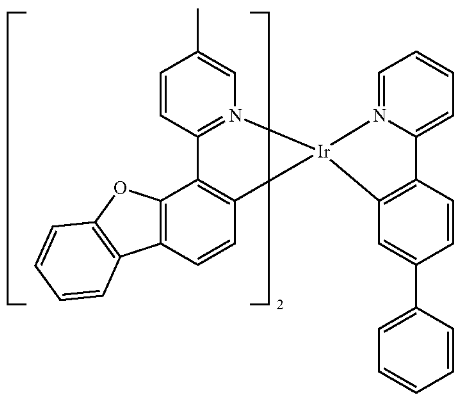
235
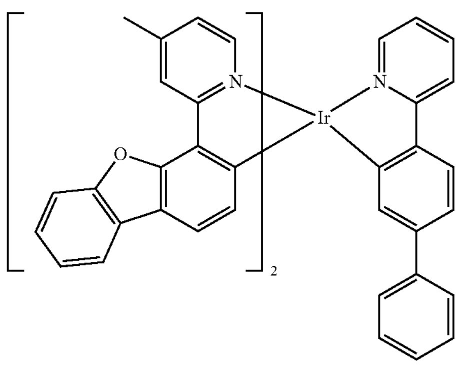
236
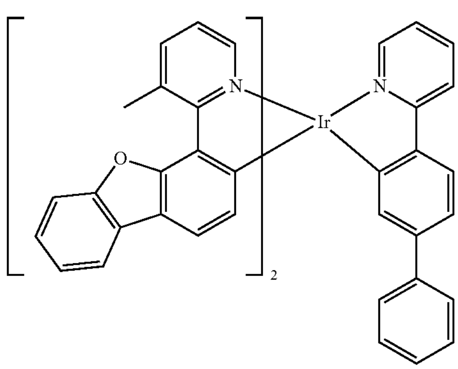
-continued
237
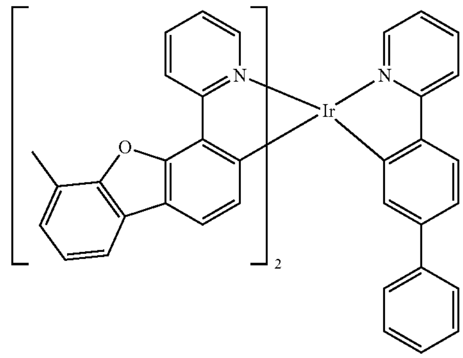
238
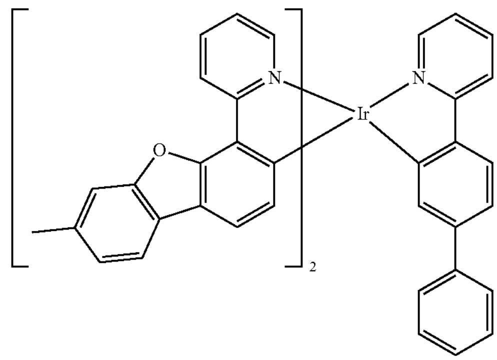
239
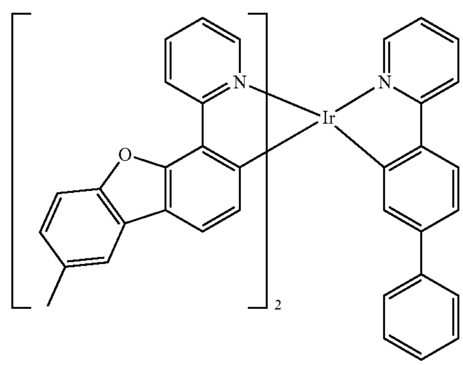
240
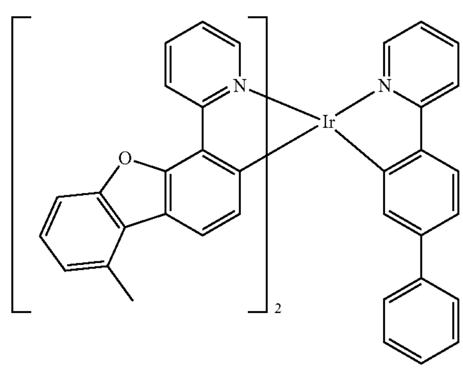

241
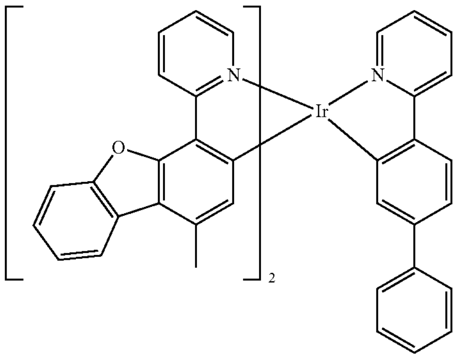
242
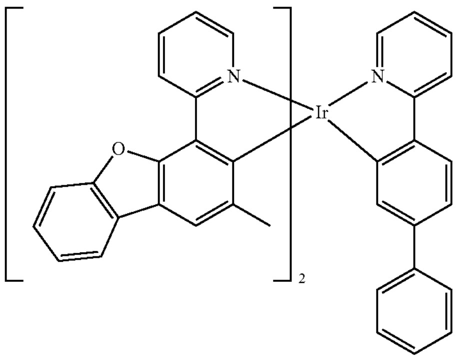
243
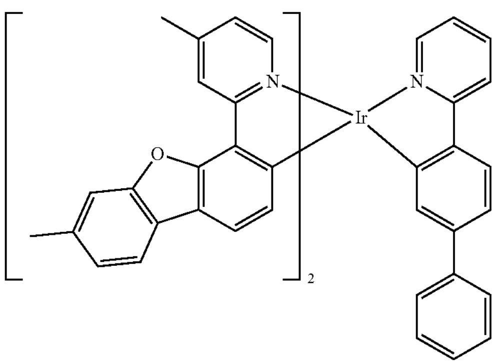
244
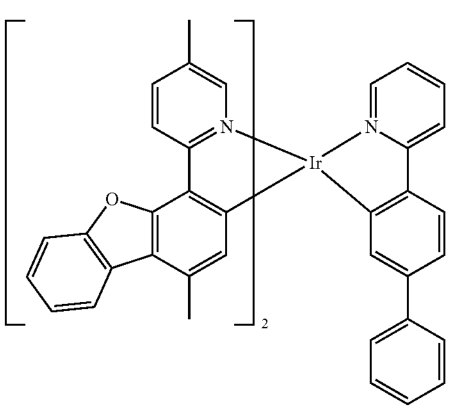
245
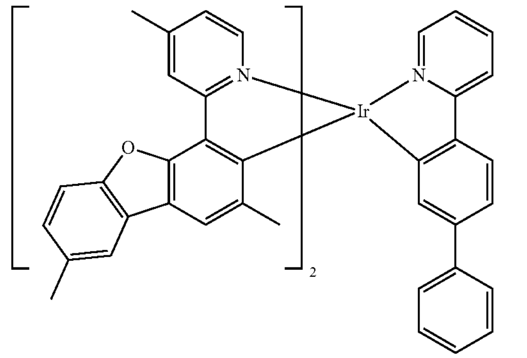
246
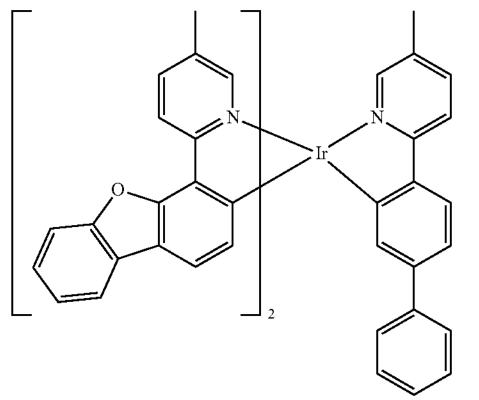
247
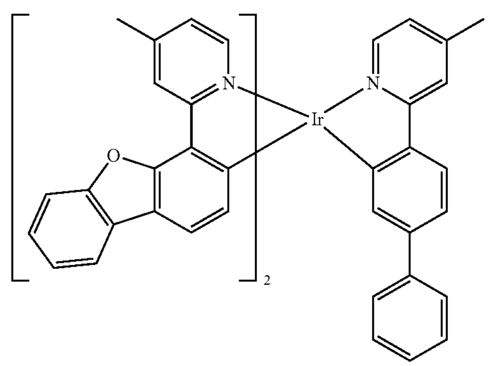
248
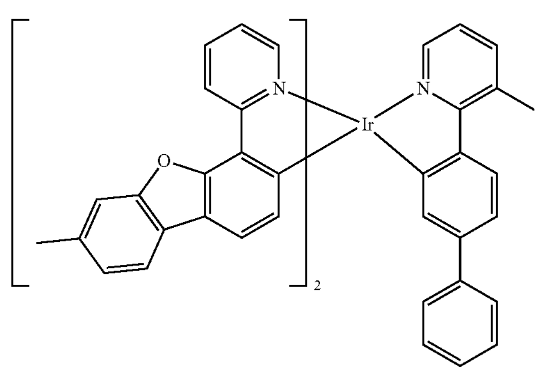

-continued
249
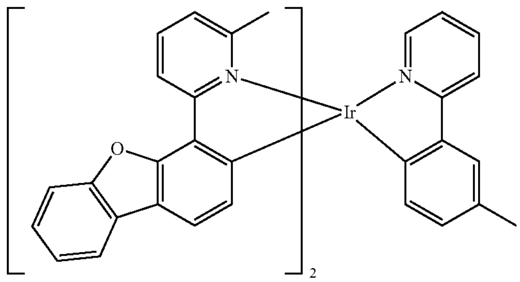
250
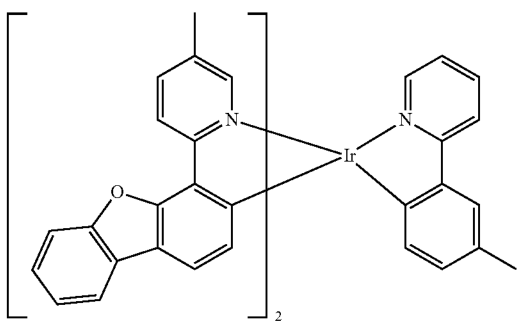
251
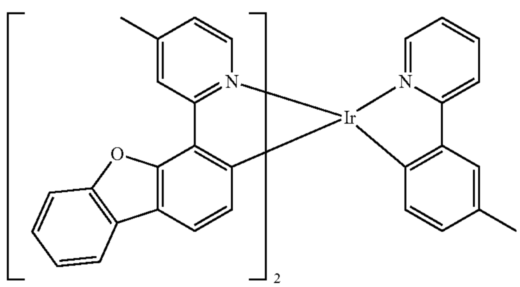
252
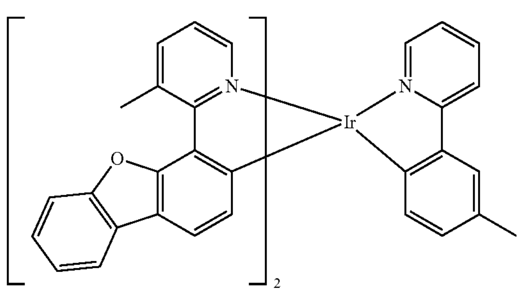
253
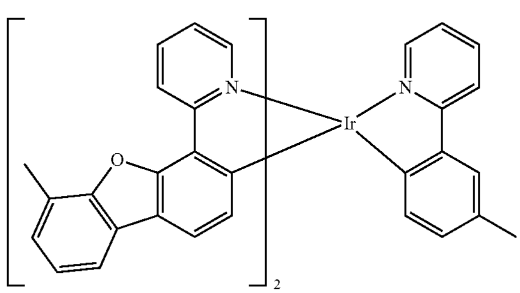
-continued
254
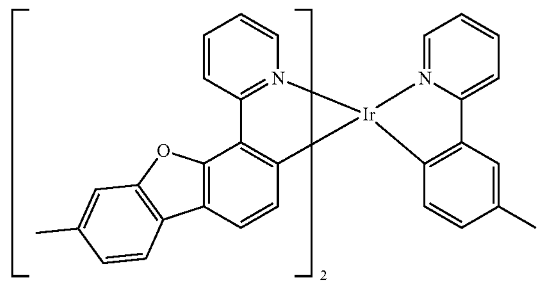
255
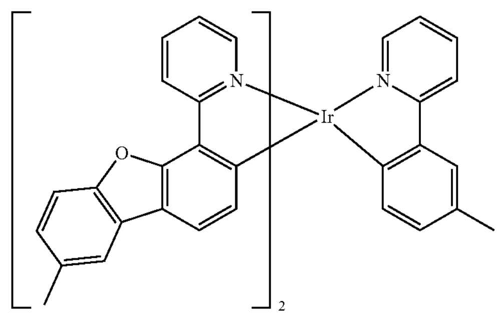
256
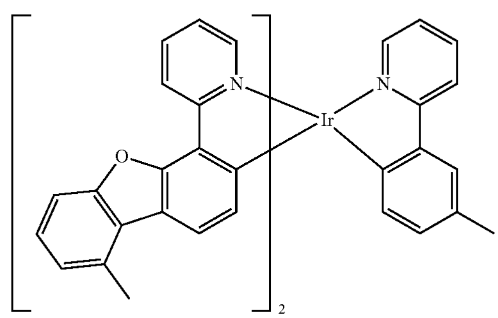
257
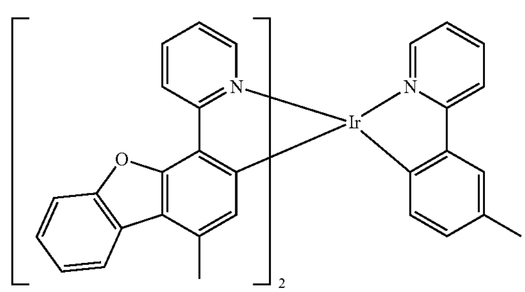
258
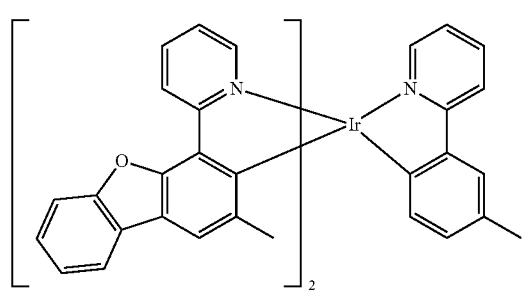

259
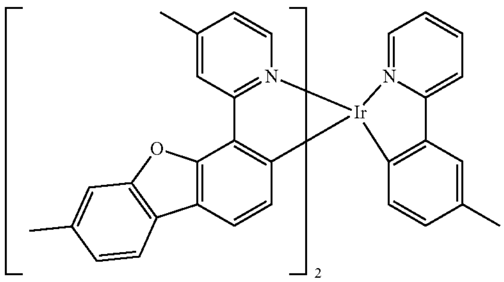
260
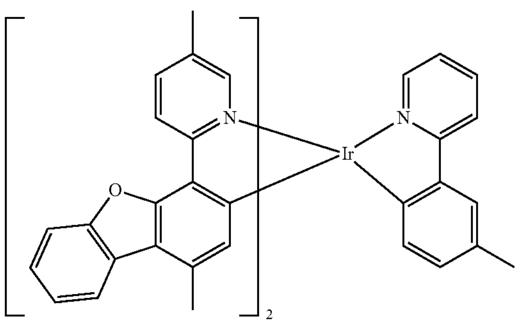
261
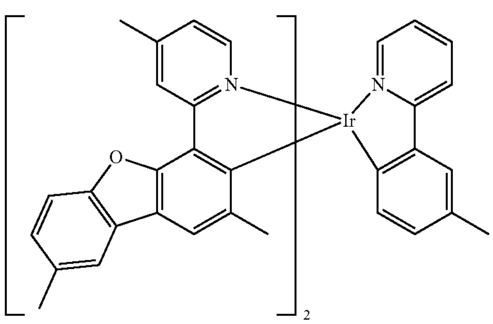
262
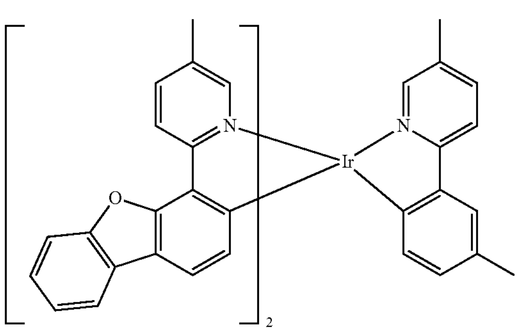
263
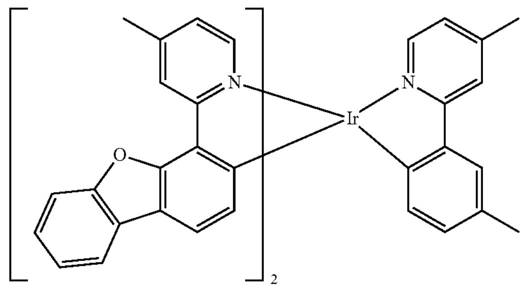
264
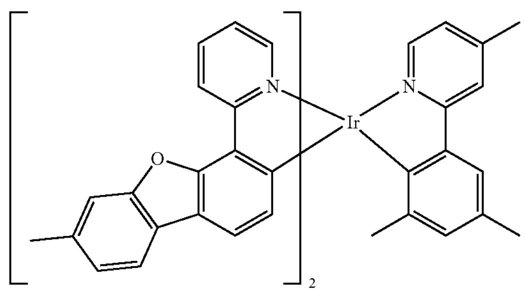
265
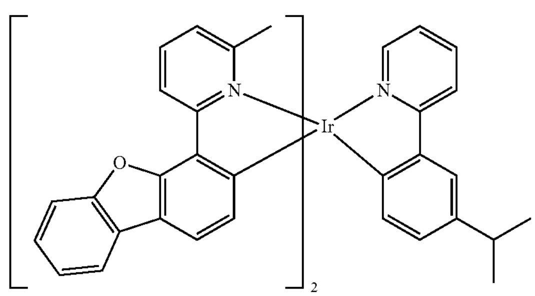
266
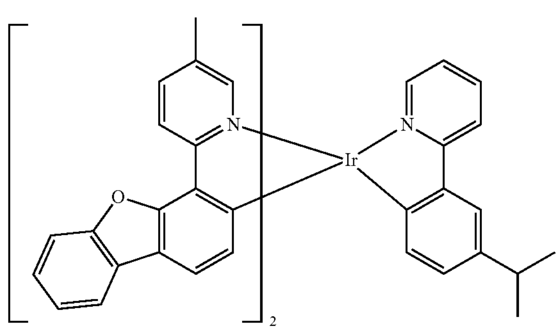
267
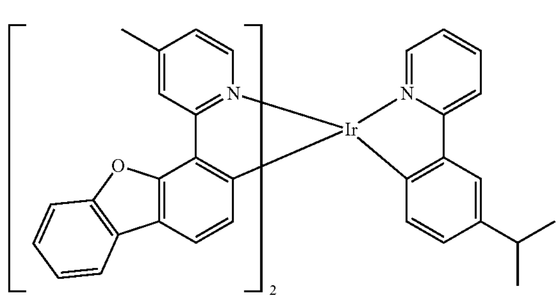

-continued
268
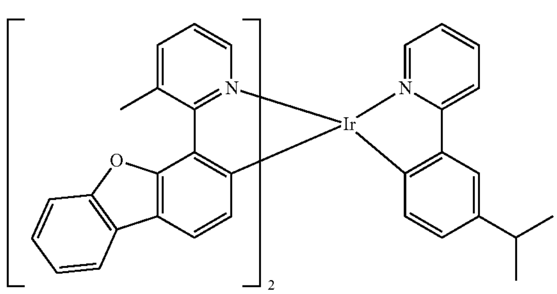
269
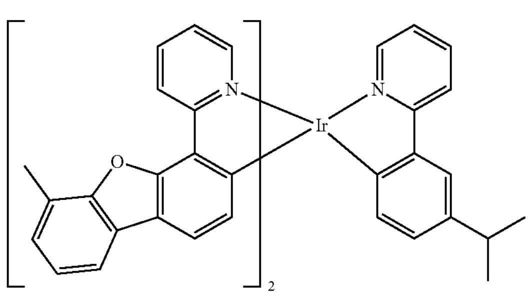
270
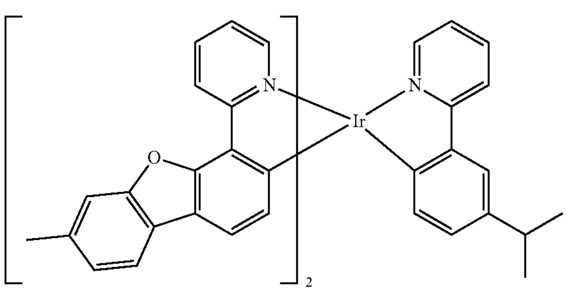
271
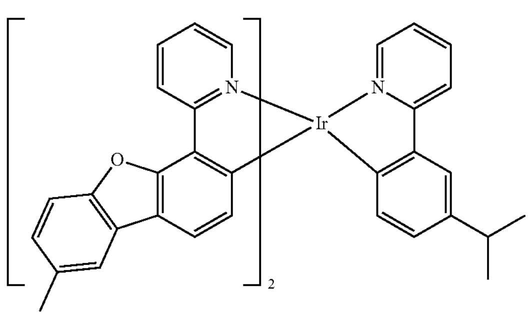
272
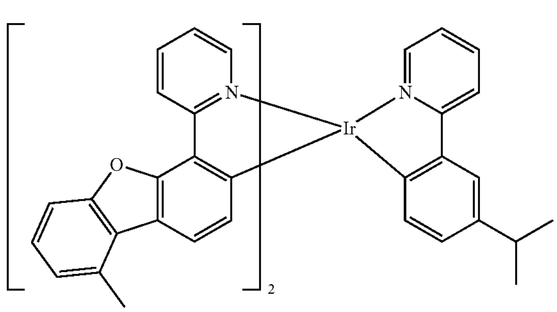
-continued
273
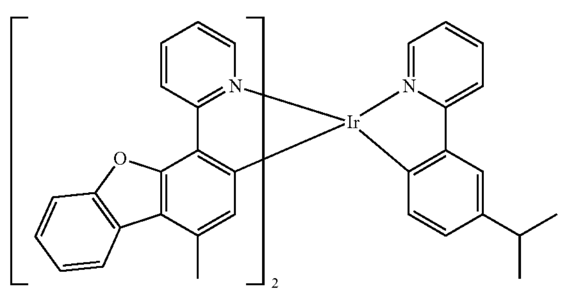
274
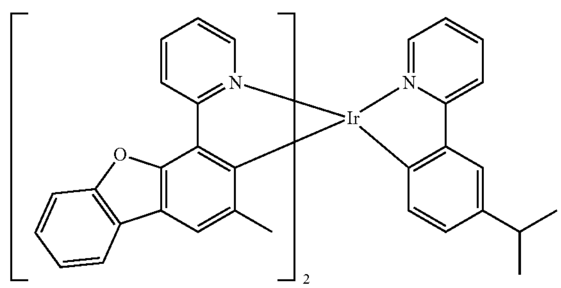
275
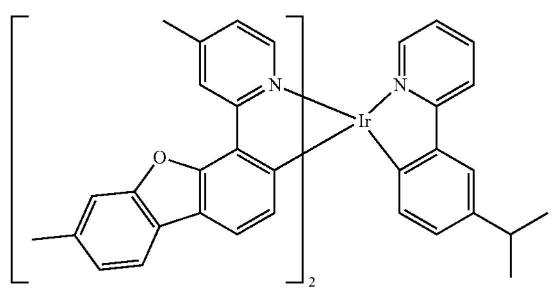
276
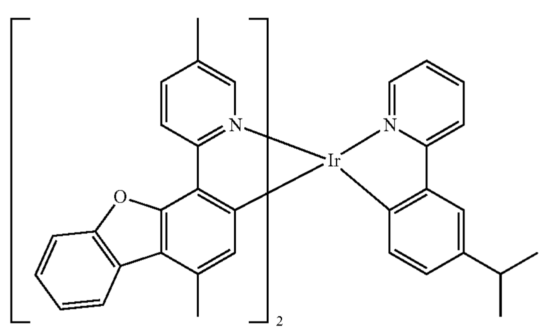
277
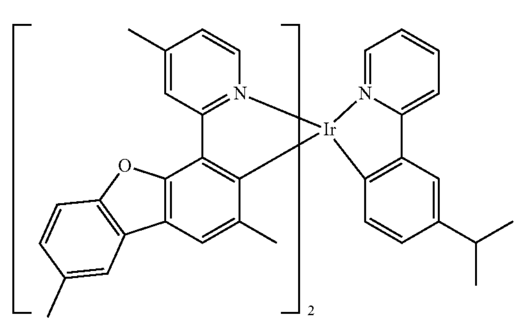

-continued
278
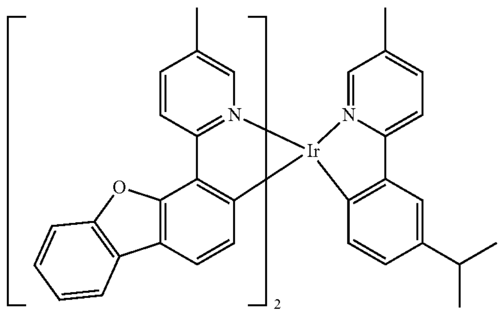
279
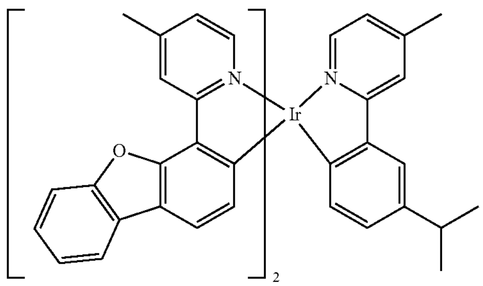
280
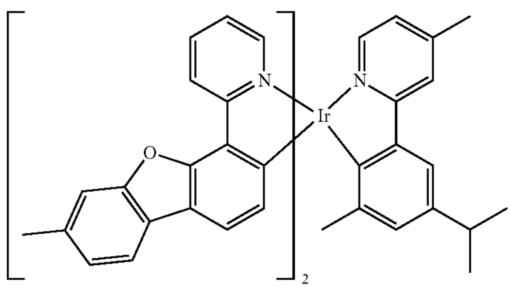
281
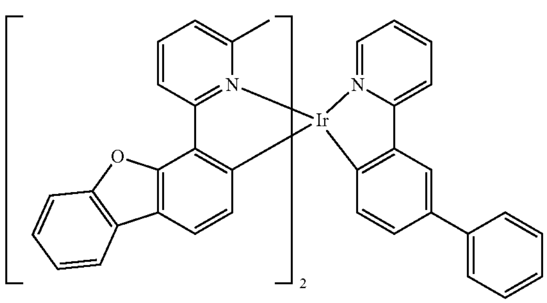
282
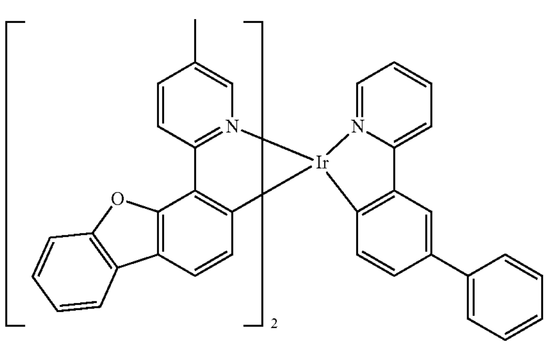
-continued
283
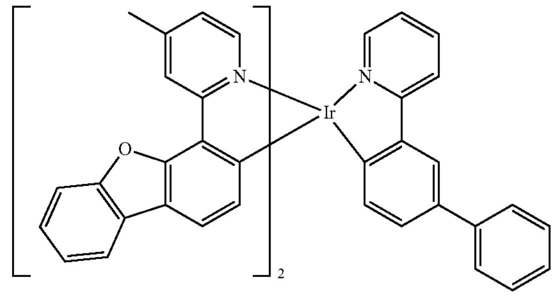
284
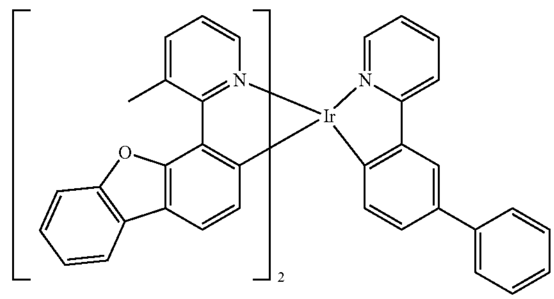
285
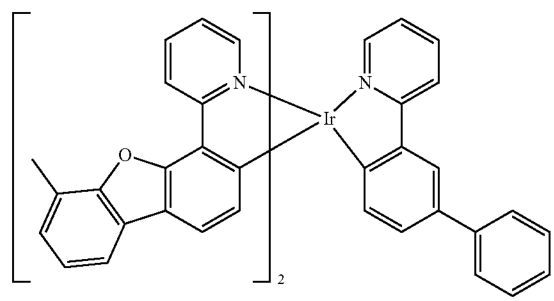
286
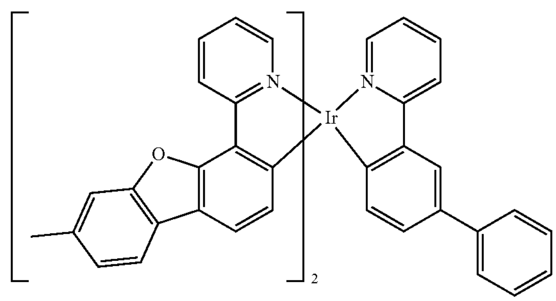
287
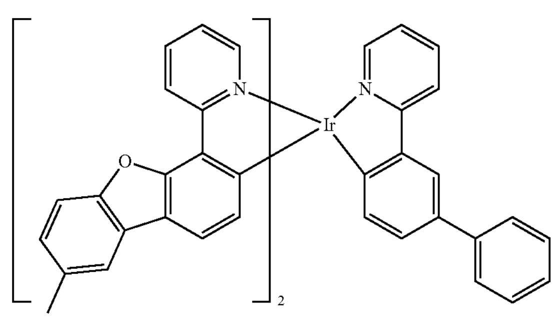

-continued

288

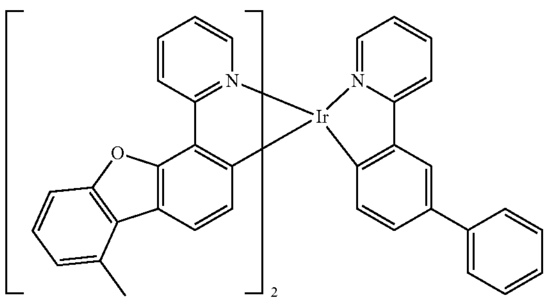

289

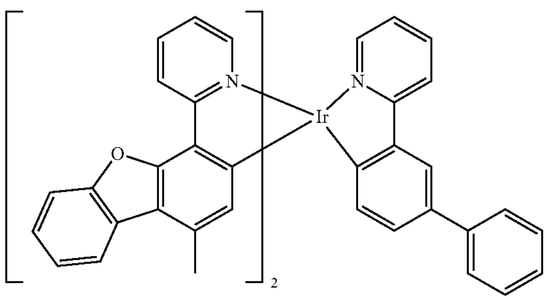

290

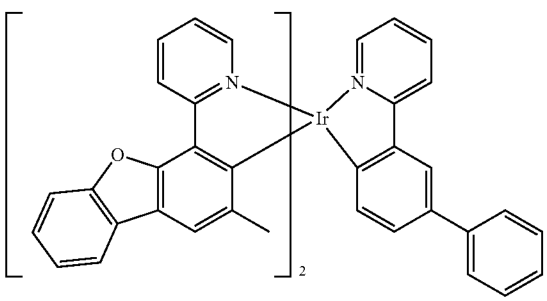

291

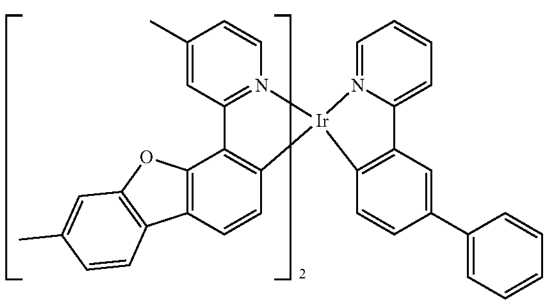

292

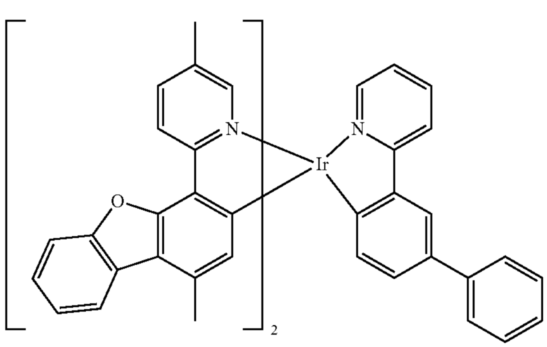

-continued

293

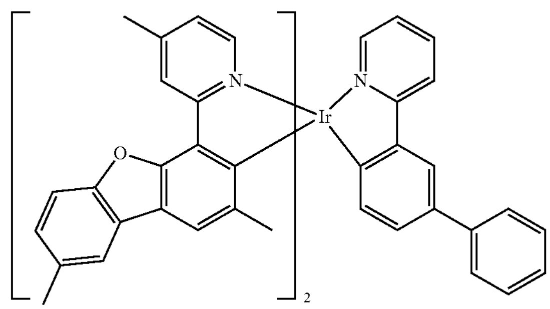

294

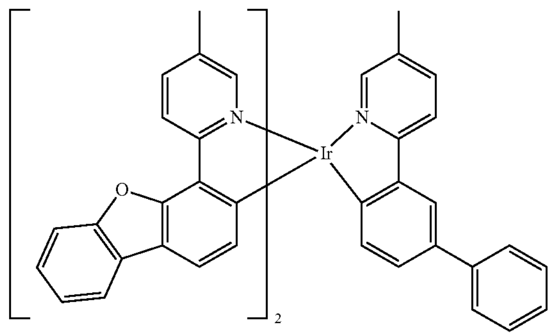

295

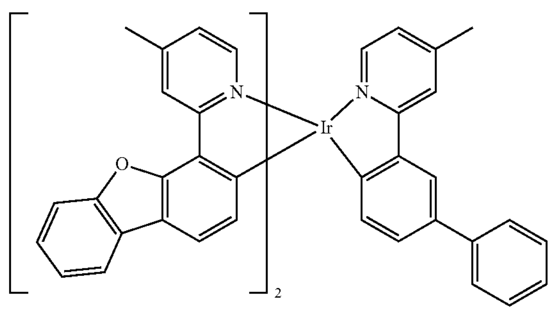

296

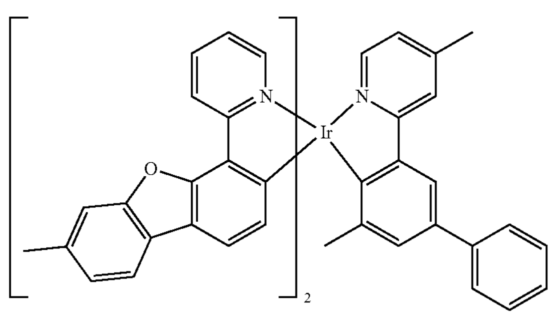

In the organometallic compound represented by Formula 1, $L_1$ may be a ligand represented by Formula 2, $L_2$ may be a ligand represented by Formula 3, wherein $R_1$, $R_2$, $R_{28}$, $R_{29}$, $Z_1$, and $Z_2$ in Formulae 2 and 3 may respectively be understood by referring to the descriptions of $R_1$, $R_2$, $R_{28}$, $R_{29}$, $Z_1$, and $Z_2$ provided herein and may each not be hydrogen.

In Formula 2, the sum of a1 and a2 may be 1 or greater. That is, the ligand represented by Formula 2 may be substituted with at least one $R_1$, $R_2$, or any combination thereof (in the present specification, $R_1$ and $R_2$ may not each be hydrogen). Accordingly, an electron withdrawing group and/or an electron donating group may be introduced into the ligand represented by Formula 2. Thus, the emission wavelength of light emitted from the organometallic compound represented by Formula 1 may be precisely controlled, and electrical matching with a host may be improved. Therefore, an electronic device, e.g., an organic light-emitting device, including the organometallic compound represented by Formula 1 may emit light having excellent colorimetric purity and show effects of reducing a driving voltage.

Further, d2 in Formula 3 may indicate the number of $Z_2$(s), and d2 may be an integer from 1 to 10. That is, since d2 is not 0, ring $CY_{12}$ in Formula 3 may be substituted with at least one $Z_2$ (in the present specification, $Z_2$ may not be hydrogen).

Accordingly, intermolecular interaction of the organometallic compound represented by Formula 1 may be reduced and result in reduction in intermolecular stacking of the organometallic compound represented by Formula 1. Thus, the organometallic compound may emit light which may prevent spectrum broadening and have an improved full width at half maximum (FWHM). Therefore, when the organometallic compound represented by Formula 1 is used, an electronic device (e.g., an organic light-emitting device) with high quality may be manufactured.

Further, in Formulae 2 and 3, a "saturated cyclic group (e.g., a non-aromatic cyclic group)" may not be included in the list of $R_1$, $R_2$, $R_{28}$, $R_{29}$, $Z_1$, and $Z_2$. That is, the ligand included in Formula 1 may not include a "saturated cyclic group (e.g., a non-aromatic cyclic group)" as a substituent. Upon deposition of the organometallic compound represented by Formula 1, various side effects (e.g., ligand exchanging) due to an increase in deposition temperature and molecular liquefaction at a high temperature may be prevented. Thus, when the organometallic compound represented by Formula 1 is used, process stability of an organic light-emitting device may be secured.

The HOMO energy level, LUMO energy level, energy band gap, and $S_1$ and $T_1$ energy levels of some of the organometallic compounds represented by Formula 1 were evaluated by using Gaussian 09 that performs molecular structure optimizations according to density functional theory (DFT) at a degree of B3LYP. The results thereof are shown in Table 1.

TABLE 1

| Compound No. | HOMO (eV) | LUMO (eV) | Energy band gap (eV) | $S_1$ energy level (eV) | $T_1$ energy level (eV) |
|---|---|---|---|---|---|
| 1 | −4.832 | −1.231 | 3.601 | 2.831 | 2.504 |
| 2 | −4.716 | −1.165 | 3.551 | 2.835 | 2.485 |
| 3 | −4.677 | −1.111 | 2.566 | 2.868 | 2.508 |
| 4 | −4.663 | −1.118 | 3.545 | 2.807 | 2.477 |
| 5 | −4.732 | −1.168 | 3.564 | 2.844 | 2.484 |
| 6 | −4.700 | −1.158 | 3.542 | 2.818 | 2.475 |
| 7 | −4.772 | −1.248 | 3.524 | 2.826 | 2.489 |
| 8 | −4.791 | −1.256 | 3.536 | 2.837 | 2.496 |
| 9 | −4.673 | −1.196 | 3.477 | 2.812 | 2.532 |

Referring to the results of Table 1, the organometallic compound represented by Formula 1 was found to have suitable electrical characteristics for use as a dopant in an electronic device, e.g., an organic light-emitting device.

A method of synthesizing the organometallic compound represented by Formula 1 may be apparent to one of ordinary skill in the art by referring to Synthesis Examples provided herein.

The organometallic compound represented by Formula 1 may be suitable for use in an organic layer of an organic light-emitting device, for example, as a dopant in an emission layer of the organic layer. Thus, according to another aspect, there is provided an organic light-emitting device that may include a first electrode; a second electrode; and an organic layer disposed between the first electrode and the second electrode and including an emission layer, the organic layer including at least one organometallic compound represented by Formula 1.

Since the organic light-emitting device has an organic layer including the organometallic compound represented by Formula 1, the organic light-emitting device may have a low driving voltage, high external quantum efficiency, long lifespan, and low roll-off ratio.

The organometallic compound represented by Formula 1 may be used with a pair of electrodes of an organic light-emitting device. For example, the organometallic compound represented by Formula 1 may be included in the emission layer. In this embodiment, the organometallic compound may serve as a dopant and the emission layer may further include a host (that is, an amount of the organometallic compound represented by Formula 1 may be smaller than that of the host). The emission layer may emit red light or green light, e.g., red light or green light having a maximum emission wavelength of about 500 nanometers (nm) or longer, e.g., about 500 nm to about 650 nm.

As used herein, the expression the "(organic layer) includes at least one organometallic compound" may be construed as meaning the "(organic layer) may include one organometallic compound of Formula 1 or two different organometallic compounds of Formula 1".

For example, Compound 1 may only be included in the organic layer as an organometallic compound. In this embodiment, Compound 1 may be included in the emission layer of the organic light-emitting device. In some embodiments, Compounds 1 and 2 may be included in the organic layer as organometallic compounds. In this embodiment, Compounds 1 and 2 may both be included in the same layer (for example, both Compounds 1 and 2 may be included in the emission layer).

The first electrode may be an anode, which is a hole injection electrode, and the second electrode may be a cathode, which is an electron injection electrode. In some embodiments, the first electrode may be a cathode, which is an electron injection electrode, and the second electrode may be an anode, which is a hole injection electrode.

For example, in the organic light-emitting device, the first electrode may be an anode, the second electrode may be a cathode, and the organic layer may further include a hole transport region disposed between the first electrode and the emission layer and an electron transport region disposed between the emission layer and the second electrode, wherein the hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

The term "organic layer" as used herein refers to a single and/or a plurality of layers between the first electrode and the second electrode in an organic light-emitting device. The "organic layer" may include not only organic compounds but also organometallic complexes including metals.

The FIGURE illustrates a schematic cross-sectional view of an organic light-emitting device 10 according to an embodiment. Hereinafter, a structure of an organic light-emitting device according to one or more embodiments and a method of manufacturing the organic light-emitting device will be described with reference to the FIGURE. The organic light-emitting device 10 may include a first electrode 11, an organic layer 15, and a second electrode 19, which may be sequentially layered in this stated order.

A substrate may be additionally disposed under the first electrode 11 or on the second electrode 19. The substrate may be a conventional substrate used in organic light-emitting devices, e.g., a glass substrate or a transparent plastic substrate, each having excellent mechanical strength, thermal stability, transparency, surface smoothness, ease of handling, and water repellency.

The first electrode 11 may be formed by depositing or sputtering, onto the substrate, a material for forming the first electrode 11. The first electrode 11 may be an anode. The material for forming the first electrode 11 may be selected from materials with a high work function for easy hole injection. The first electrode 11 may be a reflective electrode, a semi-transmissive electrode, or a transmissive electrode. The material for forming the first electrode 11 may be selected from indium tin oxide (ITO), indium zinc oxide (IZO), tin oxide ($SnO_2$), and zinc oxide (ZnO). In some embodiments, the material for forming the first electrode 11 may be a metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including a plurality of layers. In some embodiments, the first electrode 11 may have a triple-layered structure of ITO/Ag/ITO, but embodiments are not limited thereto.

The organic layer 15 may be on the first electrode 11.

The organic layer 15 may include a hole transport region, an emission layer, and an electron transport region.

The hole transport region may be between the first electrode 11 and the emission layer.

The hole transport region may include a hole injection layer, a hole transport layer, an electron blocking layer, a buffer layer, or a combination thereof.

The hole transport region may include a hole injection layer only or a hole transport layer only. In some embodiments, the hole transport region may include a hole injection layer and a hole transport layer which are sequentially stacked on the first electrode 11. In some embodiments, the hole transport region may include a hole injection layer, a hole transport layer, and an electron blocking layer, which are sequentially stacked on the first electrode 11.

When the hole transport region includes a hole injection layer, the hole injection layer may be formed on the first electrode 11 by using one or more suitable methods, such as vacuum deposition, spin coating, casting, and Langmuir-Blodgett (LB) deposition.

When a hole injection layer is formed by vacuum deposition, for example, the vacuum deposition may be performed at a deposition temperature in a range of about 100° C. to about 500° C., at a vacuum pressure in a range of about $10^{-8}$ torr to about $10^{-3}$ torr, and at a deposition rate in a range of about 0.01 Angstroms per second (Å/sec) to about 100 Å/sec, though the conditions may vary depending on a compound that is used as a hole injection material and a structure and thermal properties of a desired hole injection layer, but conditions for the vacuum deposition are not limited thereto.

When a hole injection layer is formed by spin coating, the spin coating may be performed at a coating rate in a range of about 2,000 revolutions per minute (rpm) to about 5,000 rpm, and at a temperature in a range of about 80° C. to 200° C., to facilitate removal of a solvent after the spin coating, though the conditions may vary depending on a compound that is used as a hole injection material and a structure and thermal properties of a desired hole injection layer, but conditions for the spin coating are not limited thereto.

The conditions for forming a hole transport layer and an electron blocking layer may be inferred from the conditions for forming the hole injection layer.

The hole transport region may include m-MTDATA, TDATA, 2-TNATA, NPB, p-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor-sulfonic acid (PANI/CSA), polyaniline/poly(4-styrene sulfonate) (PANI/PSS), a compound represented by Formula 201, a compound represented by Formula 202, or any combination thereof:

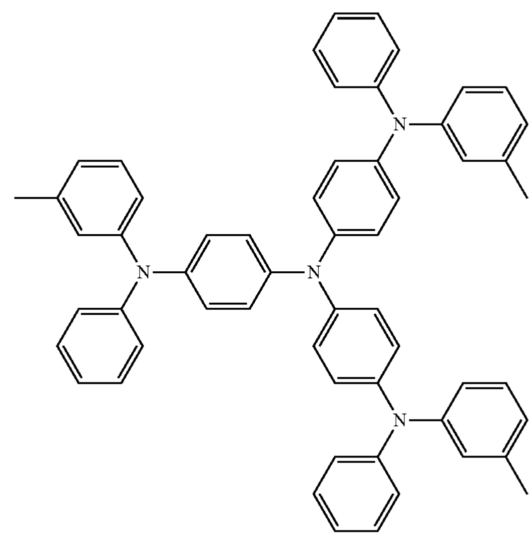

m-MTDATA

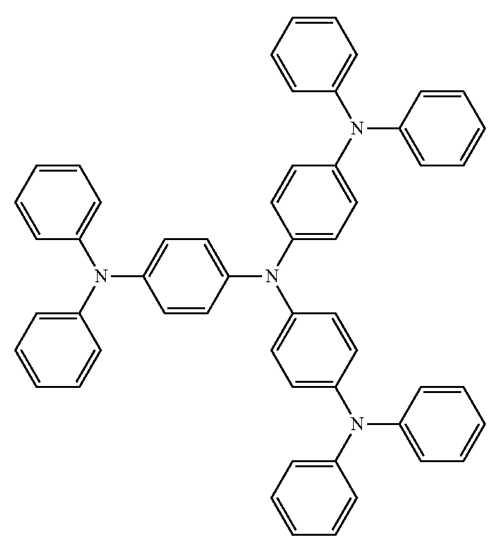

TDATA

-continued
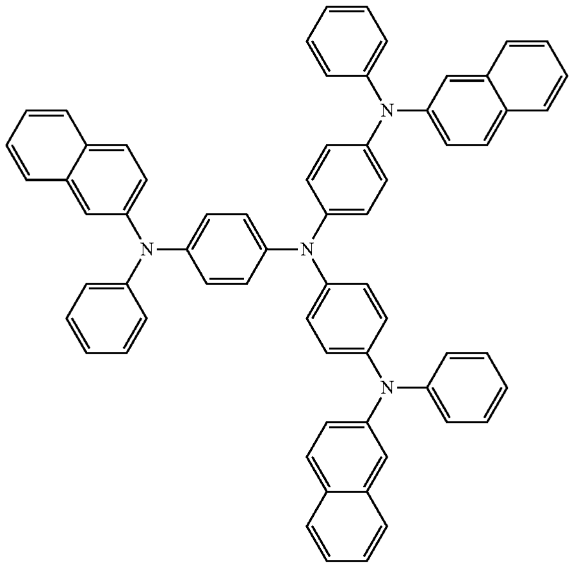
2-TNATA
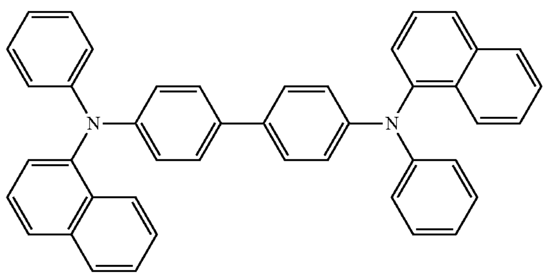
NPB
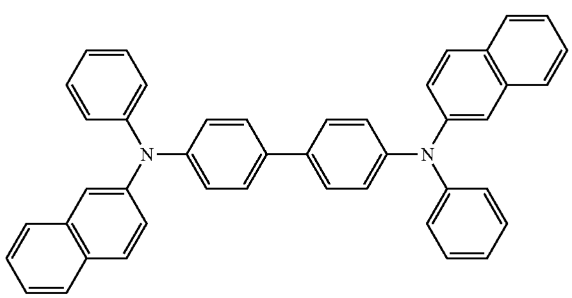
β-NPB
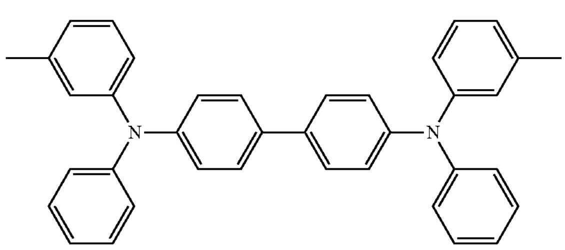
TPD
-continued
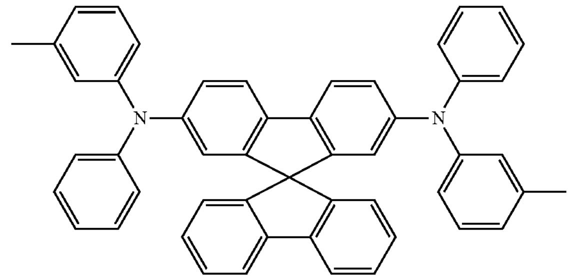
Spiro-TPD
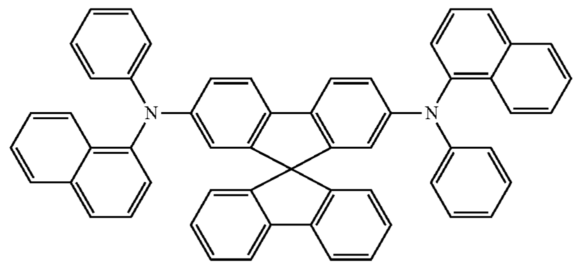
Spiro-NPB
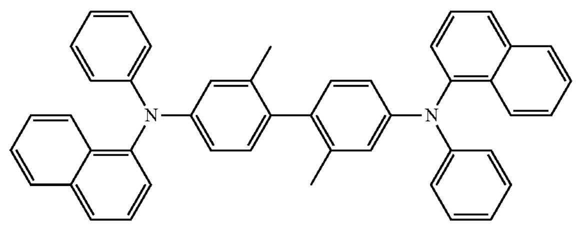
methylated NPB
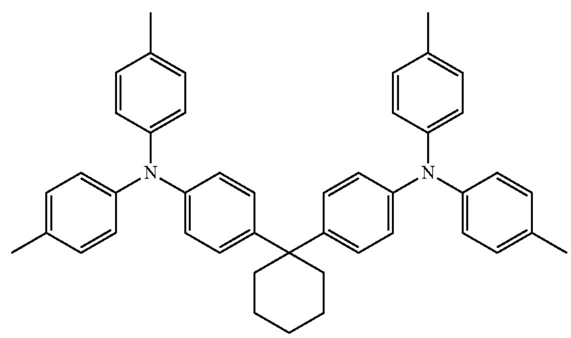
TAPC
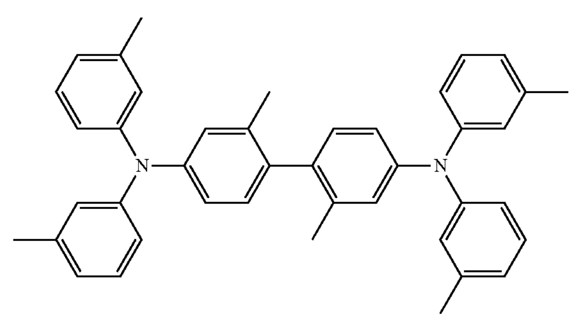
HMTPD -continued Formula 201

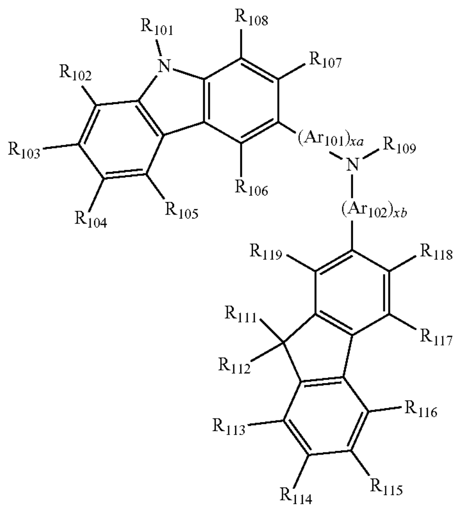

Formula 202

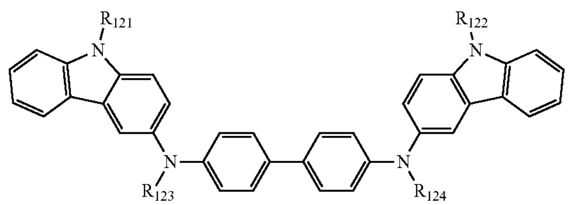

In Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

In Formula 201, xa and xb may each independently be an integer from 0 to 5. In some embodiments, xa and xb may each independently be an integer from 0 to 2. In some embodiments, xa may be 1, and xb may be 0, but embodiments are not limited thereto.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (e.g., a methyl group, an ethyl group, a propyl group, a butyl group, pentyl group, or a hexyl group), or a $C_1$-$C_{10}$ alkoxy group (e.g., a methoxy group, an ethoxy group, a propoxy group, a butoxy group, or a pentoxy group);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof.

In Formula 201, $R_{109}$ may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In some embodiments, the compound represented by Formula 201 may be represented by Formula 201A:

Formula 201A

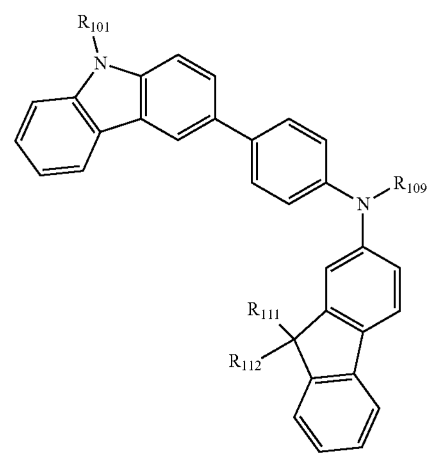

In Formula 201A, $R_{101}$, $R_{111}$, $R_{112}$, and $R_{109}$ may respectively be understood by referring to the descriptions of $R_{101}$, $R_{111}$, $R_{112}$, and $R_{109}$ provided herein.

In some embodiments, the hole transport region may include one of Compounds HT1 to HT20 or any combination thereof:
HT1
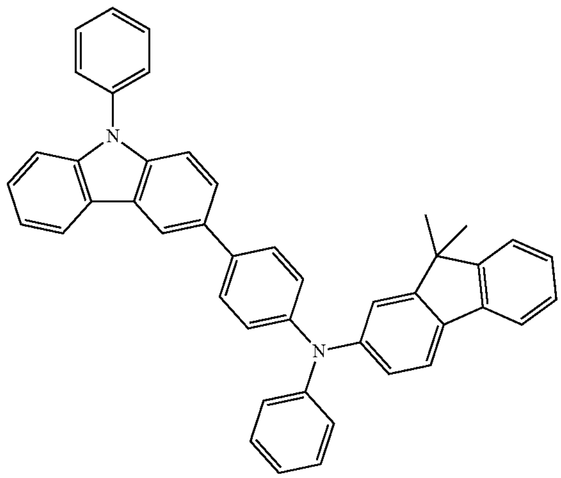
HT2
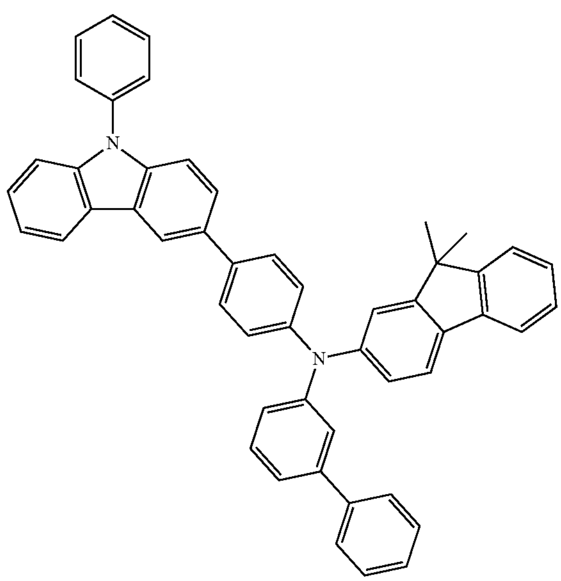
-continued
HT3
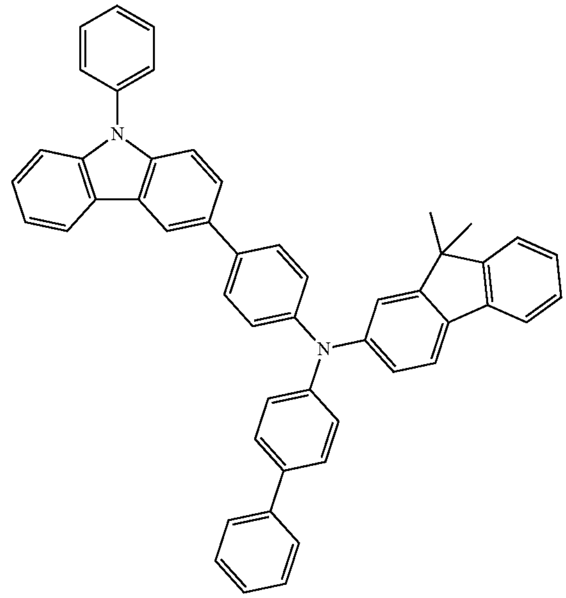
HT4
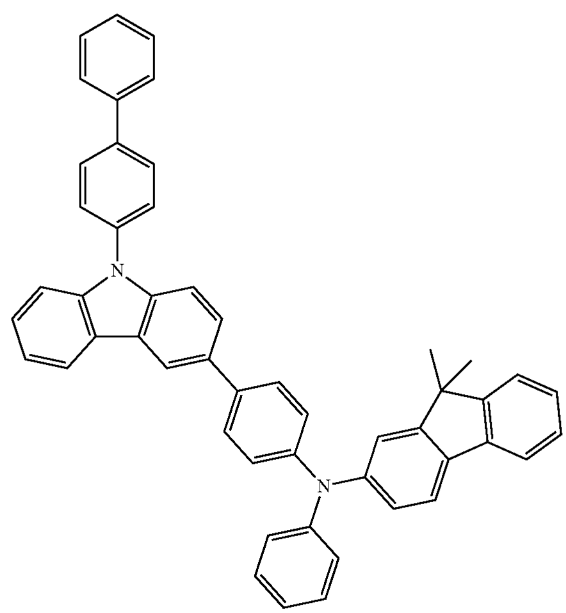

HT5
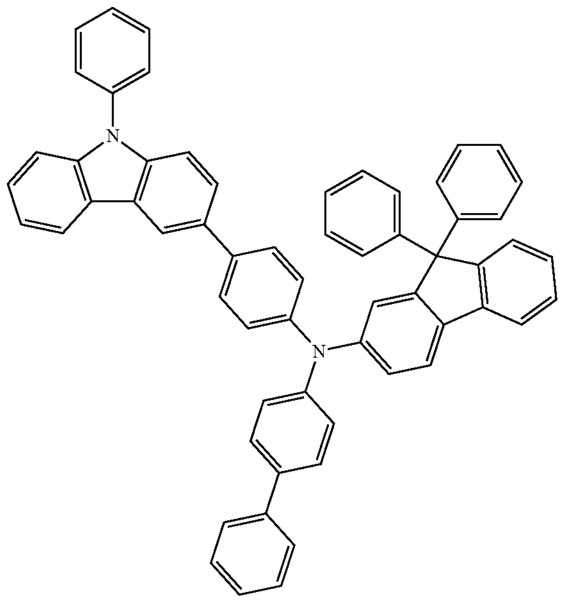
HT6
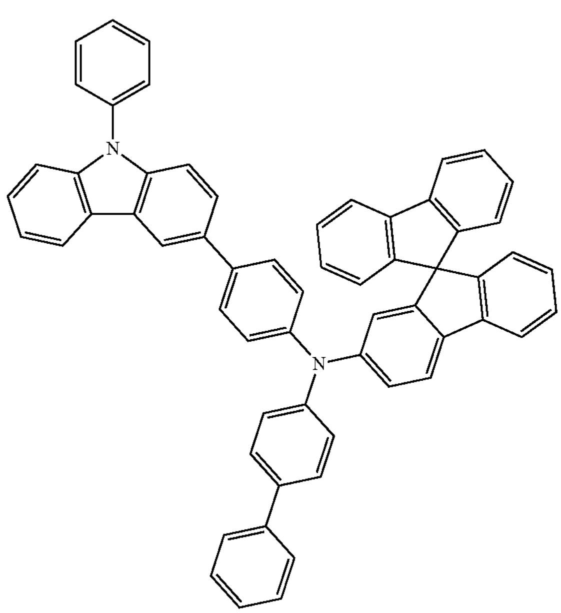
HT7
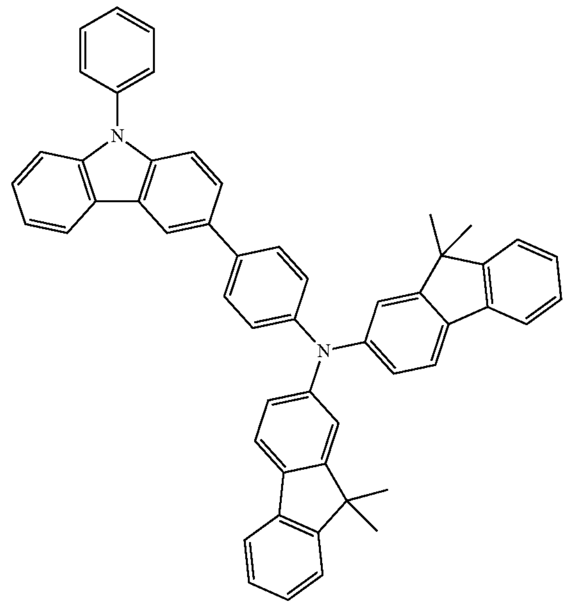
HT8
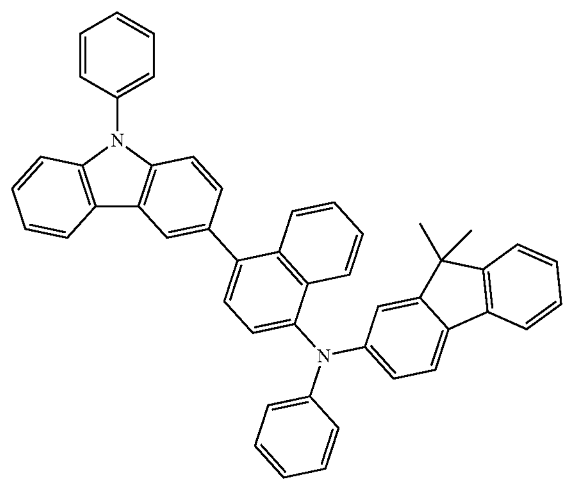
HT9
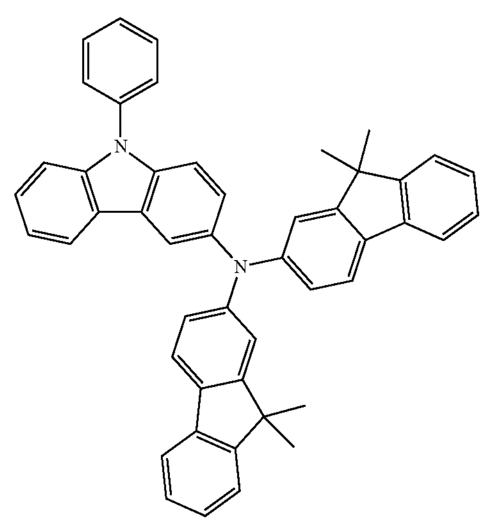

HT10
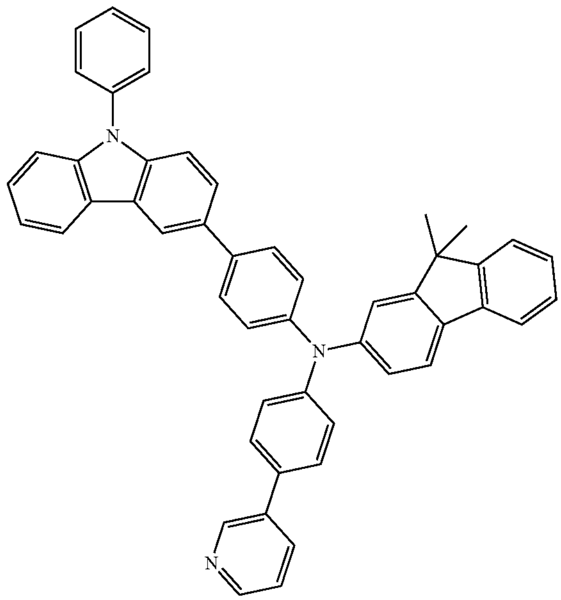
HT11
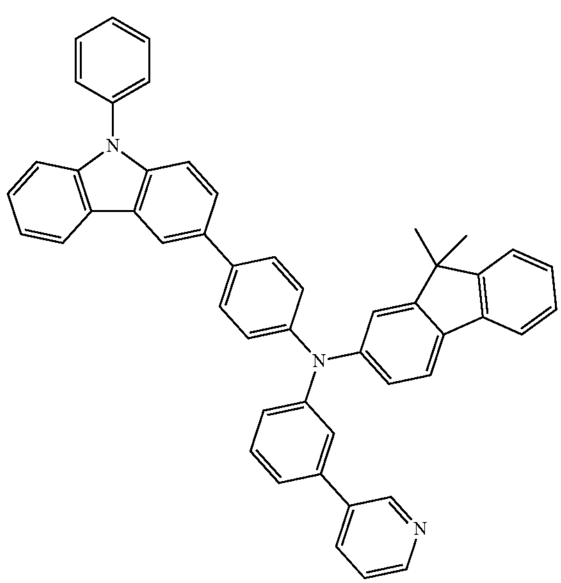
HT12
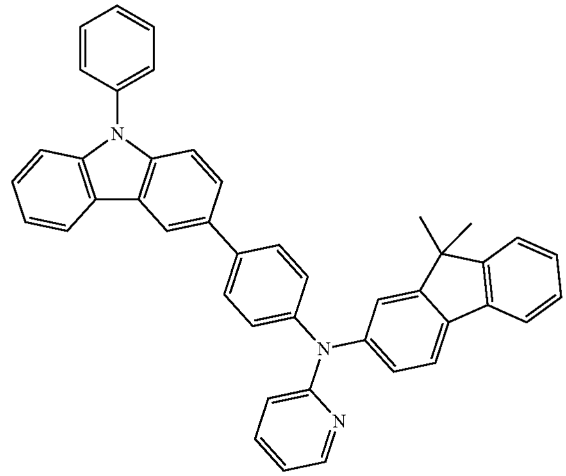
HT13
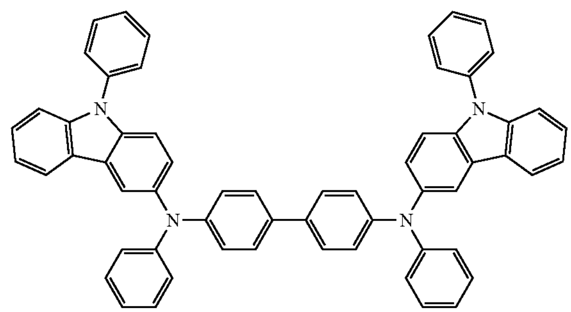
HT14
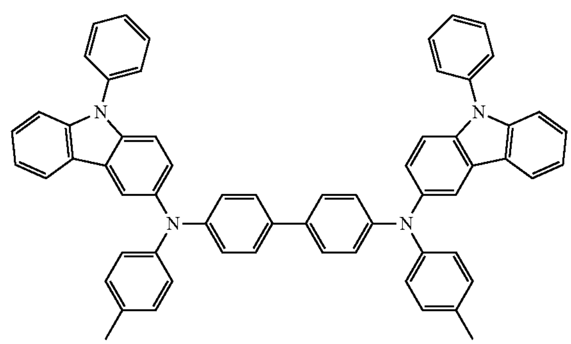
HT15
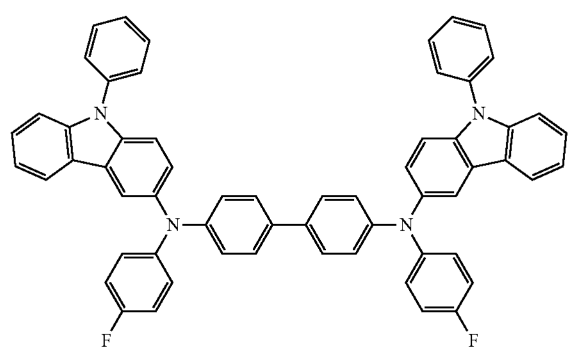

-continued

HT16

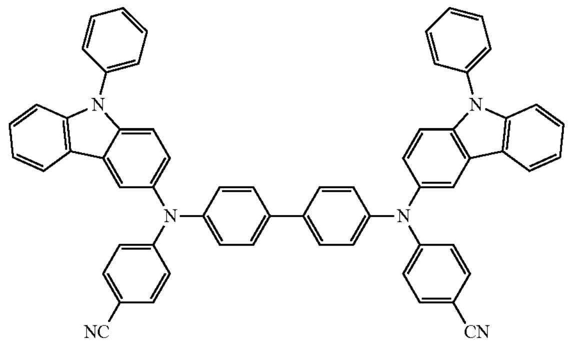

HT17

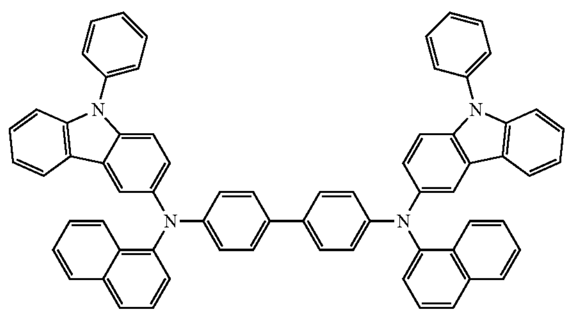

HT18

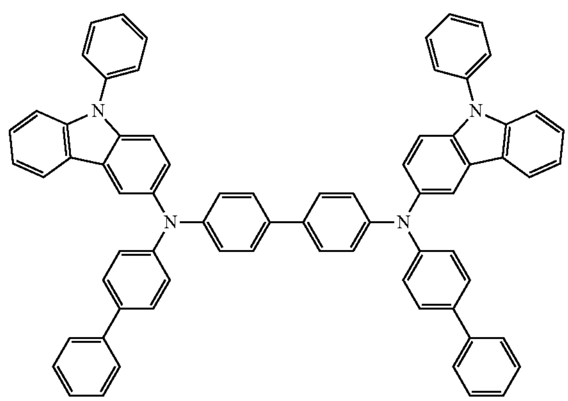

HT19

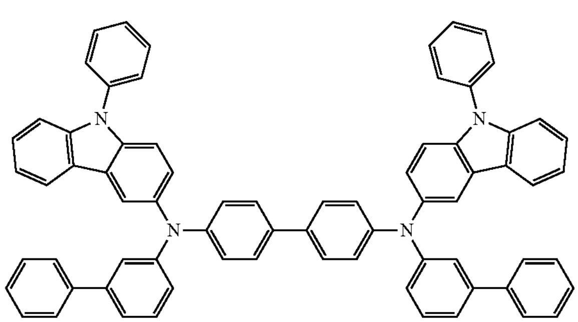

-continued

HT20

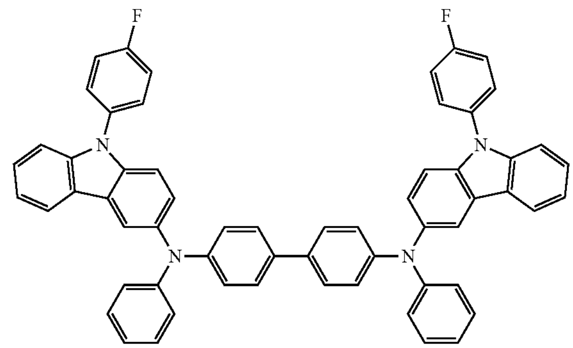

The thickness of the hole transport region may be in a range of about 100 (Angstroms) Å to about 10,000 Å, and in some embodiments, about 100 Å to about 1,000 Å. When the hole transport region includes at least one selected from a hole injection layer and a hole transport layer, the thickness of the hole injection layer may be in a range of about 100 Å to about 10,000 Å, and in some embodiments, about 100 Å to about 1,000 Å, and the thickness of the hole transport layer may be in a range of about 50 Å to about 2,000 Å, and in some embodiments, about 100 Å to about 1,500 Å. When the thicknesses of the hole transport region, the hole injection layer, and the hole transport layer are within any of these ranges, excellent hole transport characteristics may be obtained without a substantial increase in driving voltage.

The hole transport region may include a charge generating material as well as the aforementioned materials, to improve conductive properties of the hole transport region. The charge generating material may be substantially homogeneously or non-homogeneously dispersed in the hole transport region.

The charge generating material may include, for example, a p-dopant. The p-dopant may be a quinone derivative, a metal oxide, a compound containing a cyano group, or any combination thereof, but embodiments are not limited thereto. In some embodiments, the p-dopant may be a quinone derivative, such as tetracyanoquinodimethane (TCNQ), a 2,3,5,6-tetrafluoro-tetracyano-1,4-benzoquinonedimethane (F4-TCNQ), or F6-TCNNQ; a metal oxide, such as a tungsten oxide or a molybdenum oxide; a compound containing a cyano group, such as Compound HT-D1; or any combination thereof:

HT-D1

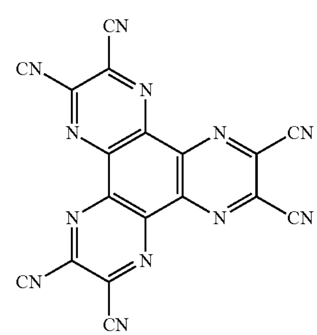

-continued

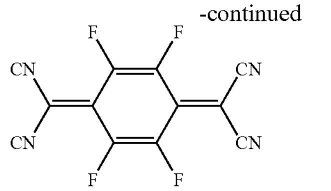

F4-TCNQ

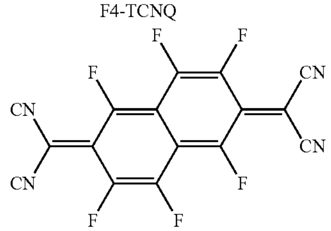

F4-TCNNQ

The hole transport region may further include a buffer layer.

The buffer layer may compensate for an optical resonance distance depending on a wavelength of light emitted from the emission layer to improve the efficiency of an organic light-emitting device.

When the hole transport region includes an electron blocking layer, a material for forming the electron blocking layer may be selected from the materials for forming a hole transport region and host materials described herein, but embodiments are not limited thereto. In some embodiments, when the hole transport region includes an electron blocking layer, mCP described herein may be used for forming the electron blocking layer.

An emission layer may be formed on the hole transport region by using one or more suitable methods, such as vacuum deposition, spin coating, casting, or LB deposition. When the emission layer is formed by vacuum deposition or spin coating, vacuum deposition and coating conditions for forming the emission layer may be generally similar to those conditions for forming a hole injection layer, though the conditions may vary depending on a compound that is used.

The emission layer may include a host and a dopant, and the dopant may include the organometallic compound represented by Formula 1.

The host may include TPBi, TBADN, ADN (also known as "DNA"), CBP, CDBP, TCP, mCP, Compound H50, Compound H51, Compound H52, or any combination thereof:

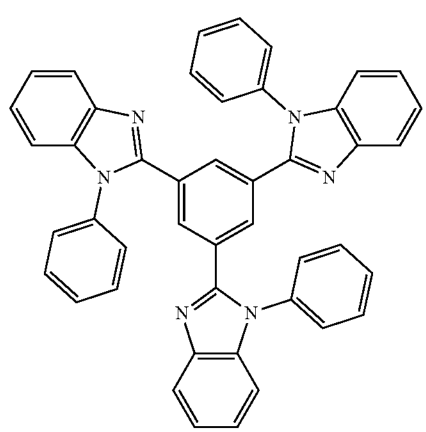

TPBi

-continued

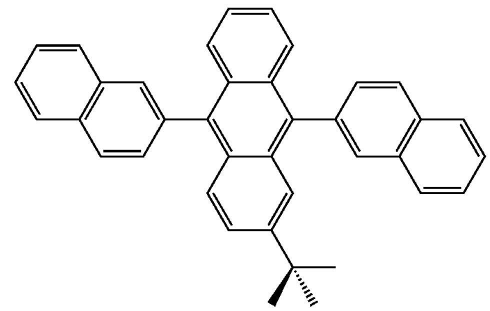

TBADN

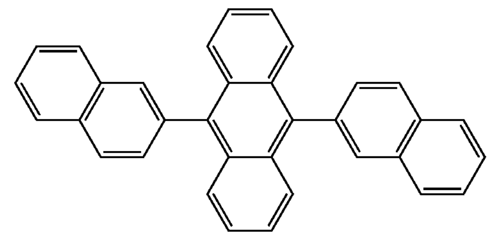

ADN

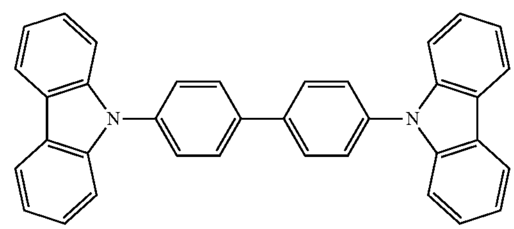

CBP

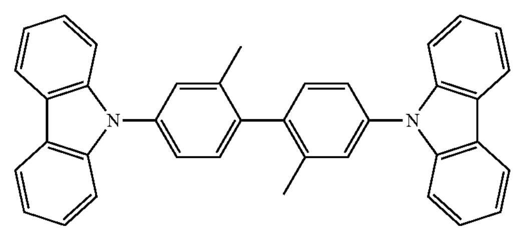

CDBP

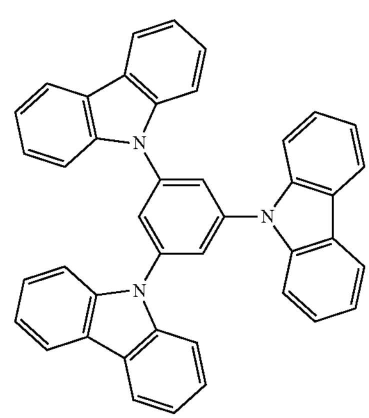

TCP

-continued

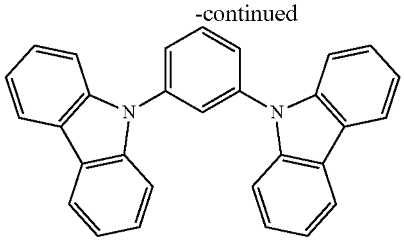

mCP

H50

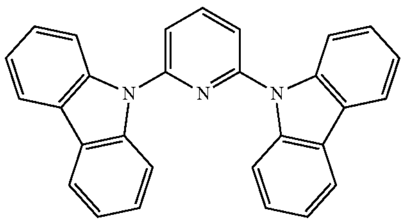

H51

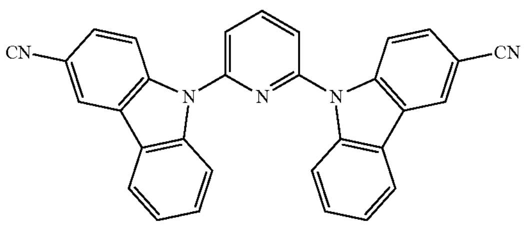

H52

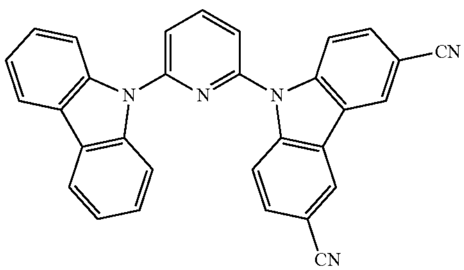

When the organic light-emitting device 10 is a full-color organic light-emitting device, the emission layer may be patterned into a red emission layer, a green emission layer, and/or a blue emission layer. In some embodiments, the emission layer may have a structure in which the red emission layer, the green emission layer, and/or the blue emission layer are layered to emit white light. In some embodiments, the structure of the emission layer may vary.

When the emission layer includes the host and the dopant, an amount of the dopant may be from about 0.01 parts to about 15 parts by weight based on about 100 parts by weight of the host, but embodiments are not limited thereto.

The thickness of the emission layer may be in a range of about 100 Å to about 1,000 Å, and in some embodiments, about 200 Å to about 600 Å. When the thickness of the emission layer is within any of these ranges, improved luminescence characteristics may be obtained without a substantial increase in driving voltage.

Next, an electron transport region may be formed on the emission layer.

The electron transport region may include a hole blocking layer, an electron transport layer, an electron injection layer, or a combination thereof.

In some embodiments, the electron transport region may have a hole blocking layer/an electron transport layer/an electron injection layer structure or an electron transport layer/an electron injection layer structure, but embodiments are not limited thereto. The electron transport layer may have a single-layered structure or a multi-layered structure including two or more different materials.

The conditions for forming a hole blocking layer, an electron transport layer, and an electron injection layer may be inferred based on the conditions for forming the hole injection layer.

When the electron transport region includes a hole blocking layer, the hole blocking layer may include, for example, at least of BCP, Bphen, BAlq, or any combination thereof:

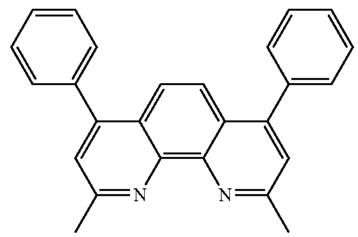

BCP

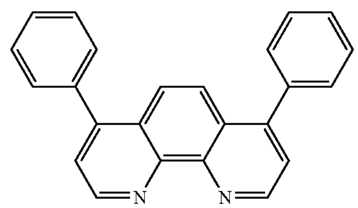

Bphen

The thickness of the hole blocking layer may be in a range of about 20 Å to about 1,000 Å, and in some embodiments, about 30 Å to about 300 Å. When the thickness of the hole blocking layer is within any of these ranges, excellent hole blocking characteristics may be obtained without a substantial increase in driving voltage.

The electron transport layer may include BCP, Bphen, TPBi, $Alq_3$, BAlq, TAZ, NTAZ, or any combination thereof:

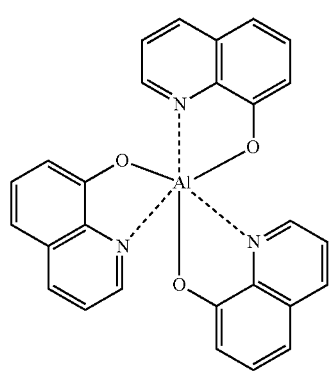

$Alq_3$

-continued
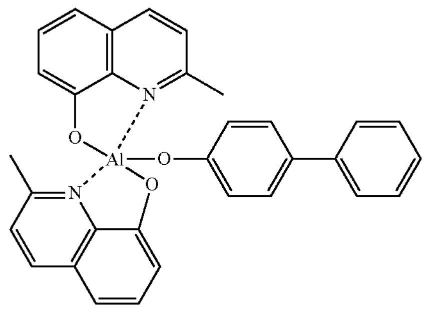
BAlq
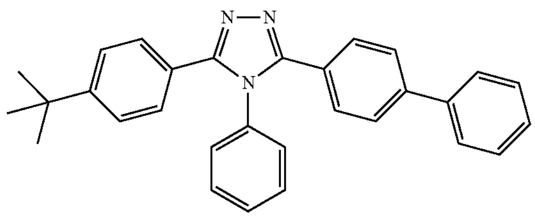
TAZ
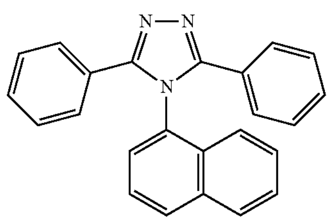
NTAZ
In some embodiments, the electron transport layer may include at least one of Compounds ET1 to ET25, but embodiments are not limited thereto:
ET1
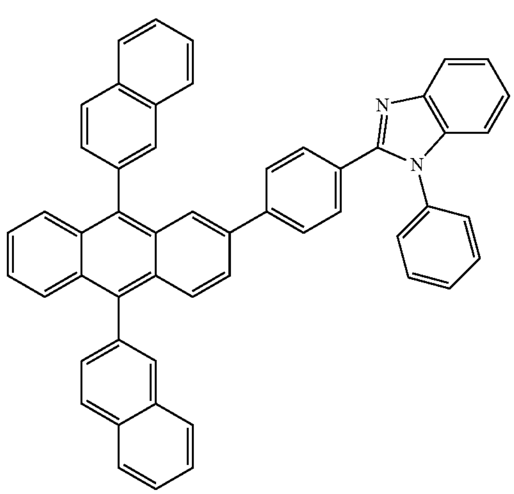
-continued
ET2
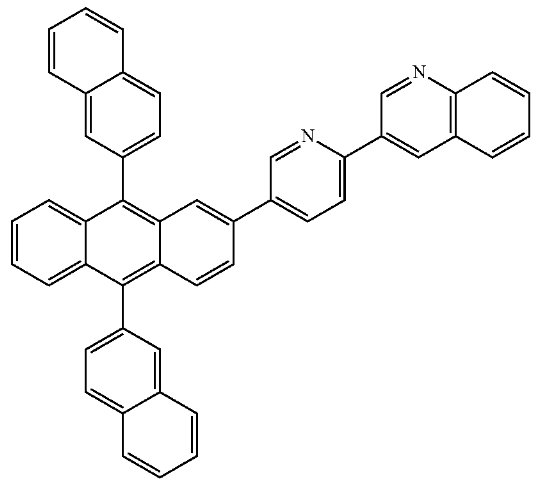
ET3
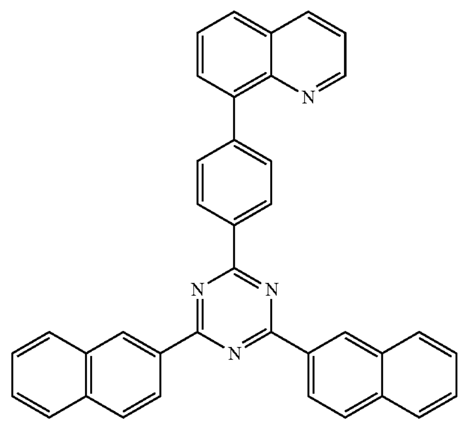
ET4
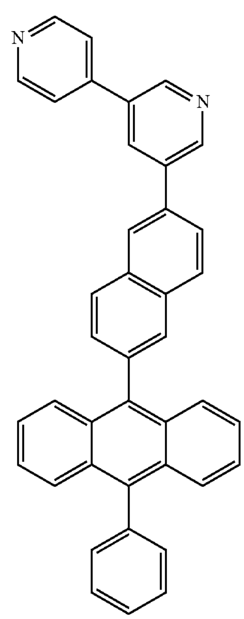

-continued
ET5
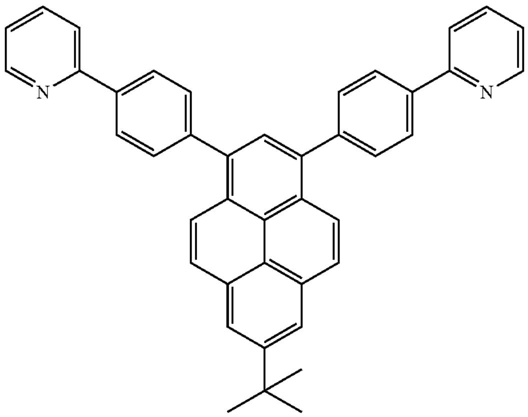
ET6
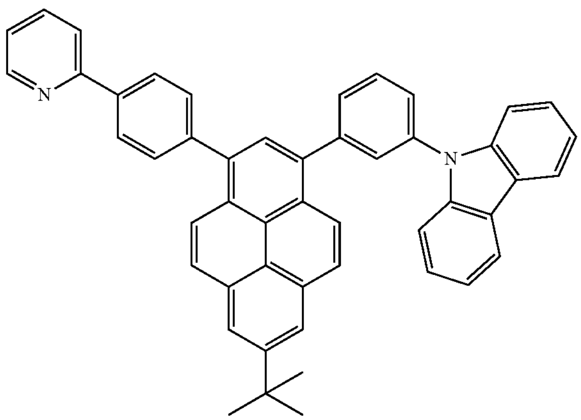
ET7
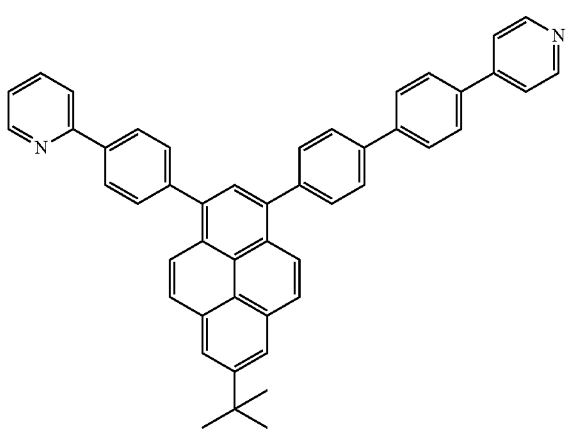
-continued
ET8
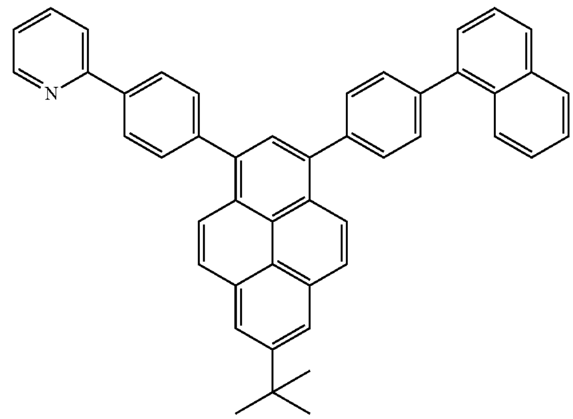
ET9
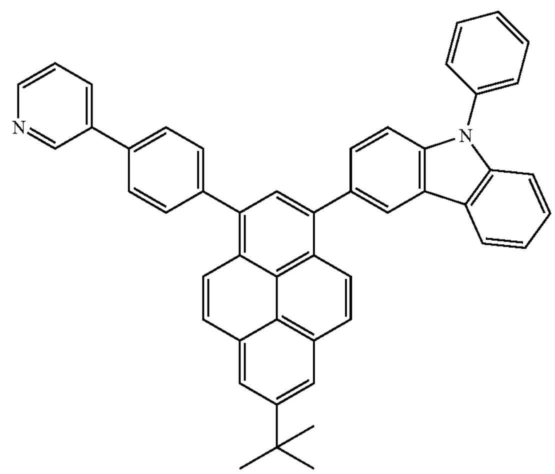
ET10
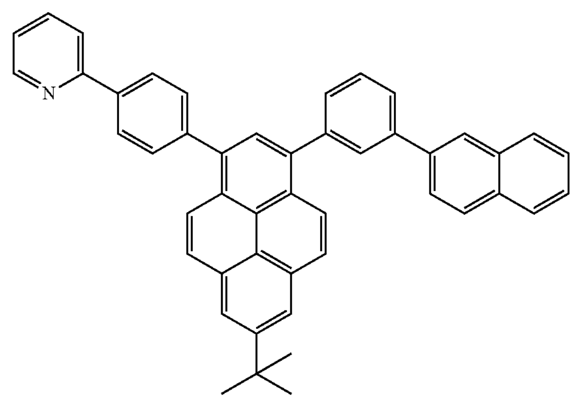
ET11
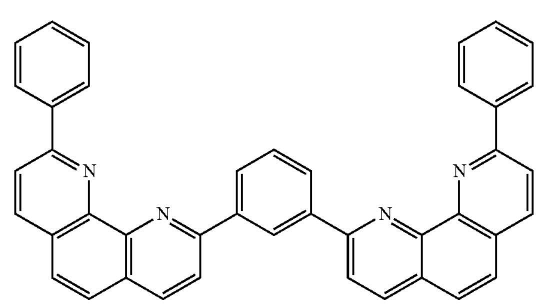

-continued
ET12
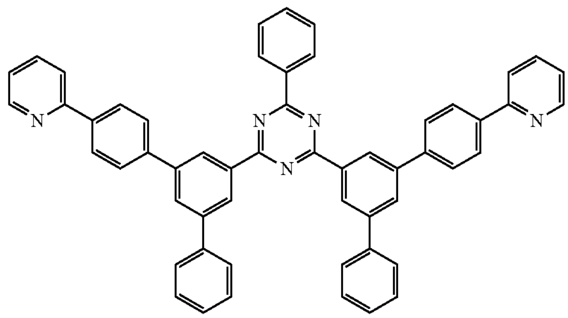
ET13
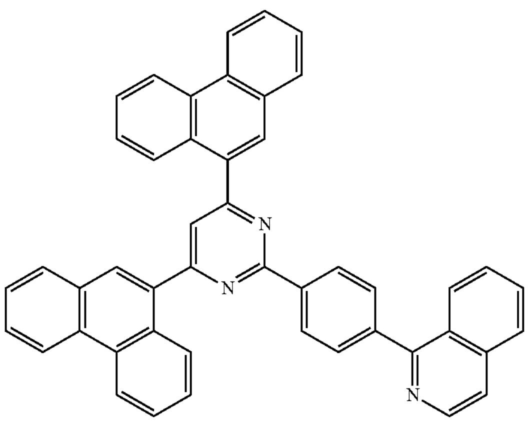
ET14
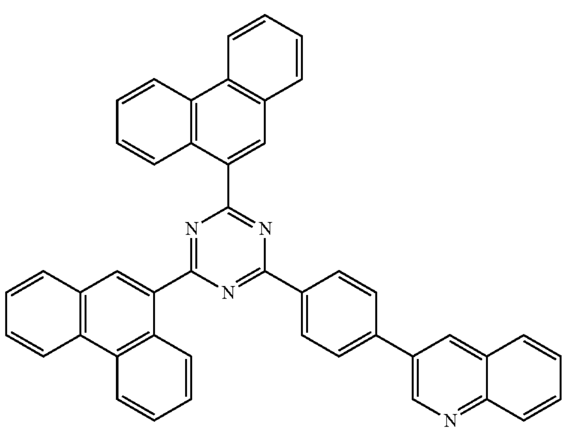
ET15
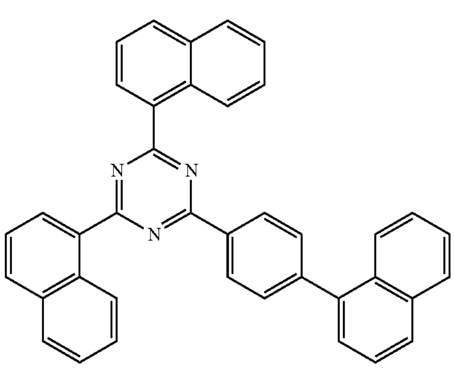
-continued
ET16
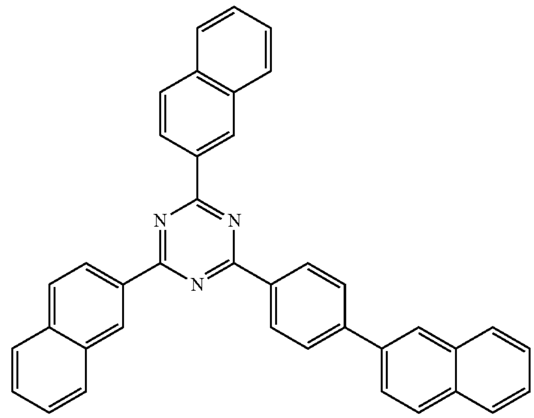
ET17
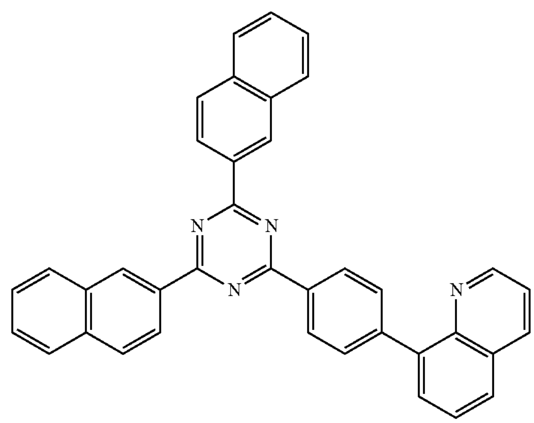
ET18
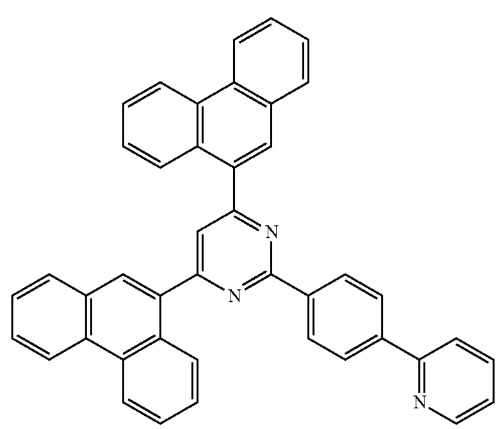

-continued
ET19
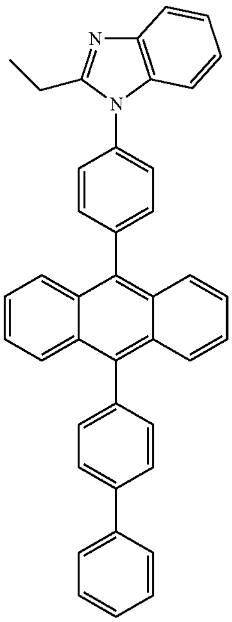
ET20
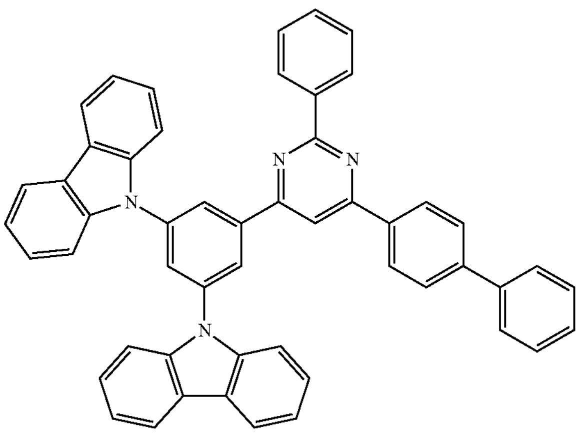
E21
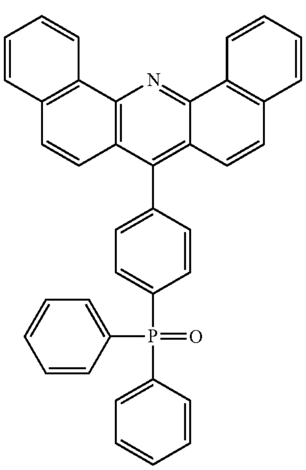
-continued
E22
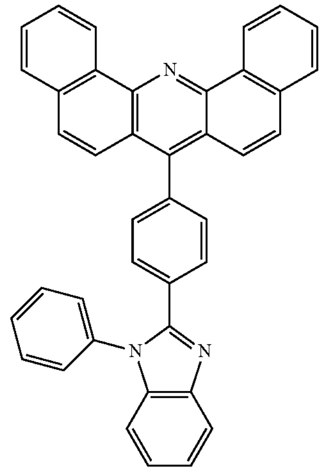
E23
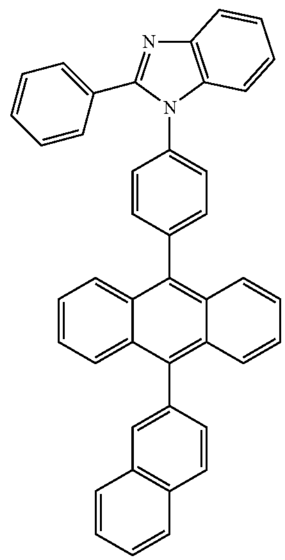
ET24
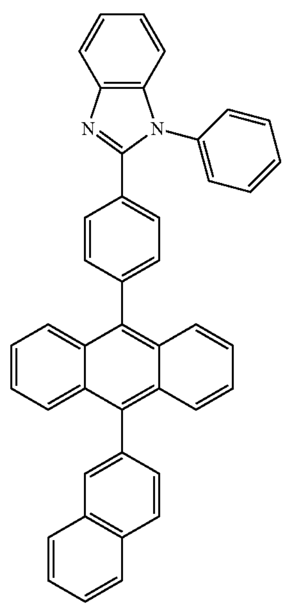

-continued

ET25

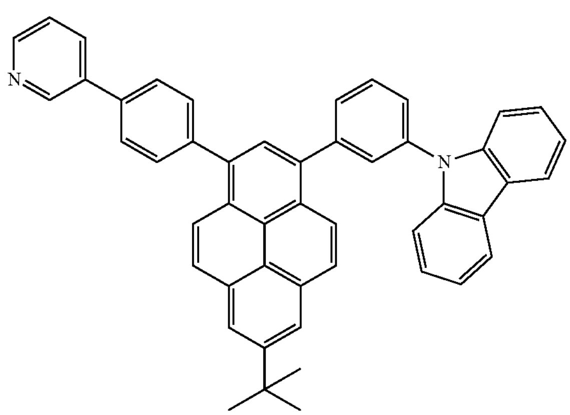

The thickness of the electron transport layer may be in a range of about 100 Å to about 1,000 Å, and in some embodiments, about 150 Å to about 500 Å. When the thickness of the electron transport layer is within any of these ranges, excellent electron transport characteristics may be obtained without a substantial increase in driving voltage.

The electron transport layer may further include a material containing metal, in addition to the materials described above.

The material containing metal may include a Li complex. The Li complex may include, e.g., Compound ET-D1 or Compound ET-D2:

ET-D1

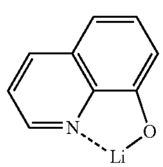

ET-D2

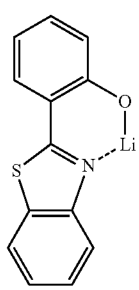

The electron transport region may include an electron injection layer that facilitates electron injection from the second electrode 19.

The electron injection layer may include LiF, NaCl, CsF, $Li_2$, BaO, or any combination thereof.

The thickness of the electron injection layer may be in a range of about 1 Å to about 100 Å, for example, about 3 Å to about 90 Å. When the thickness of the electron injection layer is within any of these ranges, excellent electron injection characteristics may be obtained without a substantial increase in driving voltage.

The second electrode 19 may be on the organic layer 15. The second electrode 19 may be a cathode. A material for forming the second electrode 19 may be a material with a relatively low work function, such as a metal, an alloy, an electrically conductive compound, and a mixture thereof. Examples of the material for forming the second electrode 19 may include lithium (Li), magnesium (Mg), aluminum (AI), aluminum-lithium (Al—Li), calcium (Ca), magnesium-indium (Mg—In), and magnesium-silver (Mg—Ag).

In some embodiments, ITO or IZO may be used to form a transmissive second electrode 19 to manufacture a top emission light-emitting device. In some embodiments, the material for forming the second electrode 19 may vary.

Hereinbefore the organic light-emitting device 10 has been described with reference to the FIGURE, but embodiments are not limited thereto.

According to an aspect of still another embodiment, a diagnostic composition may include at least one organometallic compound represented by Formula 1.

Since the organometallic compound represented by Formula 1 provides high luminescence efficiency, the diagnostic efficiency of the diagnostic composition that includes the organometallic compound represented by Formula 1 may be excellent.

The diagnostic composition may be applied in various ways, such as in a diagnostic kit, a diagnostic reagent, a biosensor, or a biomarker.

The term "$C_1$-$C_{60}$ alkyl group" as used herein refers to a linear or branched saturated aliphatic hydrocarbon monovalent group having 1 to 60 carbon atoms. The term "$C_1$-$C_{60}$ alkylene group" as used herein refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group as used herein may include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group or a tert-decyl group, each unsubstituted or substituted with a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, or any combination thereof. In some embodiments, Formula 9-33 described above may be a branched C alkyl group. Formula 9-33 may be a tert-butyl group substituted with two methyl groups.

The term "$C_1$-$C_{60}$ alkoxy group" as used herein refers to a monovalent group represented by —$OA_{101}$ (wherein $A_{101}$ is a $C_1$-$C_1$ alkyl group).

Examples of the $C_1$-$C_{60}$ alkoxy group, the $C_1$-$C_{20}$ alkoxy group, or the $C_1$-$C_{10}$ alkoxy group as used herein may include a methoxy group, an ethoxy group, a propoxy group, a butoxy group, or a pentoxy group.

The term "$C_2$-$C_{60}$ alkenyl group" as used herein refers to a group formed by placing at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a group formed by placing at least one carbon-carbon triple bond in the middle or at the terminus of the $C_2$-$C_{60}$ alkyl group. Examples thereof include an ethenyl group and a propenyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent monocyclic saturated hydrocarbon group including 3 to 10 carbon atoms. The term "$C_3$-$C_{10}$ cycloalkylene group" as used herein refers to a divalent group having the same structure as the $C_3$-$C_{10}$ cycloalkyl group.

Examples of the $C_3$-$C_{10}$ cycloalkyl group as used herein may include a cyclopropyl group, a cyclobutyl group, a cyclopentyl group, a cyclohexyl group, a cycloheptyl group, a cyclooctyl group, an adamantanyl group, a bicyclo[1.1.1]pentyl group, a bicyclo[2.1.1]hexyl group, a bicyclo[2.2.1]heptyl group (a norbornanyl group), or a bicyclo[2.2.2]octyl group.

The term "$C_1$-$C_{10}$ heterocycloalkyl group" as used herein refers to a monovalent monocyclic group including at least one N, O, P, Si, B, Se, Ge, Te, S, or any combination thereof as a ring-forming atom and 1 to 10 carbon atoms. The term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group as used herein may include a silolanyl group, a silinanyl group, a tetrahydrofuranyl group, a tetrahydro-2H-pyranyl group, or a tetrahydrothiophenyl group.

The term "$C_3$-$C_{10}$ cycloalkenyl group" as used herein refers to a monovalent monocyclic group that has 3 to 10 carbon atoms and at least one carbon-carbon double bond in its ring, wherein the molecular structure as a whole is non-aromatic. Examples thereof include a cyclopentenyl group, a cyclohexenyl group, and a cycloheptenyl group.

The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group including at least one N, O, P, Si, B, Se, Ge, Te, S, or any combination thereof as a ring-forming atom, 2 to 10 carbon atoms, and at least one double bond in its ring. Examples of the $C_2$-$C_{10}$ heterocycloalkenyl group include a 2,3-dihydrofuranyl group and a 2,3-dihydrothiophenyl group. The term "$C_1$-$C_{10}$ heterocycloalkylene group" as used herein refers to a divalent group having the same structure as the $C_1$-$C_{10}$ heterocycloalkyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include a plurality of rings, the plurality of rings may be fused to each other.

The term "$C_7$-$C_{60}$ alkyl aryl group" as used herein refers to a $C_6$-$C_{60}$ aryl group substituted with at least one $C_1$-$C_{60}$ alkyl group.

The term "$C_1$-$C_{60}$ heteroaryl group" as used herein refers to a monovalent group having a heterocyclic aromatic system having at least one N, O, P, Si, B, Se, Ge, Te, S, or any combination thereof as a ring-forming atom and 1 to 60 carbon atoms. The term "$C_1$-$C_{60}$ heteroarylene group" as used herein refers to a divalent group having a heterocyclic aromatic system having at least one heteroatom selected from N, O, P, Si, B, Se, Ge, Te, S, or any combination thereof as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include a plurality of rings, the plurality of rings may be fused to each other.

The term "$C_2$-$C_{60}$ alkyl heteroaryl group" as used herein refers to a $C_1$-$C_{60}$ heteroaryl group substituted with at least one $C_1$-$C_{60}$ alkyl group.

The term "$C_6$-$C_{60}$ aryloxy group" as used herein is represented by —$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group). The term "$C_1$-$C_{60}$ alkylthio group" as used herein is represented by —$SA_{104}$ (wherein $A_{104}$ is the $C_1$-$C_{60}$ alkyl group).

The term "monovalent non-aromatic condensed polycyclic group" as used herein refers to a monovalent group that has two or more condensed rings and only carbon atoms (e.g., the number of carbon atoms may be in a range of 8 to 60) as ring-forming atoms, wherein the molecular structure as a whole is non-aromatic. Examples of the monovalent non-aromatic condensed polycyclic group include a fluorenyl group.

The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and a heteroatom of N, O, P, Si, B, Se, Ge, Te, S, or any combination thereof and carbon atoms (e.g., the number of carbon atoms may be in a range of 1 to 60) as ring-forming atoms, wherein the molecular structure as a whole is non-aromatic. Examples of the monovalent non-aromatic condensed heteropolycyclic group include a carbazolyl group.

The term "divalent non-aromatic condensed heteropolycyclic group" as used herein refers to a divalent group having substantially the same structure as the monovalent non-aromatic condensed heteropolycyclic group.

The term "$C_5$-$C_{30}$ carbocyclic group" as used herein refers to a saturated or unsaturated cyclic group including 5 to 30 carbon atoms only as ring-forming atoms. The $C_5$-$C_{30}$ carbocyclic group may be a monocyclic group or a polycyclic group. Examples of the "$C_5$-$C_{30}$ carbocyclic group (unsubstituted or substituted with at least one $R_{10a}$)" may include an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a silole group, or a fluorene group, each (unsubstituted or substituted with at least one $R_{10a}$).

The term "$C_1$-$C_{30}$ heterocyclic group" as used herein refers to saturated or unsaturated cyclic group including 1 to 30 carbon atoms and at least one N, O, P, Si, B, Se, Ge, Te, S, or any combination thereof as ring-forming atoms. The $C_1$-$C_{30}$ heterocyclic group may be a monocyclic group or a polycyclic group. The $C_1$-$C_{30}$ heterocyclic group may be a monocyclic group or a polycyclic group. Examples of the "$C_1$-$C_{30}$ heterocyclic group (unsubstituted or substituted with at least one $R_{10a}$)" may include a thiophene group, a furan group, a pyrrole group, a silole group, a borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, each (unsubstituted or substituted with at least one $R_{10a}$).

The "fluorinated $C_1$-$C_{60}$ alkyl group (or fluorinated $C_1$-$C_{20}$ alkyl group or the like)", "fluorinated $C_3$-$C_{10}$ cycloalkyl group", "fluorinated $C_1$-$C_{60}$ heterocycloalkyl group", and "fluorinated phenyl group" as used herein may respectively be a $C_1$-$C_{60}$ alkyl group (or $C_1$-$C_{20}$ alkyl group or the like), $C_3$-$C_{10}$ cycloalkyl group, a $C_1$-$C_{10}$ heterocycloalkyl group, and a phenyl group, each substituted with at least one fluoro group (—F). Examples of the "fluorinated $C_1$ alkyl group (i.e., a fluorinated methyl group)" may include —$CF_3$, —$CF_2H$, and —$CFH_2$. The "fluorinated $C_1$-$C_{60}$ alkyl group (or fluorinated $C_1$-$C_{20}$ alkyl group or the like)", "fluorinated $C_3$-$C_{10}$ cycloalkyl group", "fluorinated $C_1$-$C_{60}$ heterocycloalkyl group", or "fluorinated phenyl group" may respectively be: i) a fully fluorinated $C_1$-$C_{60}$ alkyl group (or fully fluorinated $C_1$-$C_{20}$ alkyl group or the like), fully fluorinated $C_3$-$C_{10}$ cycloalkyl group, fully fluorinated $C_1$-$C_{60}$ heterocycloalkyl group, or fully fluorinated phenyl group, in which all hydrogen atoms are substituted with fluoro groups, or ii) a partially fluorinated $C_1$-$C_{60}$ alkyl group (or partially fluorinated $C_1$-$C_{20}$ alkyl group or the like), partially fluorinated $C_3$-$C_{10}$ cycloalkyl group, partially fluorinated $C_1$-$C_{10}$ heterocycloalkyl group, or partially fluorinated phenyl group, in which some of hydrogen atoms are substituted with fluoro groups.

The "deuterated $C_1$-$C_{60}$ alkyl group (or deuterated $C_1$-$C_{20}$ alkyl group or the like)", "deuterated $C_3$-$C_{10}$ cycloalkyl group", "deuterated $C_1$-$C_{10}$ heterocycloalkyl group", and "deuterated phenyl group" as used herein may respectively be a $C_1$-$C_{60}$ alkyl group (or $C_1$-$C_{20}$ alkyl group or the like), $C_3$-$C_{10}$ cycloalkyl group, a $C_1$-$C_{10}$ heterocycloalkyl group, and a phenyl group, each substituted with at least one deuterium. Examples of the "deuterated $C_1$ alkyl group (i.e., a deuterated methyl group)" may include —$CD_3$, —$CD_2H$, and —$CDH_2$. Examples of the "deuterated $C_3$-$C_{10}$ cycloalkyl group" may include Formula 10-501. The "deuterated $C_1$-$C_{60}$ alkyl group (or deuterated $C_1$-$C_{20}$ alkyl group or the like)", "deuterated $C_3$-$C_{10}$ cycloalkyl group", "deuterated $C_1$-$C_{10}$ heterocycloalkyl group", or "deuterated phenyl group" may respectively be: i) a fully deuterated $C_1$-$C_{60}$ alkyl group (or fully deuterated $C_1$-$C_{20}$ alkyl group or the like), fully deuterated $C_3$-$C_{10}$ cycloalkyl group, fully deuterated $C_1$-$C_{10}$ heterocycloalkyl group, or fully deuterated phenyl group, in which all hydrogen atoms are substituted with deuterium atoms, or ii) a partially deuterated $C_1$-$C_{60}$ alkyl group (or partially deuterated $C_1$-$C_{20}$ alkyl group or the like), partially deuterated $C_3$-$C_{10}$ cycloalkyl group, partially deuterated $C_1$-$C_{10}$ heterocycloalkyl group, or partially deuterated phenyl group, in which some of hydrogen atoms are substituted with deuterium atoms.

The "($C_1$-$C_{20}$ alkyl)'X' group" refers to a 'X' group substituted with at least one $C_1$-$C_{20}$ alkyl group. For example, the "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the "($C_1$-$C_{20}$ alkyl)phenyl group" as used herein refers to a phenyl group substituted with at least one $C_1$-$C_{20}$ alkyl group. Examples of the ($C_1$ alkyl)phenyl group may include a toluyl group.

In the present specification, "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, and an azadibenzothiophene 5,5-dioxide group" each refer to a hetero ring in which at least one ring-forming carbon atom is substituted with nitrogen atom and respectively having an identical backbone as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group".

Substituents of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{60}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may each independently be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, —$P(=O)(Q_{28})(Q_{29})$, —$P(Q_{28})(Q_{29})$, or any combination thereof;

—$N(Q_{31})(Q_{32})$, —$Si(Q_{33})(Q_{34})(Q_{35})$, —$B(Q_{36})(Q_{37})$, —$P(=O)(Q_{38})(Q_{39})$, or —$P(Q_{38})(Q_{39})$; or any combination thereof.

In the present specification, $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_0$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_2$-$C_{10}$ heterocycloalkenyl group; a $C_6$-$C_0$ aryl group unsubstituted or substituted with deuterium, a $C_1$-$C_{60}$ alkyl group, a $C_6$-$C_0$ aryl group, or any combination thereof; a $C_6$-$C_0$ aryloxy group; a $C_6$-$C_0$ arylthio group; a $C_1$-$C_{60}$ heteroaryl group; a monovalent non-aromatic condensed polycyclic group; or a monovalent non-aromatic condensed heteropolycyclic group.

Hereinafter, a compound and an organic light-emitting device according to an embodiment will be described in detail with reference to Synthesis Examples and Examples, however, the present disclosure is not limited thereto. The wording "B was used instead of A" used in describing Synthesis Examples means that an amount of B used was identical to an amount of A used based on molar equivalence.

EXAMPLES

Synthesis Example 1 (Compound 12)

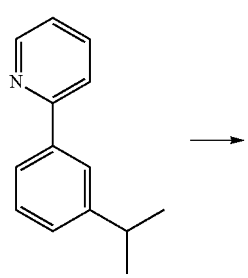

12-1

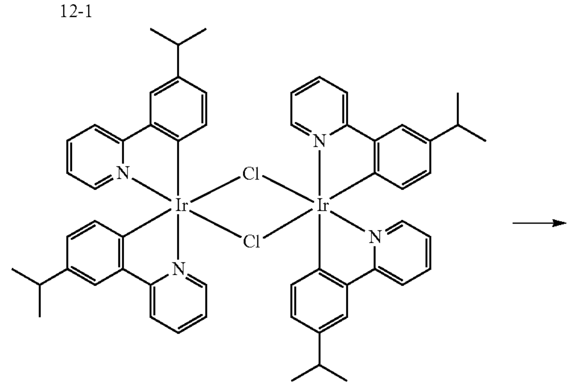

12-2

-continued

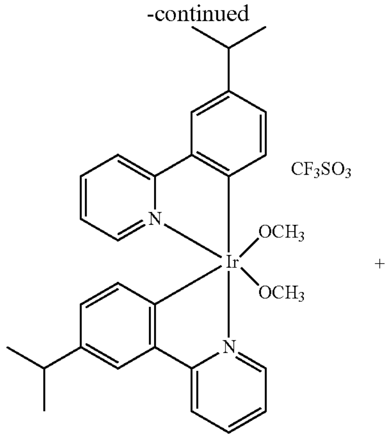

12-3

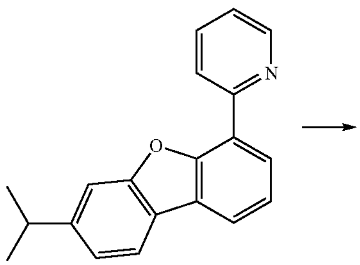

12-4

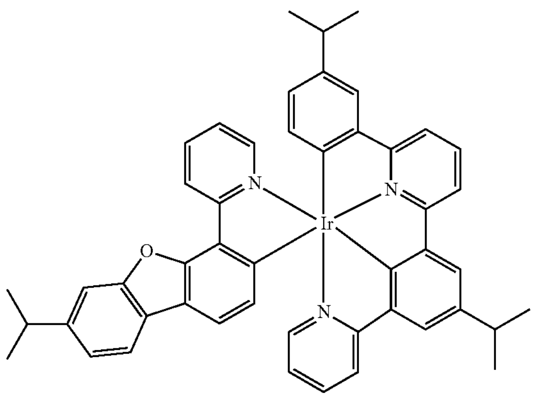

12

Synthesis of Compound 12-2

2.2 grams (g) (6.24 mmol) of $IrCl_3$ hydrate and 2.71 g (3 eq., 15.31 mmol) of Compound 12-1 were added to a flask, followed by mixing with 24 milliliters (mL) of 2-ethoxyethanol and 8 mL of $H_2O$. Then, in $N_2$ atmosphere, the mixture was stirred under reflux at a temperature of 120° C. for 18 hours. The resulting product was cooled to room temperature to obtain a precipitate. The precipitate was filtered and washed sequentially with water, methanol, and hexane, followed by drying, to thereby obtaining 2.6 g of Compound 12-2. Compound 12-2 was used in the next step without any further purification.

Synthesis of Compound 12-3

2.5 g (1.56 mmol) of Compound 12-2 was mixed with 30 mL of dichloromethane, followed by slowly adding dropwise a mixture of 0.92 g (2.3 eq., 3.59 mmol) of AgOTf and 10 mL of methanol. Upon blocking out light, the obtained product was stirred overnight at room temperature to produce a resulting product, which was then filtered using a celite filter. The filtrate was concentrated to yield 3.2 g of Compound 12-3 which was used in the next step without any further purification.

Synthesis of Compound 12

3 g (3.77 mmol) of Compound 12-3 and 1.3 g (1.2 eq., 4.52 mmol) of Compound 12-4 were mixed with 20 mL of ethanol, followed by stirring under reflux at a temperature of 90° C. overnight. Once the reaction was complete, the product was cooled to room temperature and filtered to obtain a solid. The resulting solid was washed with ethanol and dried to obtain the resulting product. The resulting product was dissolved in dichloromethane and purified through column chromatography to thereby obtain 1.1 g of Compound 12.

LCMS: m/z calcd for $C_{48}H_{44}IrN_3O$, 871.1; Found 871.31.

Synthesis Example 2 (Compound 10)

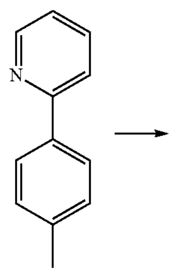

10-1

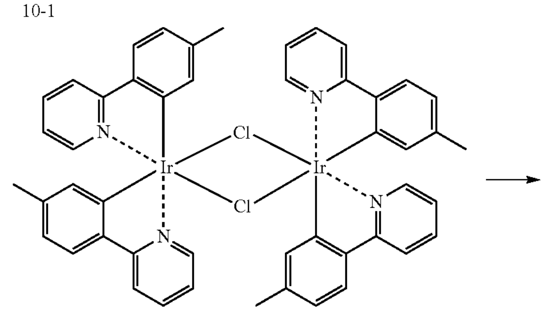

10-2

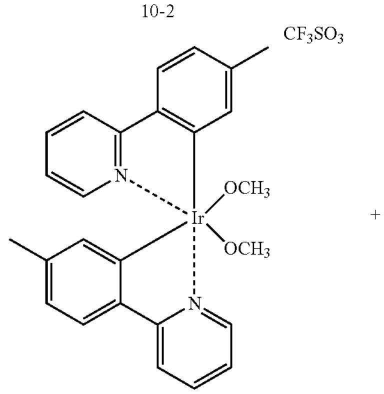

10-3

-continued

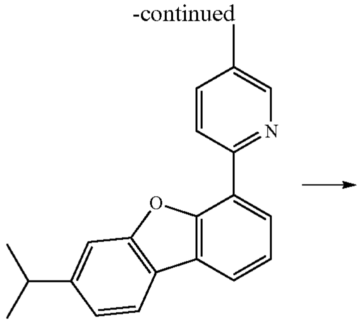

10-4

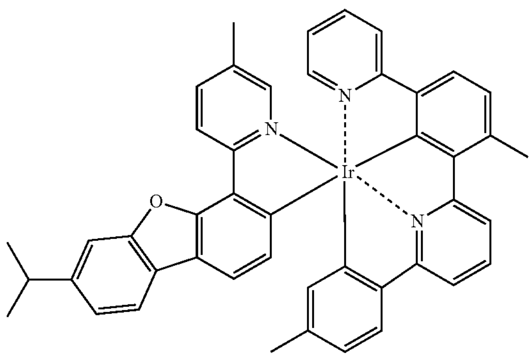

10

Synthesis of Compound 10-2

2.8 g (7.94 mmol) of $IrCl_3$ hydrate and 3.0 g (2.23 eq., 17.71 mmol) of Compound 10-1 were added to a flask, followed by mixing with 30 mL of 2-ethoxyethanol and 10 mL of $H_2O$. Then, in $N_2$ atmosphere, the mixture was stirred under reflux at a temperature of 120° C. for 18 hours. The resulting product was cooled to room temperature to obtain a precipitate. The precipitate was filtered and washed sequentially with water, methanol, and hexane, followed by drying, to thereby obtaining 4.0 g of Compound 10-2. Compound 10-2 was used in the next step without any further purification.

Synthesis of Compound 10-3

2.0 g (1.25 mmol) of Compound 10-2 was mixed with 30 mL of dichloromethane, followed by slowly adding dropwise a mixture of 0.74 g (2.3 eq., 2.87 mmol) of AgOTf and 10 mL of methanol. Upon blocking out light, the obtained product was stirred overnight at room temperature to produce a resulting product, which was then filtered using a celite filter. Then, the filtrate was concentrated to obtain 2.5 g of Compound 10-3. Compound 10-3 was used in the next step without any further purification.

Synthesis of Compound 10

2.4 g (3.24 mmol) of Compound 10-3 and 1.17 g (1.2 eq., 3.89 mmol) of Compound 10-4 were mixed with 20 mL of ethanol, followed by stirring under reflux at a temperature of 90° C. overnight. Once the reaction was complete, the product was cooled to room temperature and filtered to obtain a solid. The resulting solid was washed with ethanol and dried to obtain a resulting product. The resulting product was dissolved in dichloromethane and purified through column chromatography to thereby obtain 0.8 g of Compound 10.

LCMS: m/z calcd for $C_{45}H_{38}IrN_3O$, 829.26; Found 830.29.

Synthesis Example 3 (Compound 1)

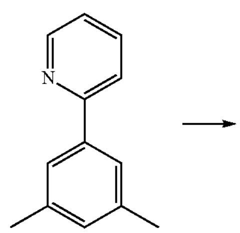

1-1

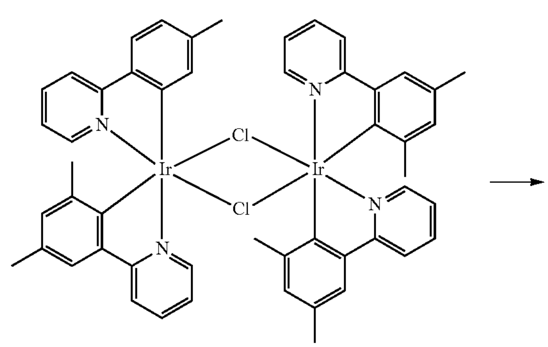

1-2

-continued

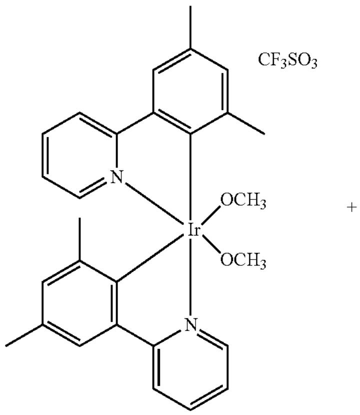

1-3

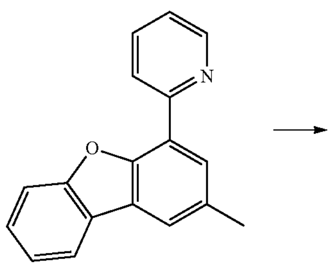

1-4

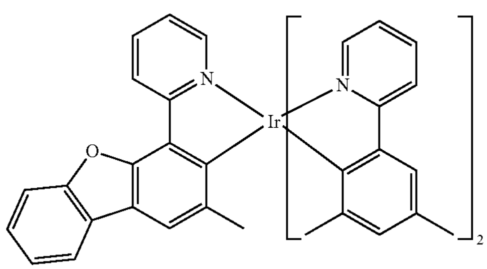

1

Synthesis of Compound 1-2

Compound 1-2 was synthesized in substantially the same manner as in Synthesis of Compound 1-2 in Synthesis Example 1, except that Compound 1-1 was used instead of Compound 12-1.

Synthesis of Compound 1-3

Compound 1-3 was synthesized in substantially the same manner as in Synthesis of Compound 12-3 in Synthesis Example 1, except that Compound 1-2 was used instead of Compound 12-2.

Synthesis of Compound 1

Compound 1 was synthesized in substantially the same manner as in Synthesis of Compound 12 in Synthesis Example 1, except that Compound 1-3 and Compound 1-4 were used instead of Compound 12-3 and Compound 12-4, respectively (yield: 11%).

LCMS: m/z calcd for $C_{44}H_{36}IrN_3O$, 814.99; Found 815.25.

Synthesis Example 4 (Compound 2)

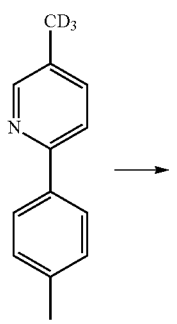

2-1

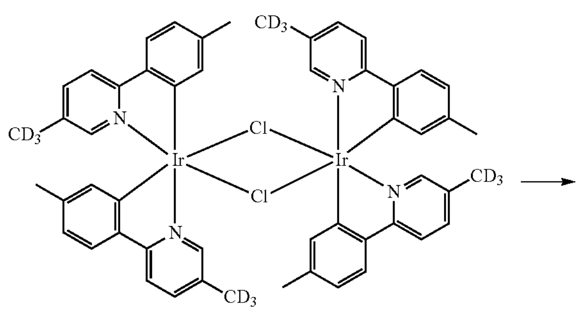

2-2

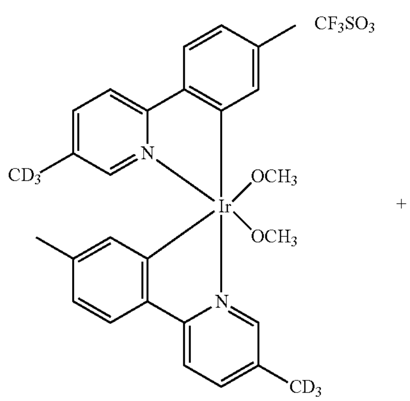

2-3

-continued

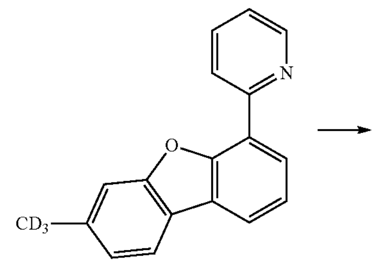

2-4

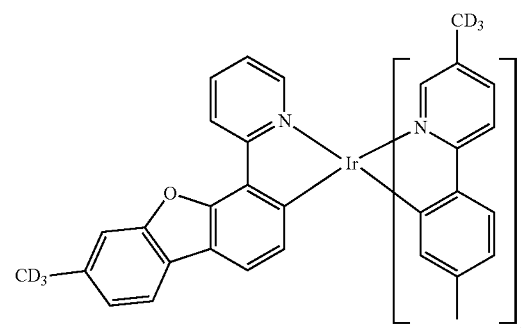

2

Synthesis of Compound 2-2

Compound 2-2 was synthesized in substantially the same manner as in Synthesis of Compound 12-2 in Synthesis Example 1, except that Compound 2-1 was used instead of Compound 12-1.

Synthesis of Compound 2-3

Compound 2-3 was synthesized in substantially the same manner as in Synthesis of Compound 12-3 in Synthesis Example 1, except that Compound 2-2 was used instead of Compound 12-2.

Synthesis of Compound 2

Compound 2 was synthesized in substantially the same manner as in Synthesis of Compound 12 in Synthesis Example 1, except that Compound 2-3 and Compound 2-4 were used instead of Compound 12-3 and Compound 12-4, respectively (yield: 60%).

LCMS: m/z calcd for $C_{44}H_{27}D_9IrN_3O$, 824.05; Found 824.31.

Synthesis Example 5 (Compound 3)

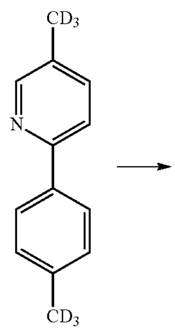

3-1

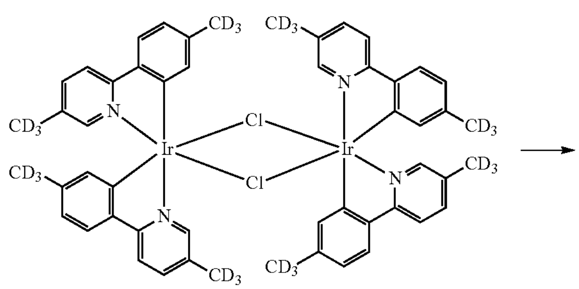

3-2

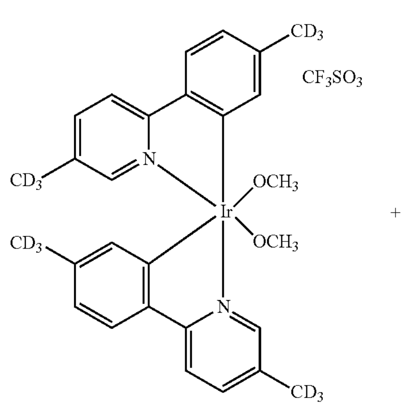

3-3

-continued

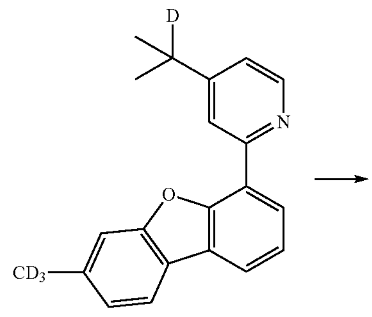

3-4

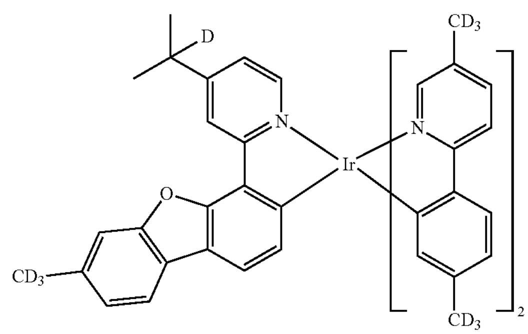

3

Synthesis of Compound 3-2

Compound 3-2 was synthesized in substantially the same manner as in Synthesis of Compound 12-2 in Synthesis Example 1, except that Compound 3-1 was used instead of Compound 12-1.

Synthesis of Compound 3-3

Compound 3-3 was synthesized in substantially the same manner as in Synthesis of Compound 12-3 in Synthesis Example 1, except that Compound 3-2 was used instead of Compound 12-2.

Synthesis of Compound 3

Compound 3 was synthesized in substantially the same manner as in Synthesis of Compound 12 in Synthesis Example 1, except that Compound 3-3 and Compound 3-4 were used instead of Compound 12-3 and Compound 12-4, respectively (yield: 58%).

LCMS: m/z calcd for $C_{47}H_{26}D_{16}IrN_3O$, 873.17; Found 873.40.

Synthesis Example 6 (Compound 4)
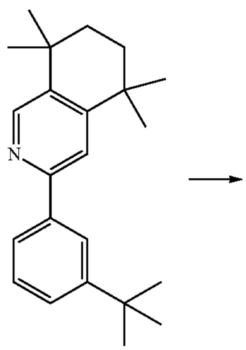
4-1
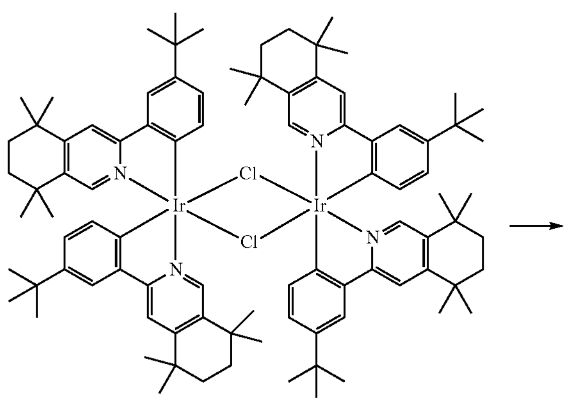
4-2
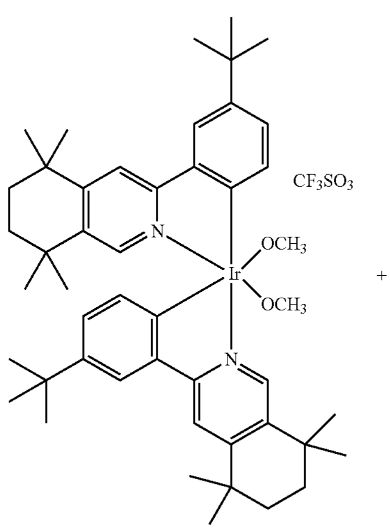
4-3

-continued

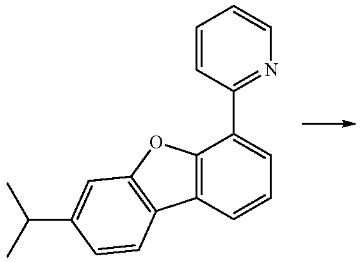

4-4

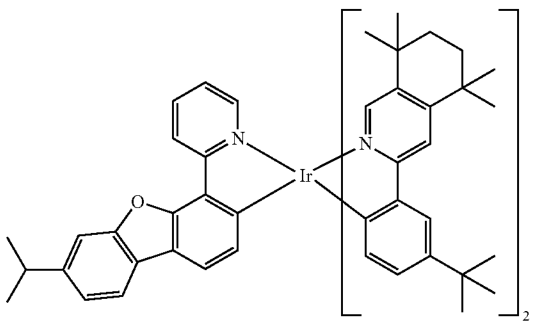

4

Synthesis of Compound 4-2

Compound 4-2 was synthesized in substantially the same manner as in Synthesis of Compound 12-2 in Synthesis Example 1, except that Compound 4-1 was used instead of Compound 12-1.

Synthesis of Compound 4-3

Compound 4-3 was synthesized in substantially the same manner as in Synthesis of Compound 12-3 in Synthesis Example 1, except that Compound 4-2 was used instead of Compound 12-2.

Synthesis of Compound 4

Compound 4 was synthesized in substantially the same manner as in Synthesis of Compound 12 in Synthesis Example 1, except that Compound 4-3 and Compound 4-4 were used instead of Compound 12-3 and Compound 12-4, respectively (yield: 62%).

LCMS: m/z calcd for $C_{66}H_{76}IrN_3O$, 1117.56; Found 1119.56.

Synthesis Example 7 (Compound 5)

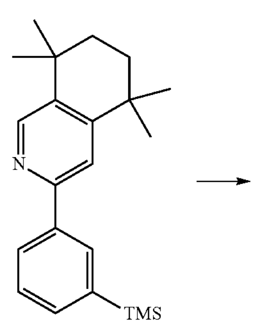

5-1

-continued
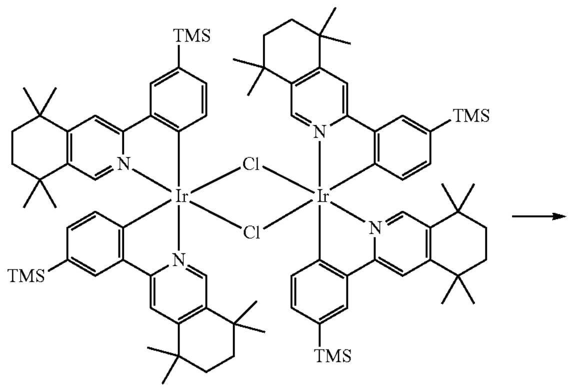
5-2
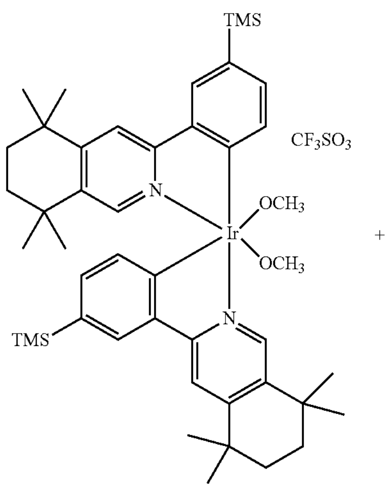
5-3
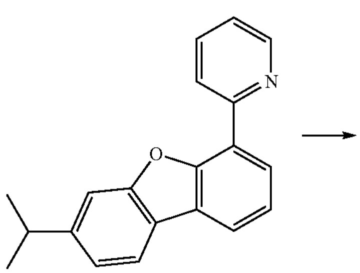
4-4
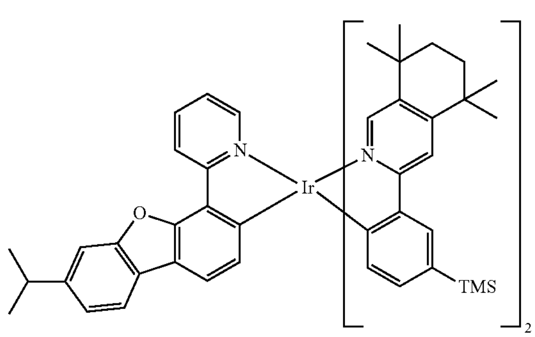
5

Synthesis of Compound 5-2

Compound 5-2 was synthesized in substantially the same manner as in Synthesis of Compound 12-2 in Synthesis Example 1, except that Compound 5-1 was used instead of Compound 12-1.

Synthesis of Compound 5-3

Compound 5-3 was synthesized in substantially the same manner as in Synthesis of Compound 12-3 in Synthesis Example 1, except that Compound 5-2 was used instead of Compound 12-2.

Synthesis of Compound 5

Compound 5 was synthesized in substantially the same manner as in Synthesis of Compound 12 in Synthesis Example 1, except that Compound 5-3 and Compound 4-4 were used instead of Compound 12-3 and Compound 12-4, respectively (yield: 48%).

LCMS: m/z calcd for $C_{64}H_{76}IrN_3OSi_2$, 1151.52; Found 1151.7.

Synthesis Example 8 (Compound 6)

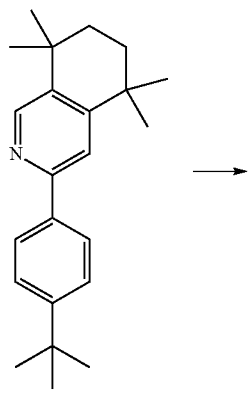

6-1

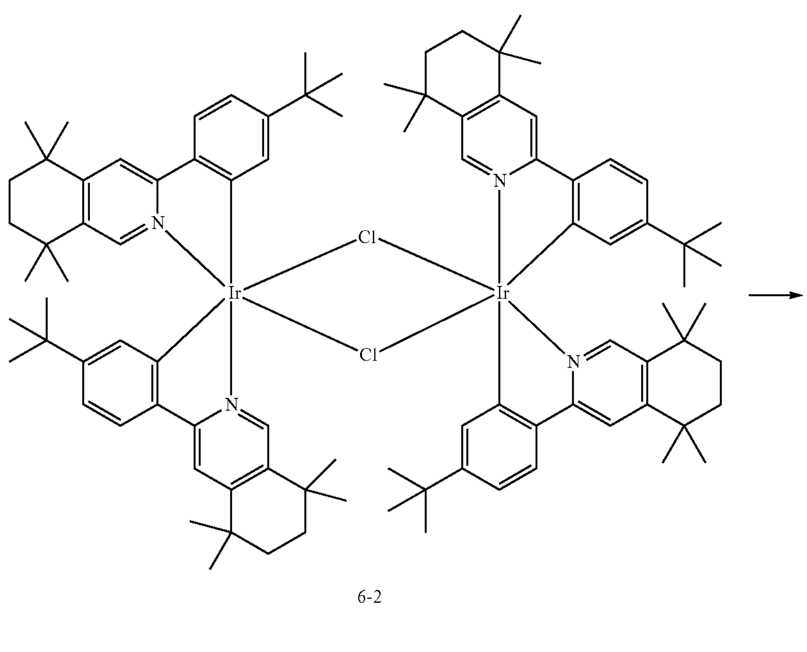

6-2

-continued

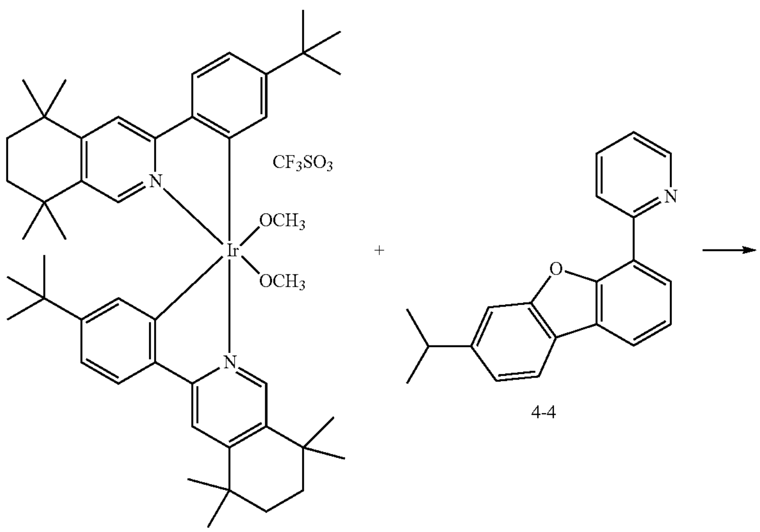

6-3

4-4

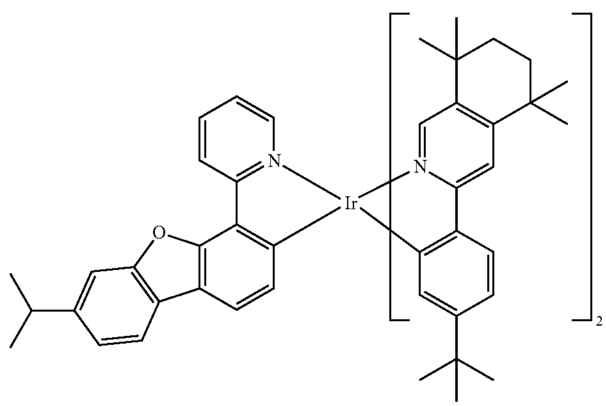

6

Synthesis of Compound 6-2

Compound 6-2 was synthesized in substantially the same manner as in Synthesis of Compound 12-2 in Synthesis Example 1, except that Compound 6-1 was used instead of Compound 12-1.

Synthesis of Compound 6-3

Compound 6-3 was synthesized in substantially the same manner as in Synthesis of Compound 12-3 in Synthesis Example 1, except that Compound 6-2 was used instead of Compound 12-2.

Synthesis of Compound 6

Compound 6 was synthesized in substantially the same manner as in Synthesis of Compound 12 in Synthesis Example 1, except that Compound 6-3 and Compound 4-4 were used instead of Compound 12-3 and Compound 12-4, respectively (yield: 56%).

LCMS: m/z calcd for $C_{66}H_{76}IrN_3O$, 1119.55; Found 1119.56.

Synthesis Example 9 (Compound 7)
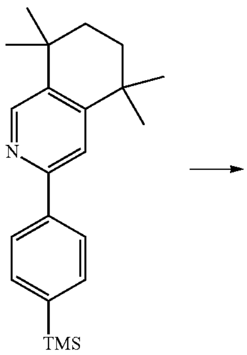
7-1
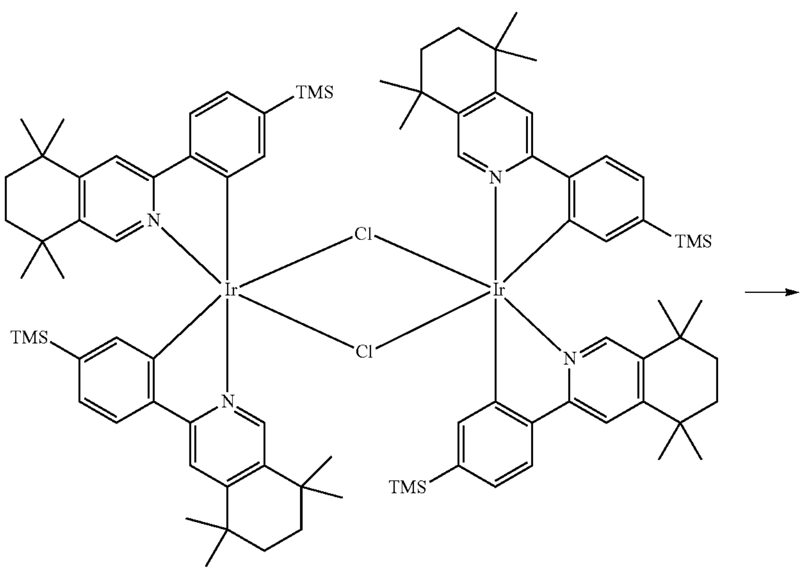
7-2
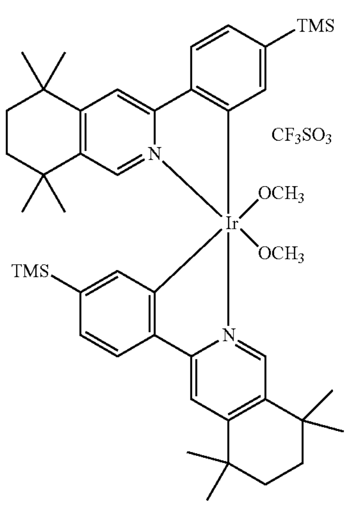
7-3
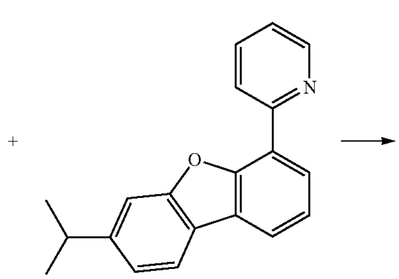
4-4

-continued

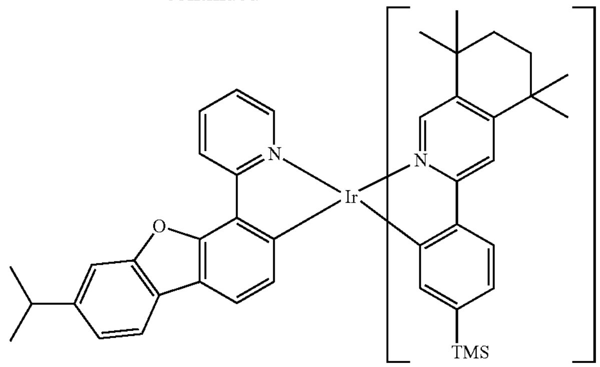

7

Synthesis of Compound 7-2

Compound 7-2 was synthesized in substantially the same manner as in Synthesis of Compound 12-2 in Synthesis Example 1, except that Compound 7-1 was used instead of Compound 12-1.

Synthesis of Compound 7-3

Compound 7-3 was synthesized in substantially the same manner as in Synthesis of Compound 12-3 in Synthesis Example 1, except that Compound 7-2 was used instead of Compound 12-2.

Synthesis of Compound 7

Compound 7 was synthesized in substantially the same manner as in Synthesis of Compound 12 in Synthesis Example 1, except that Compound 7-3 and Compound 4-4 were used instead of Compound 12-3 and Compound 12-4, respectively (yield: 49%).

LCMS: m/z calcd for $C_{64}H_{76}IrN_3OSi_2$, 1151.52; Found 1151.7.

Synthesis Example 10 (Compound 8)

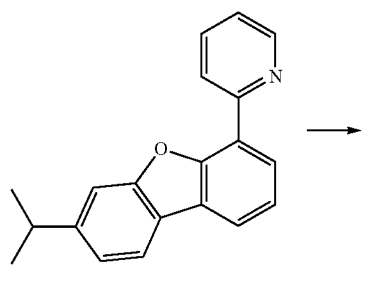

4-4

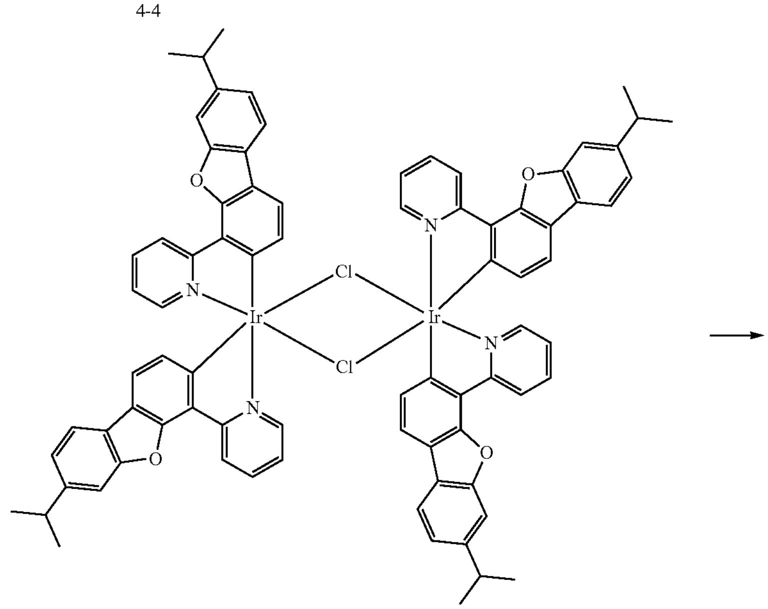

8-2

-continued

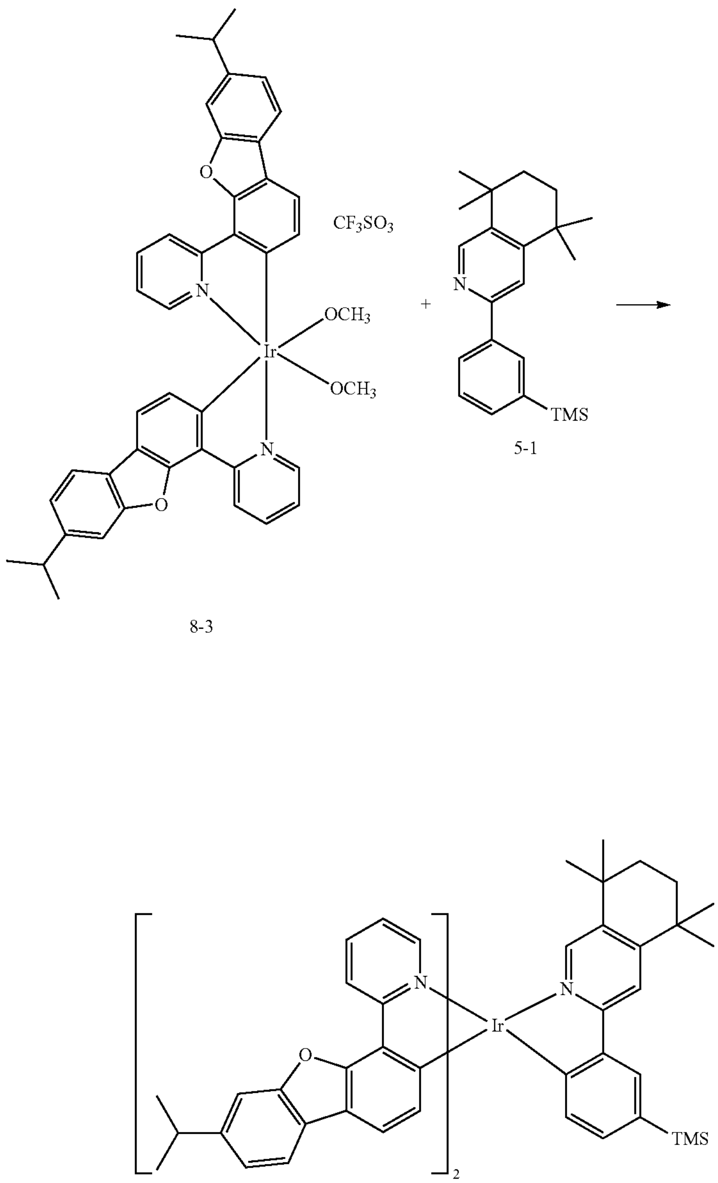

Synthesis of Compound 8-2

Compound 8-2 was synthesized in substantially the same manner as in Synthesis of Compound 12-2 in Synthesis Example 1, except that Compound 4-4 was used instead of Compound 12-1.

Synthesis of Compound 8-3

Compound 8-3 was synthesized in substantially the same manner as in Synthesis of Compound 12-3 in Synthesis Example 1, except that Compound 8-2 was used instead of Compound 12-2.

Synthesis of Compound 8

Compound 8 was synthesized in substantially the same manner as in Synthesis of Compound 12 in Synthesis Example 1, except that Compound 8-3 and Compound 5-1 were used instead of Compound 12-3 and Compound 12-4, respectively (yield: 50%).

LCMS: m/z calcd for $C_{62}H_{62}IrN_3O_2Si$, 1101.42; Found 1101.48.

Synthesis Example 11 (Compound 9)
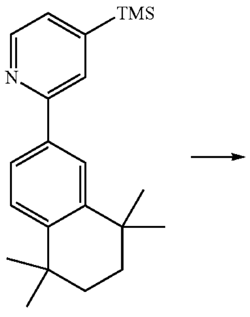
9-1
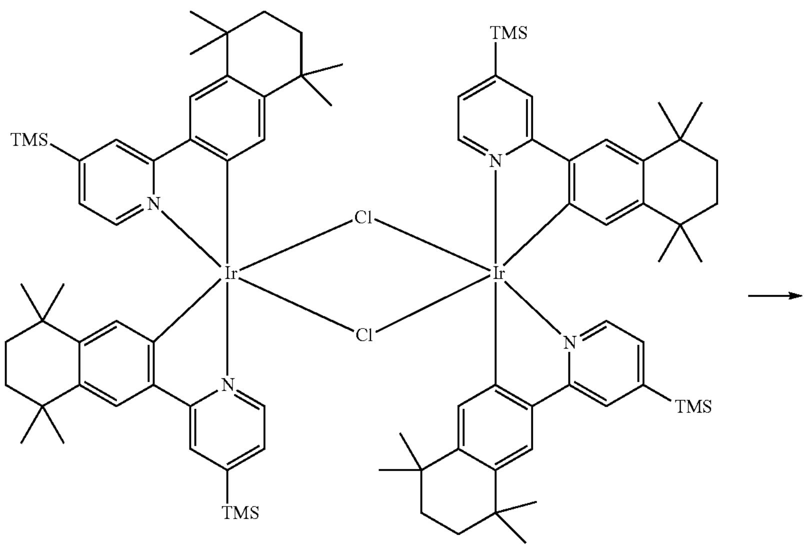
9-2
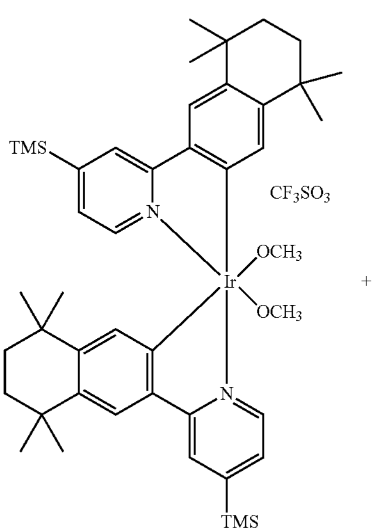
9-3
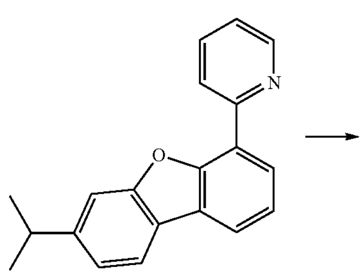
4-4

-continued

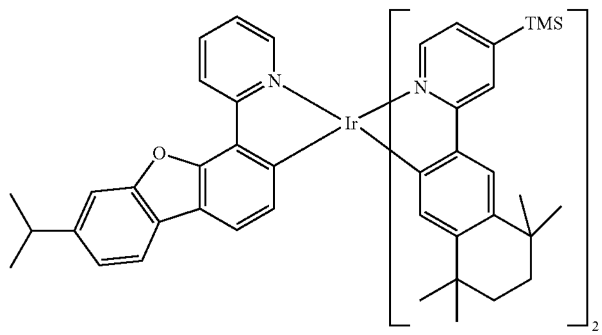

9

Synthesis of Compound 9-2

Compound 9-2 was synthesized in substantially the same manner as in Synthesis of Compound 12-2 in Synthesis Example 1, except that Compound 9-1 was used instead of Compound 12-1.

Synthesis of Compound 9-3

Compound 9-3 was synthesized in substantially the same manner as in Synthesis of Compound 12-3 in Synthesis Example 1, except that Compound 9-2 was used instead of Compound 12-2.

Synthesis of Compound 9

Compound 9 was synthesized in substantially the same manner as in Synthesis of Compound 12 in Synthesis Example 1, except that Compound 9-3 and Compound 4-4 were used instead of Compound 12-3 and Compound 12-4, respectively (yield: 48%).

LCMS: m/z calcd for $C_{64}H_{76}IrN_3OSi_2$, 1151.52; Found 1151.7.

Synthesis Example 12 (Compound 11)

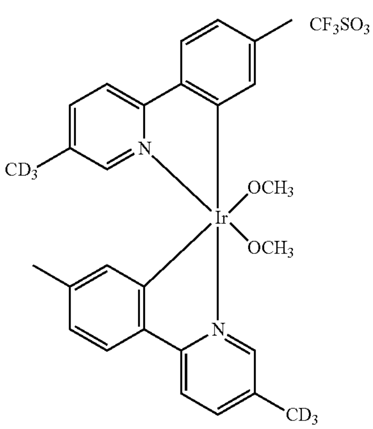

2-3

+

-continued

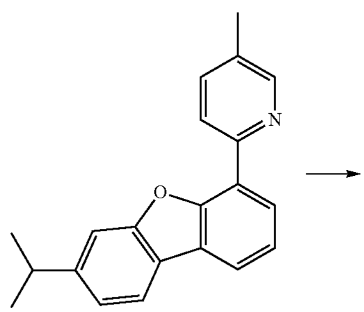

10-4

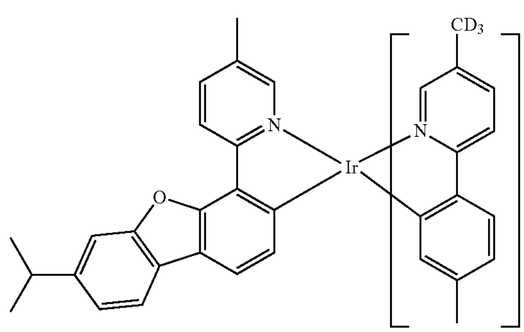

11

Compound 11 was synthesized in substantially the same manner as in Synthesis of Compound 12 in Synthesis Example 1, except that Compound 2-3 and Compound 10-4 were used instead of Compound 12-3 and Compound 12-4, respectively (yield: 63%).

LCMS: m/z calcd for $C_{47}H_{36}D_6IrN_3O$, 863.11; Found 863.33.

Synthesis Example 13 (Compound 13)
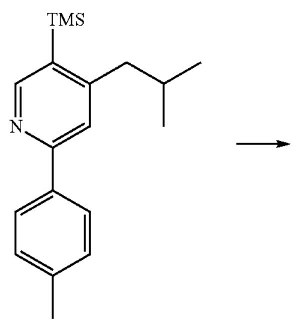
13-1
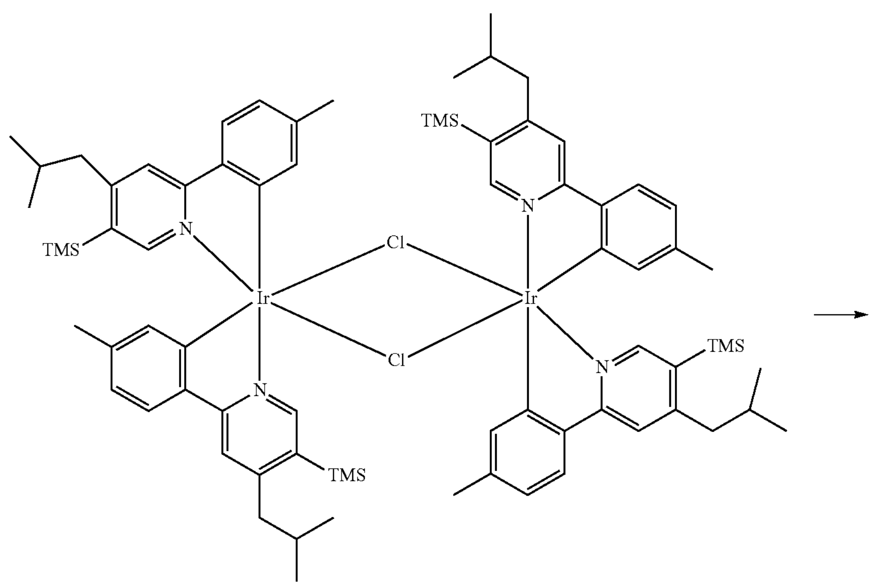
13-2
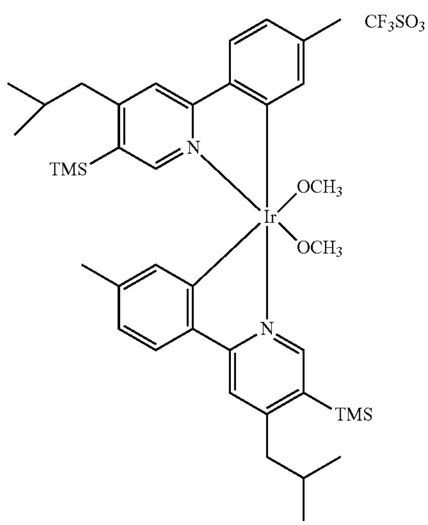
13-3
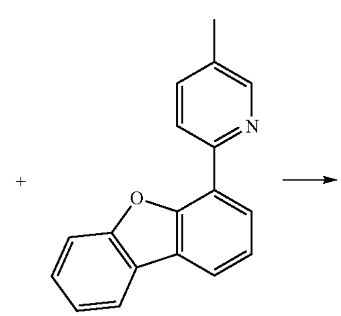
13-4

-continued

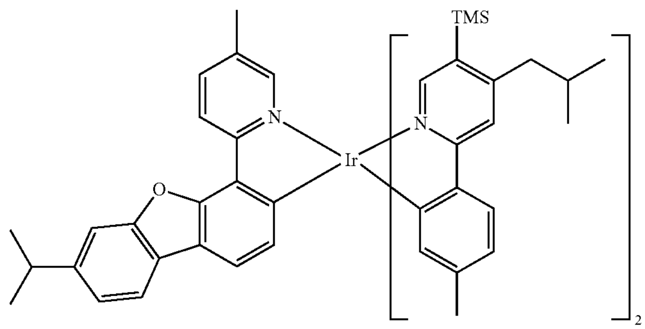

13

Synthesis of Compound 13-2

Compound 13-2 was synthesized in substantially the same manner as in Synthesis of Compound 12-2 in Synthesis Example 1, except that Compound 13-1 was used instead of Compound 12-1.

Synthesis of Compound 13-3

Compound 13-3 was synthesized in substantially the same manner as in Synthesis of Compound 12-3 in Synthesis Example 1, except that Compound 13-2 was used instead of Compound 12-2.

Synthesis of Compound 13

Compound 13 was synthesized in substantially the same manner as in Synthesis of Compound 12 in Synthesis Example 1, except that Compound 13-3 and Compound 13-4 were used instead of Compound 12-3 and Compound 12-4, respectively (yield: 54%).

LCMS: m/z calcd for $C_{56}H_{64}IrN_3OSi_2$, 1043.42; Found 1043.51.

Example 1

A glass substrate, on which an anode having an ITO/Ag/ITO (70 Å/1,000 Å/70 Å) structure was deposited, was cut to a size of 50 millimeters (mm)×50 mm×0.5 mm, sonicated in isopropyl alcohol and water for 5 minutes each, and cleaned by exposure to ultraviolet rays and ozone for 30 minutes. Subsequently, the glass substrate was mounted on a vacuum-deposition device.

2-TNATA was vacuum-deposited on the anode to form a hole injection layer having a thickness of 600 Å, and 4,4'-bis[N-(1-naphthyl)-N-phenylamino]biphenyl (hereinafter, referred as "NPB") was vacuum-deposited on the hole injection layer to form a hole transport layer having a thickness of 1,350 Å.

Subsequently, CBP (host) and Compound 1 (dopant) were co-deposited on the hole transport layer at a weight ratio of 98:2 to form an emission layer having a thickness of 400 Å.

Then, BCP was vacuum-deposited on the emission layer to form a hole blocking layer having a thickness of 50 Å. $Alq_3$ was vacuum-deposited on the hole blocking layer to form an electron transport layer having a thickness of 350 Å. LiF was vacuum-deposited on the electron transport layer to form an electron injection layer having a thickness of 10 Å. Mg and Ag were co-deposited on the electron injection layer at a weight ratio of 90:10 to form a cathode having a thickness of 120 Å, thereby completing the manufacture of an organic light-emitting device.

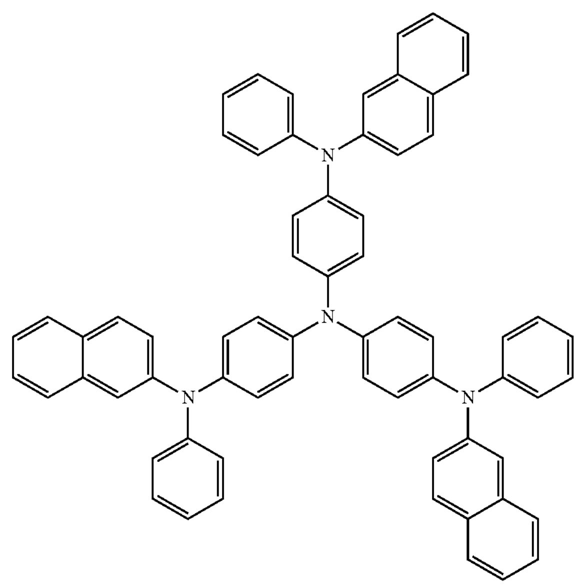

2-TNATA

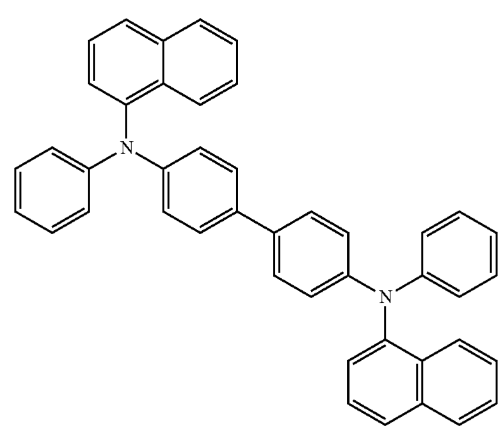

NPB

-continued

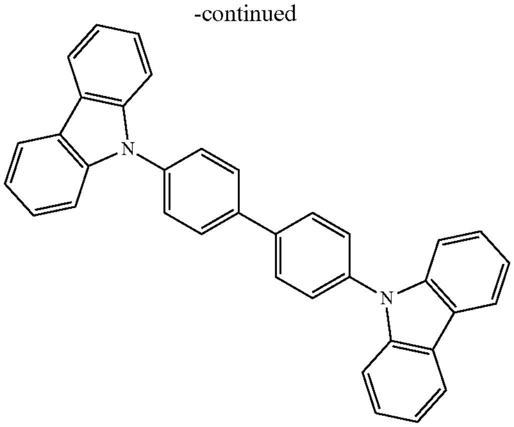

CBP

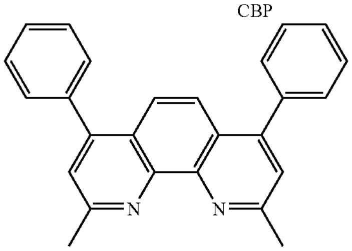

BCP

Examples 2 to 13 and Comparative Examples A, B, and C

Organic light-emitting devices were manufactured in substantially the same manner as in Example 1, except that the compounds shown in Table 2 were used instead of Compound 1 as a dopant in the formation of an emission layer.

Evaluation Example 2: Evaluation of Characteristics of Organic Light-Emitting Device The driving voltage, maximum value of external quantum efficiency (Max EQE), roll-off ratio, maximum emission wavelength of electroluminance (EL) spectrum, and lifespan ($LT_{97}$) of each organic light-emitting device manufactured in Examples 1 to 13 and Comparative Examples A, B, and C were evaluated. The results thereof are shown in Table 2. A Keithley 2400 current voltmeter and a luminance meter (Minolta Cs-1000A) were used in the evaluation. The lifespan ($LT_{97}$) refers to time required for the initial luminance of 3,500 nit of the organic light-emitting device to reduce by 97%. The roll-off ratio was calculated by Equation 20:

Roll-off ratio={1−(efficiency (at 3,500 nit)/maximum luminescence efficiency)}×100%    Equation 20

TABLE 2

| | Dopant in emission layer Compound No. | Driving voltage (V) | Max EQE (%) | Roll-off ratio (%) | Maximum emission wavelength (nm) | $LT_{97}$ (hr) (at 3500 nit) |
|---|---|---|---|---|---|---|
| Example 1 | 1 | 4.74 | 22.2 | 10 | 533 | 165 |
| Example 2 | 2 | 4.63 | 20.3 | 9 | 535 | 157 |
| Example 3 | 3 | 4.59 | 20.4 | 7 | 531 | 159 |
| Example 4 | 4 | 4.56 | 21.1 | 4 | 539 | 161 |
| Example 5 | 5 | 4.62 | 21.5 | 5 | 537 | 163 |
| Example 6 | 6 | 4.60 | 20.8 | 7 | 538 | 158 |
| Example 7 | 7 | 4.50 | 22.1 | 8 | 535 | 157 |
| Example 8 | 8 | 4.66 | 22.4 | 8 | 534 | 160 |
| Example 9 | 9 | 4.65 | 20.8 | 7 | 535 | 150 |
| Example 10 | 10 | 4.60 | 21.6 | 7 | 528 | 162 |
| Example 11 | 11 | 4.66 | 22.5 | 9 | 524 | 155 |
| Example 12 | 12 | 4.51 | 20.9 | 10 | 531 | 165 |
| Example 13 | 13 | 4.72 | 21.8 | 8 | 527 | 151 |
| Comparative Example A | A | 5.8 | 16.1 | 18 | 531 | 134 |
| Comparative Example B | B | 5.6 | 15.2 | 16 | 534 | 146 |
| Comparative Example C | C | 5.4 | 15.8 | 10 | 529 | 120 |

1
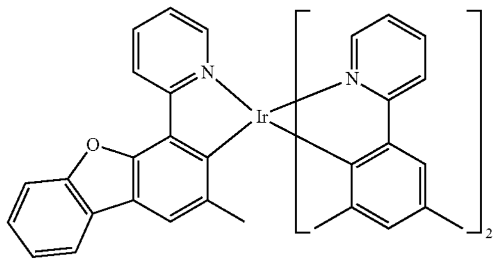
2
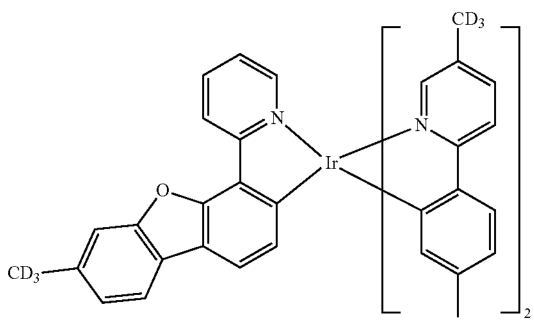
3
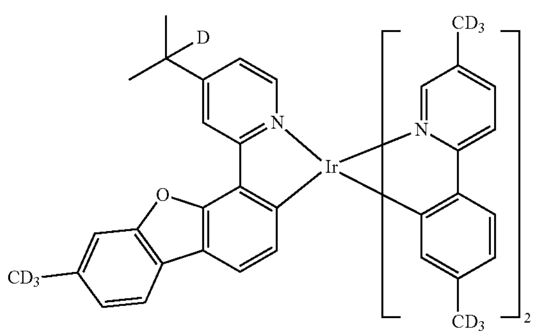
4
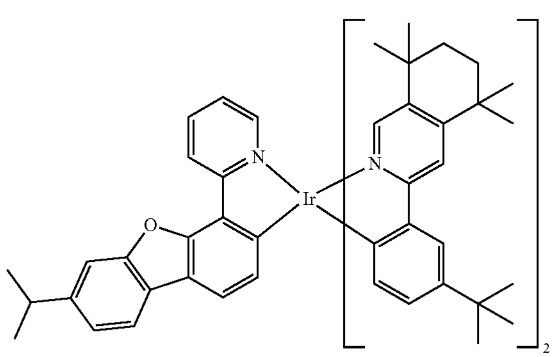
-continued
5
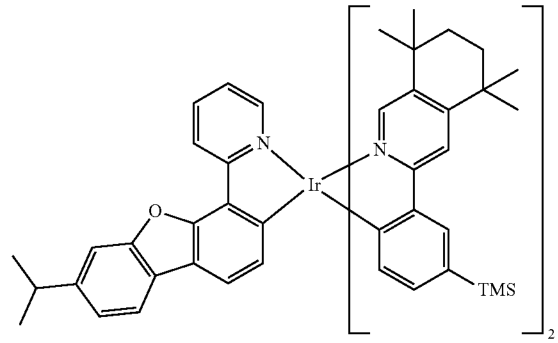
6
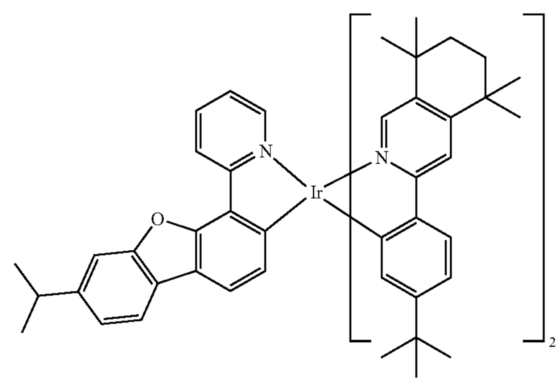
7
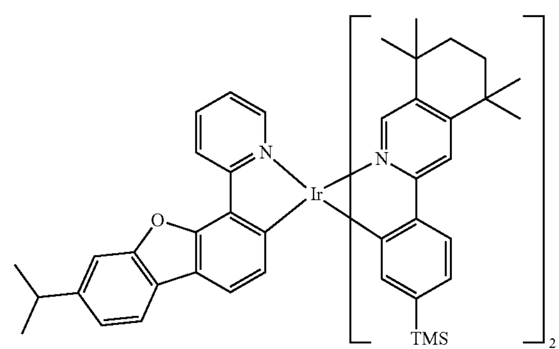
8
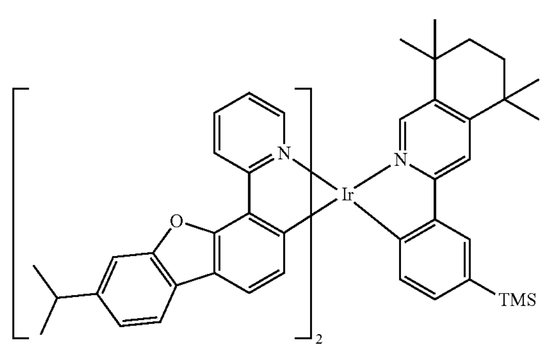

9

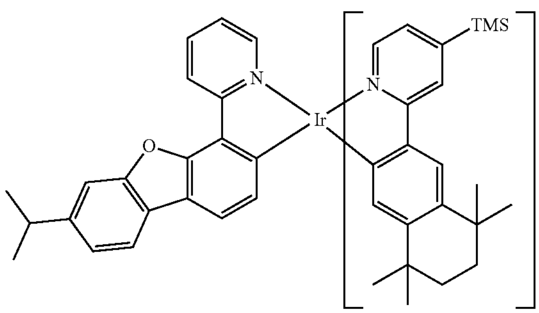

10

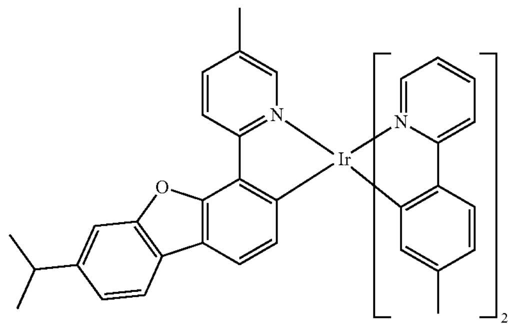

11

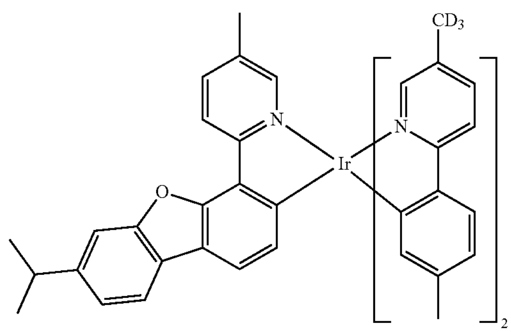

12

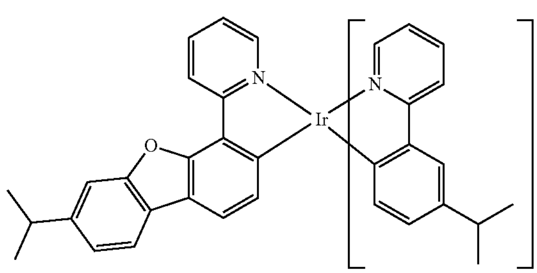

13

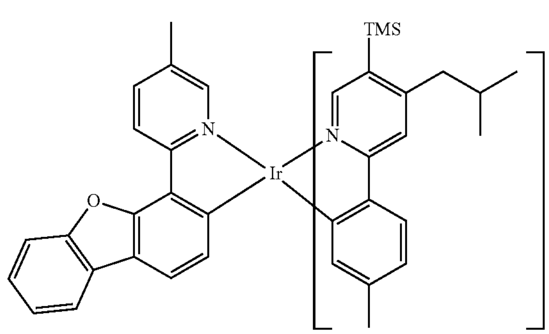

A

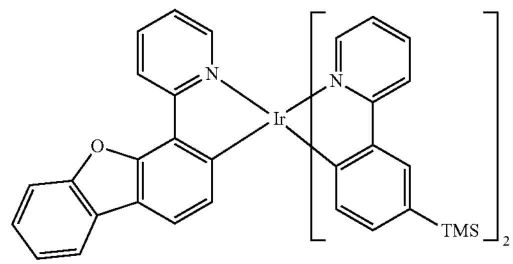

B

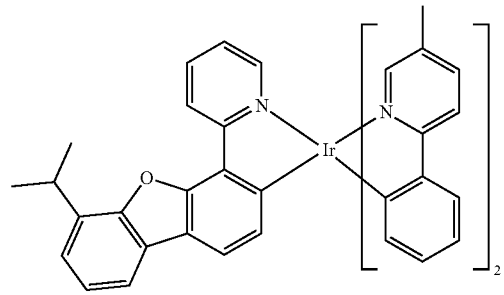

C

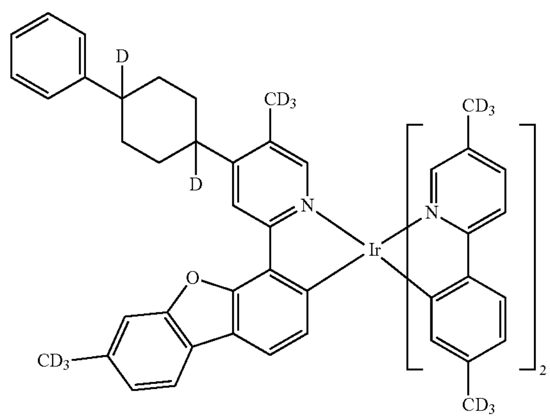

Referring to Table 2, the organic light-emitting device of Examples 1 to 13 were found to have improved driving voltage, improved external quantum efficiency, improved roll-off ratio, and improved lifespan characteristics, as compared with the organic light-emitting devices of Comparative Examples A, B, and C.

The organometallic compound may have a high spin density and a high radiative decay rate. Thus, an electronic device, e.g., an organic light-emitting device, including the organometallic compound may have improved driving voltage, improved external quantum efficiency, improved roll-off ratio, and improved lifespan characteristics. Further, a diagnostic composition including the organometallic compound may have a high diagnostic efficiency, because the organometallic compound is excellent in phosphorescent emission characteristics.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the FIGURES, it will be understood by those of ordinary skill in the art that various changes in form and details may be made therein without departing from the spirit and scope as defined by the following claims.

What is claimed is:

1. An organometallic compound represented by Formula 1:

$M(L_1)_{n1}(L_2)_{n2}$ Formula 1 wherein the organometallic compound represented by Formula 1 comprises a group represented by —$Si(Q_3)(Q_4)(Q_5)$, a group represented by —$Ge(Q_3)(Q_4)(Q_5)$, or any combination thereof, wherein, in Formula 1, M is a transition metal, $L_1$ is a ligand represented by Formula 2, $L_2$ is a ligand represented by Formula 3, n1 and n2 are each 1 or 2, and the sum of n1 and n2 is 3, $L_1$ is different from $L_2$,

2

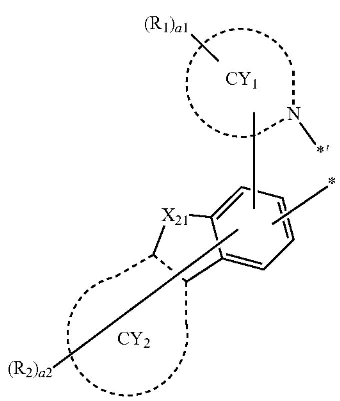

3

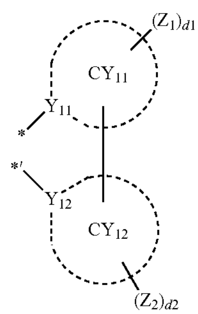

wherein, in Formulae 2 and 3, $Y_{11}$ is N, and $Y_{12}$ is C, ring $CY_1$ and ring $CY_{11}$ are each independently a $C_1$-$C_{30}$ heterocyclic group, ring $CY_2$ and ring $CY_{12}$ are each independently a $C_5$-$C_{30}$ carbocyclic group or a $C_1$-$C_{30}$ heterocyclic group, $X_{21}$ is O, S, Se, $N(R_{28})$, $C(R_{28})(R_{29})$, or $Si(R_{28})(R_{29})$, $R_1$, $R_2$, $R_{28}$, $R_{29}$, $Z_1$, and $Z_2$ are each independently deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted alkoxy group, a substituted or unsubstituted $C_6$-$C_{30}$ unsaturated carbocyclic group, a substituted or unsubstituted $C_2$-$C_{30}$ unsaturated heterocyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, provided that $R_2$ is not —$Si(Q_3)(Q_4)(Q_5)$, i) a1 is 0, and a2 is 1 or 2, ii) a1 is 1 or 2, and a2 is 0, or iii) a1 is 1 or 2, and a2 is 1 or 2;

d1 is an integer from 0 to 10, wherein, when a1 is 2 or greater, at least two $R_1$(s) are identical to or different from each other; when a2 is 2 or greater, at least two $R_2$(s) are identical to or different from each other; and when d1 is 2 or greater, at least two $Z_1$(s) are identical to or different from each other, d2 is an integer from 1 to 10, wherein, when d2 is 2 or greater, at least two $Z_2$(s) are identical to or different from each other, at least two selected from a plurality of $R_1$(s) are optionally linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, at least two selected from a plurality of $R_2$(s) are optionally linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, at least two selected from a plurality of $Z_1$(s) are optionally linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, at least two selected from a plurality of $Z_2$(s) are optionally linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, at least two selected from $R_1$(s), $R_2$(s), $Z_1$(s), and $Z_2$(s) are optionally linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{10a}$ is understood by referring to the description of $R_1$ provided herein,

* and *' each indicate a binding site to M in Formula 1, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_6$-$C_{30}$ unsaturated carbocyclic group, and the substituted $C_2$-$C_{30}$ unsaturated heterocyclic group is:

deuterium, —F, —Cl, —Br, —I, —$CD_3$, —$CD_2H$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_6$-$C_{30}$ unsaturated carbocyclic group, a $C_2$-$C_{30}$ unsaturated heterocyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(═O)($Q_{18}$)($Q_{19}$), —P($Q_{18}$)($Q_{19}$), or any combination thereof;

a $C_6$-$C_{30}$ unsaturated carbocyclic group or a $C_2$-$C_{30}$ unsaturated heterocyclic group, each unsubstituted or substituted with deuterium, —F, —Cl, —Br, —I, —$CD_3$, —$CD_2H$, —$CDH_2$, —$CF_3$, —$CFH_2$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{30}$ unsaturated carbocyclic group, a $C_2$-$C_{30}$ unsaturated heterocyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(═O)($Q_{28}$)($Q_{29}$), —P($Q_{28}$)($Q_{29}$), or any combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(═O)($Q_{38}$)($Q_{39}$), or —P($Q_{38}$)($Q_{39}$); or any combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid group or a salt thereof a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof a $C_2$-$C_{60}$ alkenyl group; a $C_2$-$C_{60}$ alkynyl group; a $C_1$-$C_{60}$ alkoxy group; or a $C_6$-$C_{30}$ unsaturated carbocyclic group or $C_2$-$C_{30}$ unsaturated heterocyclic group, each unsubstituted or substituted with deuterium, a $C_1$-$C_{60}$ alkyl group, a $C_6$-$C_{60}$ aryl group, or any combination thereof.

2. The organometallic compound of claim 1, wherein M is Ir.

3. The organometallic compound of claim 1, wherein ring $CY_1$ and ring $CY_{11}$ are each independently a pyridine group, a pyrimidine group, a pyrazine group, a pyridazine group, a triazine group, a quinoline group, an isoquinoline group, a quinoxaline group, a quinazoline group, a phenanthroline group, a 5,6,7,8-tetrahydroisoquinoline group, or a 5,6,7,8-tetrahydroquinoline group, and ring $CY_2$ and ring $CY_{12}$ are each independently a benzene group, a naphthalene group, an anthracene group, a phenanthrene group, a triphenylene group, a pyrene group, a chrysene group, a 1,2,3,4-tetrahydronaphthalene group, a thiophene group, a furan group, an indole group, a borole group, a silole group, a germole group, a phosphole group, a selenophene group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a 5,6,7,8-tetrahydroisoquinoline group, or a 5,6,7,8-tetrahydroquinoline group.

4. The organometallic compound of claim 1, wherein $X_{21}$ is O or S.

5. The organometallic compound of claim 1, wherein $R_1$, $R_2$, $R_{28}$, $R_{29}$, $Z_1$, and $Z_2$ are each independently:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, a $C_1$-$C_{20}$ alkenyl group, or a $C_1$-$C_{20}$ alkoxy group;

a $C_1$-$C_{20}$ alkyl group, a $C_1$-$C_{20}$ alkenyl group, or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a phenyl group, a ($C_1$-$C_{20}$ alkyl) phenyl group, a biphenyl group, a terphenyl group, a naphthyl group, a pyridinyl group, a pyrimidinyl group, or any combination thereof;

a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_2$-$C_{20}$ alkyl group, a $C_1$-$C_{20}$ alkoxy group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$), provided that $R_2$ is not —Si($Q_3$)($Q_4$)($Q_5$), wherein $Q_1$ to $Q_9$ are each independently:

deuterium, —F, —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, —$CF_3$, —$CF_2H$, —$CFH_2$, —$CH_2CF_3$, —$CH_2CF_2H$, —$CH_2CFH_2$, —$CHFCH_3$, —$CHFCF_2H$, —$CHFCFH_2$, —$CHFCF_3$, —$CF_2CF_3$, —$CF_2CF_2H$, or —$CF_2CFH_2$; or an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, a $C_1$-$C_{10}$ alkyl group, a phenyl group, or any combination thereof.

6. The organometallic compound of claim 1, wherein d1 is 0, 1, or 2, and d2 is 1, 2, 3, or 4.

7. The organometallic compound of claim 1 comprising at least one deuterium.

8. The organometallic compound of claim 1, wherein ring $CY_1$ in Formula 2 is represented by one of Formulae CY1-1 to CY1-19:

CY1-1

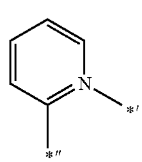

CY1-2

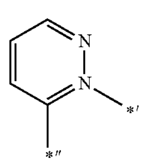

CY1-3

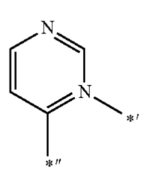

-continued

CY1-4

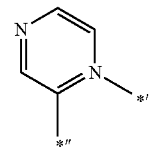

CY1-5

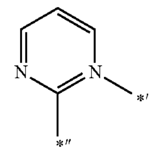

CY1-6

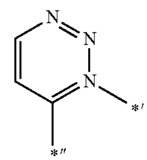

CY1-7

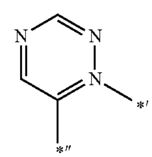

CY1-8

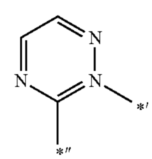

CY1-9

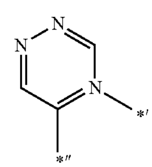

CY1-10

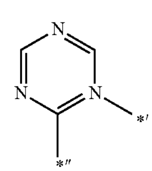

CY1-11

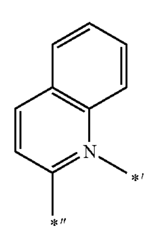

-continued
CY1-12
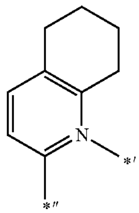
CY1-13
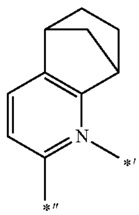
CY1-14
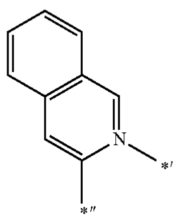
CY1-15
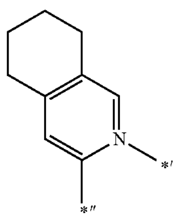
CY1-16
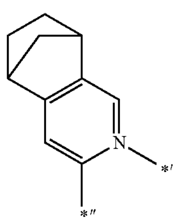
CY1-17
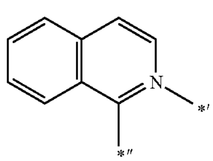
CY1-18
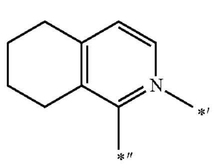
-continued
CY1-19
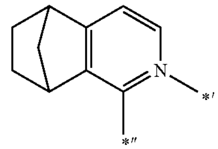
wherein, in Formulae CY1-1 to CY1-19, *' indicates a binding site to M in Formula 1, and *" indicates a binding site to an adjacent benzo group.
9. The organometallic compound of claim 1, wherein a group represented by
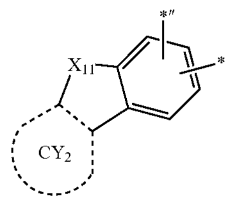
in Formula 2 is represented by one of Formulae CY2-1 to CY2-6:
CY2-1
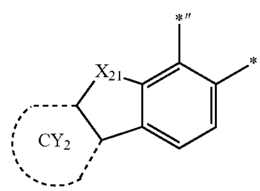
CY2-2
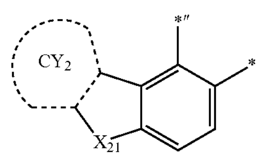
CY2-3
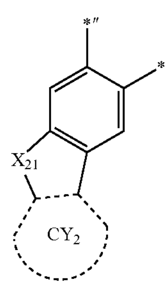
CY2-4
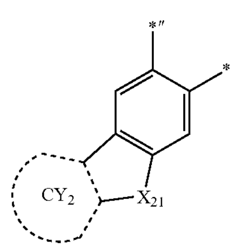

CY2-5
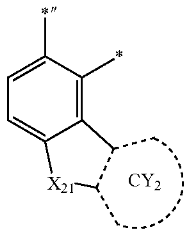
CY2-6
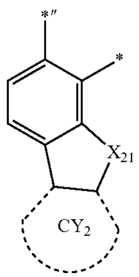
wherein, in Formulae CY2-1 to CY2-6, $X_{21}$ and ring $CY_2$ are each understood by referring to the descriptions thereof in claim 1, * indicates a binding site to M in Formula 1, and *" indicates a binding site to ring $CY_1$ in Formula 2.
10. The organometallic compound of claim 1, wherein a group represented by
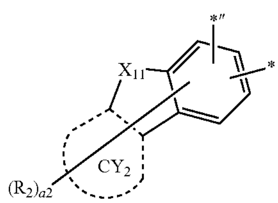
in Formula 2 is represented by one of Formulae CY2(1) to CY2(22):
CY2(1)
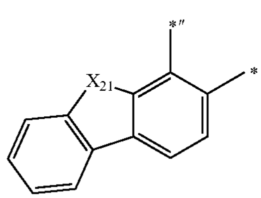
CY2(2)
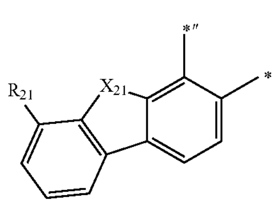
CY2(3)
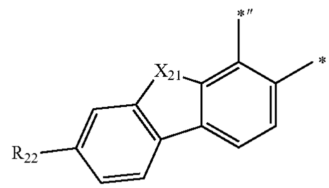
CY2(4)
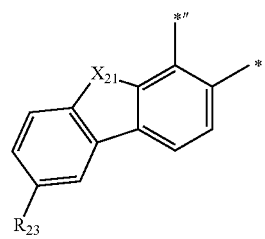
CY2(5)
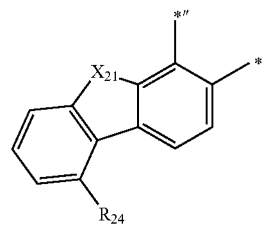
CY2(6)
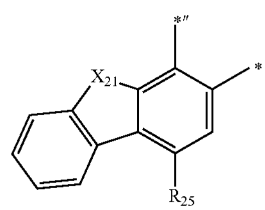
CY2(7)
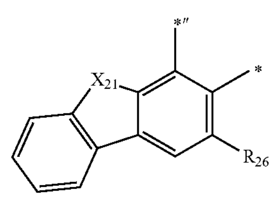
CY2(8)
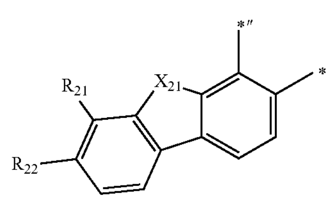
CY2(9)
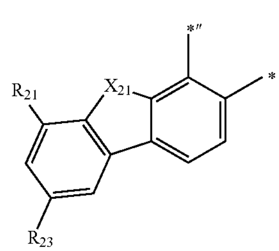

-continued
CY2(10)
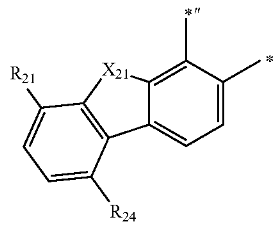
CY2(11)
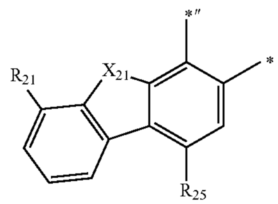
CY2(12)
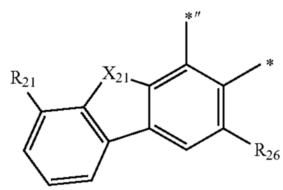
CY2(13)
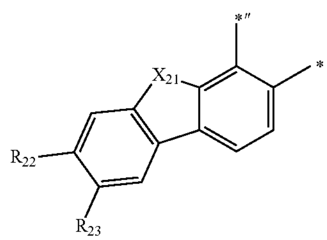
CY2(14)
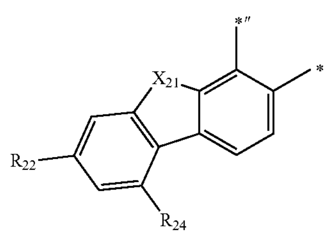
CY2(15)
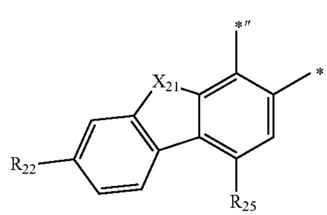
CY2(16)
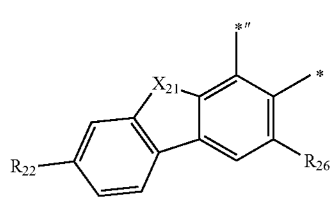
-continued
CY2(17)
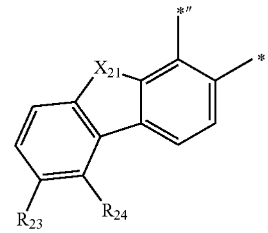
CY2(18)
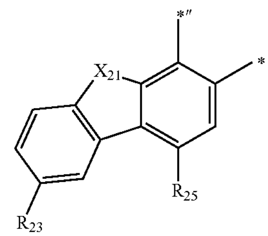
CY2(19)
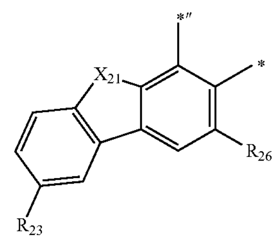
CY2(20)
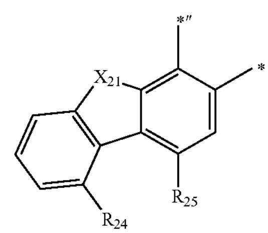
CY2(21)
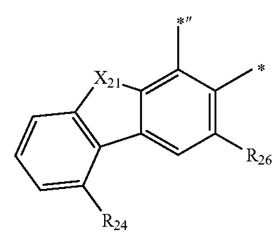
CY2(22)
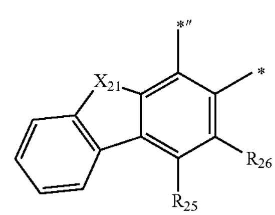
wherein, in Formulae CY2(1) to CY2(22), $X_{21}$ is understood by referring to the description thereof in claim 1, $R_{21}$ to $R_{26}$ are each understood by referring to the description of $R_2$ in claim 1, * indicates a binding site to M in Formula 1, and *" indicates a binding site to ring $CY_1$ in Formula 2.

11. The organometallic compound of claim 1, wherein a group represented by
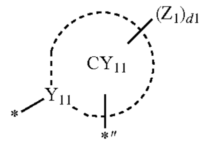
in Formula 3 is represented by one of Formulae CY11(1) to CY11(18):
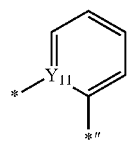
CY11(1)
CY11(2)
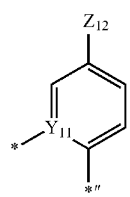
CY11(3)
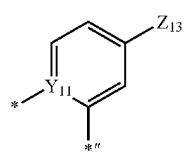
CY11(4)
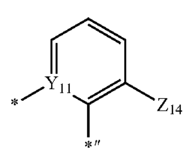
CY11(5)
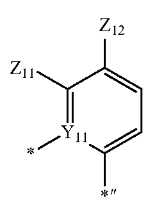
CY11(6)
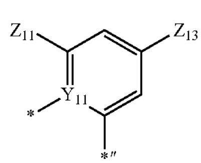
CY11(7)
-continued
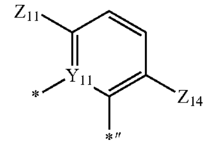
CY11(8)
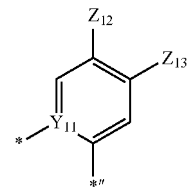
CY11(9)
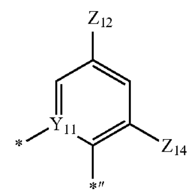
CY11(10)
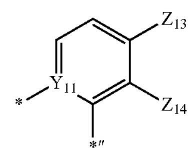
CY11(11)
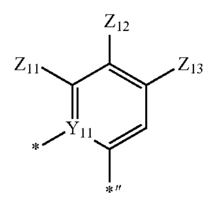
CY11(12)
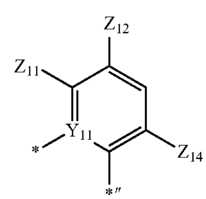
CY11(13)
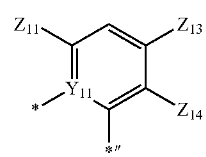
CY11(14)
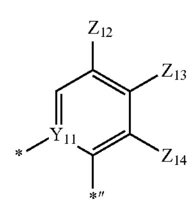
CY11(15)

-continued

CY11(16)

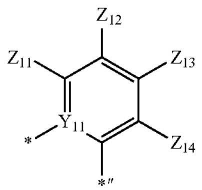

CY11(17)

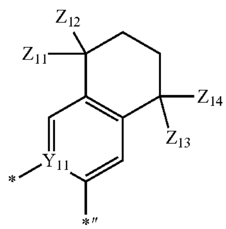

CY11(18)

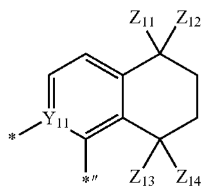

wherein, in Formulae CY11(1) to CY11(18), $Y_{12}$ is understood by referring to the description thereof in claim 1, $Z_{11}$ to $Z_{14}$ are each understood by referring to the description of $Z_1$ in claim 1, * indicates a binding site to M in Formula 1, and *" indicates a binding site to an adjacent atom in Formula 3.

12. The organometallic compound of claim 1, wherein a group represented by

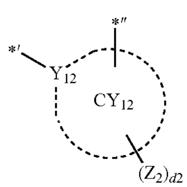

in Formula 3 is represented by one of Formulae CY12(1) to CY12(17):

CY12(1)

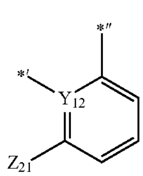

CY12(2)

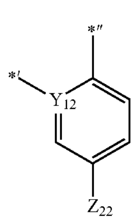

-continued

CY12(3)

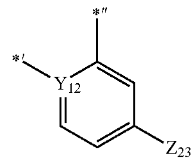

CY12(4)

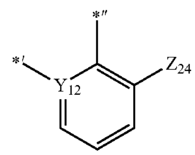

CY12(5)

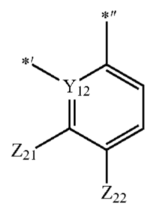

CY12(6)

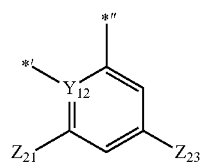

CY12(7)

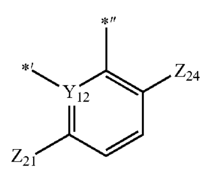

CY12(8)

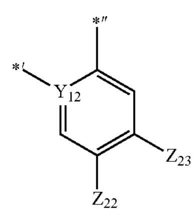

CY12(9)

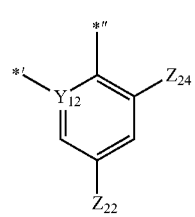

CY12(10)

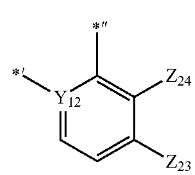

-continued

CY12(11)

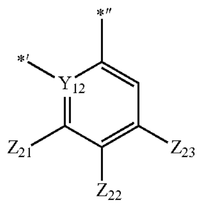

CY12(12)

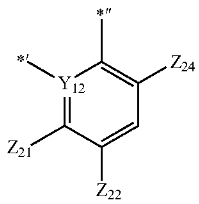

CY12(13)

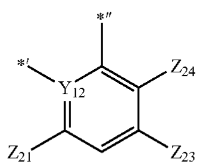

CY12(14)

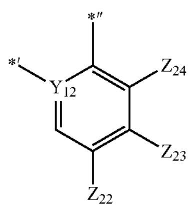

CY12(15)

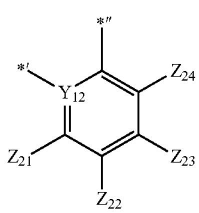

CY12(16)

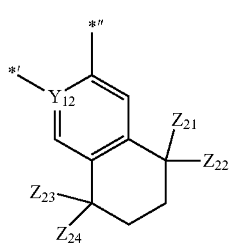

CY12(17)

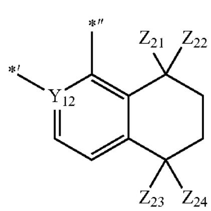

wherein, in Formulae CY12(1) to CY12(17), $Y_{12}$ is understood by referring to the description thereof in claim 1, $Z_{21}$ to $Z_{24}$ are each understood by referring to the description of $Z_2$ in claim 1, *' indicates a binding site to M in Formula 1, and *" indicates a binding site to an adjacent atom in Formula 3.

13. The organometallic compound of claim 1, wherein the organometallic compound is of Compounds 5, 7 to 9, 13 to 14, 22, 173, 175 to 176, 179, and 181:

5

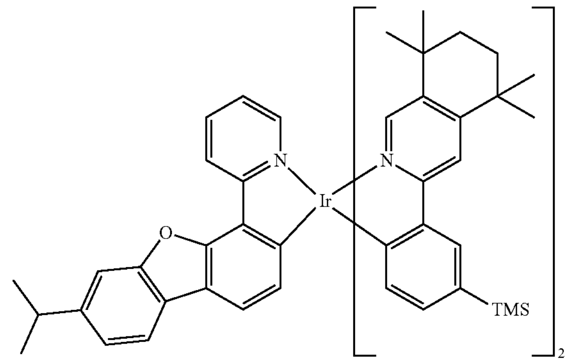

7

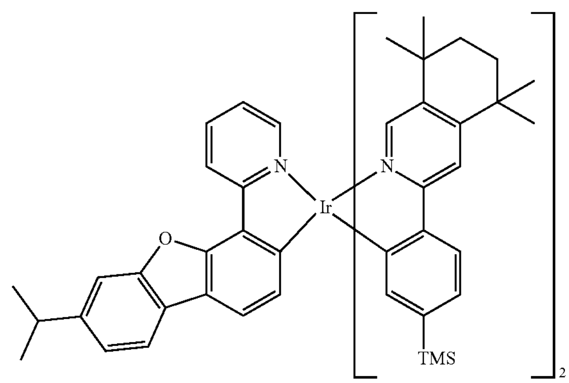

8

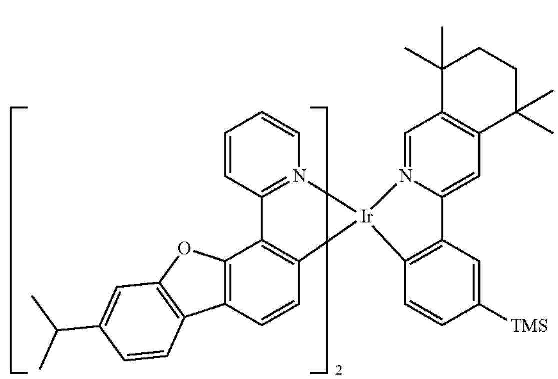

-continued
9
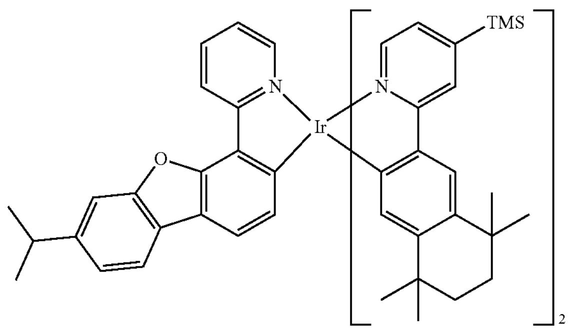
13
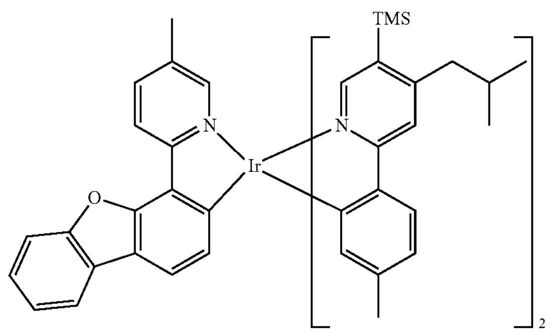
14
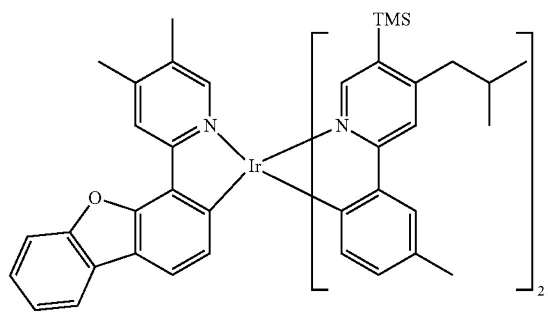
22
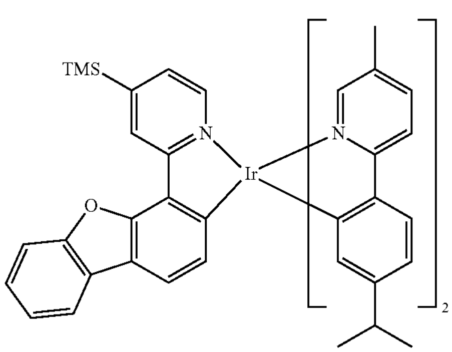
-continued
173
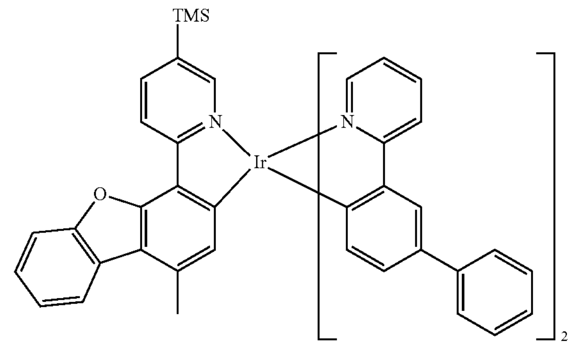
175
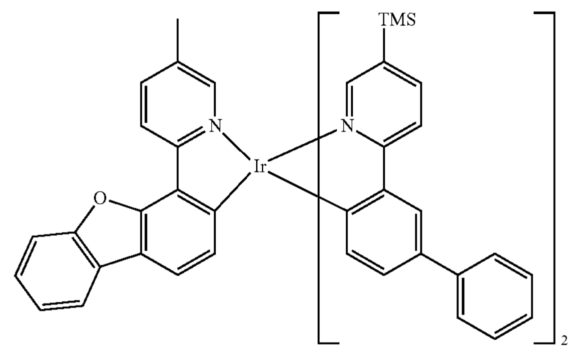
176
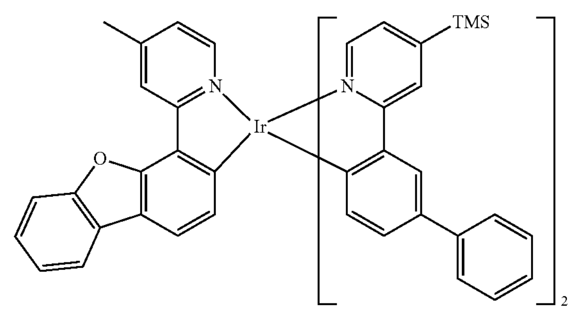
179
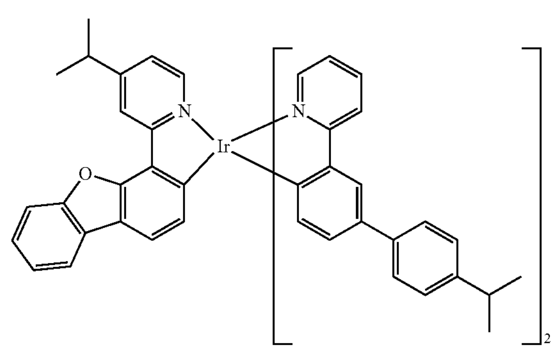

-continued

181

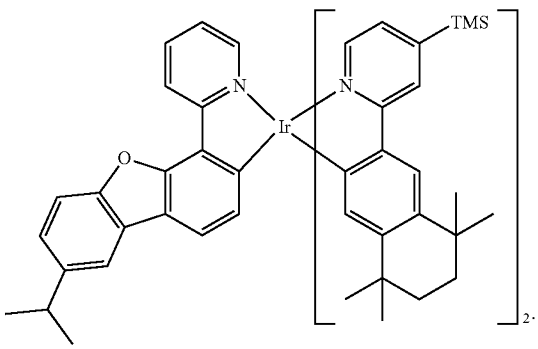

14. An organic light-emitting device comprising:

a first electrode;

a second electrode; and an organic layer disposed between the first electrode and the second electrode and comprising an emission layer; and wherein, the organic layer comprises at least one organometallic compound of claim 1.

15. The organic light-emitting device of claim 14, wherein the first electrode is an anode, the second electrode is a cathode, and the organic layer further comprises a hole transport region disposed between the first electrode and the emission layer and an electron transport region disposed between the emission layer and the second electrode, the hole transport region comprises a hole injection layer, a hole transport layer, an electron blocking layer, a buffer layer, or any combination thereof, and the electron transport region comprises a hole blocking layer, an electron transport layer, an electron injection layer, or any combination thereof.

16. The organic light-emitting device of claim 14, wherein the emission layer comprises the organometallic compound.

17. The organic light-emitting device of claim 16, wherein the emission layer further comprises a host in an amount greater than an amount of the organometallic compound.

18. A diagnostic composition comprising one of the organometallic compound of claim 1.

* * * * *